(12) United States Patent
Kimura

(10) Patent No.: US 8,570,456 B2
(45) Date of Patent: Oct. 29, 2013

(54) SEMICONDUCTOR DEVICE, DISPLAY DEVICE AND ELECTRONIC DEVICE EQUIPPED WITH THE SEMICONDUCTOR DEVICE

(75) Inventor: Hajime Kimura, Kanagawa (JP)

(73) Assignee: Semiconductor Energy Laboratory Co., Ltd., Kanagawa-ken (JP)

( * ) Notice: Subject to any disclaimer, the term of this patent is extended or adjusted under 35 U.S.C. 154(b) by 21 days.

(21) Appl. No.: 12/978,802

(22) Filed: Dec. 27, 2010

(65) Prior Publication Data

US 2011/0090189 A1    Apr. 21, 2011

Related U.S. Application Data

(63) Continuation of application No. 11/462,815, filed on Aug. 7, 2006, now Pat. No. 7,859,488.

(30) Foreign Application Priority Data

Aug. 12, 2005    (JP) ................................. 2005-234007

(51) Int. Cl.
   *G02F 1/136*    (2006.01)
   *G02F 1/1343*   (2006.01)

(52) U.S. Cl.
   USPC ............................................. 349/48; 349/38

(58) Field of Classification Search
   USPC ...................................................... 349/48, 38
   See application file for complete search history.

(56) References Cited

U.S. PATENT DOCUMENTS

| | | | |
|---|---|---|---|
| 5,216,531 | A | 6/1993 | Hirai et al. |
| 5,942,773 | A | 8/1999 | Kaneko |
| 6,229,506 | B1 | 5/2001 | Dawson et al. |
| 6,346,730 | B1 | 2/2002 | Kitakado et al. |

(Continued)

FOREIGN PATENT DOCUMENTS

| | | |
|---|---|---|
| CN | 001167341 A | 12/1997 |
| EP | 0 473 090 A2 | 3/1992 |

(Continued)

OTHER PUBLICATIONS

Machine translation of JP2004-061812A1, which is equivalent to WO 2004/061812A1; Jul. 2004.*

(Continued)

*Primary Examiner* — Wen-Ying P Chen
(74) *Attorney, Agent, or Firm* — Fish & Richardson P.C.

(57) ABSTRACT

The present invention provides a semiconductor device which can prevent a current from flowing into a display element at a signal writing operation, without increasing power consumption and without changing a potential of a power supply for supplying a current to a load in each row. When a predetermined current is supplied to a transistor to set a gate-source voltage of the transistor, a potential of a gate terminal of the transistor is adjusted so as to prevent a current from flowing into a load which is connected to a source terminal of the transistor. Thus, a potential of a wire connected to the gate terminal of the transistor is made different from that of a wire connected to a drain terminal of the transistor. At that time, an operation of a transistor is shifted so as to allow a large amount of current to flow, and influences by intersection capacitance parasitic to a wire or the like or wire resistance are hardly caused, and a set operation is conducted quickly.

18 Claims, 101 Drawing Sheets

(56) References Cited

U.S. PATENT DOCUMENTS

| | | |
|---|---|---|
| 6,535,185 B2 | 3/2003 | Kim et al. |
| 6,630,977 B1 | 10/2003 | Yamazaki et al. |
| 6,727,522 B1* | 4/2004 | Kawasaki et al. ............. 257/103 |
| 6,750,833 B2 | 6/2004 | Kasai |
| 6,774,877 B2 | 8/2004 | Nishitoba et al. |
| 6,777,888 B2 | 8/2004 | Kondo |
| 6,828,950 B2 | 12/2004 | Koyama |
| 6,864,863 B2 | 3/2005 | Kasai |
| 6,885,146 B2 | 4/2005 | Yamazaki et al. |
| 6,950,168 B2 | 9/2005 | Yamazaki et al. |
| 6,958,651 B2 | 10/2005 | Kimura |
| 6,975,313 B2 | 12/2005 | Kurumisawa |
| 7,061,014 B2 | 6/2006 | Hosono et al. |
| 7,064,346 B2 | 6/2006 | Kawasaki et al. |
| 7,091,667 B2 | 8/2006 | Sakaguchi et al. |
| 7,091,939 B2 | 8/2006 | Kasai |
| 7,098,085 B2 | 8/2006 | Yamanaka et al. |
| 7,126,661 B2 | 10/2006 | Yamazaki et al. |
| 7,183,229 B2 | 2/2007 | Yamanaka |
| 7,248,237 B2 | 7/2007 | Yamada et al. |
| 7,253,665 B2 | 8/2007 | Kimura |
| 7,274,345 B2 | 9/2007 | Imamura et al. |
| 7,282,782 B2 | 10/2007 | Hoffman et al. |
| 7,317,429 B2 | 1/2008 | Shirasaki et al. |
| 7,323,356 B2 | 1/2008 | Hosono et al. |
| 7,345,657 B2 | 3/2008 | Kimura |
| 7,436,474 B2 | 10/2008 | Kim |
| 7,453,427 B2 | 11/2008 | Kimura |
| 7,554,362 B2 | 6/2009 | Kimura |
| 7,663,615 B2 | 2/2010 | Shirasaki et al. |
| 7,679,585 B2 | 3/2010 | Kimura |
| 7,701,541 B2 | 4/2010 | Yamazaki et al. |
| 7,768,601 B2 | 8/2010 | Kim |
| 7,773,058 B2 | 8/2010 | Kimura |
| 7,852,330 B2 | 12/2010 | Kimura |
| 7,859,488 B2 | 12/2010 | Kimura |
| 7,911,233 B2 | 3/2011 | Kimura |
| 7,924,244 B2 | 4/2011 | Kimura et al. |
| 8,059,068 B2 | 11/2011 | Kimura |
| 8,093,589 B2 | 1/2012 | Sugihara et al. |
| 8,305,138 B2 | 11/2012 | Kimura |
| 8,441,315 B2 | 5/2013 | Kimura |
| 8,497,823 B2 | 7/2013 | Kimura et al. |
| 2001/0038098 A1 | 11/2001 | Yamazaki et al. |
| 2002/0021293 A1 | 2/2002 | Tam |
| 2002/0047120 A1 | 4/2002 | Inukai |
| 2002/0130827 A1 | 9/2002 | Maurice |
| 2003/0043131 A1 | 3/2003 | Iguchi |
| 2003/0057853 A1 | 3/2003 | Ino |
| 2003/0090481 A1 | 5/2003 | Kimura |
| 2003/0148565 A1 | 8/2003 | Yamanaka |
| 2003/0193489 A1* | 10/2003 | Koyama ....................... 345/204 |
| 2004/0222089 A1 | 11/2004 | Inoue et al. |
| 2004/0222950 A1 | 11/2004 | Kimura |
| 2004/0246241 A1 | 12/2004 | Sato et al. |
| 2004/0256617 A1 | 12/2004 | Yamada et al. |
| 2004/0257314 A1 | 12/2004 | Chang |
| 2005/0007181 A1 | 1/2005 | Kimura |
| 2005/0007398 A1 | 1/2005 | Hirai |
| 2005/0083272 A1 | 4/2005 | Kimura |
| 2005/0116967 A1 | 6/2005 | Shirasaki et al. |
| 2005/0122349 A1 | 6/2005 | Yamazaki et al. |
| 2005/0156833 A1 | 7/2005 | Koyama |
| 2005/0168899 A1 | 8/2005 | Sato et al. |
| 2006/0091793 A1 | 5/2006 | Baude et al. |
| 2006/0244107 A1 | 11/2006 | Sugihara et al. |
| 2007/0013613 A1* | 1/2007 | Umezaki ....................... 345/55 |
| 2007/0087492 A1 | 4/2007 | Yamanaka |
| 2007/0194379 A1 | 8/2007 | Hosono et al. |
| 2007/0262978 A1 | 11/2007 | Kimura |
| 2007/0296652 A1 | 12/2007 | Imamura et al. |
| 2009/0174631 A1 | 7/2009 | Kimura |
| 2009/0278122 A1 | 11/2009 | Hosono et al. |
| 2009/0280600 A1 | 11/2009 | Hosono et al. |
| 2010/0156877 A1 | 6/2010 | Kimura |
| 2011/0063275 A1 | 3/2011 | Imamura et al. |
| 2011/0101352 A1 | 5/2011 | Hosono et al. |
| 2011/0133828 A1 | 6/2011 | Kimura |
| 2011/0163320 A1 | 7/2011 | Kimura |
| 2011/0201162 A1 | 8/2011 | Hosono et al. |
| 2012/0012838 A1 | 1/2012 | Hosono et al. |

FOREIGN PATENT DOCUMENTS

| | | |
|---|---|---|
| EP | 0 812 020 A2 | 12/1997 |
| EP | 1 134 811 A1 | 9/2001 |
| EP | 1 191 512 A2 | 3/2002 |
| EP | 1 197 943 A2 | 4/2002 |
| EP | 1 331 627 A2 | 7/2003 |
| EP | 1577870 A1 | 9/2005 |
| EP | 1598938 A1 | 11/2005 |
| EP | 1610292 A2 | 12/2005 |
| EP | 1 737 044 A1 | 12/2006 |
| EP | 2 226 847 A2 | 9/2010 |
| EP | 2 228 783 A1 | 9/2010 |
| EP | 2 246 894 A1 | 11/2010 |
| EP | 2 306 444 A1 | 4/2011 |
| EP | 2 348 502 A2 | 7/2011 |
| EP | 2 413 366 A1 | 2/2012 |
| JP | 05-011721 A | 1/1993 |
| JP | 05-190101 A | 7/1993 |
| JP | 05-210124 A | 8/1993 |
| JP | 05-251705 A | 9/1993 |
| JP | 08-248896 A | 9/1996 |
| JP | 2000-044236 A | 2/2000 |
| JP | 2000-056286 A | 2/2000 |
| JP | 2000-105350 A | 4/2000 |
| JP | 2000-150900 A | 5/2000 |
| JP | 2000259098 A | 9/2000 |
| JP | 2001-166252 A | 6/2001 |
| JP | 2001-189520 A | 7/2001 |
| JP | 2002-076356 A | 3/2002 |
| JP | 2002-169510 A | 6/2002 |
| JP | 2002-189448 A | 7/2002 |
| JP | 2002-198311 A | 7/2002 |
| JP | 2002-231628 A | 8/2002 |
| JP | 2002-246310 A | 8/2002 |
| JP | 2002-246311 A | 8/2002 |
| JP | 2002-252174 A | 9/2002 |
| JP | 2002-289859 A | 10/2002 |
| JP | 2002-350749 A | 12/2002 |
| JP | 2003005710 A | 1/2003 |
| JP | 2003-195810 A | 7/2003 |
| JP | 2003-241705 A | 8/2003 |
| JP | 2003-288049 A | 10/2003 |
| JP | 2004-101777 A | 4/2004 |
| JP | 2004-191603 A | 7/2004 |
| JP | 2004-201297 A | 7/2004 |
| JP | 2004361935 A | 12/2004 |
| JP | 2005-033172 A | 2/2005 |
| JP | 2005049844 A | 2/2005 |
| JP | 2005-107129 A | 4/2005 |
| JP | 2006039527 A | 2/2006 |
| JP | 2006-171109 A | 6/2006 |
| JP | 2006-258172 A | 9/2006 |
| JP | 2007041571 A | 2/2007 |
| JP | 2007-072453 A | 3/2007 |
| JP | 2013-140407 A | 7/2013 |
| KR | 20010014948 A | 2/2001 |
| KR | 20050052400 A | 6/2005 |
| WO | 02/075709 A1 | 9/2002 |
| WO | 03/058328 A1 | 7/2003 |
| WO | WO 2004/061812 A1 | 7/2004 |
| WO | WO 2004061812 A1 * | 7/2004 |
| WO | WO 2004/077671 A1 | 9/2004 |
| WO | 2004109638 A1 | 12/2004 |
| WO | 2005/088726 A1 | 9/2005 |
| WO | 2006/064943 A1 | 6/2006 |

OTHER PUBLICATIONS

Korean Office Action (Application No. 2010-0134162) dated Feb. 29, 2012, Full English Translation.

(56) References Cited

OTHER PUBLICATIONS

Tomoyuki Shirasaki et al.; "57.4L: Late News Paper: Full-color Polymer AM-OLED using Ink-jet and a-Si TFT Technologies"; SID 04 Digest; pp. 1516-1519; May 26-27, 2004.

Chinese Patent Application No. 200610159377.7, First Office Action dated Oct. 16, 2009, with full English translation (20 pages).

Kenji Nomura et al.; "Room-temperature fabrication of transparent flexible thin-film transistors using amorphous oxide semiconductors"; Nature; Nov. 25, 2004; pp. 488-492; vol. 432.

Noboru Kimizuka et al.; "Syntheses and Single-Crystal Data of Homologous Compounds, $In_2O_3(ZnO)m$ (m = 3, 4, and 5), $InGaO_3(ZnO)3$, and $Ga_2O_3(ZnO)m$ (m = 7, 8, 9, and 16) in the $In_2O_3$-$ZnGa_2O_4$-ZnO System"; Journal of Solid State Chemistry; Apr. 1, 1995; pp. 170-178; vol. 116, No. 1.

Kenji Nomura et al.; "Thin-Film Transistor Fabricated in Single Crystalline Transparent Oxide Semiconductor"; Science; May 23, 2003; pp. 1269-1272; vol. 300, No. 5623.

Kenji Nomura et al.; "Carrier transport in transparent oxide semiconductor with intrinsic structural randomness probed using single-crystalline $InGaO_3(ZnO)5$ films"; Applied Physics Letters; Sep. 13, 2004; pp. 1993-1995; vol. 85, No. 11.

Toshio Kamiya et al.; "1a-F-5 Room temperature fabrication and carrier transport of amorphous semiconductor exhibiting large electron Hall mobilities > 10 cm2/Vs"; (The 65th Autumn Meeting, 2004) The Japan Society of Applied Physics; Sep. 1, 2004; No. 2, p. 791 w/English translation (7 pages).

Kenji Nomura et al.; "31a-ZA-6 Carrier Transport in Transparent Amorphous Oxide Semiconductor $InGaZnO4$"; (The 51st Spring Meeting,2004); The Japan Society of Applied Physics and Related Societies, Mar. 28, 2004, p. 669; No. 2 w/English translation (7 pages).

Chunfei Li et al.; "Modulated Structures of Homologous Compounds $InMO3(ZnO)m$ (M=In,Ga; m=Integer) Described by Four-Dimensional Superspace Group"; Journal of Solid State Chemistry; 1998; pp. 347-355; vol. 139.

Tomoyuki Shirasaki et al.; "57.4L: Late News Paper: Full-color Polymer AM-OLED using Ink-jet and a-Si TFT Technologies"; SID 04 Digest, vol. 35; pp. 1516-1519; May 26-27, 2004.

Taiwanese Office Action (TW Application No. 095128356) dated Jun. 18, 2013, with English translation, 27 pages.

Office Action, Taiwanese Application No. 99144222, dated Jul. 8, 2013, 18 pages with full English translation.

Office Action, Chinese Patent Application No. 201010619574.9, dated Aug. 29, 2013, 22 pages with full English translation.

\* cited by examiner

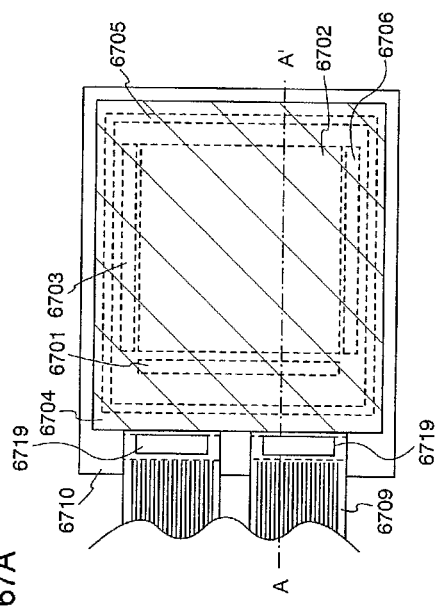
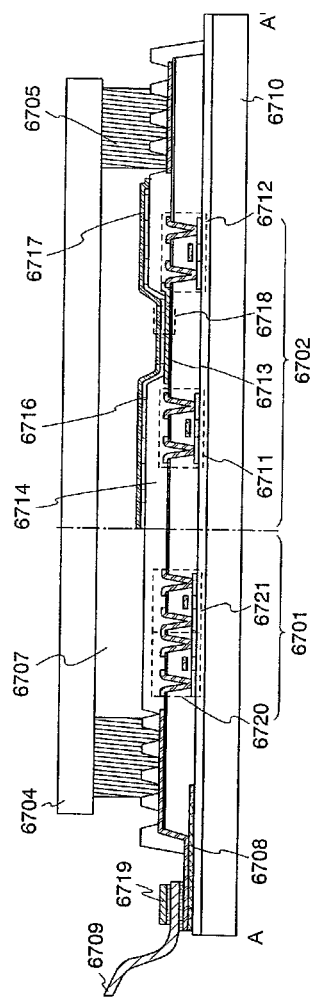
FIG. 67A
FIG. 67B

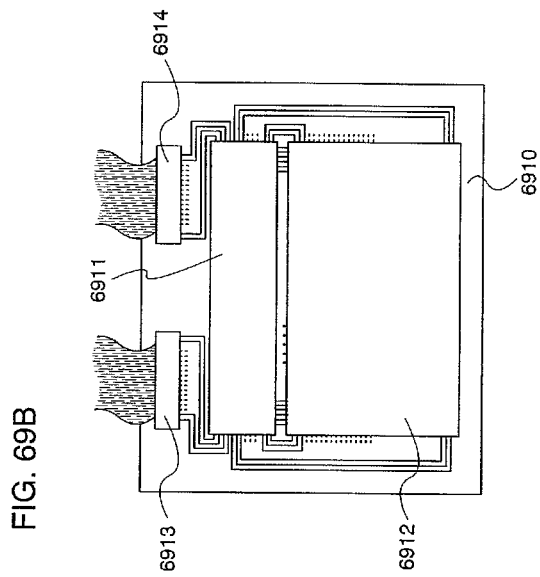
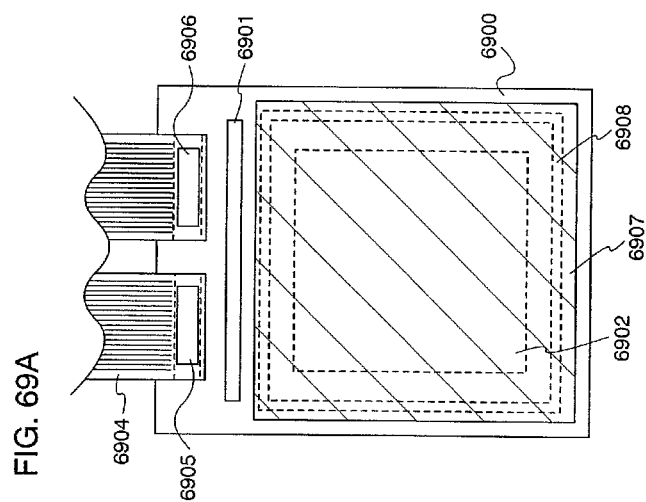
FIG. 69A
FIG. 69B

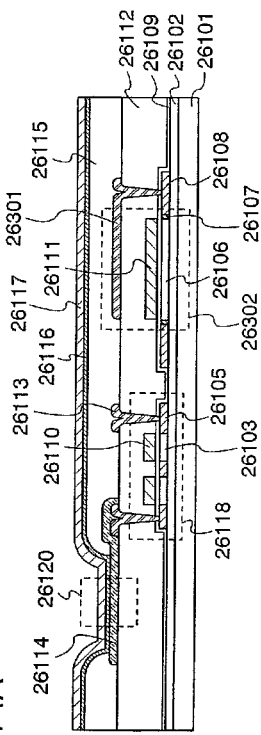

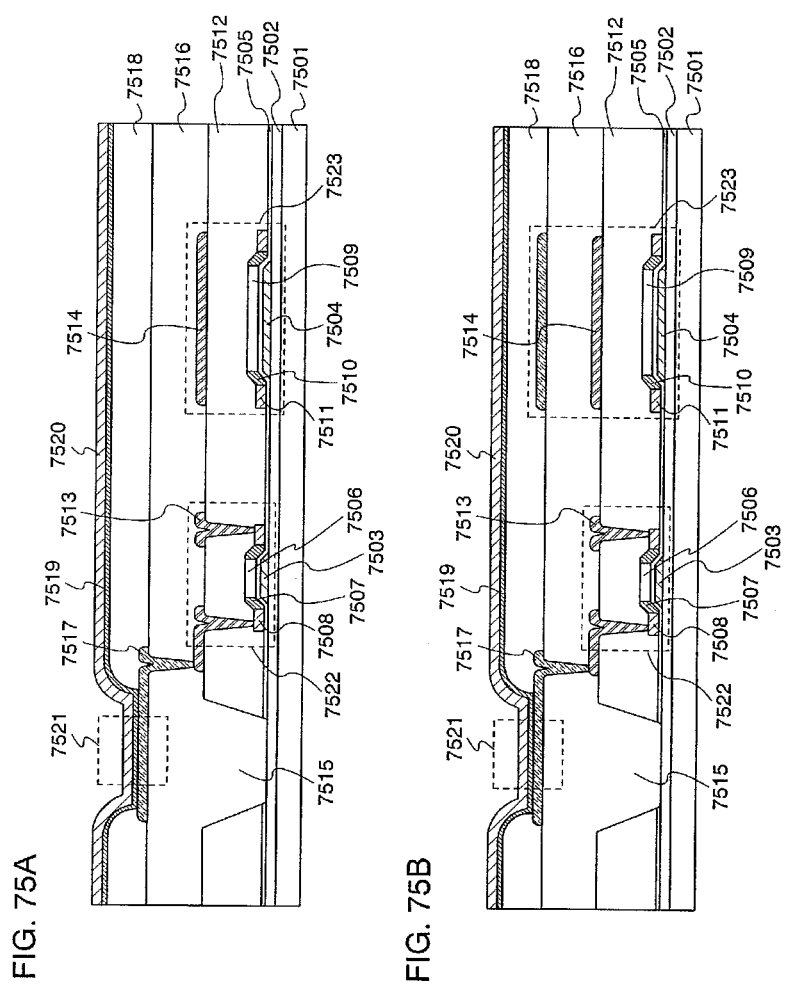

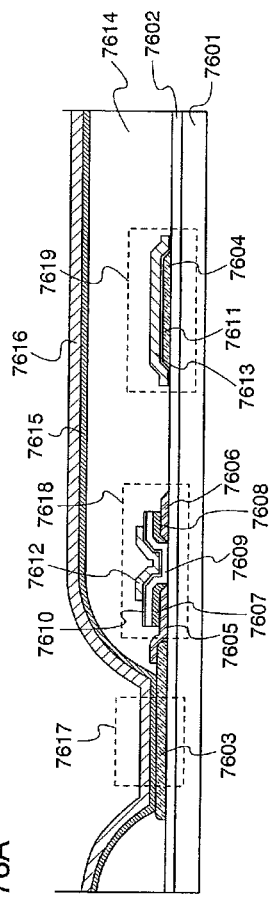
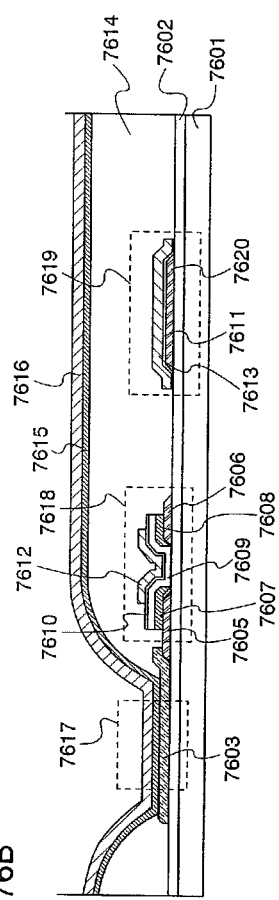
FIG. 76A
FIG. 76B

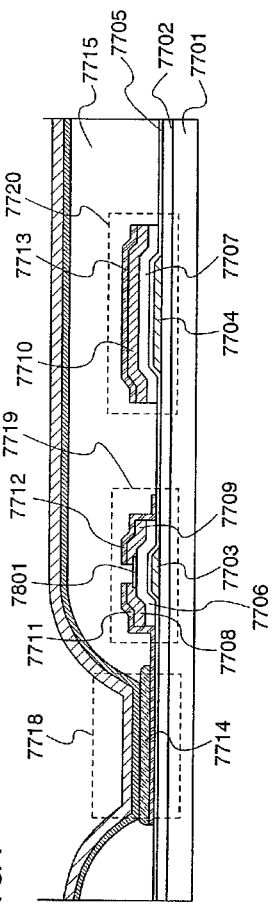
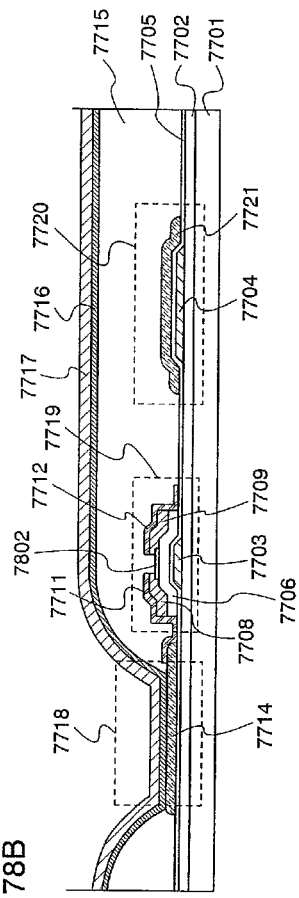
FIG. 78A
FIG. 78B

PRIOR ART

SEMICONDUCTOR DEVICE, DISPLAY DEVICE AND ELECTRONIC DEVICE EQUIPPED WITH THE SEMICONDUCTOR DEVICE

CROSS-REFERENCE TO RELATED APPLICATIONS

This application is a continuation of U.S. application Ser. No. 11/462,815, filed Aug. 7, 2006, now allowed, which claims the benefit of a foreign priority application filed in Japan as Serial No. 2005-234007 on Aug. 12, 2005, both of which are incorporated by reference.

BACKGROUND OF THE INVENTION

1. Field of the Invention

The present invention relates to a semiconductor device having a function to control a current to be supplied to a load by a transistor. In particular, the present invention relates to a display device including a pixel formed of a current driven light-emitting element in which luminance is changed in accordance with a current, and a signal line driver circuit therefor. Further, the present invention relates to a display device and an electronic device having the semiconductor device.

Note that the semiconductor device herein means all devices that can function by utilizing the semiconductor characteristics.

2. Description of the Related Art

In recent years, self-luminous display devices having pixels each formed with a light-emitting element such as a light-emitting diode (LED) have been drawing attention. As a light-emitting element used in such self-luminous display devices, there are an organic light-emitting diode (also referred to as an OLED (Organic Light-Emitting Diode), an organic EL element, an electroluminescence (EL) element, or the like), which have been drawing attention as a light-emitting element used for self-luminous display devices, and are used for an organic EL display or the like.

Since a light-emitting element such as an OLED is a self-luminous type, there are various advantages such that high visibility of pixels is ensured as compared to a liquid crystal display, no back light is required, higher response speed is achieved and the like. In addition, luminance of a light-emitting element is controlled by a current value to flow through there.

As for display devices with the use of such light-emitting elements which emit light by themselves (self-luminous type), there are known a simple matrix driving method and an active matrix driving method as a driving method thereof. The former method provides a simple structure, but has a problem that it is difficult to realize a large and high luminance display device or the like. Recently, an active matrix type has been developed actively, in which a current flowing to a light-emitting element is controlled by a thin film transistor (TFT) provided inside a pixel circuit.

Such an active matrix type display device has a problem that a current flowing to a light-emitting element is changed due to variation or degradation of current characteristics of a driving TFT, which leads to luminance variation.

In other words, the active matrix display device has a problem that a current supplied to a light emitting element varies due to variations in current characteristics of driving TFTs for a current flowing to a light-emitting element, thereby causing luminance variation. In view of this, various circuits are proposed, in which luminance variation is suppressed without changing a current supplied to a light-emitting element even when characteristics of driving TFTs vary between pixel circuits.

Non-patent document 1, patent document 1 and patent document 2 all disclose structures of semiconductor devices in active matrix type display devices. Patent documents 1 and 2 disclose circuit configurations in which current flowing to a light-emitting element is not changed due to variation of characteristics of a driving TFT disposed inside a pixel circuit. This configuration is called a current-writing type pixel or a current-inputting type pixel.

FIG. 92 shows an example of a basic configuration of a circuit diagram which has been disclosed in Patent Document 1 (International Publication No. WO 2004/061812) (refer to FIG. 14 of the patent document 1 and description in the specification regarding that). FIG. 92 shows a circuit including a current source transistor 9201, a shift transistor 9202, a switch 9203, a capacitor element 9204, a switch 9205, a switch 9206, a current source 9207, a load 9208, wires 9209, 9211, 9212 and a switch 9213.

FIG. 93 shows an example of a basic configuration of a circuit diagram which has been disclosed in Patent Document 2 (International Publication No. WO 2004/077671) (refer to FIG. 20 of the patent document 2 and description in the specification regarding that). FIG. 93 shows a circuit including a current source transistor 9301, a shift transistor 9302, a switch 9303, a capacitor element 9304, a switch 9305, switches 9306A, 9306B, current sources 9307A, 9307B, a load 9308, wires 9309, 9311A, 9311B, 9312 and a switch 9313.

FIG. 96 shows an example of a configuration of a circuit diagram disclosed in the non-patent document 1 (T. Shirasaki et al, SID '04 Digest, pp. 1516-1519 (2004)) (refer to FIGS. 2 and 3 of the non-patent document 1 and description regarding that). A circuit diagram shown in FIG. 96 is a diagram in which the circuit diagram shown in the non-patent document 1 is described along with description of patent documents 1 and 2. FIG. 96 shows a circuit including a current source transistor 9601, a switch 9603, a capacitor element 9604, switches 9605, 9606, a current source 9607, a load 9608, and wires 9609, 9611 and 9612.

In the case of circuit configurations shown in Patent Documents 1 and 2, a switch is required between the current source transistor and the load, and thus, there is a problem that a current is difficult to flow into the load. When the switch is not provided, a current flows into the load, and thus, a desired operation cannot be obtained. Further, in the case of the circuit configurations shown in Patent Documents 1 and 2, there is a problem that the number of transistors is large, which leads to decrease of aperture ratio.

A problem of the circuit configuration shown in FIG. 92 is described with reference to FIGS. 94A and 94B. FIG. 94A shows the same circuit configuration as FIG. 92. In FIG. 94A, the switch 9203 is denoted by SW1; the switch 9205, SW2; the switch 9206, SW3; a potential of the wire 9209, Vdd; a potential of the wire 9211, Vss1; a potential of the wire 9212, Vss2; and the switch 9213, SW4 for explanation. The potentials of the wires are set Vdd>Vss2>Vss1.

FIG. 94B shows a change of a potential of each switch and each wire, at a signal writing operation and an input operation in a circuit configuration of FIG. 94A.

At the signal writing operation of FIG. 94B, SW1 turns ON, SW 2 turns ON, SW3 turns ON and SW4 turns OFF. Current supply to the power source 9207 starts and a gate-source voltage (Vgs) which is necessary for the power source transistor 9301 to supply current to the power source 9207, is applied to the capacitor element 9204. At that time, a nodeG has a potential of Vdd, and thus, a potential of a nodeS is increased, since the capacitor element 9204 holds a voltage of Vgs. The potential of the nodeS comes to be in a steady state, and the difference between the nodeG and the nodeS becomes Vgs. In FIG. 94B, $V_{load}$ is applied to a load 9208 between the nodeS and Vss2 at the signal writing operation, and a potential gradient from the nodeS to Vss is generated. Thus, a current flows to the load 9208 at a signal writing operation, thereby causing such a defect that a right signal cannot be supplied to the load.

In the case of a circuit diagram described in the non-patent document 1, a potential of a power supply line for supplying a current to a display element which is a load, is changed one row by one row, thereby preventing current from flowing into the display element at the signal writing operation to the load. This is because a right signal cannot be input into a pixel, when the current is supplied to the display element which is a load at the signal writing operation. As a result, defective display is caused. In addition, when the frequency is F, the capacitance is C and the voltage is V, power consumption P is obtained by the formula (1), generally.

$$P=FCV^2 (F: \text{frequency}, C: \text{capacitance}, V: \text{voltage}) \quad (1)$$

Thus, according to the formula (1), the frequency is preferably small so as to reduce power consumption. In other words, it is not preferable that the potential of the power supply line is changed, which results in increase of power consumption.

In the non-patent document 1, it is necessary that a large current is supplied to the light-emitting element from the power supply line. Thus, it is necessary to dispose a switch which can control a large current, so as to change a potential of the power supply line of each row and to supply a large current. Thus, there is a problem that a size of a transistor for a circuit is needed to be large. If the size of a transistor is large, power consumption of a transistor also becomes large. In a conventional configuration as described in the non-patent document 1, in a transistor for driving a display element at the signal writing operation, Vds=Vgs is obtained, while Vds>Vgs is obtained at the time of light emission. When constant current characteristics (flatness of current) of a transistor in a saturation region becomes worse, current values at the signal writing operation and at the time of light emission become extremely different.

In the invention of the non-patent document 1, currents flowing into a transistor are equal at the signal writing operation and at the time of light emission. Therefore, for example, when a dark image is to be displayed, in the case where a slight amount of current is written into a transistor, there is a problem that a signal is not written sufficiently, because of an influence of noise, parasitic intersection capacitance or wire resistance.

SUMMARY OF THE INVENTION

In view of the problems, it is an object of the present invention to provide a semiconductor device which is hardly influenced by parasitic intersection capacitance or wire resistance, when a slight amount of current is written into a transistor at the signal writing operation. Further, it is another object of the present invention to provide a semiconductor device which can prevent a current from flowing into a display element at the signal writing operation, without increasing power consumption and without changing a potential of a power supply for supplying a current to a load in each row.

An aspect of a semiconductor device of the present invention is a semiconductor device including: a first wire; a second wire; a third wire; a first switch; a second switch; a first transistor wherein a first terminal of the first transistor is electrically connected to the first wire and a gate terminal of the first transistor is electrically connected to the second wire via the first switch; a second transistor wherein a first terminal of the second transistor is electrically connected to a second terminal of the first transistor, a gate terminal of the second transistor is electrically connected to the second wire via the first switch, a second terminal of the second transistor is electrically connected to a load and is electrically connected to the third wire via the second switch; a capacitor element which is electrically connected between the gate terminal of the second transistor and the second terminal of the second transistor; and means for short circuiting between the first terminal of the first transistor and the second terminal of the first transistor.

An aspect of a semiconductor device of the present invention is a semiconductor device including: a first wire; a second wire; a third wire; a first switch; a second switch; a first transistor wherein a first terminal of the first transistor is electrically connected to the first wire and a gate terminal of the first transistor is electrically connected to the second wire via the first switch; a second transistor wherein a first terminal of the second transistor is electrically connected to a second terminal of the first transistor, a gate terminal of the second transistor is electrically connected to the second wire via the first switch, a second terminal of the second transistor is electrically connected to a load and is electrically connected to the third wire via the second switch; a capacitor element which is electrically connected between the gate terminal of the second transistor and the second terminal of the second transistor; a current source electrically connected to the third wire; and means for short circuiting between the first terminal of the first transistor and the second terminal of the first transistor.

An aspect of a semiconductor device of the present invention is a semiconductor device comprising: a first wire; a second wire; a third wire; a fourth wire; a first switch; a second switch; a first transistor wherein a first terminal of the first transistor is electrically connected to the first wire and a gate terminal of the first transistor is electrically connected to the second wire via the first switch; a second transistor wherein a first terminal of the second transistor is electrically connected to a second terminal of the first transistor, a gate terminal of the second transistor is electrically connected to the second wire via the first switch, a second terminal of the second transistor is electrically connected to a load and is electrically connected to the third wire via the second switch; a capacitor element which is electrically connected between the gate terminal of the second transistor and the second terminal of the second transistor; a first current source electrically connected to the third wire and a second current source electrically connected to the fourth wire; and means for short circuiting between the first terminal of the first transistor and the second terminal of the first transistor.

In the present invention, the first and the second switches may each be a transistor.

In the present invention, a potential of the first wire may be higher than a potential of the second wire.

In the present invention, the first transistor and the second transistor may have the same conductivity.

In the present invention, the means for short circuiting may be a switch which is electrically connected to the first and second terminals of the first transistor.

In the present invention, the load may be a display element having a rectifying property.

In the present invention, the load may be an EL element.

A semiconductor device of the present invention may be applied to a display device or an electronic device.

As described above, in accordance with the present invention, when a predetermined current is supplied to a transistor to set a gate-source voltage of the transistor, a potential of a gate terminal of the transistor is adjusted so as to prevent a current from flowing into a load which is connected to a source terminal of the transistor. Thus, a potential of a wire connected to the gate terminal of the transistor is made different from that of a wire connected to a drain terminal of the transistor.

Moreover, in accordance with the present invention, in two transistors which are connected in series, at a set operation (or at a signal writing operation), one of the two transistors is set to have a low source-drain voltage so as to conduct a set operation on the other transistor. At an output operation, the two transistors serve as a multigate transistor, and a current value at the output operation is made small. In other words, the current at the set operation can be made large. Accordingly, influences by intersection capacitance parasitic to a wire or the like or a wire resistance are hardly caused, and the set operation is conducted quickly.

In sum, influences by intersection capacitance parasitic to a wire or the like or a wire resistance are hardly caused, and the set operation is conducted quickly, and a potential of a gate terminal of a transistor is made lower or higher than a drain terminal of the transistor so as to adjust a potential of a source terminal of the transistor, thereby preventing current from flowing to a load.

A switch used in the present invention may be any switch such as an electrical switch or a mechanical switch. That is, various types of switches can be used as long as they can control a current, without being limited to a particular type. It may be a transistor, a diode (PN diode, PIN diode, Schottky diode, diode-connected transistor, and the like), or a logic circuit configured by combining them. Therefore, in the case of applying a transistor as a switch, polarity (conductivity) of the transistor is not particularly limited because it operates just as a switch. However, when an off current is preferred to be small, a transistor of polarity with a small off current is favorably used. For example, there is given a transistor having an LDD region, a transistor having a multigate structure and the like as a transistor with a small off current. Further, it is desirable that an N-channel transistor is employed when a potential of a source terminal of the transistor serving as a switch is closer to the low potential side power source (Vss, GND, 0 V and the like), and a P-channel transistor is desirably employed when the potential of the source terminal is closer to the high potential side power source (Vdd and the like). This helps a transistor to easily serve as a switch as the absolute value of the gate-source voltage can be increased. It is also to be noted that a CMOS switch can also be applied by using both N-channel and P-channel transistors. With a CMOS switch, an operation can be appropriately performed even when the situation changes such that a voltage output through the switch (that is, an input voltage to the switch) is higher or lower than an output voltage.

In the present invention, "being connected" means "being electrically connected" and "being directly connected". Therefore, in the configuration disclosed in the present invention, another element which enables an electrical connection (for example, a switch, a transistor, a capacitor element, an inductor, a resistor element, a diode, and the like) may be provided in addition to the predetermined connection. Alternatively, direct connection may be made without interposing another element. It is to be noted that when elements are connected without interposing another element which enables electrical connection and connected not electrically but directly, it is referred to as "being directly connected" or "being in direct connection". It is to be noted when the description is made as "being electrically connected", it includes a case where elements are electrically connected and a case where elements are directly connected.

It is to be noted that a display element can employ various modes. For example, a display medium which changes contrast by an electromagnetic effect can be used, such as an EL element (organic EL element, inorganic EL element, or EL element containing organic material and inorganic material), an electron discharging element, a liquid crystal element, an electron ink, a light diffraction element, a discharging element, a digital micromirror device (DMD), a piezoelectric element, and a carbon nanotube. It is to be noted that an EL panel type display device using an EL element includes an EL display, a display device using an electron discharging element includes a field emission display (FED), an SED type flat panel display (Surface-conduction Electron-emitter Display), and the like; a liquid crystal panel type display device includes a liquid crystal display; a digital paper type display device using an electron ink includes electronic paper; a display device using a light diffraction element includes a grating light valve (GLV) type display; a PDP (Plasma Display Panel) type display using a discharging element includes a plasma display; a DMD panel type display device using a micro mirror element includes a digital light processing (DLP) type display device; a display device using a piezoelectric element includes a piezoelectric ceramic display; a display device using a carbon nanotube includes a nano emissive display (NED), and the like.

It is to be noted that transistors of various modes can be applied as a transistor of the present invention. Therefore, kinds of transistors applicable to the present invention are not limited. Accordingly, a thin film transistor (TFT) using an amorphous semiconductor film typified by amorphous silicon and polycrystalline silicon, a MOS transistor formed using a semiconductor substrate or an SOI substrate, a junction transistor or a bipolar transistor, a transistor using a compound semiconductor such as ZnO or a-InGaZnO, a transistor using an organic semiconductor or a carbon nanotube, and other transistors can be used. It is to be noted that an amorphous semiconductor film may contain hydrogen or halogen. A substrate over which a transistor is provided is not limited to a particular type and various kinds of substrates can be used. Therefore, a transistor can be provided over, for example, a single crystalline substrate, an SOI substrate, a glass substrate, a quartz substrate, a plastic substrate, a paper substrate, a cellophane substrate, a stone material substrate, a stainless steel substrate, a substrate including a stainless steel foil and the like. Further, a transistor formed using a certain substrate may be transferred to another substrate.

It is to be noted that a transistor can have structures with various modes and is not limited to a specific structure. For example, a multigate structure which has two or more gate lines may be employed as well. With a multigate structure, an off current can be reduced and reliability can be improved by improving the pressure resistance of a transistor, and further flat characteristics can be obtained such that a drain-source current hardly changes even when a drain-source voltage changes in the operation in a saturation region. Further, gate electrodes may be provided over and under a channel. Accordingly, a channel region increases with such a structure in which gate electrodes are provided over and under a channel, thereby an S value (sub-threshold coefficient) can be improved since a current value is easily increased and a depletion layer is easily formed. Further, a gate electrode may be provided over a channel or under the channel. A forward staggered structure or an inversely staggered structure may be employed. A channel region may be divided into a plurality of regions, connected in parallel, or connected in series. Further, a source electrode or a drain electrode may overlap a channel (or a part of it). Alternatively, charges are accumulated in a part of the channel and an unstable operation can be prevented by employing such a structure in which a source electrode or a drain electrode does not overlap a channel (or a part of it). Further, an LDD region may be provided. By providing an LDD region, an off current can be reduced and reliability can be improved by improving the pressure resistance of a transistor, and further flat characteristics can be obtained such that a drain-source current hardly changes even when a drain-source voltage changes in the operation in a saturation region.

It is to be noted that various types of transistors can be used as a transistor of the present invention and formed over various substrates. Therefore, all of the circuits may be formed over a glass substrate, a plastic substrate, a single crystal substrate, an SOI substrate, or any other substrates. When all the circuits are formed over a substrate, cost can be reduced by reducing the number of components and reliability can be improved by reducing the number of connections with the components. Alternatively, a part of a circuit may be formed over a certain substrate and another part of the circuit may be formed over another substrate. That is, not all of the circuits are required to be formed over the same substrate. For example, some of circuits may be formed over a glass substrate using transistors and some of the circuits may be formed over a single crystal substrate to obtain IC chips. The IC chips may be provided over the glass substrate by COG (Chip On Glass). Alternatively, the IC chip may be connected to a glass substrate using TAB (Tape Automated Bonding) or a printed substrate. In this manner, when some of circuits are formed over the same substrate, cost can be reduced by reducing the number of components and reliability can be improved by reducing the number of connections with the components. Further, a portion with a high driving voltage or a high driving frequency which consumes more power is not preferably formed over the same substrate, thereby an increase in power consumption can be prevented.

It is to be noted in the present invention that one pixel corresponds to one element which can control brightness. Therefore, for example, one pixel expresses one color element by which brightness is expressed. Accordingly, in a case of a color display device formed of color elements of R (red), G (green), and B (blue), the smallest unit of an image is formed of three pixels of an R pixel, a G pixel, and a B pixel. It is to be noted that a color element is not limited to be formed of three colors and may be more colors such as RGBW (W is white) or yellow, cyan and magenta in addition to RGB. Further, as another example, when controlling the brightness of one color element by using a plurality of regions, one of the plurality of regions corresponds to one pixel. Therefore, for example, in a case of performing area gray scale display, a plurality of regions are provided for one color element to control the brightness, which express a gray scale as a whole. One of the regions to control the brightness corresponds to one pixel. Therefore, in that case, one color element is formed of a plurality of pixels. Moreover, in that case, regions which contribute to display differ in size depending on the pixel. In the plurality of regions to control the brightness provided for one color element, that is, a plurality of pixels which form one color element, a viewing angle may be expanded by supplying each pixel with a slightly different signal.

In the present invention, there is a case where pixels may be arranged in matrix. The case where pixels are arranged in matrix corresponds not only to a case where pixels are arranged in a grid configuration where longitudinal stripes and lateral stripes cross each other, but also to a case where dots of three color elements are arranged in what is called a delta configuration when a full color display is performed using the three color elements (for example, RGB). Further, a Bayer arrangement is also included. It is to be noted that a color element is not limited to three colors and may have more colors. The size of a light emission area may be different depending on each dot of the color element.

A transistor is an element with at least three terminals, having a gate, a drain, and a source. A channel region is provided between the drain region and the source region. Here, it is difficult to determine which of two terminals is a source or a drain since they depend on the structure, operating condition, and the like of the transistor. Therefore, in the present invention, there is a case where a region which functions as a source or a drain is not referred to a source or a drain. In that case, as one example, the source or the drain is referred to as a first terminal or a second terminal.

It is to be noted that a gate includes a gate electrode and a gate wire (also referred to as a gate line, a gate signal line, or the like) or a part of them. A gate electrode corresponds to a conductive film of a part overlapping a semiconductor forming a channel region or an LDD (Lightly Doped Drain) region and the like with a gate insulating film interposed therebetween. The gate wire corresponds to a wire for connecting gate electrodes of pixels to each other and a wire for connecting a gate electrode and another wire.

However, there is a part which functions as a gate electrode and also as a gate wire. Such a region may be referred to as a gate electrode or a gate wire. That is, there is a region which cannot be distinguished as a gate electrode or a gate wire. For example, when there is a channel region overlapping a gate wire which is extended, the region functions as a gate wire and also as a gate electrode. Therefore, such a region may be referred to as a gate electrode or a gate wire.

Further, a region which is formed of the same material as a gate electrode and connected to a gate electrode may be referred to as a gate electrode as well. Similarly, a region which is formed of the same material as a gate wire and connected to a gate wire may be referred to as a gate wire. In a strict sense, such a region does not overlap a channel region or does not have a function to connect to another gate electrode in some cases. However, there is a region which is formed of the same material as a gate electrode or a gate wire and connected to a gate electrode or a gate wire due to a manufacturing margin and the like. Therefore, such a region may also be referred to as a gate electrode or a gate wire.

For example, in a multigate transistor, gate electrodes of one transistor and another transistor are often connected through a conductive film formed of the same material as the gate electrode. Such a region for connecting the gate electrodes may be referred to as a gate wire, or a gate electrode when a multigate transistor is considered as one transistor. That is, a component which is formed of the same material as a gate electrode or a gate wire and connected to the gate electrode or the gate wire may be referred to as a gate electrode or a gate wire. Moreover, for example, a conductive film of a portion which connects a gate electrode and a gate wire may also be referred to as a gate electrode or a gate wire.

It is to be noted that a gate terminal corresponds to a part of a region of a gate electrode or a region electrically connected to the gate electrode.

It is to be noted that a source includes a source region, a source electrode, and a source wire (also referred to as source line, source signal line, or the like), or a part of them. A source region corresponds to a semiconductor region which contains a large amount of P-type impurities (boron, gallium, or the like) or N-type impurities (phosphorus, arsenic, or the like). Therefore, a region containing a small amount of P-type impurities or N-type impurities, that is, an LDD (Lightly Doped Drain) region is not included in a source region. A source electrode corresponds to a conductive layer of a part which is formed of a different material from a source region and electrically connected to the source region. However, a source electrode is sometimes referred to as a source electrode including a source region. A source wire corresponds to a wire for connecting source electrodes of pixels to each other and a wire for connecting a source electrode and another wire.

However, there is a region which functions as a source electrode and also as a source wire. Such a region may be referred to as a source electrode or a source wire. That is, there is a region which cannot be distinguished as a source electrode or a source wire. For example, when there is a source region overlapping a source wire which is extended, the region functions as a source wire and also as a source electrode. Therefore, such a region may be referred to as a source electrode or a source wire.

Further, a region which is formed of the same material as a source electrode and connected to a source electrode may be referred to as a source electrode as well. A part which connects one source electrode and another source electrode may also be referred to as a source electrode as well. Further, a part overlapping a source region may be referred to as a source electrode. Similarly, a part which is formed of the same material as a source wire and connected to the source wire may be referred to as a source wire. In a strict sense, there is a case where such a part does not have a function to connect one source electrode to another source electrode. However, there is a region which is formed of the same material as a source electrode or a source wire and connected to the source electrode or the source wire due to a manufacturing margin and the like. Therefore, the region may also be referred to as a source electrode or a source wire.

For example, a conductive film of a portion which connects a source electrode and a source wire may be referred to as a source electrode or a source wire.

It is to be noted that a source terminal corresponds to a part of a source region, a source electrode, or a region electrically connected to a source electrode.

It is to be noted that a drain is similar to as a source.

In addition, in the present invention, a semiconductor device corresponds to a device including a circuit having a semiconductor element (transistor, diode, or the like). Further, a semiconductor device may be a general device which functions by utilizing semiconductor characteristics. A display device corresponds to a device including a display element (liquid crystal element, light-emitting element, or the like). It is to be noted that a display device may be a display panel itself in which a plurality of pixels including display elements such as a liquid crystal element or an EL element or a peripheral driver circuit for driving the pixels are formed over a substrate. Moreover, a display device may include the one provided with a flexible printed circuit (FPC) or a printed wire board (PWB) (IC, a resistor element, a capacitor element, an inductor, a transistor or the like). It may include an optical sheet such as a polarizing plate or a phase plate. Moreover, it may include a backlight (such as a light guide plate, a prism sheet, a diffusion sheet, a reflecting sheet or a light source (e.g., LED or a cold-cathode tube). Further, a light emitting device corresponds to a display device including a self-luminous light-emitting element such as an EL element and an element used for an FED in particular. A liquid crystal display device corresponds to a display device including a liquid crystal element.

In the present invention, an expression that an object is "formed on" or "formed over" a different object does not necessarily mean that the object is in direct contact with a different object. The expression may include a case where two objects are not in direct contact with each other, i.e., with another object sandwiched therebetween. Accordingly, when it is described that a layer B is formed on a layer A (over a layer A), it means either case where the layer B is formed on and in direct contact with the layer A, or where another layer (e.g., a layer C or a layer D) is formed on and in direct contact with the layer A, and then the layer B is formed on and in direct contact with the layer C or D. In addition, when it is described that an object is "formed above" a different object, it does not necessarily mean that the object is in direct contact with the different object, and another object may be sandwiched therebetween. Accordingly, for example, when it is described that a layer B is formed over or above a layer A, it means either case where the layer B is formed in direct contact with the layer A, or where another layer (e.g., a layer C or a layer D) is formed in direct contact with the layer A, and then the layer B is formed in direct contact with the layer C or D. Similarly, when it is described that an object is formed below or under a different object, it means either case where the objects are in direct contact with each other or not in contact with each other.

The present invention can provide a semiconductor device which can prevent a current from flowing into a display element at a signal writing operation, without changing a potential of a power supply line for supplying a current to a load in each row. Therefore, a semiconductor device can be provided, in which lower power consumption is achieved than a conventional semiconductor device.

Moreover, the present invention provides a semiconductor device which has a high aperture ratio without disposing a switch between a load and a current supply transistor, and which can prevent a current from flowing into a display element at a signal writing operation. Therefore, a semiconductor device which is more miniaturized than a conventional semiconductor device can be provided.

Further, in accordance with the present invention, influences are hardly caused by intersection capacitance parasitic to a wire or the like or a wire resistance; thus, a set operation is conducted quickly and a current at an output operation can be made large. The present invention can provide a semiconductor device which is hardly influenced by a slight amount of current caused by noise or the like, and which can input a right signal to a pixel, and which can prevent a current from flowing into a display element at a signal writing operation, when e.g., a dark gray scale is displayed. Accordingly, the present invention can provide a semiconductor device which realizes miniaturization and low power consumption, and which can operate well.

In accordance with the present invention, at a signal writing operation and an output operation, a transistor serving as a current source is shifted by a switch, so that a current flowing at the signal writing operation can be made larger than a current flowing into a load or the like at the output operation. Accordingly, since a current flowing at the signal writing operation can be made larger, a steady state can be made quickly.

Furthermore, the present invention can provide a display device which is equipped with the above described semiconductor device, which can realize low power consumption and miniaturization and which can operate well, and can also provide an electronic device equipped with the display device.

BRIEF DESCRIPTION OF DRAWINGS

In the accompanying drawings:

FIGS. 67A and 67B are views showing a display panel according to an aspect of the present invention;

FIGS. 69A and 69B are views showing a display panel according to an aspect of the present invention;

FIGS. 71A to 71C are views showing a display panel according to an aspect of the present invention;

FIGS. 74A and 74B are views showing a display panel according to an aspect of the present invention;

FIGS. 75A and 75B are views showing a display panel according to an aspect of the present invention;

FIGS. 76A and 76B are views showing a display panel according to an aspect of the present invention;

FIGS. 78A and 78B are views showing a display panel according to an aspect of the present invention;

DETAILED DESCRIPTION OF THE INVENTION

Figure 1:
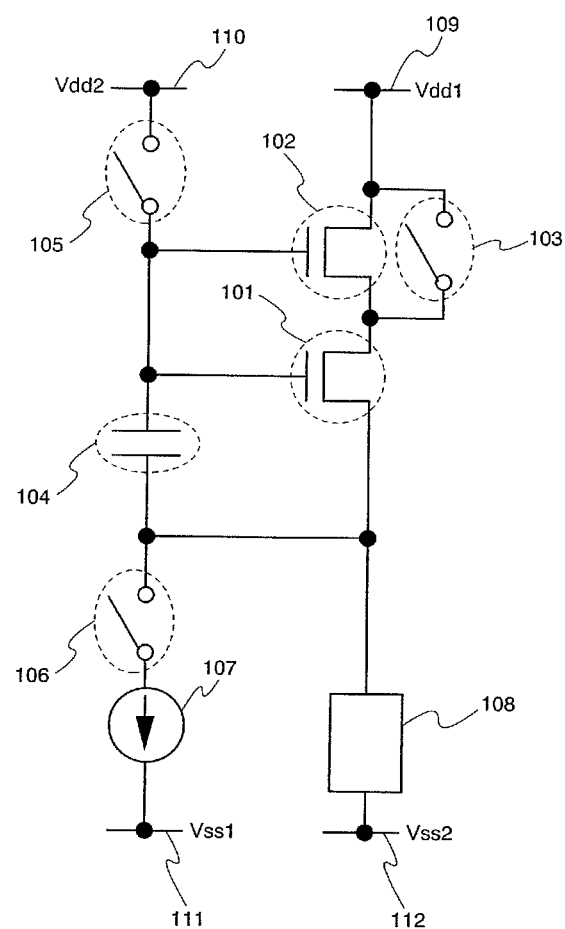
FIG. 1 is a circuit diagram showing an example of a circuit according to an aspect of the present invention.

Hereinafter, the embodiment modes will be described with reference to the drawings. It is to be noted that the present invention is not limited to the following description, and it is easily understood by those skilled in the art that modes and details herein disclosed can be modified in various ways without departing from the spirit and the scope of the present invention. Therefore, the present invention should not be interpreted as being limited to the description of the embodiment modes to be given below. It is to be noted that the same portions or portions having the same function are denoted by the same reference numerals in the drawings and description thereof is not repeated.

Embodiment Mode 1

The present invention can be applied to not only a pixel including an EL element but also various analog circuits including a current source. First, in this embodiment mode, description is made of a basic principle of the present invention.

FIG. 1 shows a configuration based on the basic principle of the present invention. There are provided a transistor 101 which always serves as a current source (or a part of a current source) (hereinafter, also referred to as a first transistor or a current source transistor) and a transistor 102 which operates differently depending on a state (hereinafter also referred to as a second transistor or a shift transistor). The current source transistor 101, the shift transistor 102 and a wire 109 are connected in series. A gate of the current source transistor 101 is connected to one terminal of a capacitor element 104. The other terminal of the capacitor element 104 is connected to a source terminal of the current source transistor 101. Thus, a gate potential of the current source transistor 101, i.e., a gate-source voltage (Vgs) can be held. The gate of the current source transistor 101 is connected to a wire 110 via a switch 105, and electric charge supply to the capacitor element 104 can be controlled by ON/OFF of the switch 105. The source of the current source transistor 101 is connected to a wire 111 via a current source 107 and a switch 106. In parallel with them, the source of the current source transistor 101 is connected to a wire 112 via a load 108.

The capacitor element 104 is connected between the gate terminal and the first terminal of the current source transistor 101. In other words, the first electrode of the capacitor element 104 is connected to the gate terminal of the current source transistor 101, and the second electrode of the capacitor element 104 is connected to the first terminal of the current source transistor 101. In addition, the capacitor element 104 may be structured such that an insulating film is interposed by a wire, an active layer, an electrode or the like, or may be omitted, if a gate capacitor of the current source transistor 101 is used.

It is to be noted that as described above, two electrodes included in one transistor, which each serve a drain or a source, are determined to serve a drain or a source depending on a difference of potentials caused between the two electrodes. Accordingly, when a potential relation generated between the two electrodes by driving (a potential of which electrode is higher or lower) is changed at the time of driving, one of the two electrodes is called a first terminal and the other thereof is called a second terminal.

Note that the load 108 has a rectifying property. In other words, the load has current-voltage characteristics showing different resistance values based on the direction of an applied bias, and has an electric property which allows a current to flow only in one direction. In this embodiment mode, the load 108 is provided so as to allow a current to flow from the current source transistor 101 to the wire 112.

It is to be noted that the term "to be connected" means an electrical connection, if not otherwise specified.

A shift means is connected to the shift transistor 102. The shift means can function as a current source or function to allow almost no current to flow between a source and a drain (or function as a switch), depending on a state. Here, a case where the shift transistor 102 serves as a current source (or a part thereof) is referred to as a current source operation. Further, a case where the shift transistor 102 operates so as to allow almost no currents to flow between a source and a drain (or function as a switch), or a case where it operates when a source-drain voltage is low, is referred to as a short circuit operation.

The current source 107 connected to the wire 111 sets a current Ib. Here, a potential input to the wire 109 is denoted by Vdd1, a potential input to the wire 110 is denoted by Vdd2, a potential input into the wire 111 is denoted by Vss1, and a potential input into the wire 112 is denoted by Vss2. At that time, the relation of potentials satisfies Vdd1>Vdd2>Vss1, and Vdd1>Vss2>Vss1. However, it is not limited to this. For example, it may satisfy Vss1>Vss2.

The relation between Vdd2, the potential input to the wire 110 and Vss2, the potential input to the wire 112, may be the same or different. In a case where Vdd2 is a different potential from Vss2, Vdd2 may be set higher than Vss2 by a threshold voltage of the current source transistor, by a threshold voltage when applied to the load, or by a sum of the threshold voltage of the current source transistor and the threshold voltage when applied to the load.

In this manner, various configurations can be employed for the shift transistor 102 so as to realize shifting between the current source operation and the short circuit operation.

In FIG. 1, the source terminal and the drain terminal of the shift transistor 102 can be connected via the switch 103. The gate terminal of the shift transistor 102 is connected to the gate terminal of the current source transistor 101. The operation of the shift transistor 102 can be shifted between the current source operation and the short circuit operation by using the switch 103.

Figure 2:
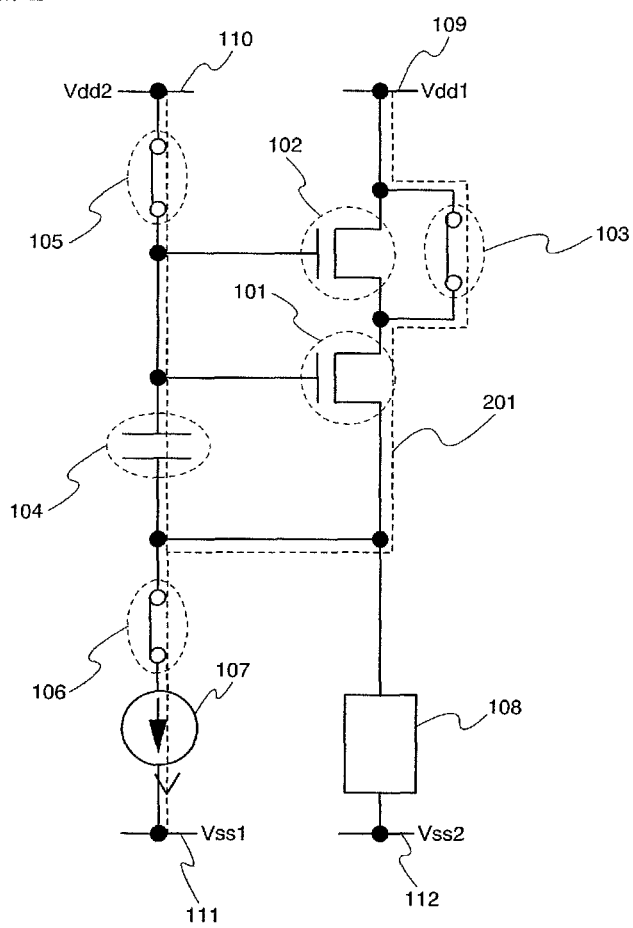
FIG. 2 is a circuit diagram showing an example of a circuit according to an aspect of the present invention.

An operation of FIG. 1 is described. As shown in FIG. 2, the switches 103, 105 and 106 are turned ON first. A current path at that time is schematically shown by a broken line with an arrow 201. In this case, the source and the drain of the shift transistor 102 have almost equal potential. In other words, almost no current flows between the source and the drain of the shift transistor 102, and the current flows toward the switch 103. The current Ib flowing to the current source 107 flows to the capacitor element 104 or the current source transistor 101. When the current flowing between the source and the drain of the current source transistor 101 becomes equal to the current Ib flowing to the current source 107, the current does not flow to the capacitor element 104. That is to say, it becomes a steady state. A gate potential of the current source transistor 101 at that time is accumulated in the capacitor element 104. In other words, a voltage required for allowing the current Ib to flow between the source and the drain of the current source transistor 101 is applied to the gate of the current source transistor 101. The above-described operation corresponds to a signal writing operation. At the signal writing operation, the shift transistor 102 conducts the short circuit operation.

In this manner, when no current flows to the capacitor element 104 and the steady state is obtained, it can be considered that the signal writing operation is finished.

Note that almost no current flows to the load 108 because of a source potential of the current source transistor 101, a potential Vss2 of the wire 112 and current-voltage characteristics of the load 108. The source potential of the current source transistor 101 can be controlled by a gate potential of the current source transistor 101, i.e., the potential Vdd2 of the wire 110. Thus, it is possible that the potential Vdd2 of the wire 110 is controlled to stop current supply to the load 108.

Figure 3:
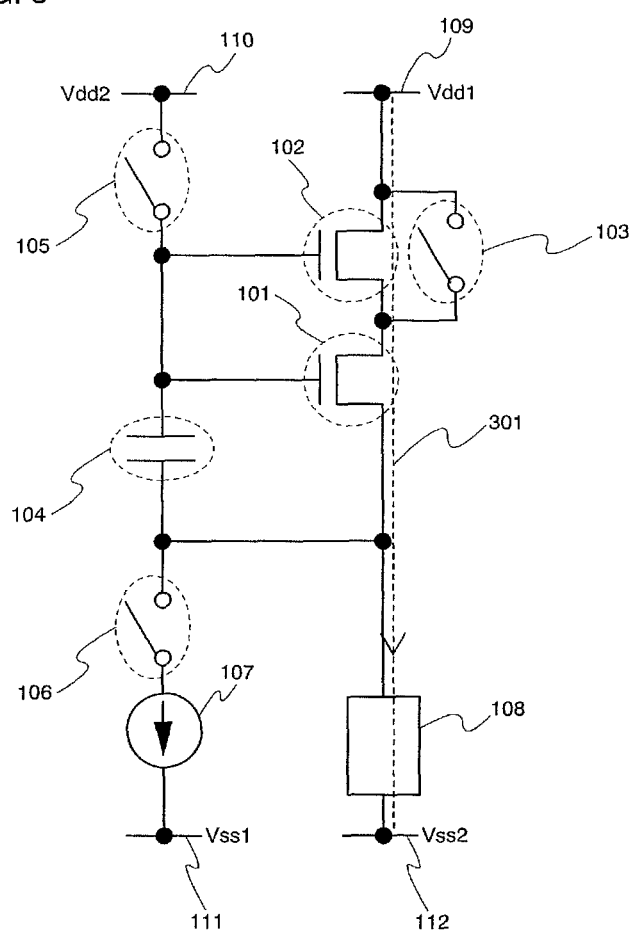
FIG. 3 is a circuit diagram showing an example of a circuit according to an aspect of the present invention.

Next, as shown in FIG. 3, the switches 103, 105 and 106 are turned OFF. A current path at that time is schematically shown by a broken line with an arrow 301. In FIG. 3, since the switch 103 is OFF, a current flows between the source and the drain of the shift transistor 102. On the other hand, the charges accumulated at the signal writing operation are held in the capacitor element 104, and the electric charges are applied to the gates of the current source transistor 101 and the shift transistor 102. The gates of the current source transistor 101 and the shift transistor 102 are connected to each other. As described above, the current source transistor 101 and the shift transistor 102 serve together as a multigate transistor. Therefore, when the current source transistor 101 and the shift transistor 102 are regarded as one transistor, a gate length L of the transistor is longer than a gate length L of the current source transistor 101. In general, when the gate length L of a transistor becomes longer, current flowing therein becomes small. Therefore, the current flowing to the load 108 becomes smaller than Ib. The above operation corresponds to an output operation. At the time of the output operation, the shift transistor 102 conducts the current source operation.

In this way, ON/OFF of the switch 103 is controlled, thereby making the current Ib flowing at the signal writing operation larger than the current flowing to the load 108 or the like at the output operation. Therefore, since the current flowing at the signal writing operation can be made larger, a steady state can be obtained quickly. In other words, an influence of a load (such as intersection capacitance, or a wire resistance) that is parasitic on a wire through which current goes, can be reduced, and the signal writing operation can be conducted quickly.

In addition, since the current Ib flowing at the signal writing operation is large, an influence of noise or the like can be reduced. In other words, even if a slight amount of current flows due to noise or the like in some degree, there is almost no influence of noises or the like, since the value of Ib is large.

Accordingly, for example, when the load 108 is an EL element, a signal can be written with a current Ib larger than a current flowing to the EL element, at a signal writing operation for making the EL element emit light with low gray scale.

Thus, a trouble such that a signal current becomes a noise is prevented, and a quick writing operation is possible.

Potentials of the gate and the source of the current source transistor 101 in response to ON/OFF of each switch of the analog circuit shown in FIG. 1 are described with reference to FIGS. 95A and 95B. FIG. 95A shows the same circuit diagram as FIG. 1. In FIG. 95A, the switch 103 is denoted by SW1; the switch 105, SW2; the switch 106, SW3; a potential of the wire 109, Vdd1, a potential of the wire 110, Vdd2; a potential of the wire 111 Vss1; and a potential of the wire 112, Vss2 for explanation.

Figure 95B:
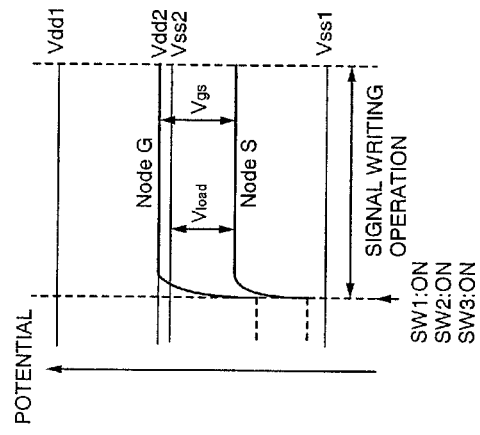
FIGS. 95A and 95B are circuit diagrams showing a circuit according to an aspect of the present invention.
Figure 95A:
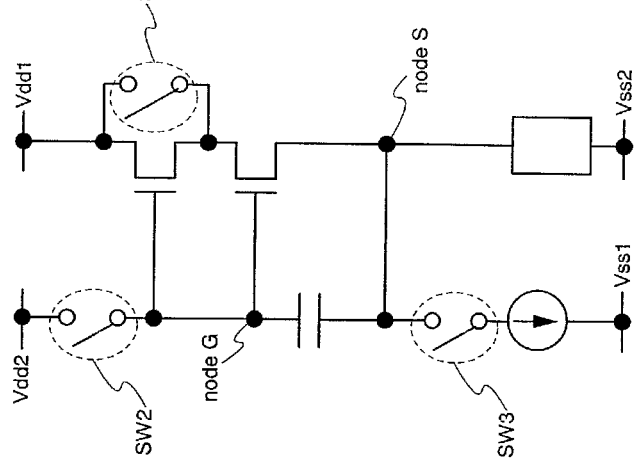
Figure 96:
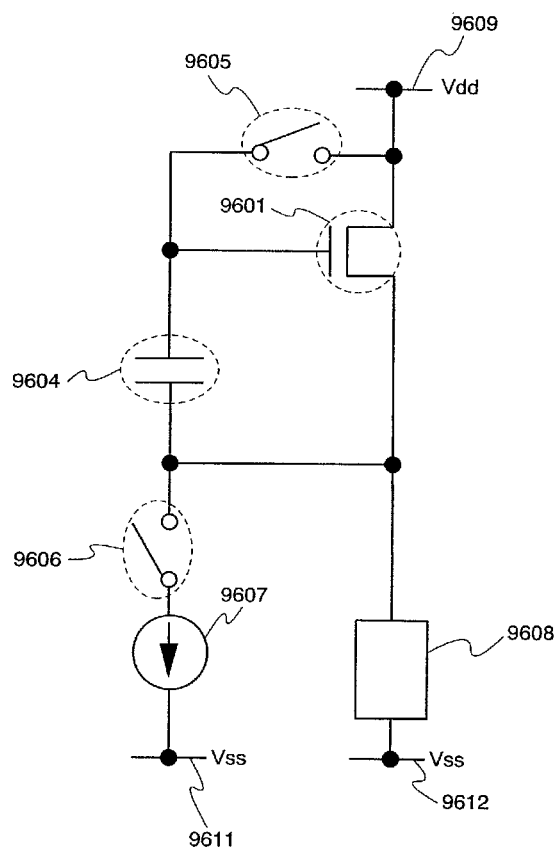
FIG. 96 is a circuit diagram showing a conventional circuit.

In FIG. 95B, potential changes of each switch and each wire at the signal writing operation and the output operation in the circuit configuration of FIG. 95A are described. Here, a potential input to the wire 109 is denoted by Vdd1; a potential input to the wire 110, Vdd2; a potential input to the wire 111, Vss1; and a potential input to the wire 112, Vss2. A relation of potentials satisfies Vdd1>Vdd2>Vss1, and Vdd1>Vss2>Vss1. The potential Vdd2 is set higher than the potential Vss2 by a threshold voltage of the current source transistor and by a threshold voltage when a voltage is applied to the load.

At the signal writing operation of FIG. 95B, SW1 is turned ON, SW2 is turned ON, and SW3 is turned ON. Current supply to the current source 107 begins, and a gate-source voltage (Vgs) which is necessary for the current source transistor 101 to allow a current to flow to the current source 107, is applied to the capacitor element 104. At that time, a nodeG has a potential of Vdd2, and since the capacitor element 104 holds a voltage of Vgs, a potential of nodeS is increased. Then, a steady state is obtained; thus, a difference between nodeG and nodeS becomes Vgs. At that time, in FIG. 95(B), a voltage $V_{load}$ is applied to the load 108 between a potential of the nodeS and Vss2 at the signal writing operation, and a potential gradient is generated from Vss2 to the nodeS. Thus, a defect such that a current flows to the load 108 at the signal writing operation, and a right signal cannot be supplied to the load, is not caused. This is caused by voltage-current characteristics of the load 108, and because it has a rectifying property. Thus, an operation can be conducted without providing a switch between the current source transistor 101 and the load 108. In addition, Vdd1, a potential of the power source line is not needed to be changed, which can contribute to low power consumption.

Note that any element can be used for the load 108, as long as it has a rectifying property. An element such as a resistor, a transistor, an EL element, a current source circuit constituted by a transistor, a capacitor and a switch may be used. A signal line or a signal line and a pixel connected thereto may be used. The pixel may include any type of display element such as an EL element or an element used for an FED.

A gate capacitor of the current source transistor 101 or the shift transistor 102 may be substituted for the capacitor element 104. In this case, the capacitor element 104 can be omitted.

High potential side power sources Vdd1 and Vdd2 are supplied to the wires 109 and 110, respectively; however, it is not necessary that the same potentials are always kept. There is no problem, when operation is done normally even when potentials are different at the signal writing operation and the output operation.

Low potential side power sources Vss1 and Vss2 are supplied to the wires 111 and 112, respectively; however, it is not necessary that the same potentials are always kept. For example, there is no problem, when operation is done normally even when potentials are different at the signal writing operation and the output operation.

Alternatively, a potential Vdd2 to be supplied to the wire 110 may be changed at each signal writing operation. In particular, when a current flowing to the current source transistor 101 at the signal writing operation is large, a potential Vdd2 to be supplied to the wire 110 is increased, thereby performing an operation normally without not dropping too much a potential Vss1 to be supplied to the wire 111 connected to the current source 107, which is preferable. Thus, even when a current flowing to the current source transistor 101 in advance at a signal writing operation is large, the potential Vdd2 to be supplied to the wire 110 is increased and thereby, it is not necessary to drop the potential Vss1 to be supplied to the wire 111 which is connected to the current source transistor 107. Thus, even when the current flowing to the current source transistor 101 is large, a margin can be given for setting the potential Vss1. Note that the potential Vdd2 to be supplied to the wire 110 may be changed in response to an amount of current flowing to the current source transistor 101 at the signal writing operation. For example, when the amount of current flowing to the current source transistor 101 at the signal writing operation is large, the potential Vdd2 to be supplied to the wire 110 is made high, and a margin of the potential Vss1 to be supplied to the wire 111 is secured. On the other hand, when the amount of current flowing to the current source transistor 101 at the signal writing operation is small, the potential Vdd2 to be supplied to the wire 110 is made low, thereby preventing a current fro, flowing to the wire 112 side, i.e., toward the load 108 at the signal writing operation.

The capacitor element 104 is connected to the gate terminal of the current source transistor 101 and the wire 111; however, the present is not limited to this. Most preferably, the capacitor element 104 is connected to the gate terminal and the source terminal of the current source transistor 101. This is because the operation of a transistor is not easily influenced by other causes as long as a voltage is maintained between the gate terminal and the source terminal since the operation of the transistor is determined by a gate-source voltage. Provided that the capacitor element 104 is disposed between the gate terminal of the current source transistor 101 and another wire, there is possibility that a potential of the gate terminal of the current source transistor 101 may change depending on the value of voltage drop of another wire.

Note that the current source transistor 101 and the shift transistor 102 operate as a multigate transistor at the output operation; therefore, these transistors preferably have the same polarity (have the same conductivity).

Note that the current source transistor 101 and the shift transistor 102 operate as a multigate transistor at the output operation; however, a gate width W of each transistor may be either the same or different. Similarly, a gate length L may be either the same or different. However, the gate width W is preferably the same since the gate width W can be considered to be the same as a normal multigate transistor. As the gate length L of the shift transistor 102 becomes longer, a current flowing to the load 108 becomes smaller. Therefore, appropriate design may be carried out according to the circumstance.

Such switches as the switches 103, 105, and 106 may be any switch such as an electrical switch or a mechanical switch. It may be anything as long as it can control a flow of a current. It may be a transistor, a diode, or a logic circuit configured with them. Therefore, in the case of using a transistor as a switch, a polarity (conductivity) thereof is not particularly limited because it operates just as a switch. However, when an off current is preferred to be small, a transistor of polarity with a small off current is favorably used. For example, there is given a transistor having an LDD region, a transistor having a multigate structure and the like as a transistor with a small off current Further, it is desirable that an N-channel transistor is employed when a potential of a source terminal of the transistor serving as a switch is closer to the low potential side power source (Vss, GND, 0 V and the like), and a P-channel transistor is desirably employed when the potential of the source terminal is closer to the high potential side power source (Vdd and the like). This helps a transistor to easily serve as a switch as the absolute value of the gate-source voltage can be increased. It is also to be noted that a CMOS switch can also be applied by using both N-channel and P-channel transistors.

Note that FIG. 1 is shown as a circuit of the present invention, however, the present invention is not limited to this configuration. By changing an arrangement and the number of switches, polarity of each transistor, the number and arrangement of the current source transistor 101, the number and arrangement of the shift transistor 102, a potential of each wire, a direction of current flow and the like, various circuits can be employed in the configuration. Further, by combining such changes described above, a configuration using various circuits can be achieved.

For example, such switches as the switches 103, 105, and 106 may be disposed anywhere as long as they can control ON/OFF of a target current. Specifically, the switch 106 which controls a current flowing to the current source 107 is preferably disposed to be in series to the current source 107. In addition, the switch 103 which controls a current flowing to the shift transistor 102 is preferably disposed in parallel with the shift transistor 102. The switch 105 is preferably disposed so as to control charges in the capacitor element 104.

Figure 4:
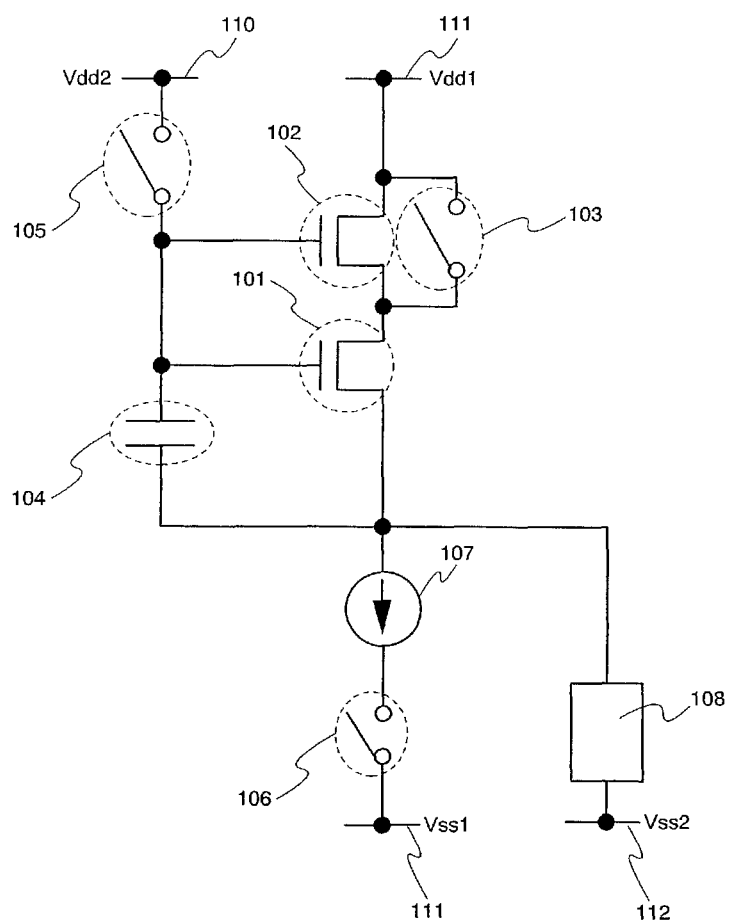
FIG. 4 is a circuit diagram showing an example of a circuit according to an aspect of the present invention.
Figure 5:
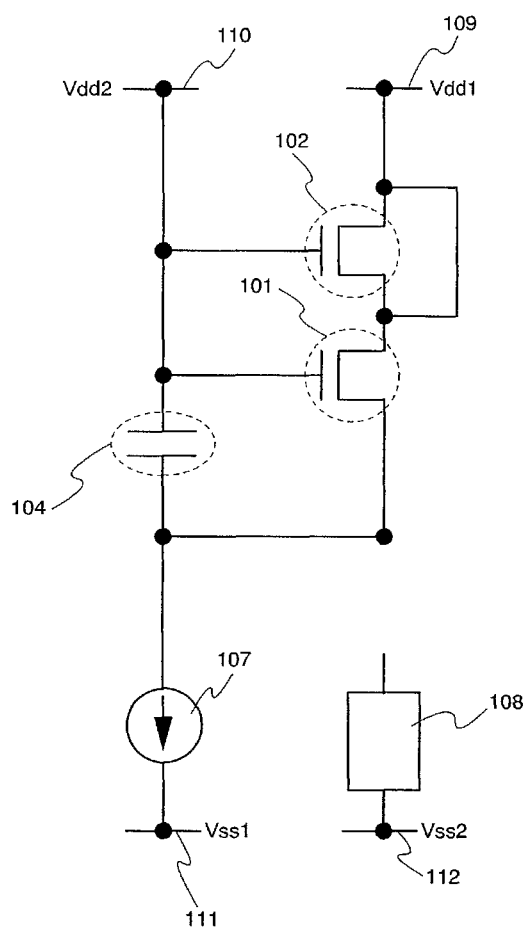
FIG. 5 is a circuit diagram showing an example of a circuit according to an aspect of the present invention.
Figure 6:
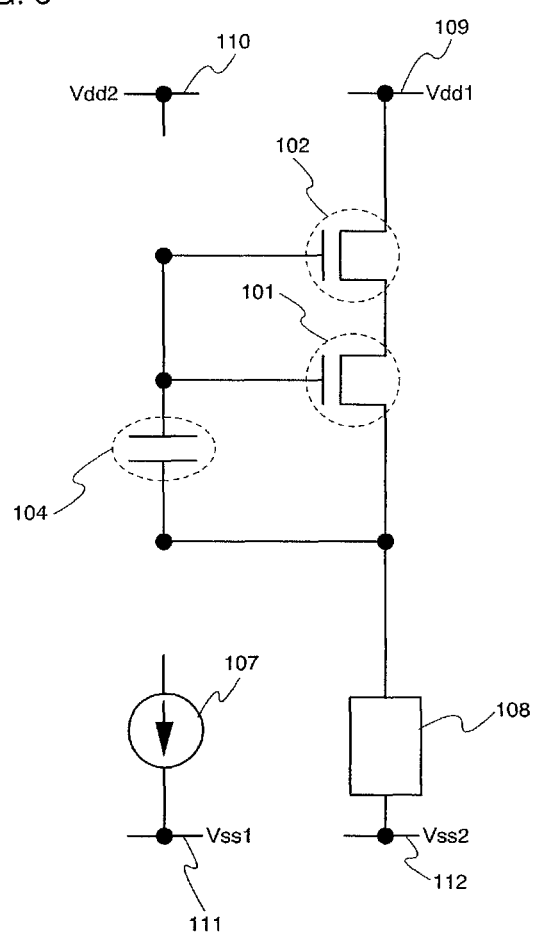
FIG. 6 is a circuit diagram showing an example of a circuit according to an aspect of the present invention.

FIG. 4 shows an example in the case where the switch 106 is disposed differently. That is, such switches as the switches 103, 105, and 106 may be disposed anywhere as long as they are connected as shown in FIG. 5 at the signal writing operation in which the current Ib from the current source 107 flows to the current source transistor 101 and the shift transistor 102 performs a short circuit operation, and connected as shown in FIG. 6 at the output operation in which the shift transistor 102 performs a current source operation and a current flowing to the shift transistor 102 and the current source transistor 101 flows to the load 108.

This embodiment mode can be freely combined with the other embodiment modes or examples in this specification.

Embodiment Mode 2

In Embodiment Mode 2, a configuration different from the analog circuit of FIG. 1 will be described.

Figure 7:
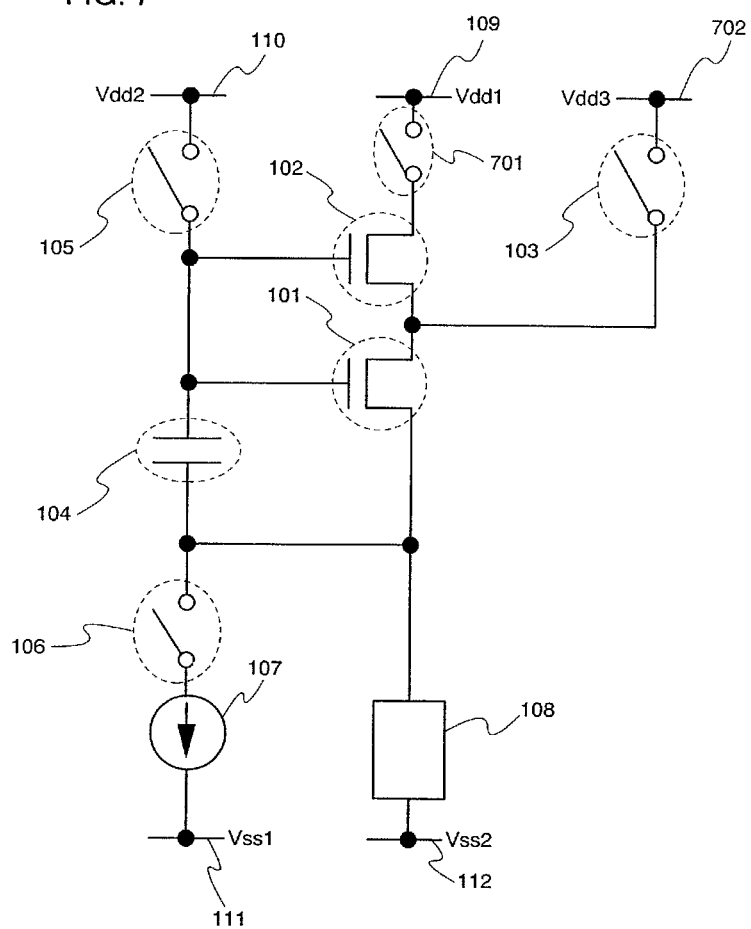
FIG. 7 is a circuit diagram showing an example of a circuit according to an aspect of the present invention.

FIG. 7 shows an example in which the connection of the switch 103 in FIG. 1 is changed. The switch 103 is connected to a wire 702. A potential of the wire 702 is supplied with Vdd3 which is higher than Vdd1.

Figure 8:
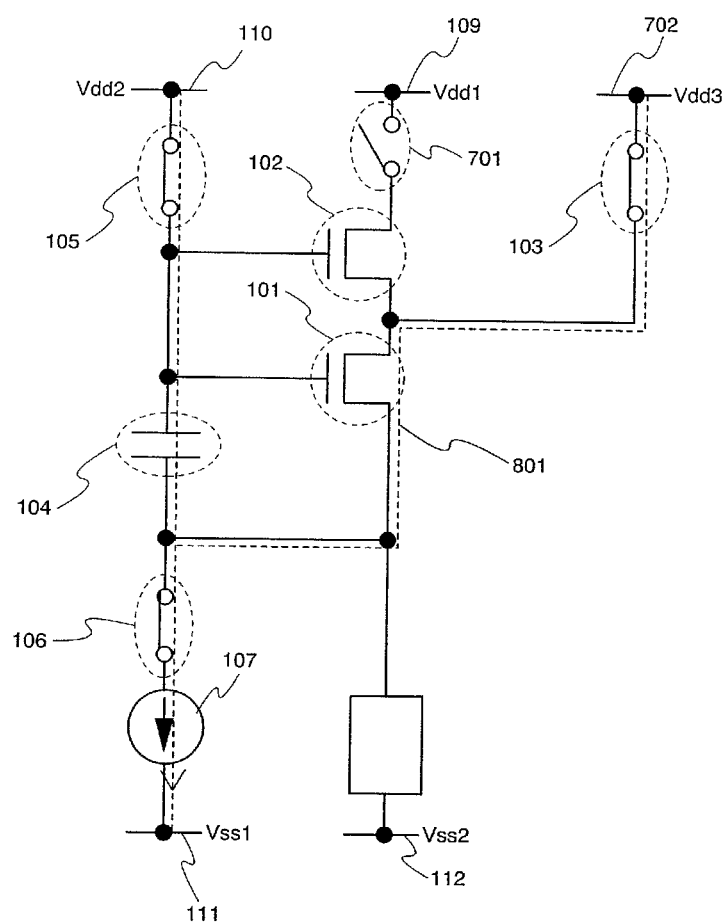
FIG. 8 is a circuit diagram showing an example of a circuit according to an aspect of the present invention.

An operation of FIG. 7 is described briefly. As shown in FIG. 8, switches 103, 105 and 106 are turned ON, and a switch 701 is turned OFF. A current path at that time is schematically shown by a broken line with an arrow 801. No current flows between a source and a drain of a shift transistor 102, and a current flows to a current source transistor from the switch 103. When the current flowing between the source and the drain of the current source transistor 101 is equal to the current Ib flowing to the current source 107, no current flows to the capacitor element 104. In other words, a steady state is obtained. At that time, a gate potential of the current source transistor 101 is accumulated in the capacitor element 104. In other words, a voltage required for allowing the current Ib to flow between the source and the drain of the current source transistor 101 is applied to the gate of the current source transistor 101. The above-described operation corresponds to a signal writing operation. At the signal writing operation, the shift transistor 102 conducts the short circuit operation.

In this manner, when no current flows to the capacitor element 104 and the steady state is obtained, it can be considered that the signal writing operation is finished.

In FIG. 7, Vdd3 which is higher than Vdd1 is supplied at a signal writing operation. Thus, more current can be supplied between the source and the drain of the current source transistor, and the set operation can be performed quickly without being influenced by an intersection capacitance and a wire resistance which are parasitic on a wire and the like. In other words, since the current at the output operation can be large, a semiconductor device which is hardly influenced by a slight amount of current due to noise or the like, can be obtained.

Figure 9:
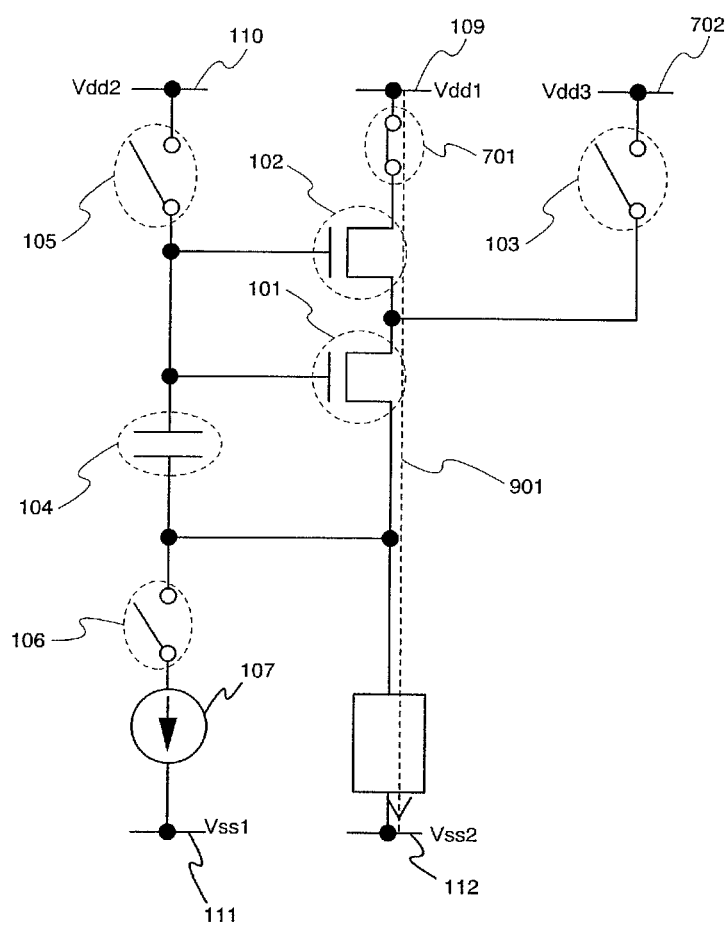
FIG. 9 is a circuit diagram showing an example of a circuit according to an aspect of the present invention.

Next, as shown in FIG. 9, the switches 103, 105 and 106 turned OFF, while the switch 701 is turned ON. A current path at that time is schematically shown by a broken line with an arrow 901. In FIG. 9, since the switch 701 is ON, a current flows between the source and the drain of the shift transistor 102. On the other hand, charges accumulated at the signal writing operation are held in the capacitor element 104, and the charges are applied to gates of the current source transistor 101 and the shift transistor 102. The gates of the current source transistor 101 and the shift transistor 102 are connected to each other. As described above, the current source transistor 101 and the shift transistor 102 serve together as a multigate transistor. Therefore, when the current source transistor 101 and the shift transistor 102 are regarded as one transistor, a gate length L of the transistor is longer than the gate length L of the current source transistor 101. In general, when the gate length L of a transistor becomes longer, the current flowing therein becomes small. Therefore, the current flowing to the load 108 becomes smaller than Ib. The above operation corresponds to an output operation. At the time of the output operation, the shift transistor 102 conducts the current source operation.

In the case of FIG. 7, the switch 701 may be added or not. The switch 701 may be disposed on a source terminal side of the shift transistor 102, or on a drain terminal side thereof. The switch 701 may be turned ON or OFF so as to be in a state opposite to the switch 103. As described above, a circuit can be configured by arranging a switch at various positions. In addition, Vdd3 which is higher than Vdd1 is supplied to the wire 702; however, the present invention is not limited to this. A different potential may be supplied.

Figure 10:
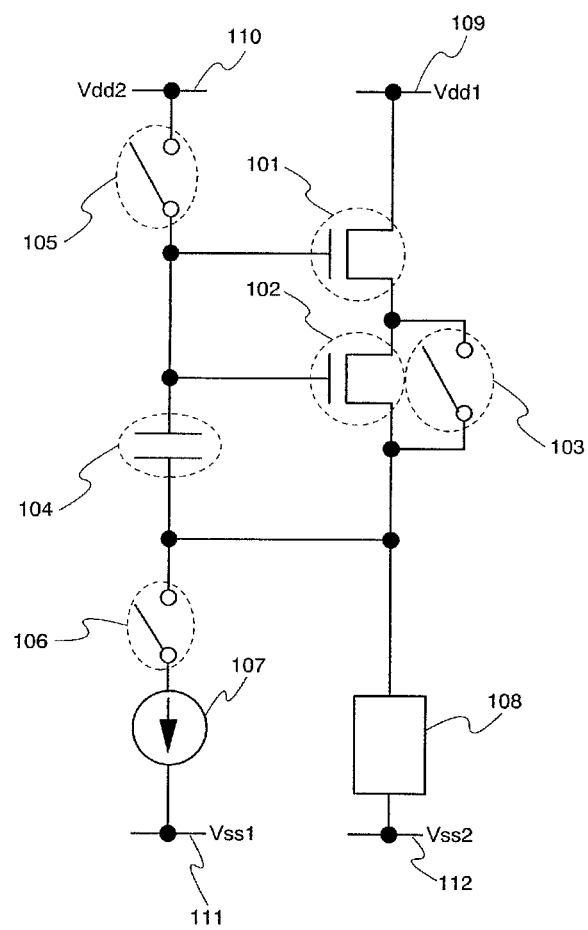
FIG. 10 is a circuit diagram showing an example of a circuit according to an aspect of the present invention.

Next, FIG. 10 shows a case where dispositions of the current source transistor 101 and the shift transistor 102 are interchanged. In FIG. 1, the wire 109, the shift transistor 102, and the current source transistor 101 are disposed in this order, however, the wire 109, the current source transistor 101 and the shift transistor 102 are disposed in this order in FIG. 10.

Here, the circuit in FIG. 1 and the circuit in FIG. 10 are compared. In FIG. 1, when the shift transistor 102 performs the short circuit operation, there is a potential difference between a gate terminal and a source terminal (drain terminal) of the shift transistor 102. Therefore, charges in a channel region of the shift transistor 102 are stored in the gate capacitor. Then, in the current source operation as well, the charge remains stored in the gate capacitor. Therefore, a potential of the gate terminal of the current source transistor 101 hardly changes between at the short circuit operation (signal writing operation) and at the current source operation (output operation).

In FIG. 10, on the other hand, when the shift transistor 102 performs a short circuit operation, there is hardly any potential difference between the gate terminal and the source terminal (drain terminal) of the shift transistor 102. Therefore, almost no charges are in the channel region of the shift transistor 102 and thus, almost no charges are stored in the gate capacitor thereof. Then, as the switches 105 and 103 are turned OFF at the current source operation, charges are accumulated in the gate capacitor of the shift transistor 102, and the shift transistor 102 operates as a part of a current source. The charge here is the one accumulated in the capacitor element 104 or the gate capacitor of the current source transistor 101. This charge moves to the gate portion of the shift transistor 102. Therefore, the potential of the gate terminal of the current source transistor 101 changes by the amount of the moved charge between at the short circuit operation (signal writing operation) and at the current source operation (output operation). As a result, an absolute value of a gate-source voltage of the current source transistor 101 and the shift transistor 102 becomes smaller at the output operation, which makes a current flowing to the load 108 smaller.

Therefore, the arrangement of the current source transistor 101 and the shift transistor 102 may be designed in accordance with circumstances. For example, in a case where an EL element is the load 108, a contrast is decreased when light is emitted slightly in displaying in black. In that case, it is more preferable to employ the configuration in FIG. 10 since a current is reduced slightly.

Figure 11:
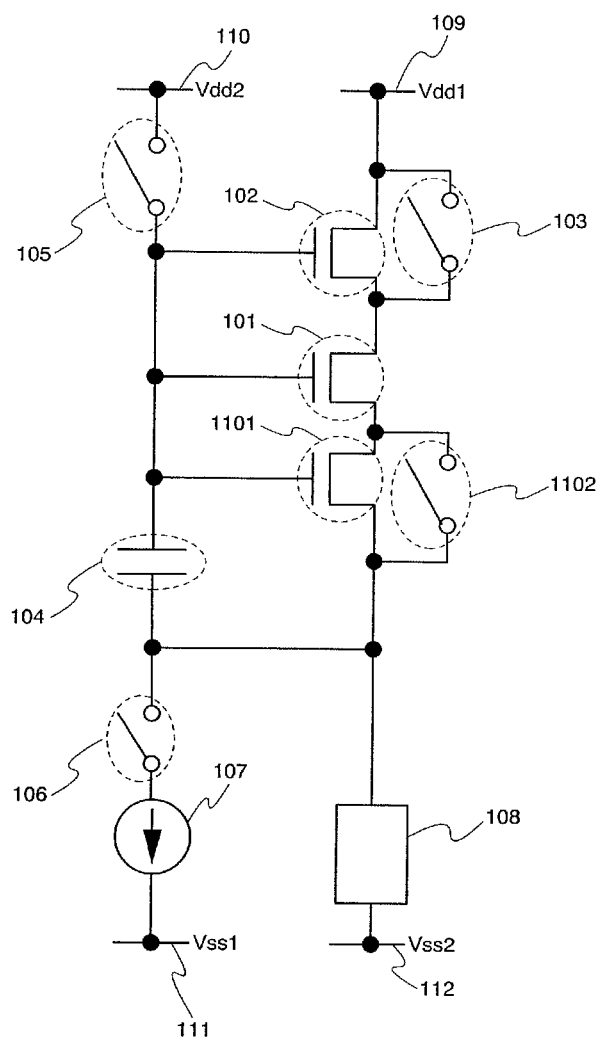
FIG. 11 is a circuit diagram showing an example of a circuit according to an aspect of the present invention.

In FIG. 1, one current source transistor 101 and one shift transistor 102 are disposed, however, a plurality of either or both of the current source transistor 101 and the shift transistor 102 may be disposed as well. Further, the arrangement thereof may be selected arbitrarily. FIG. 11 shows an example in the case where a second shift transistor 1101 and a switch 1102 are disposed.

In the case of FIG. 11, an amount of current flowing to the load 108 can be made smaller, as compared with the example shown in FIG. 1. For example, it is preferable for a case where light is emitted slightly in displaying in black when the load 108 is an EL element, which leads to reduction of contrast.

The content described in this embodiment mode corresponds to Embodiment Mode 1 of which content is partially modified. Therefore, the content described in Embodiment Mode 1 can be applied to this embodiment mode as well.

This embodiment mode can be freely combined with the other embodiment modes or examples in this specification.

Embodiment Mode 3

In Embodiment Mode 3, a configuration different from the analog circuits of the above embodiment modes will be described.

Figure 12:
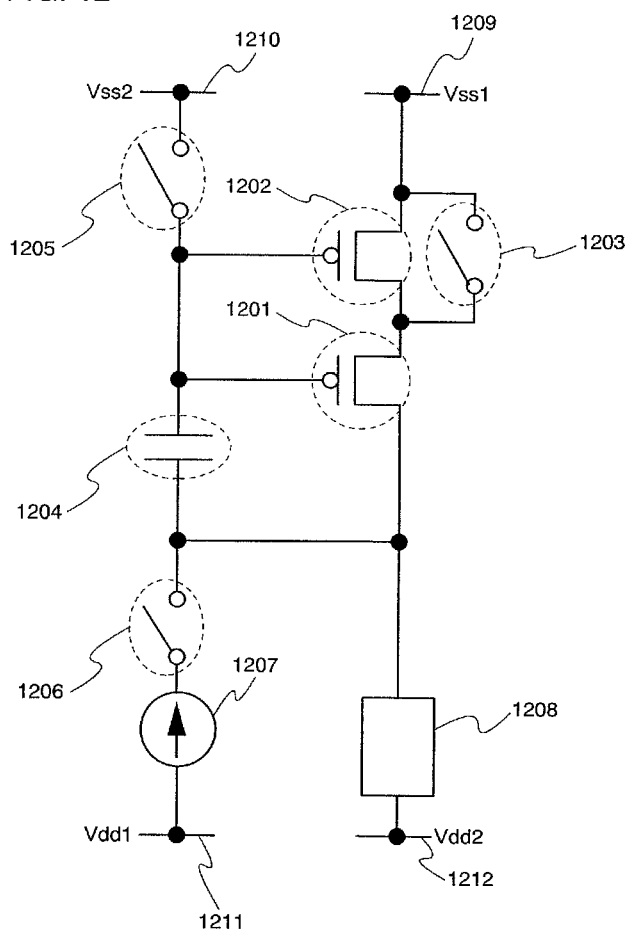
FIG. 12 is a circuit diagram showing an example of a circuit according to an aspect of the present invention.

In FIG. 1, the current source transistor 101 and the shift transistor 102 are both N-channel transistors. In this embodiment mode, a case is described, where the current source transistor 101 and the shift transistor 102 are both P-channel transistors. As for the circuit of FIG. 1, FIG. 12 shows an example in the case where the polarity (conductivity) of the current source transistor 101 and the shift transistor 102 are changed and the connection structure of the circuit is not changed. When FIG. 1 and FIG. 12 are compared, it is apparent that the change is easily done by changing potentials of the wires 109, 110, 111 and 112 to the ones of wires 1209, 1210, 1211 and 1212, and by changing the direction of current of a current source 1207. The connections of a current source transistor 1201, a shift transistor 1202, switches 1203, 1205, and 1206, the current source 1207, a load 1208 and the like are not changed.

Note that the load 1208 has a rectifying property. In other words, the load has current-voltage characteristics having different resistance values based on the direction of an applied bias, and has an electric property which allows almost current to flow only in one direction. In this embodiment mode, the load 1208 is provided so as to allow current to flow from the wire 1212 to the current source transistor 1201.

The current source 1207 connected to the wire 1211 sets a current Ib. Here, a potential input to the wire 1209 is denoted by Vss1; a potential input to the wire 1210, Vss2; a potential input to the wire 1211, Vdd1; and a potential input to the wire 1212, Vdd2. A relation of potentials satisfies at least Vss1<Vss2<Vdd1, and Vss1<Vdd2<Vdd1.

The relation between Vss2, the potential input to the wire 1210 and Vdd1, the potential input to the wire 1211, may be the same or different. In a case where Vdd2 is a different potential from Vss2, Vdd2 may be set higher than Vss2 by a threshold voltage of the current source transistor, by a threshold voltage when applied to the load, or by a sum of the threshold voltage of the current source transistor and the threshold voltage when applied to the load.

Figure 13:
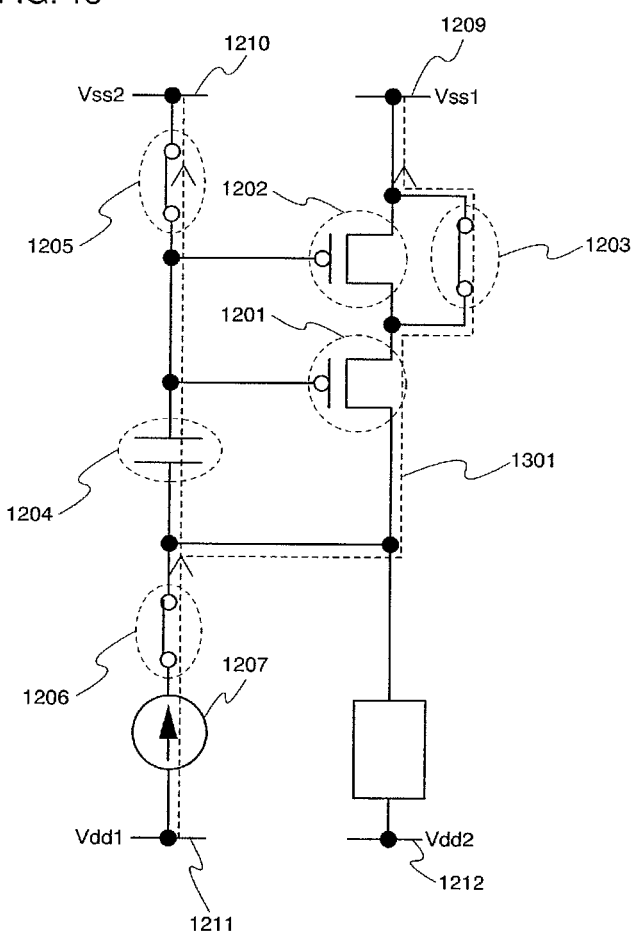
FIG. 13 is a circuit diagram showing an example of a circuit according to an aspect of the present invention.

An operation of FIG. 12 is described briefly. As shown in FIG. 13, the switches 1203, 1205 and 1206 are turned ON. A current path at that time is shown schematically by a broken line with an arrow 1301. In FIG. 12, a source and a drain of the shift transistor 1202 have almost the same potentials. In other words, almost no current flows between the source and the drain of the shift transistor 1202, and a current flows to the switch 1203. Thus, the current Ib to flow to the current source 1207 flows to a capacitor element 1204 or a current source transistor 1201. When the current flowing between the source and the drain of the current source transistor 1201 and the current Ib flowing to the current source 1207 become equal, no current flows to the capacitor element 1204. In other words, a steady state is obtained. At that time, a gate potential of the current source transistor 1201 is accumulated in the capacitor element 1204. In other words, a voltage required for allowing the current Ib to flow between the source and the drain of the current source transistor 1201 is applied to the gate of the current source transistor 1201. The above-described operation corresponds to a signal writing operation. At the signal writing operation, the shift transistor 1202 conducts the short circuit operation.

In this manner, when no current flows to the capacitor element 1204 and the steady state is obtained, it can be considered that the signal writing operation is finished.

It is to be noted that a source potential of the current source transistor 1201 can be controlled by the gate potential of the current source transistor 1201, i.e., Vdd2, a potential of the wire 1210, from the source potential of the current source transistor 1201, Vss2 which is a potential of the wire 1212 and current-voltage characteristics of the load. Thus, by controlling the potential Vdd2 of the wire 1210, it is possible that no current flows to the load 1208.

Figure 14:
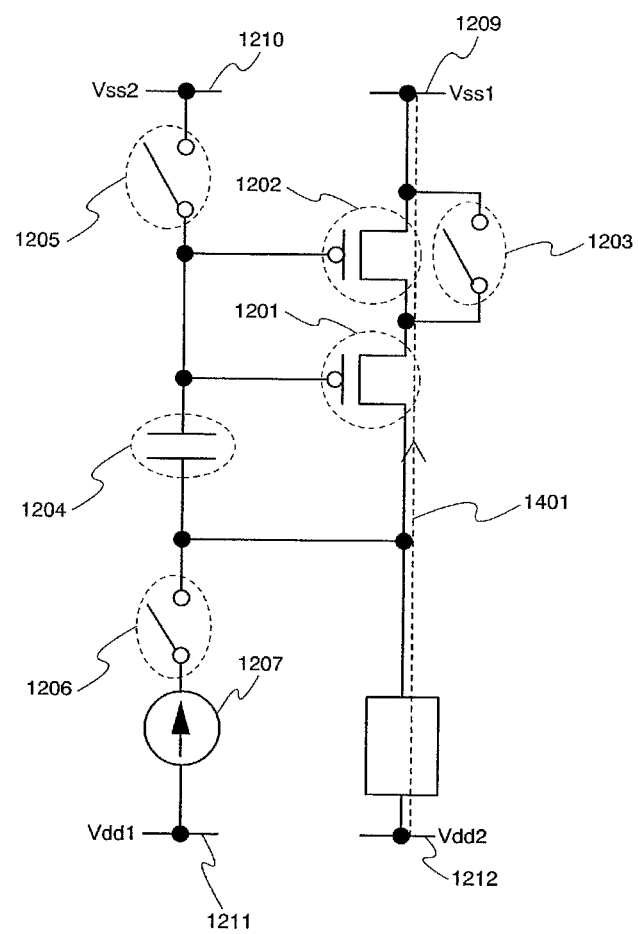
FIG. 14 is a circuit diagram showing an example of a circuit according to an aspect of the present invention.

Next, as shown in FIG. 14, the switches 1203, 1205 and 1206 are turned OFF. A current path at that time is schematically shown by a broken line with an arrow 1401. In FIG. 14, since the switch 1203 is OFF, a current flows between the source and the drain of the shift transistor 1202. On the other hand, charges accumulated at the signal writing operation are held in the capacitor element 1204, and the charges are applied to gates of the current source transistor 1201 and the shift transistor 1202. The gates of the current source transistor 1201 and the shift transistor 1202 are connected to each other.

As described above, the current source transistor 1201 and the shift transistor 1202 serve together as a multigate transistor. Therefore, when the current source transistor 1201 and the shift transistor 1202 are regarded as one transistor, a gate length L of the transistor is longer than the L of the current source transistor 1201. In general, when the gate length L of a transistor becomes longer, current flowing therein becomes small. Therefore, the current flowing to the load 1208 becomes smaller than Ib. The above operation corresponds to an output operation. At the time of the output operation, the shift transistor 1202 conducts the current source operation.

Figure 15:
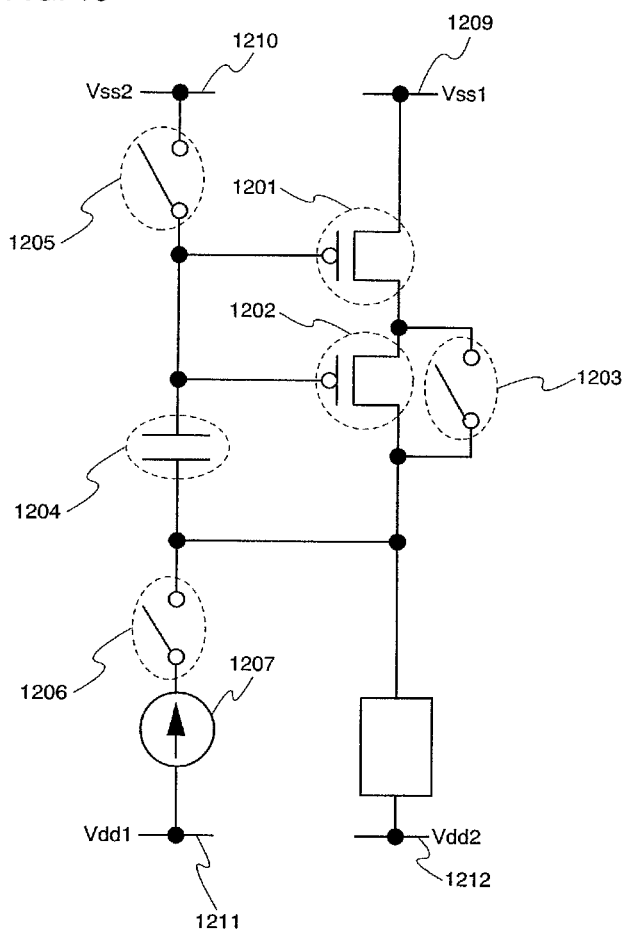
FIG. 15 is a circuit diagram showing an example of a circuit according to an aspect of the present invention.

Next, FIG. 15 shows a case where dispositions of the current source transistor 1201 and the shift transistor 1202 are interchanged. In FIG. 1, the wire 109, the shift transistor 102, and the current source transistor 101 are disposed in this order, however, the wire 1209, the current source transistor 1201 and the shift transistor 1202 are disposed in this order in FIG. 15.

Here, a difference between the circuit in FIG. 1 and the circuit in FIG. 15 is described. In FIG. 1, when the shift transistor 102 performs the short circuit operation, there is a potential difference between a gate terminal and a source terminal (drain terminal) of the shift transistor 102. Therefore, charges are stored in the gate capacitor of the shift transistor 102. Then, at the current source operation as well, the charge remains stored in the gate capacitor. Therefore, a potential of the gate terminal of the current source transistor 1201 hardly changes between at the short circuit operation (signal writing operation) and at the current source operation (output operation).

In FIG. 15, on the other hand, when the shift transistor 1202 performs a short circuit operation, there is hardly any potential difference between the gate terminal and the source terminal (drain terminal) of the shift transistor 1202. Therefore, almost no charges are in the channel region of the shift transistor 102 and charges are not stored in the gate capacitor thereof. Then, as the switches 1205 and 1203 are turned OFF in the current source operation, charges are accumulated in the gate capacitor of the shift transistor 1202, and the shift transistor 1202 operates as a part of a current source. The charge at this time is the one accumulated in the capacitor element 1204 or the gate capacitor of the current source transistor 1201. This charge moves to the gate portion of the shift transistor 1202. Therefore, the potential of the gate terminal of the current source transistor 1201 changes by the amount of the moved charge between in the short circuit operation (signal writing operation) and the current source operation (output operation). As a result, an absolute value of a gate-source voltage of the current source transistor 1201 and the shift transistor 1202 becomes smaller at the output operation, and a current flowing to the load 1208 becomes also smaller.

Therefore, the arrangement of the current source transistor 1201 and the shift transistor 1202 may be designed in accordance with circumstances. For example, in a case where an EL element is the load 1208, a contrast is decreased when light is emitted slightly in displaying in black. In that case, it is more preferable to employ the configuration in FIG. 15 since a current is reduced slightly.

Figure 16:
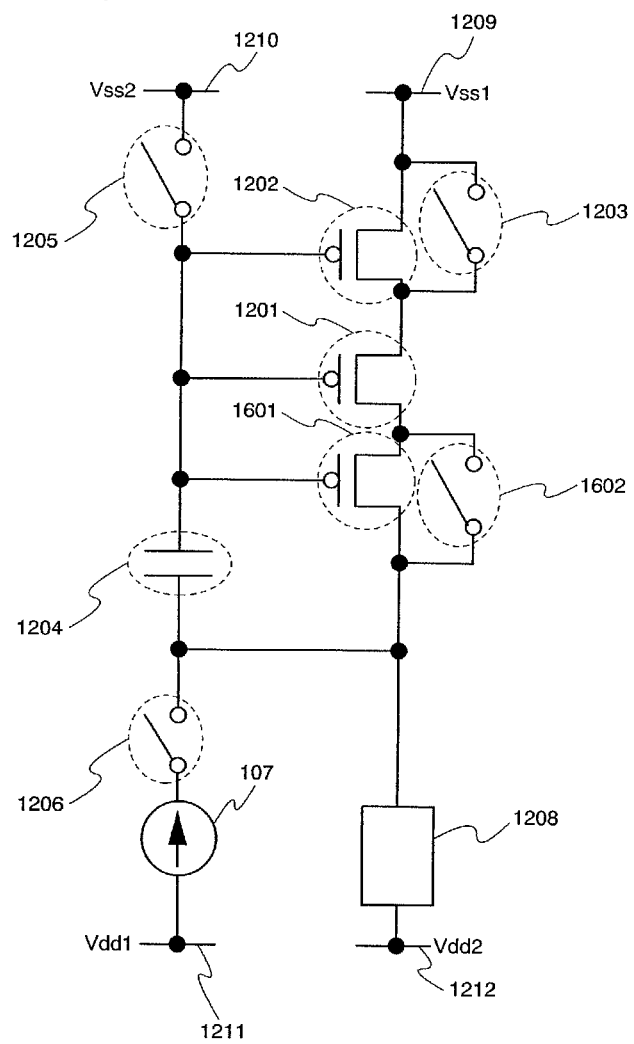
FIG. 16 is a circuit diagram showing an example of a circuit according to an aspect of the present invention.

In FIG. 12, one current source transistor 101 and one shift transistor 102 are disposed, however, a plurality of either or both of the current source transistor 101 and the shift transistor 102 may be disposed as well. Further, the arrangement thereof may be selected arbitrarily. FIG. 16 shows an example in the case where a second shift transistor 1601 and a switch 1602 are disposed.

In the case of FIG. 16, an amount of current flowing to the load 1208 can be made small, as compared with the example shown in FIG. 12. For example, it is preferable for a case where light is emitted slightly in displaying in black when the load 1208 is an EL element, which leads to reduction of contrast.

In this manner, by changing an arrangement and the number of switches, polarity of each transistor, the number and arrangement of the current source transistor, the number and arrangement of the shift transistor, a potential of each wire, a direction of current flow and the like, various circuits can be employed for constituting the present invention, without being limited to the circuit shown in FIG. 1. Further, by combining such changes, the present invention can be constituted by using further various circuits.

The content described in this embodiment mode corresponds to Embodiment Mode 1 of which content is partially modified. Therefore, the content described in Embodiment Mode 1 can be applied to this embodiment mode as well.

This embodiment mode can be freely combined with the other embodiment modes or examples in this specification.

Embodiment Mode 4

In Embodiment Mode 4, a configuration different from the analog circuit of the above embodiment mode will be described.

In the above embodiment mode, a conventional current drive circuit and a display device using it have configurations such that a signal current and a current for driving a TFT, or a signal current and a current which flows to a light-emitting element when it emits light are equal to each other or in proportion to each other.

Therefore, in a case where a drive current of a driving TFT for driving a light-emitting element is small or a case of performing dark gray scale display by a light-emitting element, the signal current becomes small proportionately. Therefore, as a parasitic capacitance of a wire used for supplying a signal current to a driving TFT and a light-emitting element is relatively quite large, there is a problem that a time constant of charging the parasitic capacitance of the wire becomes large when the signal current is small and a signal write speed becomes slow. That is, when a current is supplied to a transistor, a problem arises in that a speed at which a voltage required for the transistor to flow the current generates at a gate terminal becomes slow.

In this embodiment mode, in addition to advantageous effect of the present invention, a semiconductor device which is capable of improving a write speed of a signal and an element drive speed even when a signal current is small, will be described.

In this embodiment mode, in order to complete the set operation quickly, a potential of a gate terminal of a transistor is set to be a predetermined potential in advance before performing the set operation. The predetermined potential is approximately equal to a potential obtained when the set operation is completed (when a steady state is obtained). Therefore, the set operation can be performed quickly. Note that the set operation in this embodiment mode is an operation for supplying a current to a transistor and generating at a gate terminal thereof a voltage required for the transistor to flow the current.

Further, an operation for making a potential of a gate terminal of a transistor to be a predetermined potential so that the set operation is completed quickly is referred to as a precharge operation, and a circuit having such a function is referred to as a precharge means.

Figure 17:
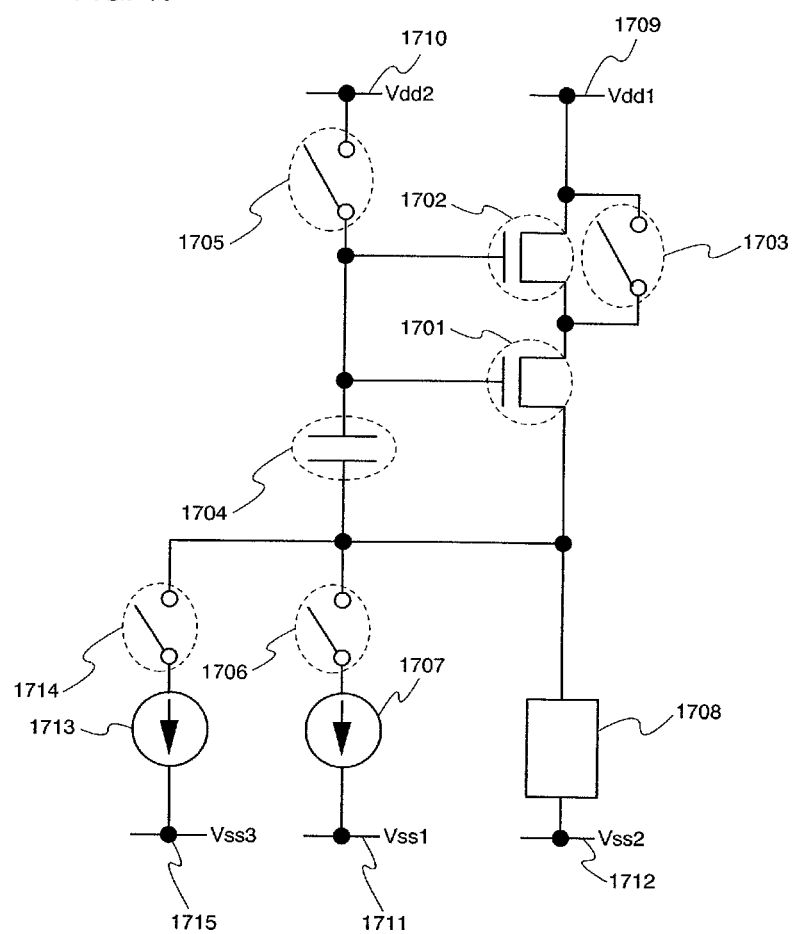
FIG. 17 is a circuit diagram showing an example of a circuit according to an aspect of the present invention.

First, FIG. 17 shows a configuration of this embodiment mode. A current source transistor 1701 which constantly operates as a current source (or a part of it) and a shift transistor 1702 of which operation changes depending on a state are provided, and the current source transistor 1701, the shift transistor 1702, and a wire 1709 are connected in series. A gate of the current source transistor 1701 is connected to one terminal of a capacitor element 1704. The other terminal of the capacitor element 1704 is connected to a source of the current source transistor. Therefore, it is possible to hold a gate-source voltage (Vgs) of the current source transistor 1701. Further, the gate terminal of the current source transistor 1701 and a wire 1710 are connected to each other via a switch 1705 and charges held in the capacitor element 1704 can be controlled by ON/OFF of the switch 1705. A source of the current source transistor 1701 and a wire 1711 are connected to each other via a first current source 1707 and a switch 1706. In parallel with the aforementioned, a source of the current source transistor 1701 and a wire 1712 are connected to each other via a load 1708. In addition, a source of the current source transistor 1701 and a wire 1715 are connected via a second current source 1713 and a switch 1714.

The first current source 1707 connected to the wire 1711 sets a current Ib1 and the second current source 1713 connected to the wire 1715 sets a current Ib2. Here, a potential input to the wire 1709 is denoted by Vdd1, a potential input to the wire 1710 is denoted by Vdd2, a potential input into the wire 1711 is denoted by Vss1, a potential input into the wire 1712 is denoted by Vss2, a potential input into the wire 1715 is denoted by Vss3. At that time, the relation of potentials at least satisfies Vdd1>Vdd2>Vss1>Vss3, and Vdd1>Vss2>Vss1>Vss3.

The relation between Vdd2, the potential input to the wire 1710 and Vss2, the potential input to the wire 1712, may be the same or different. In a case where Vdd2 is a different potential from Vss2, Vdd2 may be set higher than Vss2 by a threshold voltage of the current source transistor, by a threshold voltage when applied to the load, or by a sum of the threshold voltage of the current source transistor and the threshold voltage when applied to the load.

Note that the load 1708 has a rectifying property. In other words, the load has current-voltage characteristics having different resistance values based on an applied bias direction, and has an electric property which allows almost current to flow only in one direction. In this embodiment mode, the load 1708 is provided so as to allow current to flow from the current source transistor 1701 to the wire 1712.

Figure 18:
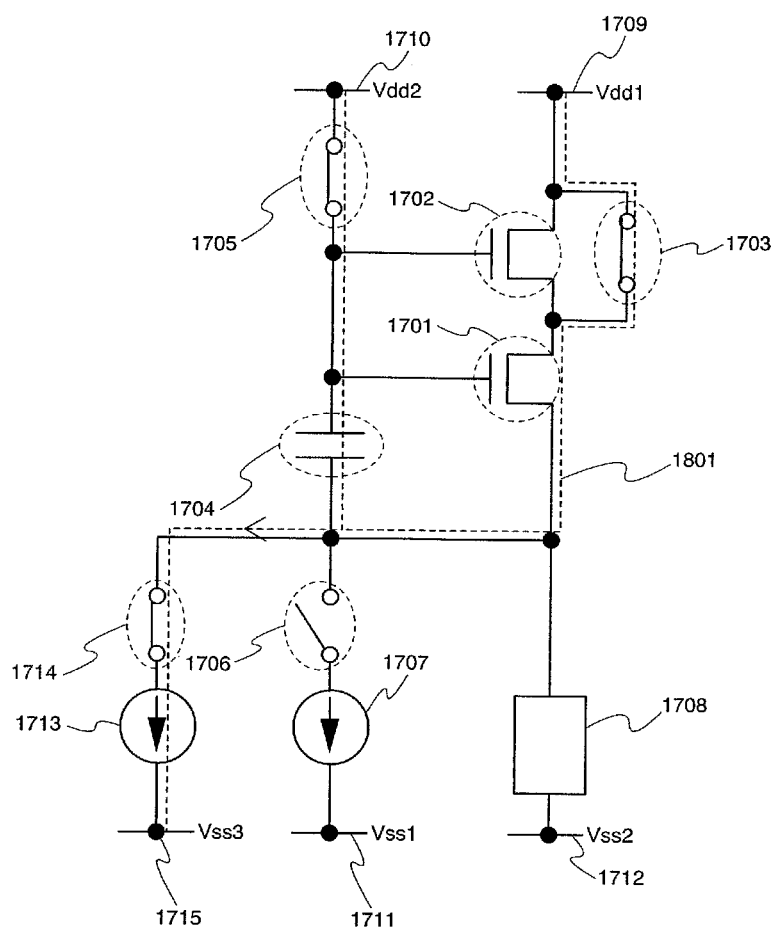
FIG. 18 is a circuit diagram showing an example of a circuit according to an aspect of the present invention.

An operation of FIG. 17 is described briefly. As shown in FIG. 18, switches 1703, 1705 and 1714 are turned ON, and the switch 1706 is turned OFF. Then, a source and a drain of the shift transistor 1702 have almost the same potentials. In other words, almost no current flows between the source and the drain of the shift transistor 1702, and a current flows to a switch 1703. A current path at that time is shown schematically by a broken line with an arrow 1801. Thus, the current Ib2 to flow to the second current source 1713 flows to the capacitor element 1704 or the current source transistor 1701. When the current flowing between the source and the drain of the current source transistor 1701 and the current flowing to the second current source 1713 become equal, no current flows to the capacitor element 1704. In other words, a steady state is obtained. At that time, a gate-source voltage of the current source transistor 1701 is accumulated in the capacitor element 1704. In other words, a voltage required for allowing the current Ib2 to flow between the source and the drain of the current source transistor 1701 is applied between the gate and the source. The above-described operation corresponds to a precharge operation. At the precharge operation, the shift transistor 1702 conducts a short circuit operation.

Figure 19:
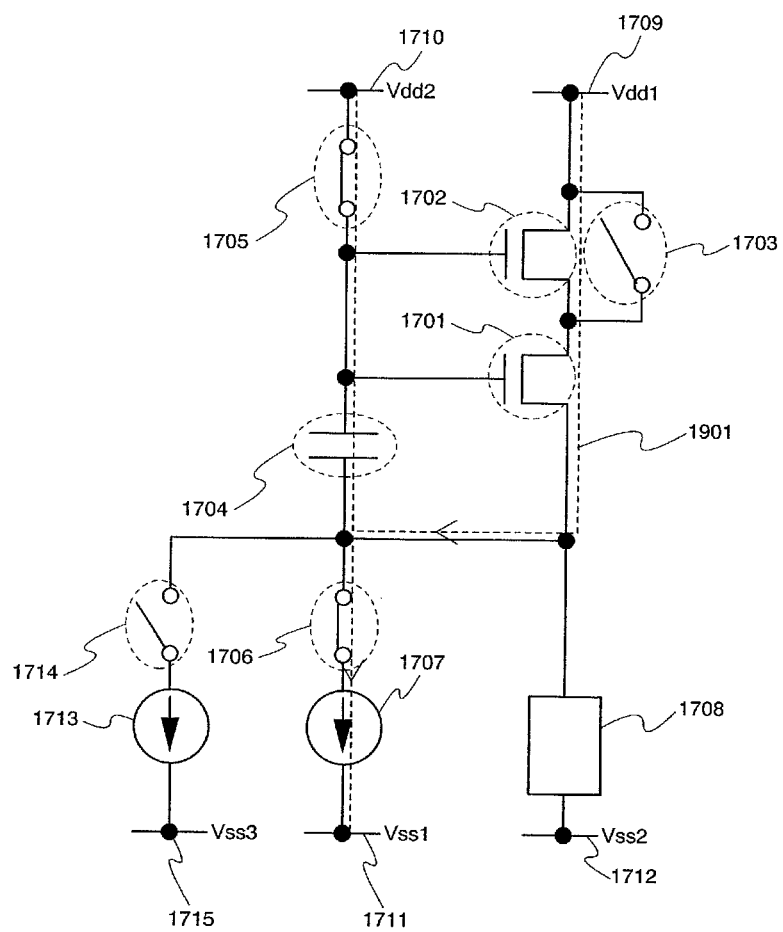
FIG. 19 is a circuit diagram showing an example of a circuit according to an aspect of the present invention.

Next, as shown in FIG. 19, the switches 1705 and 1706 turned ON, and the switches 1703 and 1714 are turned OFF. Since the switch 1703 is OFF, a current flows between the source and the drain of the shift transistor 1702. A current path at that time is schematically shown by a broken line with an arrow 1901. Thus, the current Ib1 flowing to the first current source 1707 flows to the capacitor element 1704, the current source transistor 1701 or the shift transistor 1702. At that time, the gates of the current source transistor 1701 and the shift transistor 1702 are connected to each other. Thus, the current source transistor 1701 and the shift transistor 1702 serve together as a multigate transistor. A gate length L of the multigate transistor is longer than the gate length L of the current source transistor 1701. In general, when the gate length L of a transistor becomes longer, current flowing therein becomes small.

When the current flowing between the source and the drain of the multigate transistor is equal to the current Ib1 flowing to the first current source 1707, no current flows to the capacitor element 1704. In other words, a steady state is obtained. In the steady state, no current flows to the capacitor element 1704. At that time, a gate-source voltage of the multigate transistor is accumulated in the capacitor element 1704. That is, a voltage required to supply the current Ib1 between the source and drain of the multigate transistor is applied between the gate and source thereof. The aforementioned operation corresponds to a set operation. At the time of the set operation, the shift transistor 1702 performs the current source operation.

Note that charges accumulated in the capacitor element 1704, that is a potential of the gate terminal of the current source transistor 1701 is set to be approximately equal voltage between at the precharge operation and at the set operation by appropriately setting the current Ib1 of the first current source 1707, the current Ib2 of the second current source 1713, and transistor sizes (gate width W, gate length L and the like) of the current source transistor 1701 and the shift transistor 1702. Then, in the case where the current Ib2 flowing to the second basic current source 1713 has a higher current value than the current Ib1 flowing to the first current source 1707, the capacitor element 1704 can be charged quickly by the precharge operation and the steady state can be obtained. After that, even when the current Ib1 flowing to the first current source 1707 is small at the set operation, the steady state can be obtained quickly. This is because the capacitor element 1704 is almost charged by the precharge operation.

Figure 20:
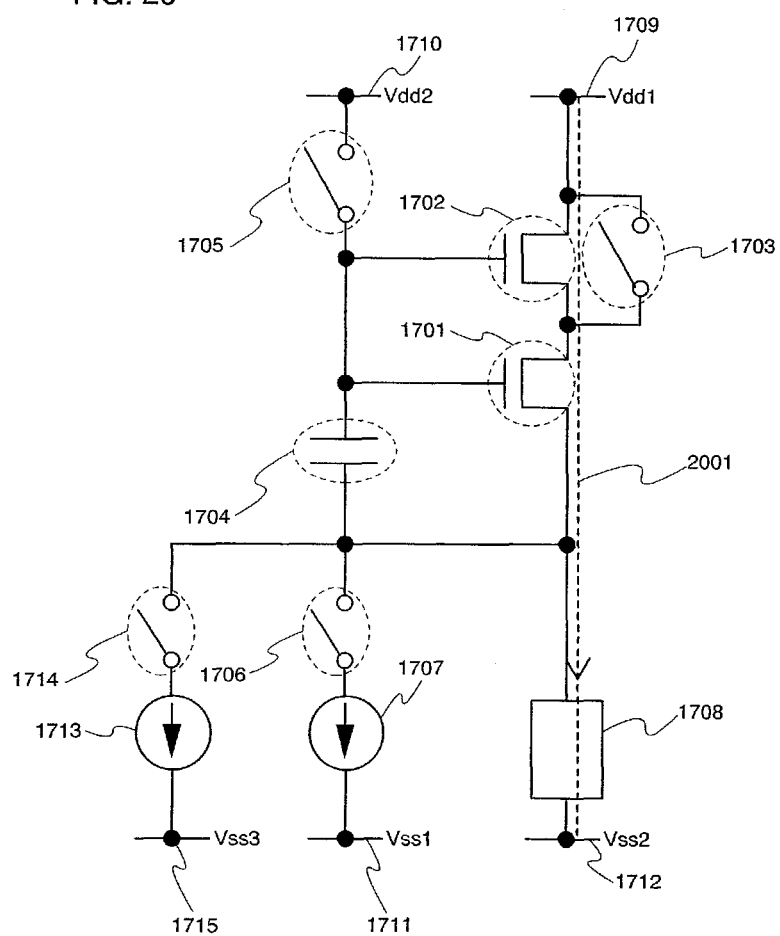
FIG. 20 is a circuit diagram showing an example of a circuit according to an aspect of the present invention.

Next, the switches 1703, 1705, 1706, and 1714 are turned OFF as shown in FIG. 20. Then, a current flows to the load 1708. A current path at that time is shown schematically by a broken line with an arrow 2001. The aforementioned operation corresponds to an output operation. At the output operation, the shift transistor 1702 conducts a current source operation.

In this mariner, by controlling ON/OFF of the switch 1703, a current flowing at the precharge operation can be made large, which enables the steady state to be obtained quickly. That is to say, an influence of a load which is parasitic on a wire through which a current flows (wire resistance, intersection capacitance and the like) is lessened and the steady state can be obtained quickly. At that time, almost the same state is already obtained as the steady state at the set operation. Therefore, the steady state can be quickly obtained at the set operation after the precharge operation.

Note that almost no current flows to the load 1708 because of a source potential of the current source transistor 1701, Vss2, a potential of the wire 1712, and current-voltage characteristics of the load 1708. The source potential of the current source transistor 1701 can be controlled by a gate potential of the current source transistor 1701, i.e., the potential Vdd2 of the wire 1710. Thus, it is possible that the potential Vdd2 of the wire 1710 is controlled to stop current supply to the load 1708.

Note that a potential of the capacitor element 1704 is different between at the set operation and at the output operation in many cases. However, voltages of both ends of the capacitor element 1704 (potential difference) does not change; therefore; a gate-source voltage of the current source transistor 1701 does not change and a desired current flows to the load 1708.

Figure 38:
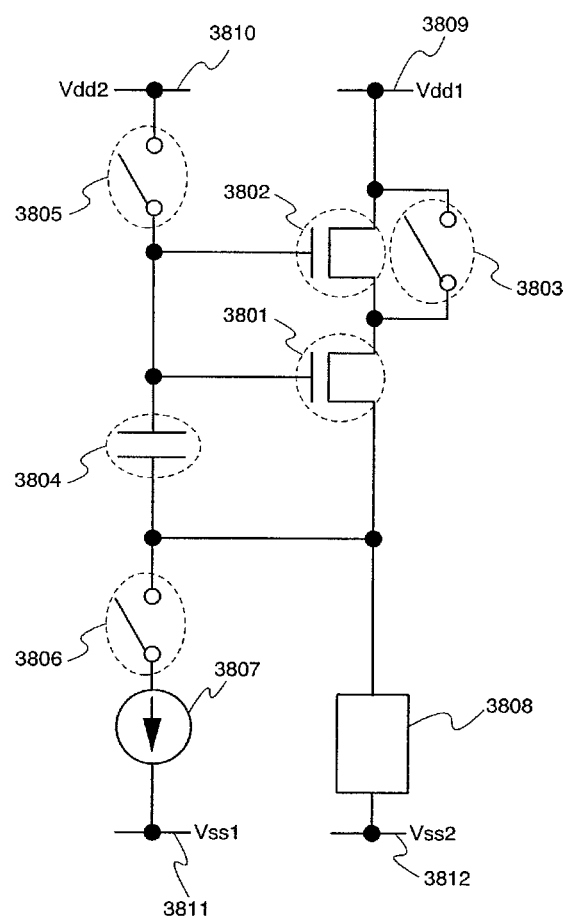
FIG. 38 is a circuit diagram showing an example of a circuit according to an aspect of the present invention.
Figure 39:
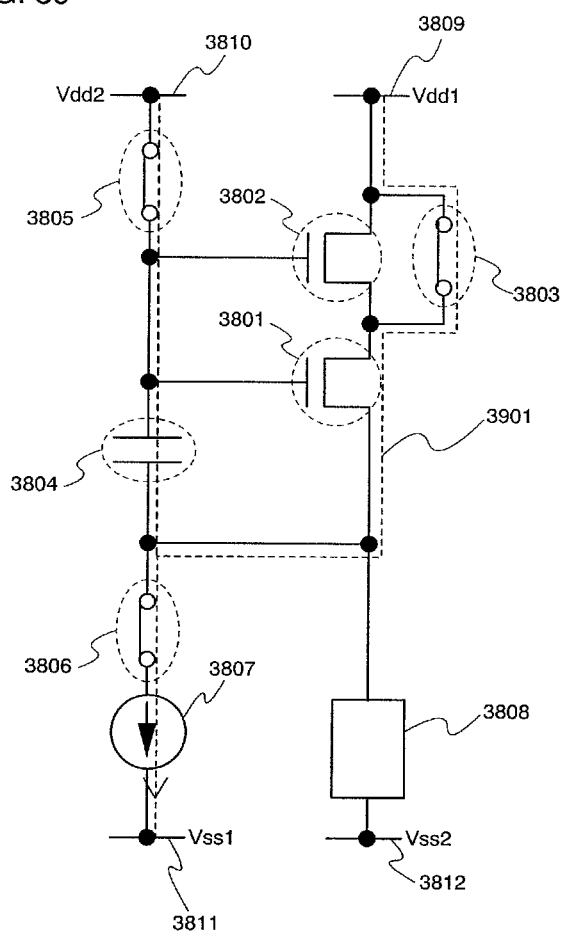
FIG. 39 is a circuit diagram showing an example of a circuit according to an aspect of the present invention.
Figure 40:
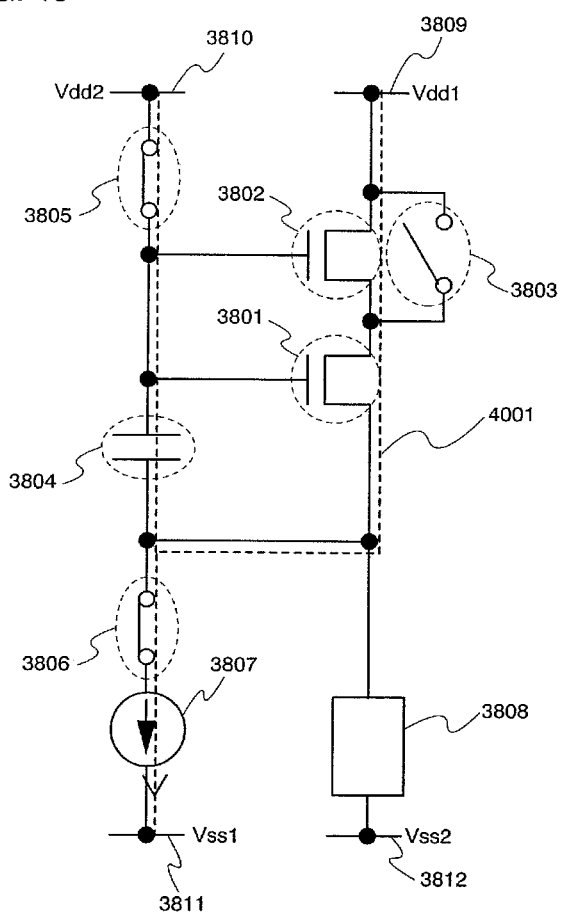
FIG. 40 is a circuit diagram showing an example of a circuit according to an aspect of the present invention.
Figure 41:
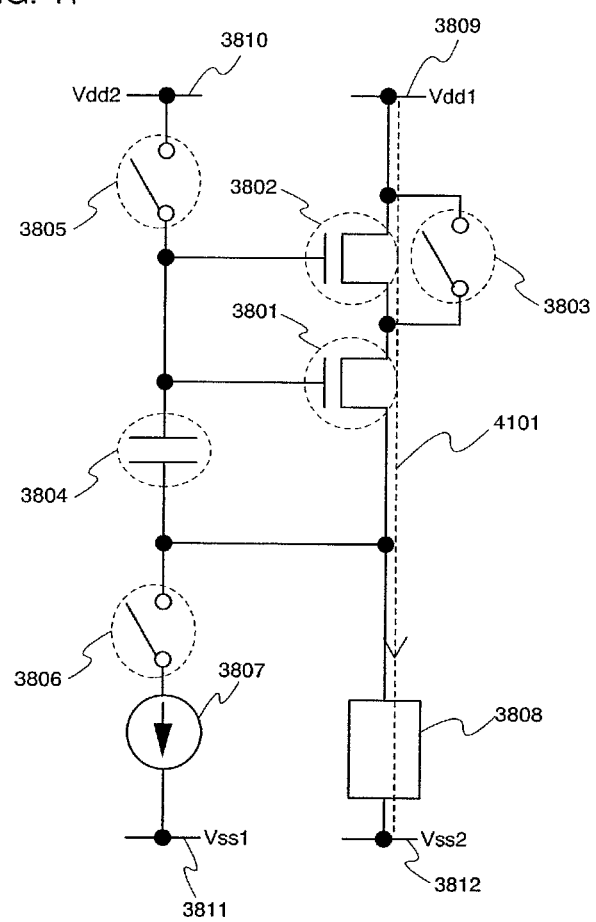
FIG. 41 is a circuit diagram showing an example of a circuit according to an aspect of the present invention.

Further, in FIG. 17, two current sources of the first current source 1707 and the second current source 1713 or two switches are used for controlling whether to supply each current in order to change the amount of current flowing at the precharge operation and the amount of current flowing at the set operation; however, the present invention is not limited to this. For example, as shown in FIG. 38, a current source 3807 only may be used for controlling. Alternatively, the current amount may be controlled without disposing a switch 3806. An operation in the configuration shown in FIG. 38 is shown in FIGS. 39 to 41 (arrows of broken lines 3901, 4001 and 4101 schematically show current paths). In this case, however, the current amount of the current source 3807 at the precharge operation (FIG. 39) and the set operation (FIG. 40) has a value corresponding to each operation and normally has different values.

Note that any element can be used for the load 3808, as long as it has a rectifying property. An element such as a resistor, a transistor, an EL element, other types of light-emitting elements, a current source circuit constituted by a transistor, a capacitor and a switch may be used. A signal line or a signal line and a pixel connected thereto may be used. The pixel may include any type of display element such as an EL element or an element used for an FED.

A gate capacitor of the current source transistor 3801 or the shift transistor 3802 may be substituted for the capacitor element 3804. In this case, the capacitor element 3804 can be omitted.

High potential side power sources Vdd1 and Vdd2 are supplied to the wires 1709 and 1710, respectively; however, it is not necessary that the same potentials are always kept. For example, there is no problem, when operation is done normally even when potentials are different at the signal writing operation and the output operation.

Alternatively, a potential Vdd2 to be supplied to the wire 1710 may be changed at each signal writing operation. In particular, when a current flowing to the current source transistor 1701 at the signal writing operation is large, a potential Vdd2 to be supplied to the wire 1710 is increased, thereby performing an operation normally without not dropping too much a potential Vss1 to be supplied to the wire 1711 connected to the current source 1707, which is preferable. Thus, even when a current flowing to the current source transistor 1701 in advance at a signal writing operation is large, the potential Vdd2 to be supplied to the wire 1710 is increased and thereby, it is not necessary to drop the potential Vss1 to be supplied to the wire 111 which is connected to the current source transistor 1707. Thus, even when the current flowing to the current source transistor 1701 is large, a margin can be given for setting the potential Vss1. Note that the potential Vdd2 to be supplied to the wire 1710 may be changed in response to an amount of current flowing to the current source transistor 1701 at the signal writing operation. For example, when the amount of current flowing to the current source transistor 1701 at the signal writing operation is large, the potential Vdd2 to be supplied to the wire 1710 is made high, and a margin of the potential Vss1 to be supplied to the wire 1711 is secured. On the other hand, when the amount of current flowing to the current source transistor 1701 at the signal writing operation is small, the potential Vdd2 to be supplied to the wire 1710 is made low, thereby preventing a current fro, flowing to the wire 1712 side, i.e., toward the load 1708 at the signal writing operation.

Low potential side power sources Vss1, Vss2 and Vss3 are supplied to the wires 1711, 1712 and 1715, respectively; however, it is not necessary that the same potentials are always kept. There is no problem, when operation is done normally even when potentials are different at the signal writing operation and the output operation.

It is to be noted that the capacitor element 3804 may be connected to a gate terminal and a source terminal of the current source transistor 3801. This is because the operation of a transistor is not easily influenced by other causes (influences such as voltage drop due to a wire resistance, etc.) as long as a voltage is maintained between the gate terminal and the source terminal since the operation of the transistor is determined by a gate-source voltage. Provided that the capacitor element 3804 is disposed between the gate terminal of the current source transistor 3801 and another wire, a potential of the gate terminal of the current source transistor 3801 may change depending on the value of voltage drop of the another wire.

Note that the current source transistor 3801 and the shift transistor 3802 operate as a multigate transistor at the current source operation, therefore, these transistors preferably have the same polarity (have the same conductivity).

Note that the current source transistor 3801 and the shift transistor 3802 operate as a multigate transistor at the current source operation, however, a gate width W of each transistor may be either the same or different. Similarly, a gate length L may be the same or different. However, the gate width W is preferably the same since the gate width W can be considered to be the same as a normal multigate transistor. As the gate length L of the shift transistor 3802 becomes longer, a current flowing at the set operation or output operation becomes smaller. Therefore, appropriate design may be carried out according to the circumstance.

Such switches as switches 3803, 3805, and 3806 may be any switch such as an electrical switch or a mechanical switch. It may be anything as long as it can control a flow of a current. It may be a transistor, a diode, or a logic circuit configured with them. Therefore, in a case of using a transistor as a switch, a polarity (conductivity) thereof is not particularly limited because it operates just as a switch. However, when off-current is preferred to be small, a transistor of a polarity with small off-current is preferably used. There is a transistor including an LDD region or the like, as a transistor with a small current. Further, it is desirable that an N-channel transistor is employed when a potential of a source terminal of the transistor serving as a switch is closer to the low potential side power source (Vss, GND, 0 V and the like), and a P-channel transistor is desirably employed when the potential of the source terminal is closer to the high potential side power source (Vdd and the like). This helps a transistor to easily serve as a switch as the absolute value of the gate-source voltage can be increased. It is also to be noted that a CMOS switch can also be applied by using both N-channel and P-channel transistors.

Note that FIGS. 17 and 38 etc., show circuits of this embodiment mode, however, the present invention is not limited to this configuration. By changing an arrangement and the number of switches, polarity of each transistor, the number and arrangement of the current source transistor 3801, the number and arrangement of the shift transistor 3802, a potential of each wire, a direction of current flow and the like, various circuits can be employed in the configuration. Further, by combining such changes, a configuration using various circuits can be achieved.

For example, such switches as switches 3803, 3805, and 3806 may be disposed anywhere as long as it can control ON/OFF of a target current. Specifically, the switch 3806 which controls a current flowing to the current source 3807 is preferably disposed to be in series. Further, the switch 3803 which controls a current flowing to the shift transistor 3802 is preferably in parallel to the shift transistor 3802. The switch 3805 is preferably disposed so as to control charges in the capacitor element 3804.

In this embodiment mode, the precharge operation is performed before the set operation. Therefore, the set operation can be performed quickly even with a small current value. Accordingly, an advantageous effect that an accurate current can be output at the output operation, can be obtained.

The content described in this embodiment mode corresponds to Embodiment Mode 1 of which content is partially modified. Therefore, the content described in Embodiment Mode 1 can be applied to this embodiment mode as well.

This embodiment mode can be freely combined with the other embodiment modes or examples in this specification.

Embodiment Mode 5

In Embodiment Mode 5, a configuration different from the analog circuits of the above embodiment modes will be described.

In Embodiment Mode 1, the configuration of FIG. 1 is employed for realizing the current source operation or the short circuit operation for the shift transistor 102. In this embodiment mode, an example of a configuration for realizing shifting between the current source operation and the short circuit operation, which is different from Embodiment Mode 1 is shown.

It should be noted that most of the description which is similar to Embodiment Mode 1 will be omitted here.

Figure 21:
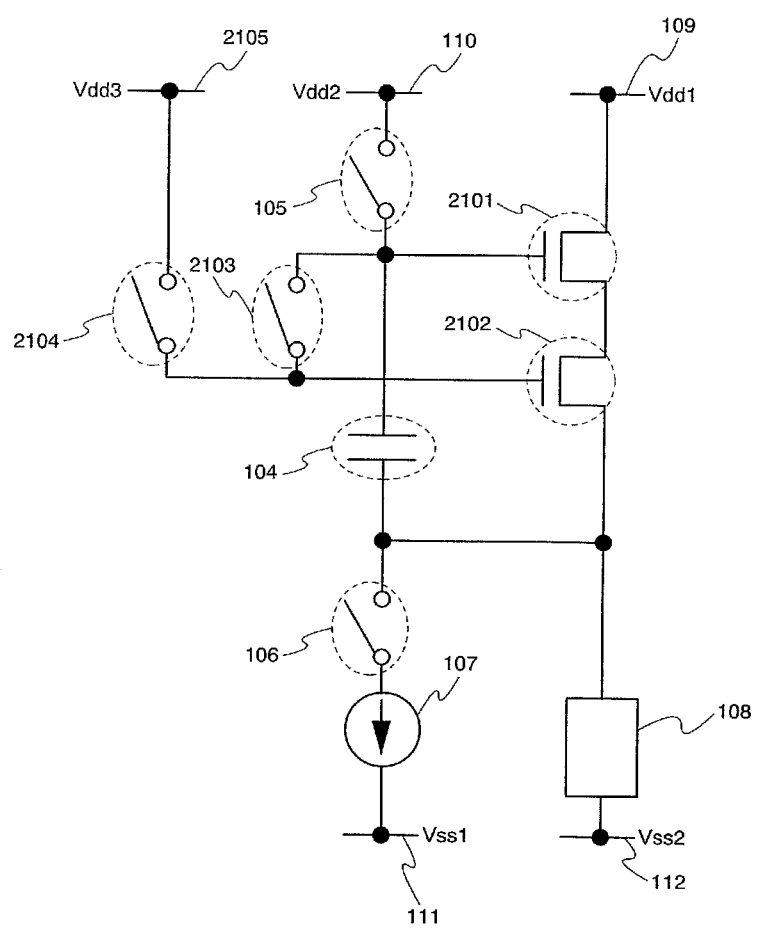
FIG. 21 is a circuit diagram showing an example of a circuit according to an aspect of the present invention.

First, FIG. 21 shows a configuration different from FIG. 1, in which the current source operation or the short circuit operation is realized for the shift transistor 102.

In FIG. 1, the switch 103 is used so that the shift transistor 102 can perform the short circuit operation. By controlling the switch 103, a current does not flow between the source and drain of the shift transistor 102, so that the source terminal and the drain terminal of the shift transistor 102 have approximately the same potentials.

On the contrary, a voltage of a gate terminal of a shift transistor 2102 is controlled so that a large current can flow to the shift transistor 2102 in FIG. 21. Specifically, an absolute value of a gate-source voltage of the shift transistor 2102 is made large by using a switch 2103. As a result, a small source-drain voltage of the shift transistor 2102 is required when a certain value of current flows. That is, the shift transistor 2102 operates as a switch.

In the current source operation, in FIG. 1, the switch 103 is turned OFF at the current source operation and the current source transistor 101 and the shift transistor 102 operate as a multigate transistor since the gate terminals thereof are connected to each other.

In FIG. 21, on the other hand, since gate terminals of the current source transistor 2101 and the shift transistor 2102 are not connected to each other, the gate terminals are made to be connected by using the switch 2103. As a result, they can operate as a multigate transistor. In FIG. 21, the current source transistor 2101 which operates as a current source (or a part of it) and the shift transistor 2102 of which operation changes depending on a state are provided, and the current source transistor 2101, the shift transistor 2102, and a wire 109 are connected in series. The gate of the current source transistor 2101 is connected to one terminal of a capacitor element 104. The other terminal of the capacitor element 104 is connected to a source of the current source transistor 2101 via the shift transistor 2102. Therefore, it is possible to hold a gate-source voltage of the current source transistor 2101. Further, the gate of the current source transistor 2101 is connected to the wire 110 via the switch 105, and the capacitor element 104 can be controlled to hold charges by ON/OFF of the switch 2103. The gate terminal of the shift transistor 2102 and a wire 2105 are connected to each other via a switch 2104. The shift transistor 2102 is controlled by ON/OFF of the switch 2104. The gates of the current source transistor 2101 and the shift transistor 2102 are connected via the switch 2103.

The first current source 107 connected to the wire 111 sets a current Ib1. Here, a potential input to the wire 109 is denoted by Vdd1, a potential input to the wire 110 is denoted by Vdd2, a potential input to the wire 2105 is denoted by Vdd3, a potential input into the wire 111 is denoted by Vss1, and a potential input into the wire 112 is denoted by Vss2. At that time, the relation of potentials satisfies Vdd3>Vdd1>Vdd2>Vss1, and Vdd3>Vdd1>Vss2>Vss1. The present invention is not limited to this; however, a potential which is as high as possible is preferable so that the shift transistor 2102 can have a higher current driving capability at the short circuit operation.

The relation between Vdd2, the potential input to the wire 110 and Vss1, the potential input to the wire 111, may be the same or different. In a case where Vdd2 is a different potential from Vss1, Vdd2 may be set higher than Vss1 by a threshold voltage of the current source transistor, by a threshold voltage applied to the load, or by a sum of the threshold voltage of the current source transistor and the threshold voltage applied to the load.

Figure 22:
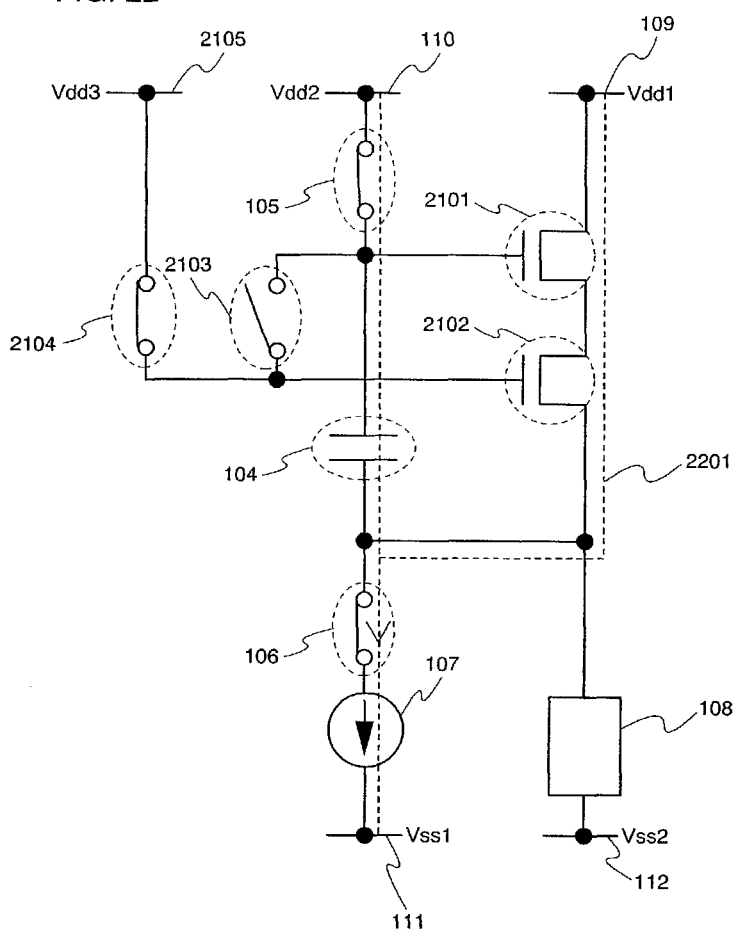
FIG. 22 is a circuit diagram showing an example of a circuit according to an aspect of the present invention.

An operation of FIG. 21 is described. First, the switches 2104, 105 and 106 are turned ON and the switch 2103 is turned OFF as shown in FIG. 22. A current path at that time is shown by a broken line with an arrow 2201. Then, the gate terminal of the shift transistor 2102 is connected to the wire 2105. The wire 2105 is supplied with a power supply on the high potential side (Vdd2), therefore, an absolute value of the gate-source voltage of the shift transistor 2102 becomes quite large. Thus, the shift transistor 2102 has quite a large current driving capability and the source and the drain thereof have approximately the same potentials. Therefore, a current Ib flowing in the current source 107 flows to the capacitor element 104 or the current source transistor 2101, thereby the source of the current source transistor 2101 has approximately the same potential as the wire 111. When a current flowing between the source and drain of the current source transistor 2101 and the current Ib flowing in the current source 107 become equal, no currents flow to the capacitor element 104. That is, a steady state is obtained. Then, a potential of the gate at the steady state is accumulated in the capacitor element 104. That is, a voltage required to allow the current Ib to flow between the source and drain of the current source transistor 2101 is applied to the gate terminal thereof. The aforementioned operation corresponds to the set operation. At the set operation, the shift transistor 2102 operates as a switch and performs the short circuit operation.

Note that almost no current flows to the load 108 because of a source potential of the current source transistor 2101, Vss2, a potential of the wire 112, and voltage-current characteristics of the load 108. The source potential of the current source transistor 2101 can be controlled by a gate potential of the current source transistor 2101, i.e., the potential Vdd2 of the wire 110. Thus, it is possible that the potential Vdd2 of the wire 110 is controlled to stop current supply to the load 108.

Figure 23:
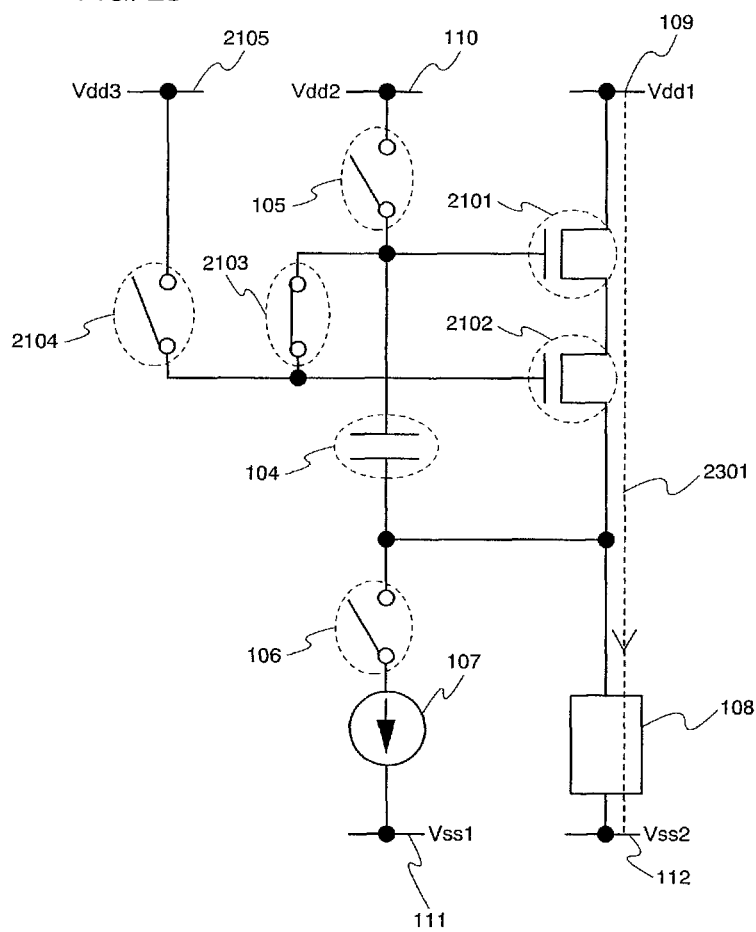
FIG. 23 is a circuit diagram showing an example of a circuit according to an aspect of the present invention.

Next, as shown in FIG. 23, the switches 2104, 105 and 106 are turned OFF, and the switch 2103 is turned ON. A current path at that time is schematically shown by a broken line with an arrow 2301. Thus, the gate of the shift transistor 2102 is connected to the gate of the current source transistor 2101. On the other hand, the charges accumulated at the set operation are held in the capacitor element 104, and the charges are applied to the gate terminals of the current source transistor 2101 and the shift transistor 2102. As described above, the current source transistor 2101 and the shift transistor 2102 serve together as a multigate transistor. Therefore, when the current source transistor 2101 and the shift transistor 2102 are regarded as one transistor, a gate length L of the transistor is longer than the L of the current source transistor 2101. Therefore, the current flowing to the load 108 becomes smaller than Ib. The above operation corresponds to an output operation. At the time of the output operation, the shift transistor 2102 conducts the current source operation.

Note that FIG. 21 is shown as a circuit of this embodiment mode; however, the present invention is not limited to this configuration. As in Embodiment Mode 1, by changing an arrangement and the number of switches, polarity of each transistor, the number and arrangement of the current source transistor 2101, the number and arrangement of the shift transistor 2102, a potential of each wire, a direction of current flow and the like, various circuits can be employed in the configuration. Further, by combining such changes, a configuration using various circuits can be achieved.

Figure 24:
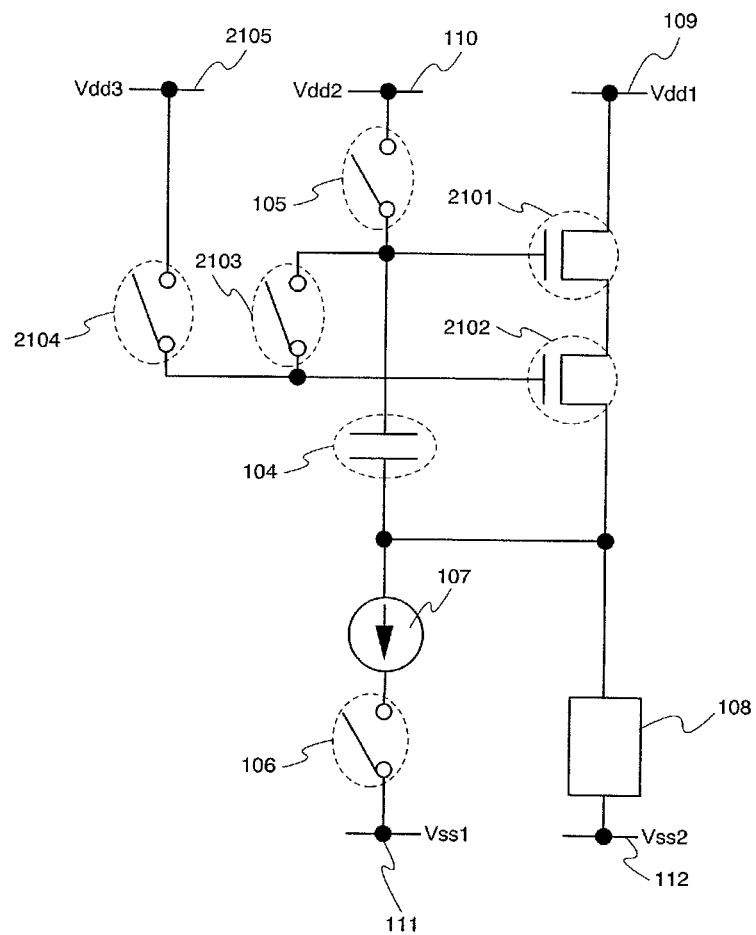
FIG. 24 is a circuit diagram showing an example of a circuit according to an aspect of the present invention.
Figure 25:
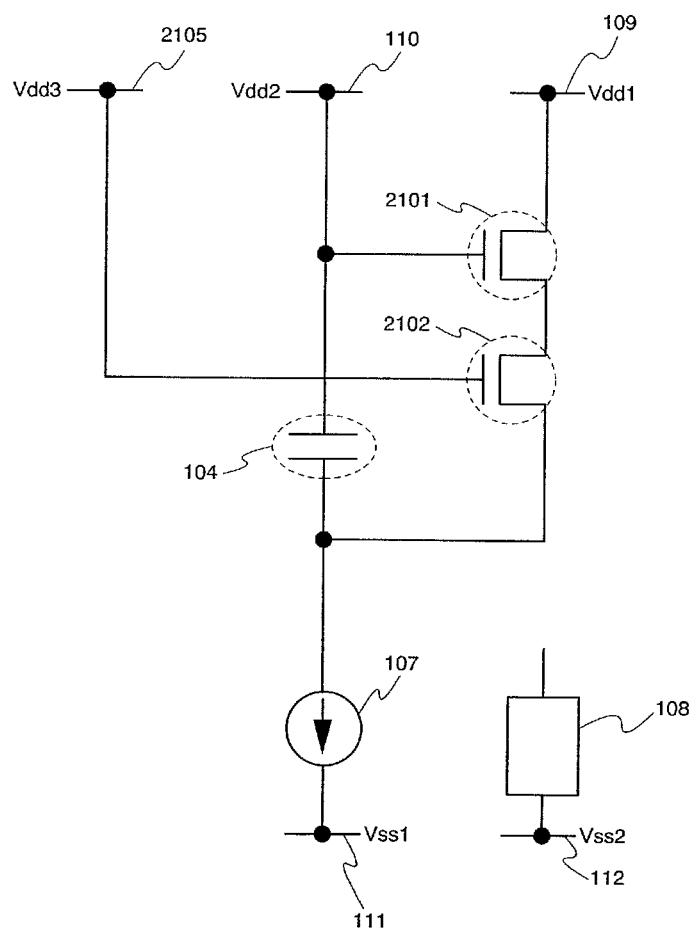
FIG. 25 is a circuit diagram showing an example of a circuit according to an aspect of the present invention.
Figure 26:
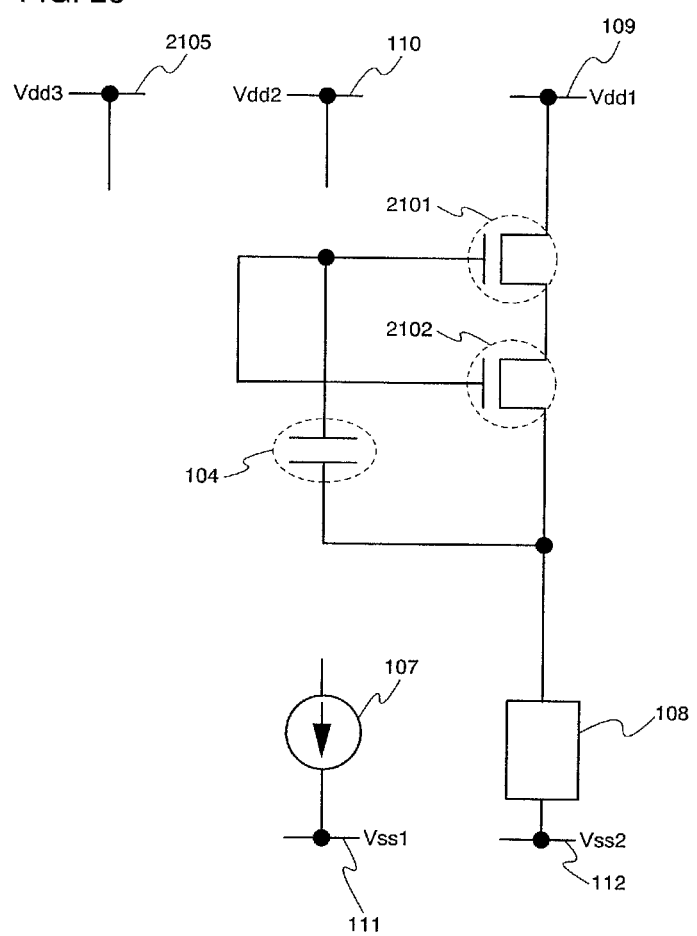
FIG. 26 is a circuit diagram showing an example of a circuit according to an aspect of the present invention.

FIG. 24 shows an example in a case where the switch 106 is disposed differently. Switches such as switches 105, 106, 2103 and 2104 may be arranged anywhere, as long as it is configured as described below. That is, the switch 106 is connected as shown in FIG. 25 at the signal writing operation in which the current Ib flowing from the current source 107 flows to the current source transistor 2101 and the shift transistor 2102 performs a short circuit operation. At the output operation, the switch 106 is connected as shown in FIG. 26 in which the shift transistor 2102 performs a current source operation and a current flowing to the shift transistor 2102 and the current source transistor 2101 flows to the load 108.

Figure 27:
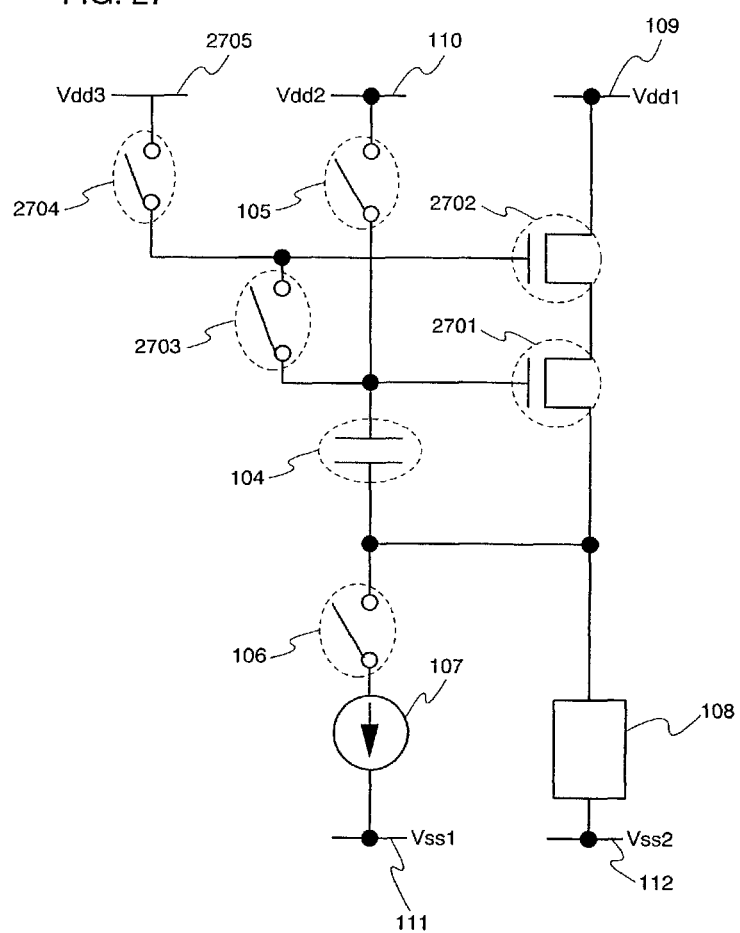
FIG. 27 is a circuit diagram showing an example of a circuit according to an aspect of the present invention.

Further, FIG. 27 shows a case where dispositions of the current source transistor 2101 and the shift transistor 2102 are interchanged. In FIG. 27, the wire 109, the shift transistor 2702, and the current source transistor 2701 are disposed in this order.

Figure 28:
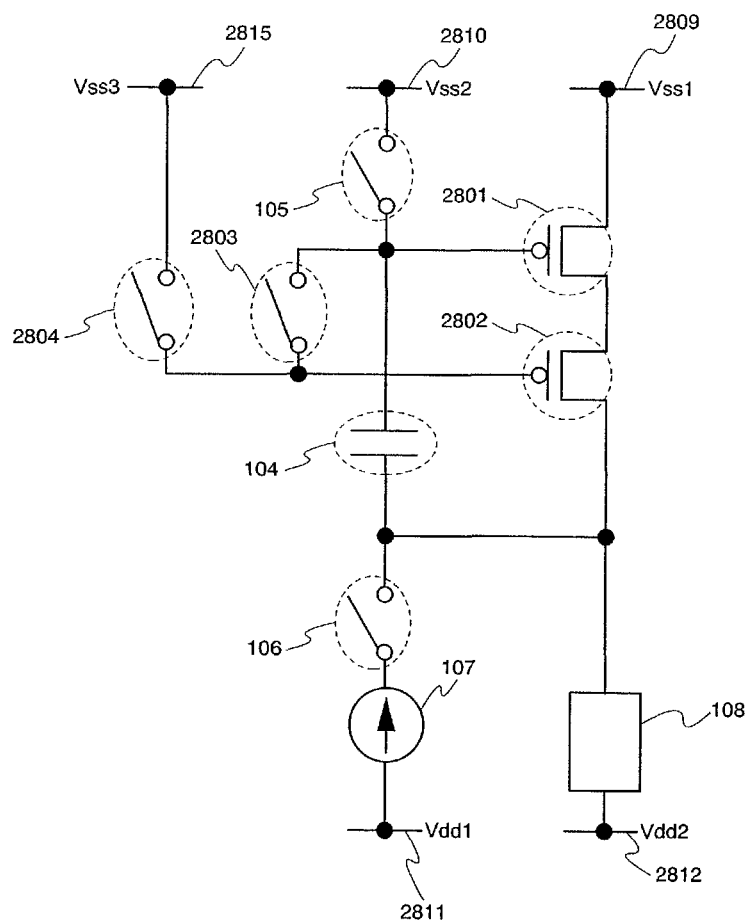
FIG. 28 is a circuit diagram showing an example of a circuit according to an aspect of the present invention.

FIG. 28 shows an example where the polarity (conductivity) of the current source transistor 2101 and the shift transistor 2102 are changed and the connection structure of the circuit is not changed in FIG. 21. When FIG. 21 and FIG. 28 are compared, it is apparent that the change is easily done by changing potentials of the wires 109, 110, 111, 112 and 2105 to the ones of wires 2809, 2810, 2811, 2812 and 2815 and changing the direction of current of the current source 107.

A current source 2807 connected to the wire 2811 sets a current Ib. Here, a potential input to the wire 2809 is denoted by Vss1, a potential input to the wire 2810 is denoted by Vss2, a potential input to the wire 2815 is denoted by Vss3, a potential input into the wire 2811 is denoted by Vdd1, and a potential input into the wire 2812 is denoted by Vdd2. At that time, the relation of potentials at least satisfies Vss3<Vss1<Vss2<Vdd1, and Vss3<Vss1<Vdd2<Vdd1.

The relation between Vss2, the potential input to the wire 2810 and Vdd1, the potential input to the wire 2811, may be the same or different. In a case where Vdd2 is a different potential from Vss2, Vss2 may be set higher than Vdd2 by a threshold voltage of the current source transistor, or by a threshold voltage when applied to the load, or by a sum of the threshold voltage of the current source transistor and the threshold voltage when applied to the load.

Figure 29:
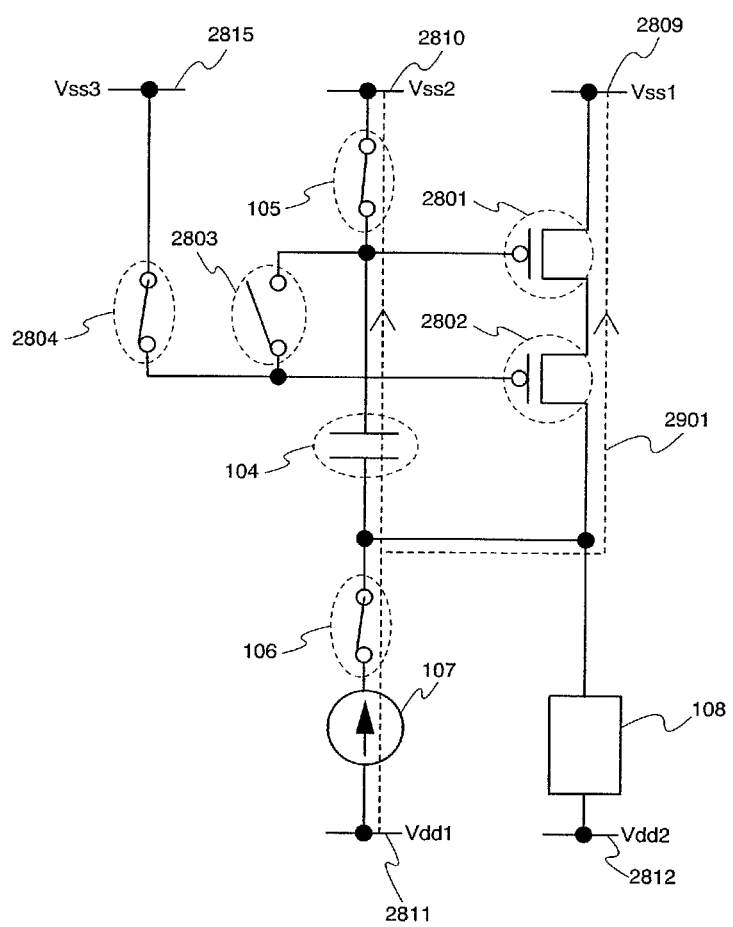
FIG. 29 is a circuit diagram showing an example of a circuit according to an aspect of the present invention.
Figure 30:
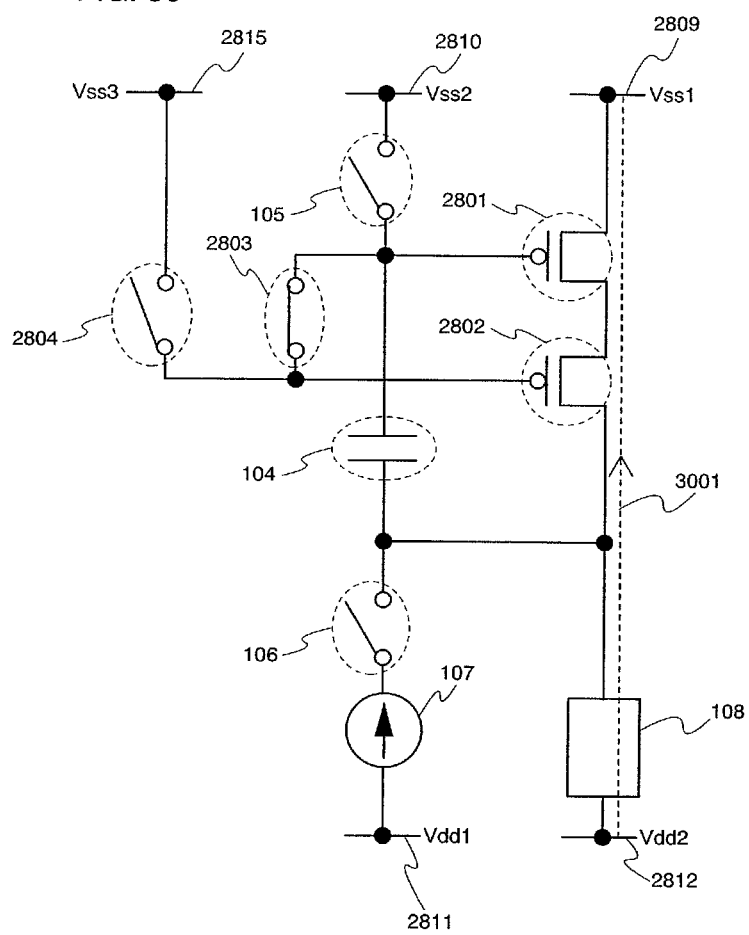
FIG. 30 is a circuit diagram showing an example of a circuit according to an aspect of the present invention.

In addition, FIG. 29 shows ON/OFF of a switch at the set operation in FIG. 28 and a current path represented by a broken line with an arrow 2901, and FIG. 30 shows ON/OFF of each switch at the output operation in FIG. 28 and a current path represented by a broken line with an arrow 3001.

In this manner, by changing an arrangement and the number of switches, polarity of each transistor, the number and arrangement of the current source transistor, the number and arrangement of the shift transistor, a potential of each wire, a direction of current flow and the like, not only the circuit of FIG. 21 but also various circuits can be employed for constituting the present invention. Further, by combining such changes, the present invention can be constituted by using further various circuits.

The content described in this embodiment mode corresponds to Embodiment Mode 1 of which content is partially modified. Therefore, the content described in Embodiment Mode 1 can be applied to this embodiment mode as well.

This embodiment mode can be freely combined with the other embodiment modes or examples in this specification.

Embodiment Mode 6

In Embodiment Mode 6, a configuration different from the analog circuit of the above embodiment mode will be described.

Figure 31:
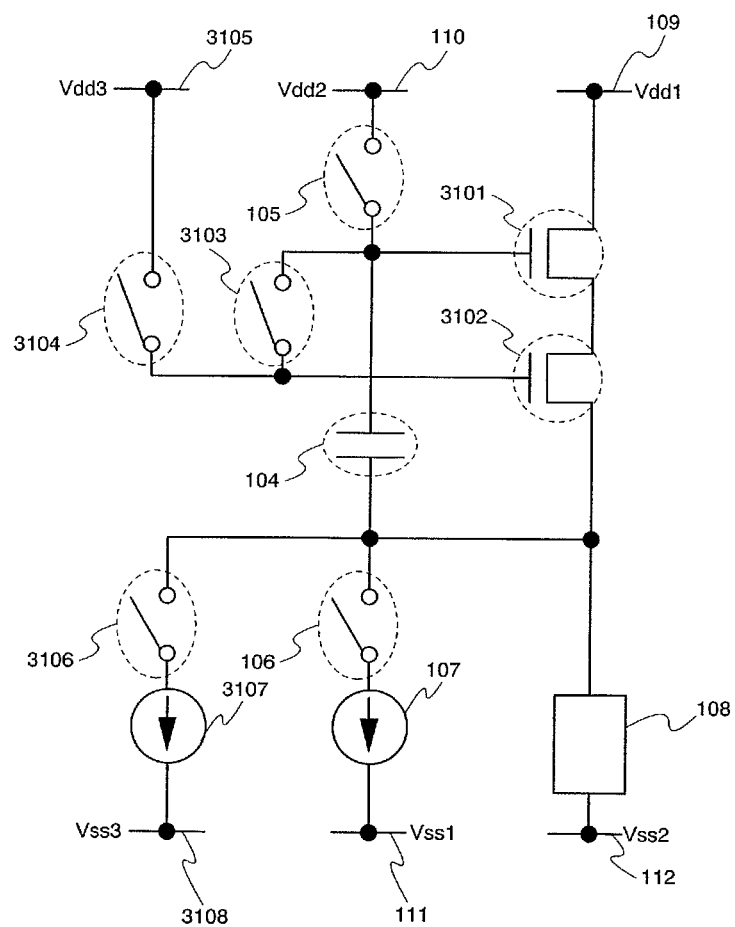
FIG. 31 is a circuit diagram showing an example of a circuit according to an aspect of the present invention.

FIG. 31 shows a configuration in which the shift transistor 102 has a different configuration from the one at the current source operation or short circuit operation of FIG. 1, and which can conduct a precharge operation described in Embodiment Mode 4.

The current source circuit shown in FIG. 31 controls a voltage of a gate terminal of a shift transistor 3102 and allows a large current to flow to the shift transistor 3102. Specifically, an absolute value of a gate-source voltage of the shift transistor 3102 is made large by using a switch 3103. As a result, only a small source-drain voltage of the shift transistor 3102 is required when a certain value of current flows. That is, the shift transistor 3102 operates just as a switch. In the configuration shown in FIG. 31, a current source transistor 3101 which constantly operates as a current source (or a part of it) and the shift transistor 3102 of which operation changes depending on a state are provided, and the current source transistor 3101, the shift transistor 3102, and the wire 109 are connected in series. A gate of the current source transistor 3101 is connected to one terminal of the capacitor element 104. The other terminal of the capacitor element 104 is connected to a source of the current source transistor 3101 via the shift transistor 3102. Therefore, it is possible to hold a gate-source voltage of the current source transistor 3101. Further, the gate and a drain of the current source transistor 3101 are connected to each other via the switch 3103 and the capacitor element 104 can be controlled to hold charges by ON/OFF of the switch 3103.

In FIG. 31, since the gates of the current source transistor 3101 and the shift transistor 3102 are not connected to each other, the switch 3103 is used so as to connect the gates. As a result, the current source transistor 3101 and the shift transistor 3102 serve together as a multigate transistor.

The first current source 107 connected to the wire 111 sets a current Ib1 and the second current source 3107 connected to the wire 3108 sets a current Ib2. Here, a potential input to the wire 109 is denoted by Vdd1, a potential input to the wire 110 is denoted by Vdd2, a potential input into the wire 3105 is denoted by Vdd3, a potential input into the wire 111 is denoted by Vss1, a potential input into the wire 112 is denoted by Vss2, a potential input into the wire 3108 is denoted by Vss3. At that time, the relation of potentials at least satisfies Vdd3>Vdd1>Vdd2>Vss1>Vss3, and Vdd3>Vdd1>Vss2>Vss1>Vss3. The present invention is not limited to this; however, a potential which is as high as possible is preferable so that the shift transistor 3102 can have a higher current driving capability at the short circuit operation.

The relation between Vdd2, the potential input to the wire 110 and Vss1, the potential input to the wire 111, may be the same or different. In a case where Vdd2 is a different potential from Vss1, Vdd2 may be set higher than Vss1 by a threshold voltage of the current source transistor, by a threshold voltage applied to the load, or by a sum of the threshold voltage of the current source transistor and the threshold voltage applied to the load.

Figure 32:
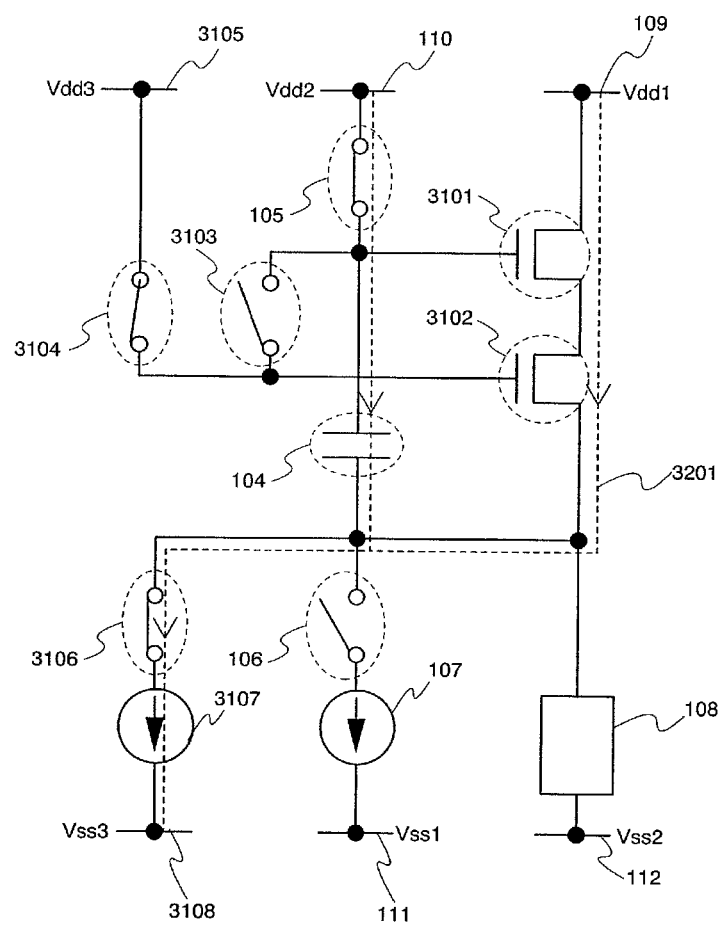
FIG. 32 is a circuit diagram showing an example of a circuit according to an aspect of the present invention.

An operation of the current source circuit shown in FIG. 31 is described. First, switches 3104, 105 and 3106 are turned ON and the switches 3103 and 106 are turned OFF as shown in FIG. 32. Then, the gate terminal of the shift transistor 3102 is connected to the wire 3105. The wire 3105 is supplied with a power supply on the high potential side (Vdd), therefore, an absolute value of the gate-source voltage of the shift transistor 3102 becomes quite large. Thus, the shift transistor 3102 has quite a high current driving capability and the source terminal and the drain terminal thereof have approximately the same potentials. Therefore, a current Ib2 flowing in the second current source 3107 flows to the capacitor element 104 or the current source transistor 3101, thereby the source terminal of the current source transistor 3101 has approximately the same potential as the wire 3108. A current path at that time is shown schematically by a broken line with an arrow 3201. When a current flowing between the source and drain of the current source transistor 3101 and the current Ib2 flowing in the second current source 3107 become equal, no current flows to the capacitor element 104. That is, a steady state is obtained. Then, a potential of the gate terminal at that time is accumulated in the capacitor element 104. That is, a voltage required to allow the current Ib2 to flow between the source and drain of the current source transistor 3101 is applied to the gate terminal thereof. The aforementioned operation corresponds to the precharge operation. At the precharge operation, the shift transistor 3102 operates as a switch and performs the short circuit operation.

Note that almost no current flows to the load 108 because of a source potential of the current source transistor 3101, Vss2, a potential of the wire 112, and current-voltage characteristics of the load 108. The source potential of the current source transistor 3101 can be controlled by a gate potential of the current source transistor 3101, i.e., the potential Vdd2 of the wire 110. Thus, it is possible that the potential Vdd2 of the wire 110 is controlled to stop current supply to the load 108.

Figure 33:
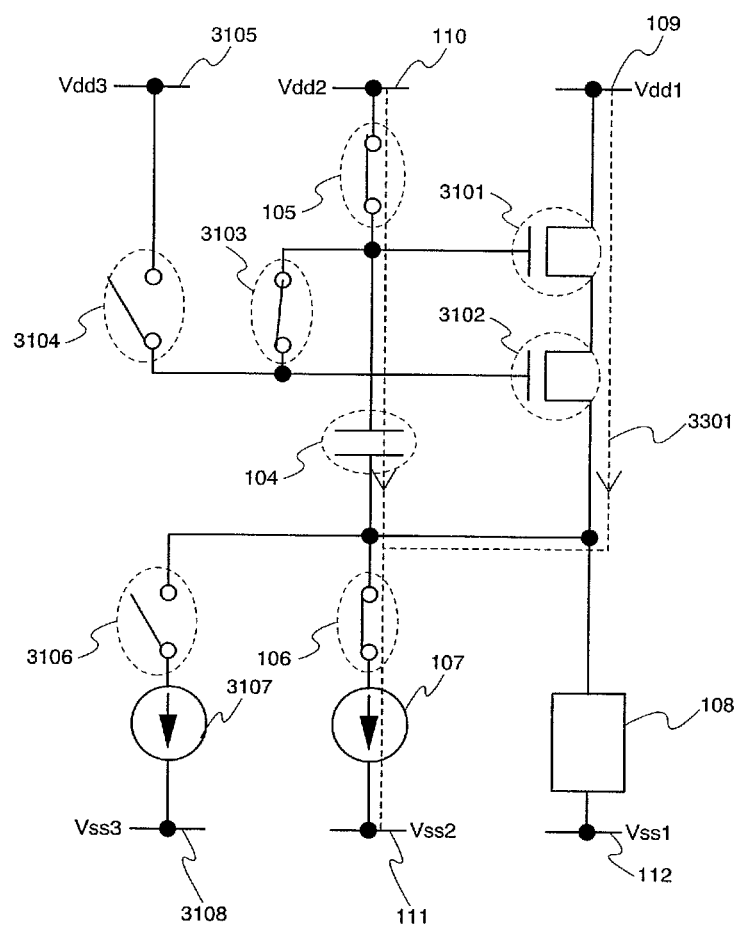
FIG. 33 is a circuit diagram showing an example of a circuit according to an aspect of the present invention.

Next, as shown in FIG. 33, the switches 3104 and 3106 are turned OFF, and the switches 105, 106 and 3103 are turned ON. Then, the gate terminals of the shift transistor 3102 and the current source transistor 3101 are connected to each other.

A current path at that time is schematically shown by a broken line with an arrow 3301. As described above, the current source transistor 3101 and the shift transistor 3102 serve together as a multigate transistor. Therefore, when the current source transistor 3101 and the shift transistor 3102 are regarded as one transistor, a gate length L of the transistor is longer than the gate length L of the current source transistor 3101. When the current flowing between a source and a drain of the multigate transistor including the current source transistor 3101 and the shift transistor 3102 becomes equal to the current Ib1 flowing to the first current source 107, no current flows to the capacitor element 104. In other words, a steady state is obtained. Potentials of the gate terminal at that time is accumulated in the capacitor element 104. The above operation corresponds to a set operation. At the time of the set operation, the shift transistor 3102 conducts the current source operation.

Figure 34:
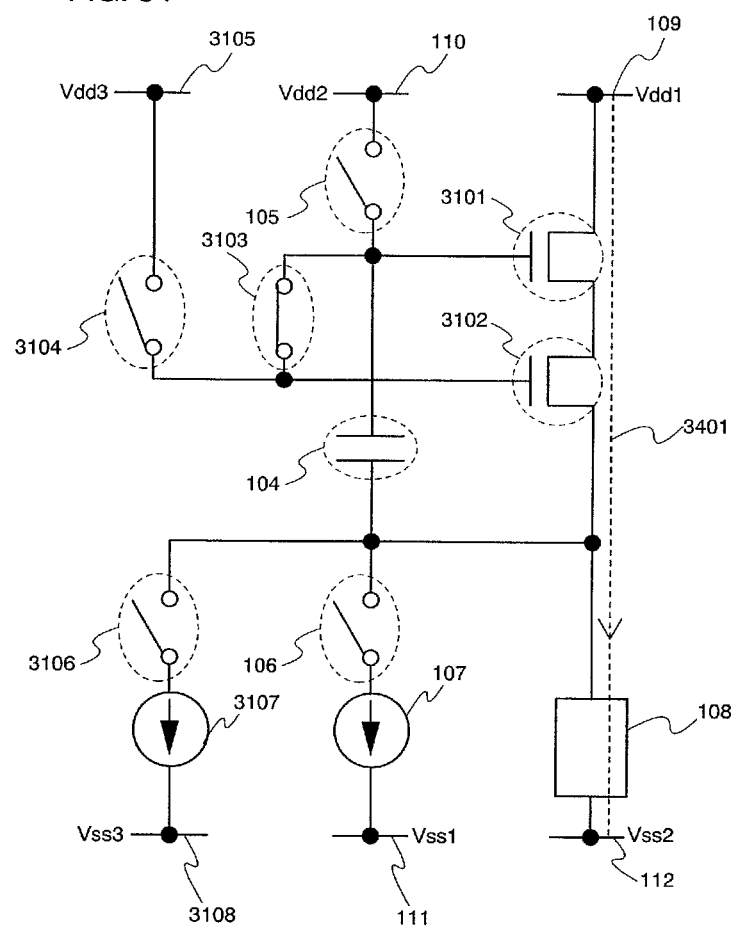
FIG. 34 is a circuit diagram showing an example of a circuit according to an aspect of the present invention.

Next, as shown in FIG. 34, the switches 105, 106, 3104 and 3106 are turned OFF, and the switch 3103 is turned ON. On the other hand, the charges accumulated at the set operation are held in the capacitor element 104, and the charges are applied to the gate terminals of the current source transistor 3101 and the shift transistor 3102. As described above, the current Ib1 flows to the load 108. A current path at that time is schematically shown by a broken line with an arrow 3401. The above operation corresponds to an output operation.

In this embodiment mode, the current source circuit shown in FIG. 31 is described; however, the present invention is not limited to this configuration, and various modifications are possible unless departing the spirit of the present invention. For example, as shown in Embodiment Mode 1, by changing an arrangement and the number of switches, polarity of each transistor, the number and arrangement of the current source transistor 3101, the number and the arrangement of the current source, the number and arrangement of the shift transistor, a potential of each wire, whether another precharge method is combined or not, a direction of current flow and the like, various circuits can be employed in the configuration. Further, by combining such changes, a configuration using various circuits can be achieved.

Figure 35:
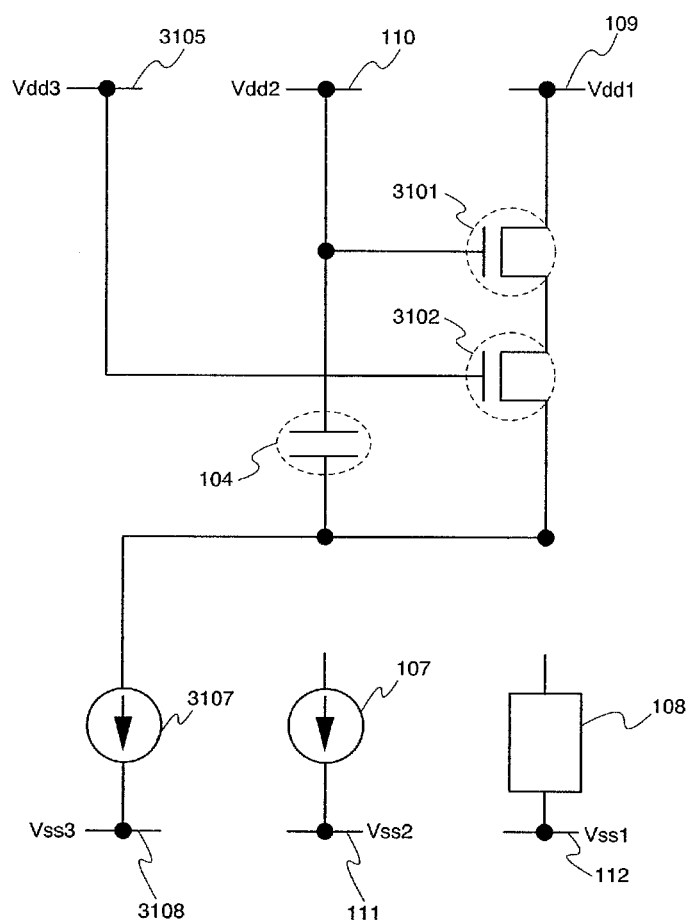
FIG. 35 is a circuit diagram showing an example of a circuit according to an aspect of the present invention.
Figure 36:
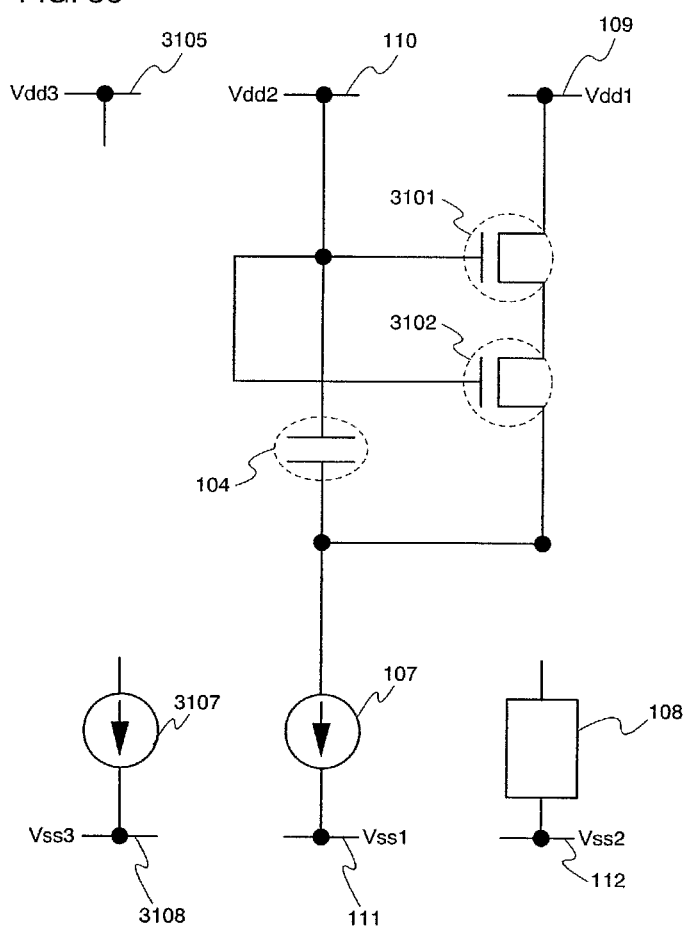
FIG. 36 is a circuit diagram showing an example of a circuit according to an aspect of the present invention.
Figure 37:
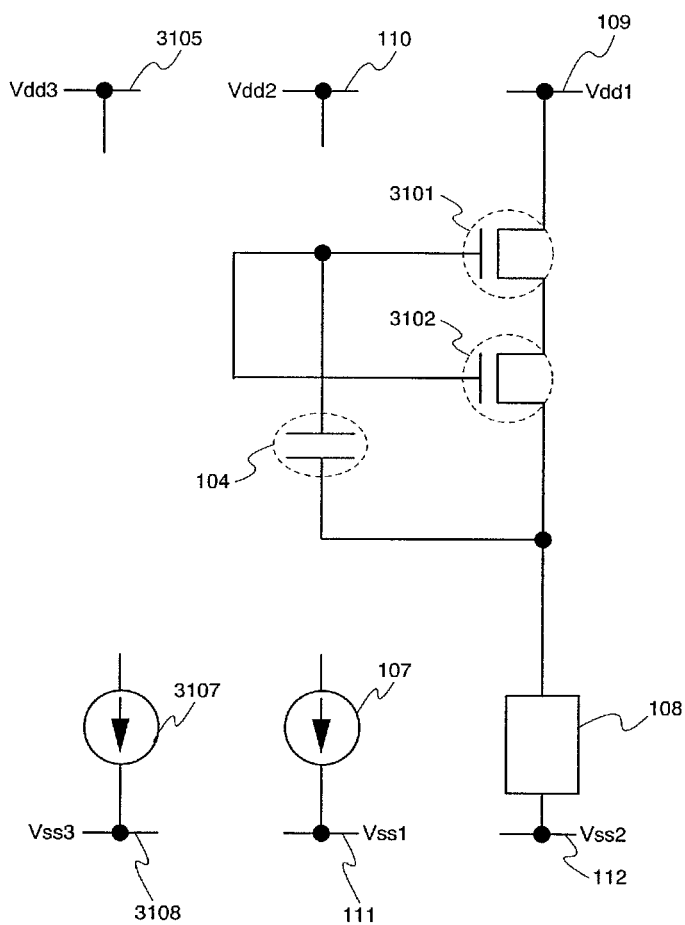
FIG. 37 is a circuit diagram showing an example of a circuit according to an aspect of the present invention.

For example, each switch may be disposed anywhere, as long as the design is set so that at the precharge operation, connection is made as shown in FIG. 35, and at the set operation, connection is made as shown in FIG. 36, and at the output operation, connection is made as shown in FIG. 37.

The content described in this embodiment mode corresponds to Embodiment Mode 1 of which content is partially modified. Therefore, the content described in Embodiment Mode 1 can be applied to this embodiment mode as well.

This embodiment mode can be freely combined with the other embodiment modes or examples in this specification.

EXAMPLES

Example 1

In Example 1, configurations of a display device and a signal line driver circuit and the like are described. A semiconductor device of the present invention can be applied to a portion of the signal line driver circuit.

Figure 42:
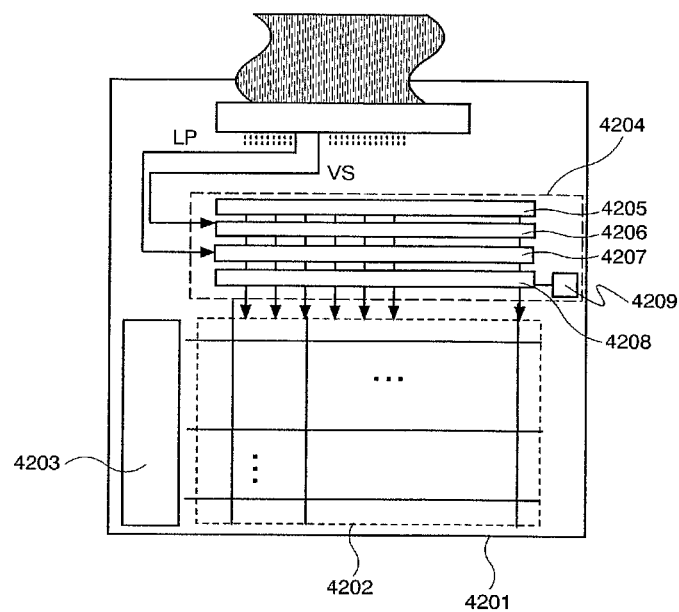
FIG. 42 is a schematic diagram of a display device including a circuit according to an aspect of the present invention.

As shown FIG. 42, a display device 4201 to which the present invention can be applied, includes a pixel region 4202, a gate line driver circuit 4203, and a signal line driver circuit 4204. The gate line driver circuit 4203 sequentially outputs a select signal to the pixel region 4202. The signal line driver circuit 4204 sequentially outputs a video signal to the pixel region 4202. In the pixel region 4202, an image is displayed by controlling the state of light in response to a video signal. The video signal input from the signal line driver circuit 4204 to the pixel region 4202 is a current. That is, a display element and an element for controlling the display element arranged in each pixel change their states according to the video signal (current) input from the signal line driver circuit 4204. Examples of the display element disposed in the pixel include an EL element, an element used in an FED (Field Emission Display) or the like.

Note that a plurality of the gate line driver circuits 4203 and the signal line driver circuits 4204 may be disposed.

A configuration of the signal line driver circuit 4204 can be divided into a plurality of portions. As an example, it can be roughly divided into a shift register 4205, a first latch circuit (LAT1) 4206, a second latch circuit (LAT2) 4207, and a digital-analog converter circuit 4208. The digital-analog converter circuit 4208 comprises a function to convert a voltage into a current, and it may also comprise a function to provide a gamma correction. That is, the digital-analog converter circuit 4208 comprises a circuit for outputting a current (a video signal) to the pixel, that is, a current source circuit to which the present invention can be applied.

Further, the pixel includes a display element such as an EL element. A circuit for outputting a current (a video signal) to the display element, that is, a current source circuit is provided as well, to which the present invention can also be applied.

An operation of the signal line driver circuit 4204 is described briefly. The shift register 4205 is formed by using a plurality of columns of flip-flop circuits (FF) or the like and input with a clock signal (S-CLK), a start pulse (SP), and an inverted clock signal (S-CLKb). Sampling pulses are output in response to the timing of these signals.

The sampling pulses output from the shift register 4205 are input to the first latch circuit (LAT1) 4206. The first latch circuit (LAT1) 4206 is input with a video signal (VS) from the video signal line and holds a video signal in each column in response to the timing at which the sampling pulses are input. In a case where the digital-analog converter circuit 4208 is disposed, the video signal has a digital value. Further, the video signal in this phase is a voltage in many cases.

However, in a case where the first latch circuit 4206 and the second latch circuit 4207 are circuits which can store analog values, the digital-analog converter circuit 4208 can be omitted in many cases. The video signal is frequently a current in that case. Further, in a case where data output to the pixel region 4202 has a binary value, that is a digital value, the digital-analog converter circuit 4208 can be omitted in many cases.

When the retainment of the video signals up to the last column is completed in the first latch circuit (LAT1) 4207, a latch pulse LP is input from a latch control line in a horizontal retrace period and the video signals held in the first latch circuit (LAT1) 4206 are transferred to the second latch circuit (LAT2) 4207 all at once. After that, the video signals held in the second latch circuit (LAT2) 4207 for one row are input to the digital-analog converter circuit 4208 at a time. Then, a signal output from the digital-analog converter circuit 4208 is input to the pixel region 4202.

While the video signal held in the second latch circuit (LAT2) 4207 is input to the digital-analog converter circuit 4208 and input to the pixel region 4202, a sampling pulse is output from the shift register 4205 again. That is, two operations are performed at the same time. Thus, a line sequential drive can be performed. This operation is repeated hereafter.

Provided that a current source circuit in the digital-analog converter circuit 4208 is a circuit which performs the set operation and the output operation, a circuit to supply a current to the current source circuit is required. In that case, a reference current source circuit 4209 is disposed.

In some cases, the signal line driver circuit or a part of it is not over the same substrate as the pixel region 4202, but formed by using an external IC chip, for example. In that case, the IC chip and the substrate are connected by using COG (Chip On Glass), TAB (Tape Auto Bonding), a printed substrate or the like.

Note that a configuration of the signal line driver circuit or the like is not limited to FIG. 42.

Figure 43:
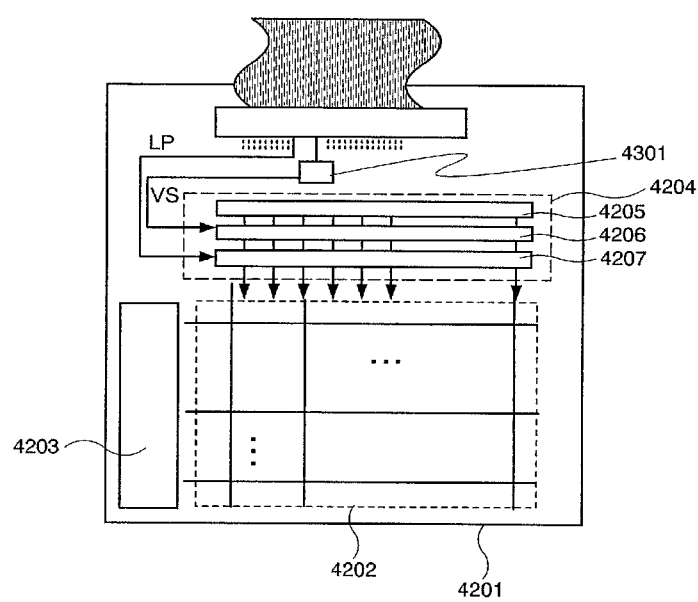
FIG. 43 is a schematic diagram of a display device including a circuit according to an aspect of the present invention.

For example, in a case where the first latch circuit 4206 and the second latch circuit 4207 can store analog values, a video signal VS (analog current) is input to the first latch circuit (LAT1) 4206 from a reference current source circuit 4301 as shown in FIG. 43 in some cases. Also, the second latch circuit 4207 is not provided in FIG. 42 in some cases.

This example can be freely combined with the other embodiment modes or examples in this specification.

Example 2

A specific configuration of the signal line driver circuit 4204 described in Example 1 is described now.

Figure 44:
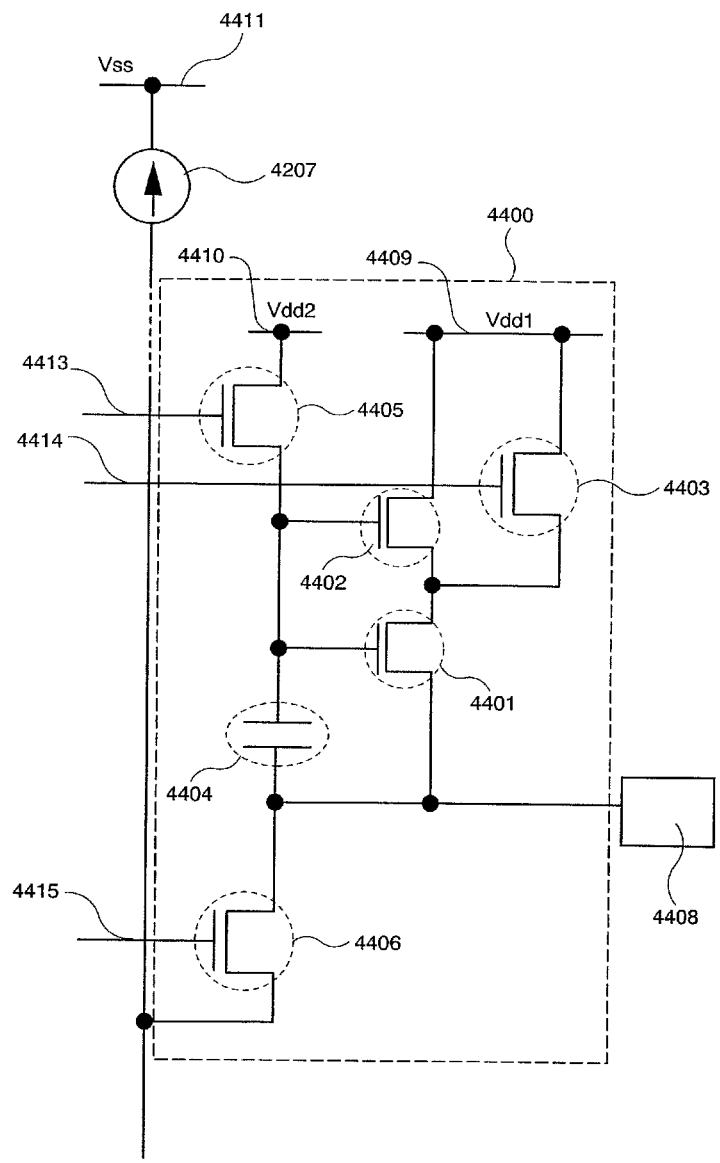
FIG. 44 is a circuit diagram showing an example of a circuit according to an aspect of the present invention.

First, FIG. 44 shows an example in the case of applying the present invention to a signal line driver circuit. A configuration of FIG. 44 includes a current source transistor 4401, a shift transistor 4402, a switching transistor 4403, a switching transistor 4405, a switching transistor 4406, a capacitor element 4404, a current source 4407, a load 4408, and wires 4409, 4410 and 4411, and each element is connected in the same way as FIG. 1. A current source circuit 4400 switches between the set operation and the output operation, and between the short circuit operation and the current source operation by wires 4413, 4414 and 4415. A current is input from the current source 4407 at the set operation. At the output operation, a current is output from the current source circuit 4400 toward the load 4408.

First, a case of FIG. 42 is described. A current source in the reference current source circuit 4209 corresponds to the current source 4407 in FIG. 44. The load 4408 in FIG. 44 corresponds to a switch, a signal line, or a pixel connected to the signal line. A constant current is output from the current source 4407. In the configuration of FIG. 44, the output operation cannot be performed at the same time with the set operation. Therefore, when the output operation and the set operation are required to be performed at the same time, it is preferable to provide two or more current source circuits and switch them. That is, the set operation is performed by one current source circuit while the output operation is performed by the other current source circuit at the same time, and this is shifted at an arbitrary cycle. Thus, the set operation and the output operation can be performed at the same time.

Figure 45:
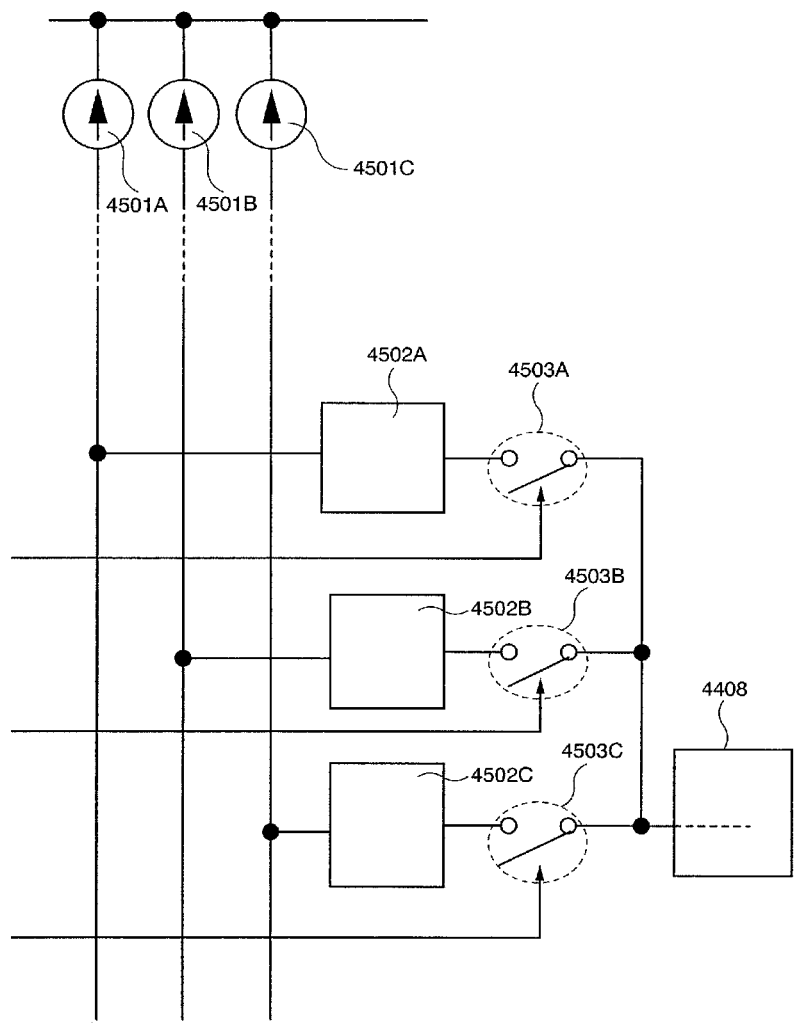
FIG. 45 is a diagram showing a pixel configuration according to an aspect of the present invention.

Further, when an analog current is output to a pixel as a video signal, a configuration shown in FIG. 45 is employed since a digital value is required to be converted into an analog value.

In FIG. 45, a case of 3-bit is described for simplicity. That is, there are current sources 4501A, 4501B, and 4501C of which current values are Ic, 2*Ic, and 4*Ic respectively, to which each current source circuits 4502A, 4502B, and 4502C is connected respectively. Therefore, the current source circuits 4502A, 4502B, and 4502C output currents of Ic, 2*Ic, and 4*Ic at the output operation. Switches 4503A, 4503B, and 4503C are connected in series to each current source circuit. These switches are controlled by a video signal output from the second latch circuit (LAT2) 4207. A sum of the current output from each current source circuit and switch is output to the load 4408, that is, the signal line of the display device. By operating as described above, an analog current is output to the pixel as a video signal.

The case of 3 bit is described in FIG. 45 for simplicity, however, the present invention is not limited to this. By configuring similarly, the number of bits can be changed easily. Also in the case of the configuration of FIG. 45, the output operation can be performed at the same time when the set operation is performed by disposing the current source circuits in parallel and operating them by switching them.

In the case of performing the set operation on the current source circuit, the timing thereof is required to be controlled. In that case, a dedicated driver circuit (a shift register and the like) may be disposed for controlling the set operation. Alternatively, the set operation to the current source circuit may be controlled by using a signal output from the shift register for controlling the LAT1 circuit. That is, both of the LAT1 circuit and the current source circuit may be controlled by one shift register. In that case, a signal output from the shift register for controlling the LAT1 circuit may be input to the current source circuit directly, or in order to separate the control of the LAT1 circuit and the control of the current source circuit, the current source circuit may be controlled via a circuit for controlling the separation. The set operation to the current source circuit may be controlled by using a signal output from the LAT2 circuit as well. The signal output from the LAT2 circuit is typically a video signal. Therefore, in order to separate a case of using it as a video signal and a case of controlling the current source circuit, the current source circuit may be controlled via a circuit for controlling the separation.

The case of FIG. 43 is described now. A current source in the reference current source circuit 4301 corresponds to the current source 4407 in FIG. 44. The load 4408 in FIG. 44 corresponds to a current source circuit disposed in the second latch circuit (LAT2) 4207. In this case, a video signal is output as a current from the current source in the reference current source circuit 4301. Note that the current may have a digital value or an analog value.

Note that a digital video signal (current value) corresponding to each bit may be input to the first latch circuit 4206. By adding together the digital video signal current corresponding to each bit, a digital value can be converted into an analog value. In that case, it is more preferable to apply the present invention to the case of inputting a signal of a bit of a small digit number because a current value of a signal becomes small. In view of this, the current value of the signal can be large by applying the present invention. Thus, a write speed of a signal is increased. It should be noted in FIG. 43 that two or more current source circuits may be disposed in parallel in the first latch circuit 4206 and be used by shifting them in a case where the second latch circuit 4207 is not provided. Accordingly, the set operation and the output operation can be performed at the same time, which allows the second latch circuit 4207 to be omitted.

It may also be considered that the current source circuit disposed in the first latch circuit 4206 corresponds to the current source 4407 in FIG. 44, and the current source circuit disposed in the second latch circuit 4207 corresponds to the load 4408 in FIG. 44.

Furthermore, the current source circuit can be applied to the reference current source circuits 4209, and 4301 shown in FIGS. 42 and 43. That is, the reference current source circuit 4209 corresponds to the load 4408 in FIG. 44 and another current source corresponds to the current source 4407 in FIG. 44.

It may also be considered that the pixel corresponds to the load 4408 in FIG. 44 and the current source circuit for outputting a current to the pixel in the signal line driver circuit 4204 corresponds to the current source 4407 in FIG. 44.

In this manner, the present invention can be applied to various portions.

Note that the configuration of FIG. 1 is used as a configuration of the current source circuit 4400 in FIG. 44; however, the present invention is not limited to this. Various configurations according to the present invention can be employed.

This example can be freely combined with the other embodiment modes or examples in this specification.

Example 3

In Example 3, a basic pixel configuration in a case where the present invention is applied to a pixel, will be described with reference to FIG. 46.

Figure 46:
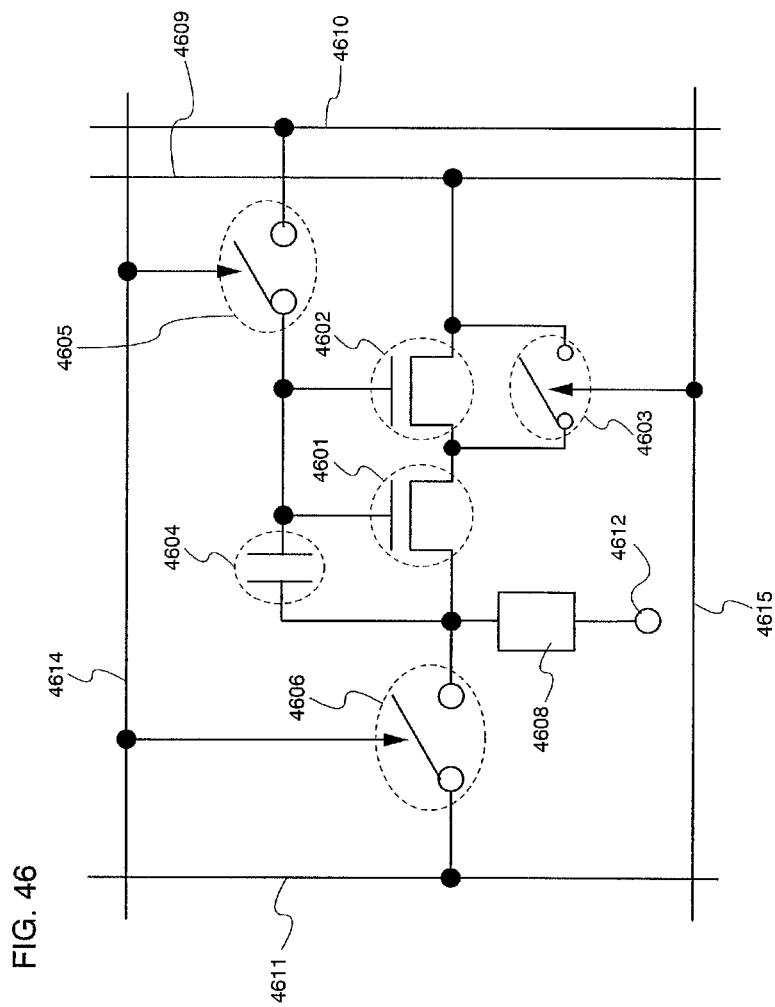
FIG. 46 is a diagram showing a pixel configuration according to an aspect of the present invention.

In FIG. 46, a pixel shown in this example includes a transistor 4601 (hereinafter, referred to as a first current source transistor or a current source transistor) which constantly serves as a current source (or a part of the current source), a transistor 4602 which operates differently depending on a state (hereinafter, also referred to as a second transistor or a shift transistor), a first switch 4603, a capacitor element 4604, a second switch 4605, a third switch 4606, a display element 4608, a first wire 4609, a second wire 4610, an opposite electrode 4612, a third wire 4611, a fourth wire 4614, and a fifth wire 4615. Note that the current source transistor 4601 and the shift transistor 4602 are both N-channel transistors.

A connection structure of the pixel is described.

A first terminal (one of a source terminal and a drain terminal) and a second terminal (the other of the source terminal and the drain terminal) of the current source transistor 4601 are connected to a pixel electrode of the display element 4608 and to the first wire 4609 via the shift transistor 4602, respectively. A gate terminal of the current source transistor 4601 is connected to the second wire 4610 via the second switch 4605, and one terminal of the capacitor element 4604, and the other terminal of the capacitor element 4604 is connected to the first terminal of the current source transistor 4601. Thus, a gate potential of the current source transistor 4601, i.e., a gate-source voltage (Vgs) can be held. The gate of the current source transistor 4601 is connected to the wire 4610 via the second switch 4605. By ON/OFF of the second switch 4605, charges supply to the capacitor element 4604 can be controlled. That is to say, when the second switch 4605 is in an ON state, the gate terminal of the current source transistor 4601 and the second wire 4610 are connected. On the other hand, when the second switch 4605 is in an OFF state, the gate terminal of the current source transistor 4601 and the second wire 4610 are disconnected (or non-conductive state).

The shift transistor 4602 includes the first switch 4603 as a shift means in a case where it serves as a current source depending on a state or a case where it serves so that no current flows between a source and a drain (or serves as a switch). Here, a case where the shift transistor 4602 serves as a current source (or a part thereof) is referred to as a current source operation. In addition, a case where the shift transistor 4602 operates so that no current flows between the soured and the drain (or serves as a switch) or a case where it operates when a source-drain voltage is small, is referred to as a short circuit operation. In FIG. 46, a source terminal and a drain terminal of the shift transistor 4602 can be connected via the first switch 4603. A gate terminal of the shift transistor 4602 is connected to the gate terminal of the current source transistor 4601. The operation of the shift transistor 4602 can be shifted into a current source operation or a short circuit operation by using the first switch 4603.

The first terminal of the current source transistor 4601 is connected to the third wire 4611 through the third switch 4606. That is to say, when the third switch 4606 is in an ON state, the first terminal of the current source transistor 4601 and the third wire 4611 are connected. On the other hand, when the third switch 4606 is in an OFF state, the first terminal of the current source transistor 4601 and the third wire 4611 are disconnected.

The capacitor element 4604 may have a structure where an insulating film is interposed by wires, active layers, electrodes, or the like, or can be omitted by using the gate capacitor of the current source transistor 4601.

Note that a predetermined potential is input to the opposite electrode 4612 of the display element 4608, the first wire 4609 and the second wire 4610, respectively.

ON/OFF of the second switch 4605 and the third switch 4606 are controlled by inputting a signal to the fourth wire 4614.

ON/OFF of the first switch 4603 is controlled by inputting a signal to the fifth wire 4615.

In addition, a signal in response to a gray scale of a pixel is input to the third wire 4611. This signal corresponds to a video signal, and a signal current flows to the third wire 4611.

Note that transistors can be applied to the first switch 4603, the second switch 4605, and the third switch 4606. Thus, a case where N-channel transistors are applied to the first switch 4603, the second switch 4605 and the third switch 4606, is described with reference FIG. 47. Note that the same portions as in FIG. 46 are described with the same reference numerals, and description thereof is omitted.

A first switching transistor 4703 corresponds to the first switch 4603. A second switching transistor 4705 corresponds to the second switch 4605. A third switching transistor 4706 corresponds to the third switch 4606.

A gate terminal of the first switching transistor 4703 is connected to the fifth wire 4615, a first terminal thereof (one of a source terminal and a drain terminal) is connected to a first terminal of the shift transistor 4602, a second terminal (the other of the source terminal and the drain terminal) thereof is connected to a second terminal of the shift transistor 4602. Therefore, when a signal input to the fifth wire 4615 is at H level, the first switching transistor 4703 is turned on whereas when the signal input to the fifth wire 4615 is at L level, the first switching transistor 4703 is turned off. In other words, since the first switching transistor 4703 is turned ON, the shift transistor 4602 conducts a short circuit operation.

A gate terminal, a first terminal (one of a source terminal and a drain terminal), and a second terminal (the other of the source terminal and the drain terminal) of the second switching transistor 4705 are connected to a fourth wire 4714, the second wire 4610, and the pixel electrode of the display element 4608 and the first terminal of the current source transistor 4601 via the capacitor element 4604, respectively. Therefore, when a signal input to the fourth wire 4614 is at H level, the second switching transistor 4705 is turned on whereas when the signal input to the fourth wire 4614 is at L level, the second switching transistor 4705 is turned off.

A gate terminal, a first terminal (one of a source terminal and a drain terminal), and a second terminal (the other of the source terminal and the drain terminal) of the third switching transistor 4706 are connected to the fourth wire 4714, the gate terminal of the current source transistor 4601, and the third wire 4611 respectively. Therefore, when a signal input to the fourth wire 4614 is at H level, the third switching transistor 4706 is turned on whereas when the signal input to the fourth wire 4614 is at L level, the third switching transistor 4706 is turned off.

Subsequently, description is made with reference to FIGS. 48A to 48C of operation of the pixel of this embodiment mode. Note that in FIGS. 48A to 48C, description is made by using the pixel configuration in FIG. 47 since the pixels of FIGS. 46 and 47 operate in the same manner.

It is to be noted that a current source 4801 connected to the third wire 4611 sets a signal current Idata which is written to the pixel. The third wire 4611 is connected to a wire 4812 through the current source 4801. A predetermined potential is input to the wire 4812. Here, potentials input to the first wire 4609, the second wire 4610, the wire 4812, and the opposite electrode 4612 are denoted by V1, V2, V3, and Vcom respectively. As for a relation of the potentials, V1>V2>V3 and V1>Vcom>V3 are at least satisfied.

It is to be noted that the operation of a pixel includes signal writing operation for writing a signal to a pixel and light emitting operation for emitting light of a gray scale level in response to a signal written to a pixel. FIGS. 48A and 48B are diagrams both showing the signal writing operation, and FIG. 48C is a diagram showing the light emitting operation.

First, a transient state at the signal writing operation is described with reference to FIG. 48A. Signals to be input to the fourth wire 4614 and the fifth wire 4615 are set to be at H level, thereby turning on the first, second and third switching transistors 4703, 4705 and 4706. Accordingly, a current flows as shown in FIG. 48A. That is, as paths of current, there is a first path where a current flows from the second wire 4610 to the capacitor element 4604 through the second switching transistor 4705 and a second path where a current flows from the first wire 4609 to the current source transistor 4601 through the first switching transistor 4703. A current Ic that flows through the first path and a current Itr that flows through the second path unite at a connecting portion of the first terminal of the current source transistor 4601 and the second electrode of the capacitor element 4604. Then, a current Ic and a current Itr flow as the signal current Idata to the wire 4812 through the third switching transistor 4706 and the current source 4801. That is to say, Ic+Itr=Idata is satisfied.

A current does not flow to the capacitor element 4604 before long, which leads to a steady state at the signal writing operation. Therefore, a current flows as shown in FIG. 48B. A current Itr that flows from the first wire 4609 to the current source transistor 4601 is equal to the signal current Idata. That is, a gate-source voltage Vgs of the current source transistor 4601 is necessary for applying the signal current Idata to the current source transistor 4601. Electric charges for the gate-source voltage Vgs of the current source transistor 4601 is accumulated in the capacitor element 4604. At that time, the shift transistor 4602 operates in a state where the source-drain voltage is small, and conducts a short circuit operation.

It is to be noted that when potentials of the gate terminal and the first terminal (here, a source) of the current source transistor 4601 at this time are denoted by Va and Vb respectively, Vgs=(Va−Vb) is satisfied. When a forward threshold voltage of the display element 4608 is denoted by $V_{ELth}$, (Vb−Vcom)<$V_{ELth}$ is preferably satisfied, thereby applying no current to the display element 4608 at the signal writing operation. Therefore, the potential V2 input to the second wire 4610 is preferably set so as to satisfy V1>V2>V3. When V2=Vcom is satisfied, the number of power sources necessary for pixels can be reduced. Further, a reverse bias can be applied to the display element 4608 at the signal writing operation by setting V2 and Vcom in the range of satisfying (Vb−Vcom)<$V_{ELth}$ It is to be noted that even when a reverse bias is applied to the display element 4608, a current does not flow to the normal display element 4608 (if it flows, it is a small amount of current). On the other hand, if the display element 4608 is short-circuited, a current flows to a short-circuited portion. Then, the short-circuited portion is insulated, thereby a display defect can be improved.

Subsequently, description is made with reference to FIG. 48C of the light emitting operation. Signals input to the fourth wire 4614 and the fifth wire 4615 are set to be at an L level, thereby turning off the first, second and third switching transistors 4703, 4705 and 4706. Thus, a current flows as shown in FIG. 48C. At this time, the third switching transistor 4706 is in an OFF state. Therefore, the capacitor element 4604 holds the gate-source voltage Vgs necessary for applying the signal current Idata to the current source transistor 4601. Accordingly, Vgs for feeding a current which is almost equal to the signal current Idata is applied to the current source transistor 4601.

Here, the channel length and the channel width of a transistor are denoted by L and W respectively. When the transistor operates in a saturation region, a current value flowing in the transistor is generally proportional to W/L if a gate-source voltage is constant. In other words, a current value is proportional to the channel width W and inversely proportional to the channel length L.

In this example, the channel length of the current source transistor 4601 and the channel length of the shift transistor 4602 are denoted by L1 and L2 respectively, and these transistors have the same channel widths W. If the current source transistor 4601 and the shift transistor 4602 through which a current flows serve as a multigate transistor, and the current source transistor 4601 and the shift transistor 4602 serve as a current source in FIG. 48C. At that time, the multigate transistor is considered to have a channel length (L1+L2) and the channel width W. On the other hand, in FIG. 48C, a current flows through the current source transistor 4601 and the shift transistor 4602, and the multigate transistor has the channel width W and the channel length (L1+L2). Therefore, at a light emitting operation, a current of Idata×(L1/(L1+L2)) can be applied to the display element 4608.

In this manner, the shift transistor 4602 is short circuited at the set operation and it is made to operate as a current source at a light-emitting operation, thereby a smaller amount of current than the signal current which is applied at the signal writing operation can be applied to the display element 4608. In other words, by adjusting the channel lengths of the current source transistor 4601 and the shift transistor 4602, a smaller amount of current than the signal current which is applied at the signal writing operation can be applied to the display element 4608.

It is to be noted that when potentials of the gate terminal and the first terminal of the current source transistor 4601 at this time are denoted by Va' and Vb' respectively, Vgs=(Va'−Vb') is satisfied. This is because Va' is increased as Vb' is increased, since the capacitor element 4604 holds the gate-source voltage Vgs although Vb'>Vb is satisfied.

It is to be noted that when potentials of H level signal and an L level signal to be input to the fourth wire 4614 are denoted by V4(H) and V4(L) respectively, the following potentials are preferable. Threshold voltages of the second switching transistor 4705 and the third switching transistor 4706 are denoted by Vth2 and Vth3 respectively.

Figure 48:
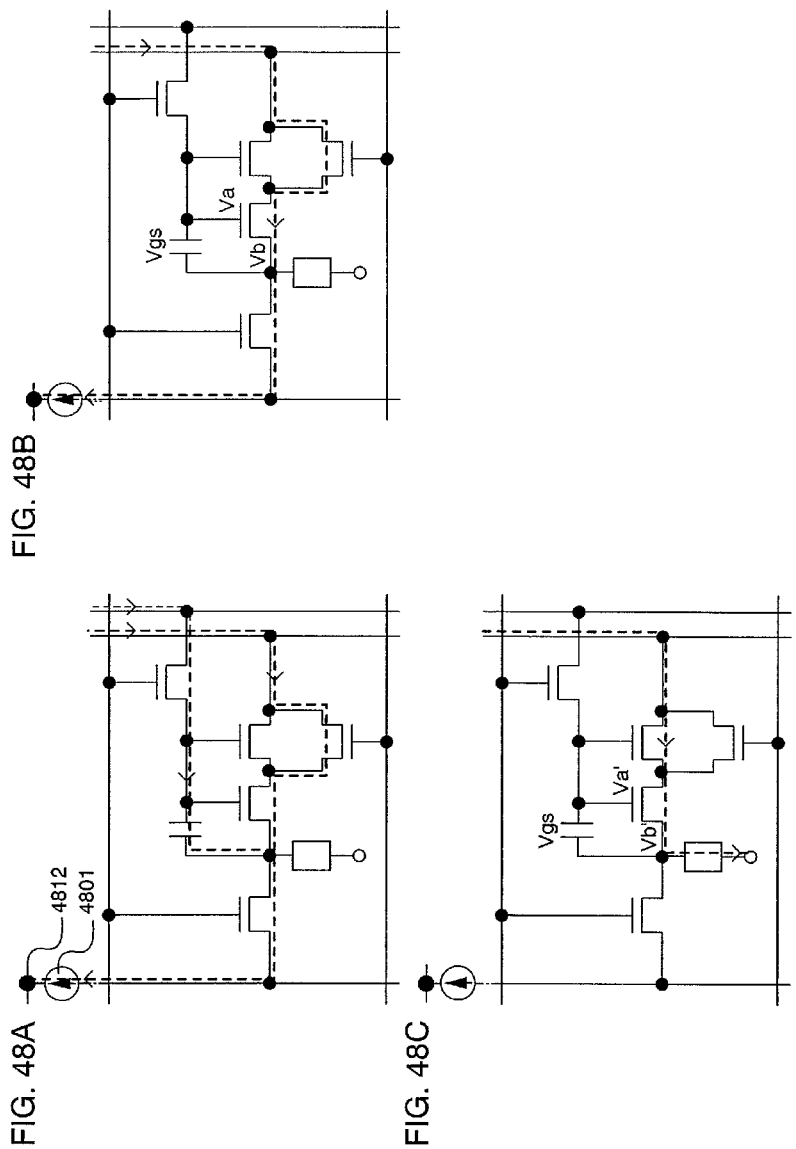
FIGS. 48A to 48C are each a diagram showing a pixel configuration according to an aspect of the present invention.

As shown in FIG. 48B, even when a potential of the pixel electrode of the display element 4608 becomes Vb, the third switching transistor 4706 is required to be in an ON state. Therefore, V4(H)>(Vb+Vth3) is set to be satisfied. Further, V4(H)>(V2+Vth2) is set to be satisfied so that the second switching transistor 4705 is in an ON state. Specifically, for example, when V2=Vcom is satisfied, V4(H) is preferably a potential higher than Vcom by 1 to 8 V.

As shown in FIG. 48C, V4(L)<(Vb+Vth3) is satisfied so that the third switching transistor 4706 is turned off. That is, when the signal current is written to another pixel, a potential of the third wire 4611 becomes Vb. Therefore, in a pixel which is not selected at this potential, the third switching transistor 4706 is required to be in an OFF state. In addition, V4(L)<(V2+Vth2) is satisfied so that the second switching transistor 4705 is in an OFF state. Specifically, for example, when V2=Vcom is satisfied, V4(L) is preferably a potential lower than Vcom by 1 to 8 V.

By employing a pixel configuration described in this example, the potential of the gate terminal of the current source transistor at the signal writing operation is controlled, thereby preventing a current from flowing to the display element at this time.

Figure 47:
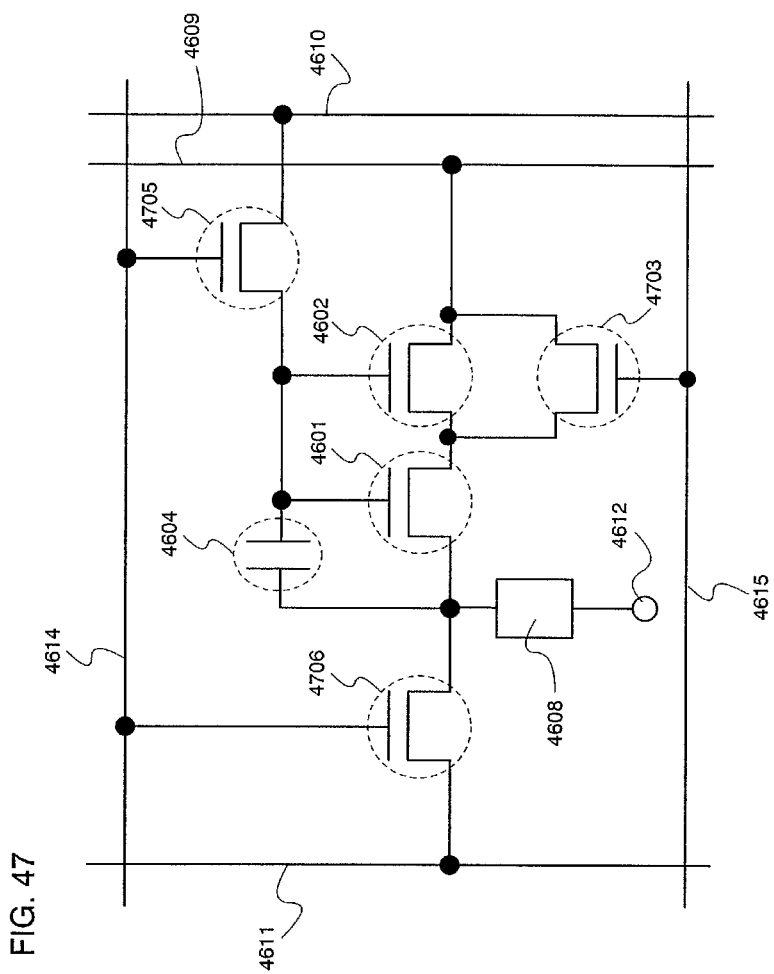
FIG. 47 is a diagram showing a pixel configuration according to an aspect of the present invention.

It is to be noted that by employing the pixel configuration shown in FIG. 47, a pixel can be formed of only N-channel transistors, which can simplify a manufacturing process. An amorphous semiconductor, a semi-amorphous semiconductor (also referred to as a microcrystalline semiconductor), or the like can be used for a semiconductor layer of a transistor constituting a pixel. For example, amorphous silicon (a-Si:H) may be used as the amorphous semiconductor. Therefore, the manufacturing process can be further simplified. As a result, reduction in a manufacturing cost and improvement in the yield can be achieved.

Further, by employing the structure of the present invention, Vds>Vgs can be satisfied at the signal writing operation. A change in the Vds can be made small between at the signal writing operation and at the light emitting operation. Therefore, even if constant current characteristics (flatness of current) in a saturation region of the current source transistor 4601 are bad, current values are almost equal at the signal writing operation and at the light emitting operation. In particular, when an amorphous semiconductor film (such as amorphous silicon) is used as a semiconductor layer of the current source transistor 4601, constant current characteristics (flatness of current) in a saturation region of the current source transistor 4601 may be deteriorated. Therefore, when the structure of the present invention is applied in the case where an amorphous semiconductor film is used as a semiconductor layer of the current source transistor 4601, a display defect can be prevented.

Figure 62:
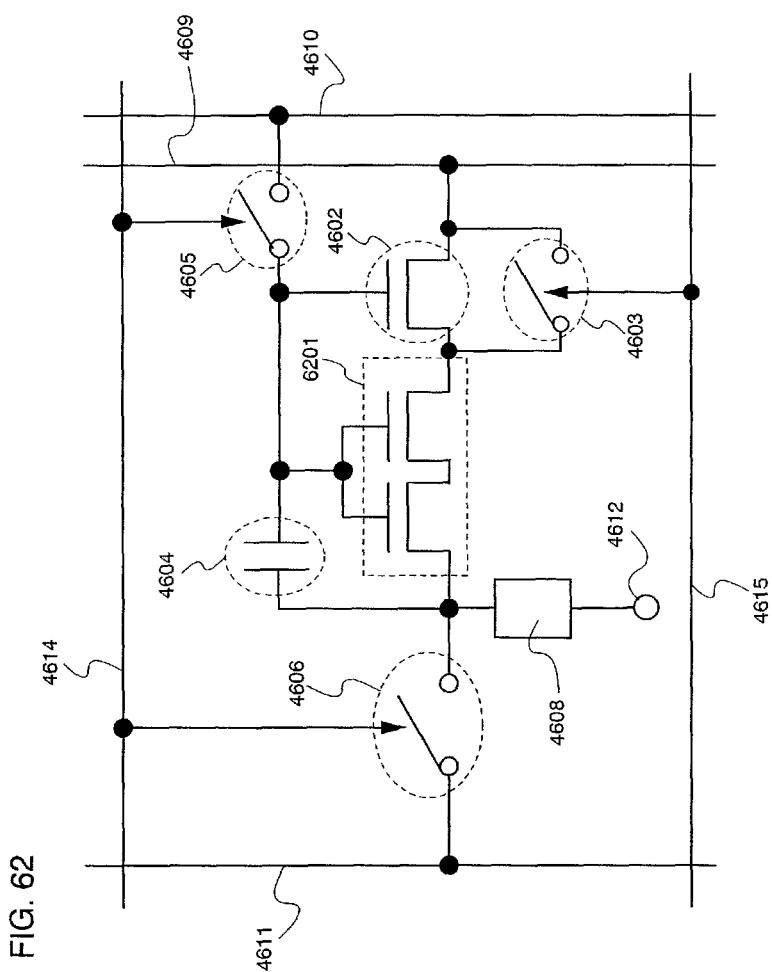
FIG. 62 is a diagram showing a pixel configuration according to an aspect of the present invention.

Further, since a high voltage is applied between the source and drain terminals of the current source transistor 4601 shown in FIG. 47, it is preferable that the channel length of the current source transistor 4601 may be longer than that of the third switching transistor 4706 or the second switching transistor 4705. Alternatively, a multigate transistor 6201 may be applied to the current source transistor 4601 as shown in FIG. 62. Accordingly, the pressure resistance of the transistor is increased, thereby preventing the transistor from being damaged.

Subsequently, description is made with reference to FIG. 49 of a display device including a pixel of the present invention.

A display device includes a signal line driver circuit 4901, a first scan line driver circuit 4902A, a second scan line driver circuit 4902B, and a pixel portion 4903. The pixel portion 4903 includes a plurality of signal lines S1 to Sn extended in the column direction from the signal line driver circuit 4901, a plurality of scan lines G1 to Gm extended in the row direction from the first scan line driver circuit 4902A, a plurality of scan lines g1 to gm extended in the row direction from the second scan line driver circuit 4902B, and a plurality of pixels 4904 arranged in matrix corresponding to the signal lines S1 to Sn and the scan lines G1 to Gm. Further, the pixel portion 4903 includes power source lines P1 to Pn and bias lines B1 to Bn which are parallel to the signal lines S1 to Sn. Each of the pixels 4904 is connected to a signal line Sj (one of the signal lines S1 to Sn), a first scan line Gi (one of the scan lines G1 to Gm), a second scan line gi (one of the scan lines g1 to gm), a power source line Pj (one of the power source lines P1 to Pn), and a bias line Bj (one of the bias lines B1 to Bn).

It is to be noted that the first scan line Gi corresponds to the fourth wire 4614 in FIG. 46. The second scan line gi corresponds to the fifth wire 4615 in FIG. 46. The signal line Sj corresponds to the third wire 4411 in FIG. 46. The power source line Pj corresponds to the first wire 4609 in FIG. 46. The bias line Bj corresponds to the second wire 4610 in FIG. 46.

The scan lines G1 to Gm are selected one by one by a signal output from the scan line driver circuit 4902A. Then, the signal is written to the pixel 4904 connected to the scan line which is selected. At this time, a signal current flows to each of the signal line S1 to Sn in response to a gray scale level of each pixel.

After signal writing is completed, another scan line is selected, and then signal writing is performed to the pixel 4904 connected to the scan line. The pixel in which a signal has been written starts a light emitting operation and emits light in accordance with the signal written to the pixel. Thus, signals are sequentially written to the pixels 4904 to perform signal writing to all the pixels 4904 sequentially.

Figure 49:
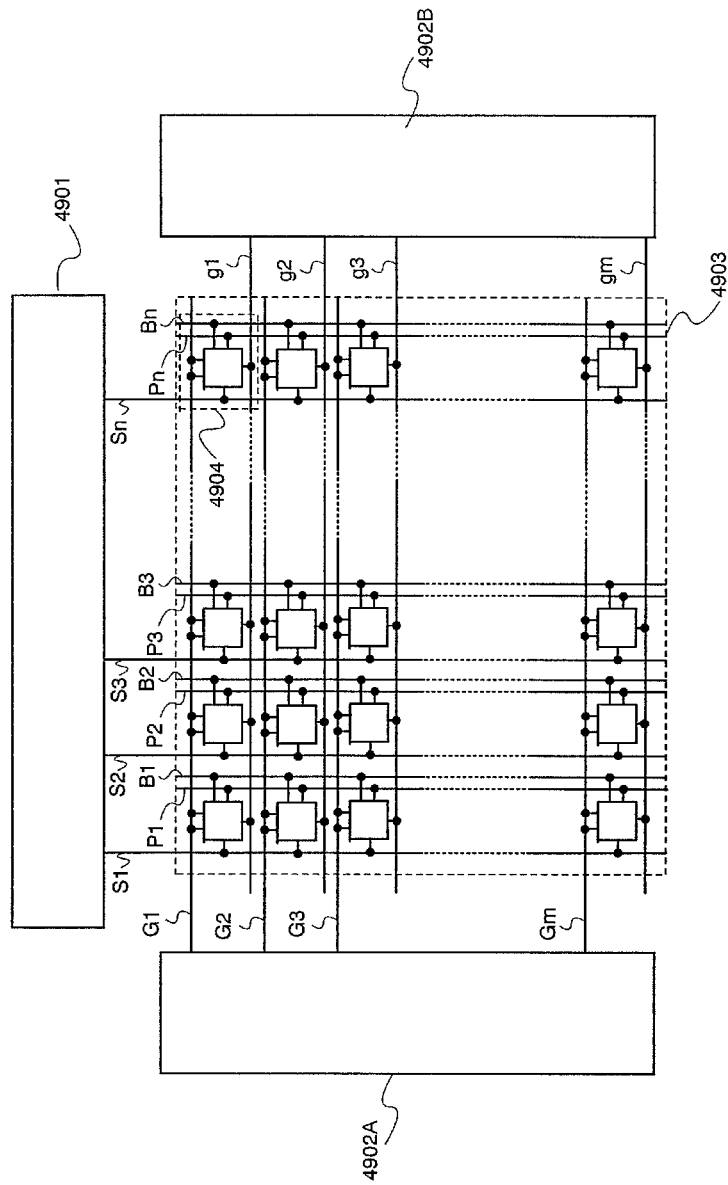
FIG. 49 is a diagram showing a display device according to an aspect of the present invention.

However, the structure of the display device shown in FIG. 49 is just one example and the present invention is not limited to this. That is, the power source lines P1 to Pn and the bias lines B1 to Bn are not required to be arranged in parallel to the signal lines S1 to Sn. The power source lines and the bias lines may be arranged in parallel to the scan lines G1 to Gm. Alternatively, each of the power source lines or the bias lines may be arranged in a grid pattern. It is to be noted that in the case where the pixel portion 4903 includes a plurality of color elements, the power source lines and the bias lines are preferably arranged as shown in FIG. 49.

Figure 90:
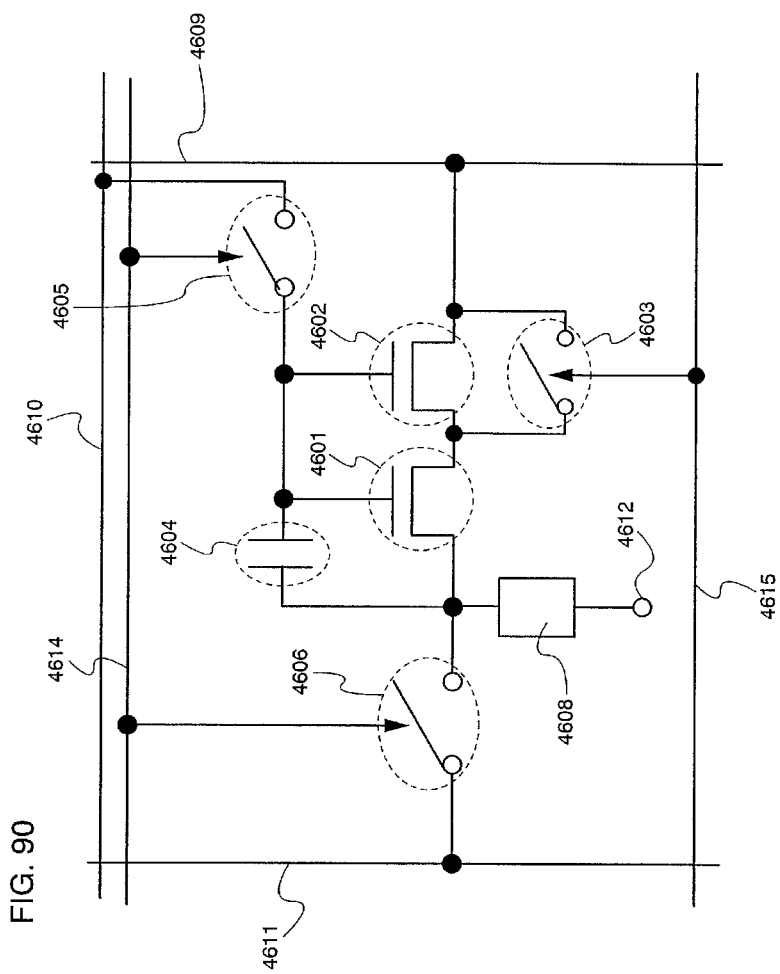
FIG. 90 is a diagram showing a pixel configuration according to an aspect of the present invention.
Figure 91:
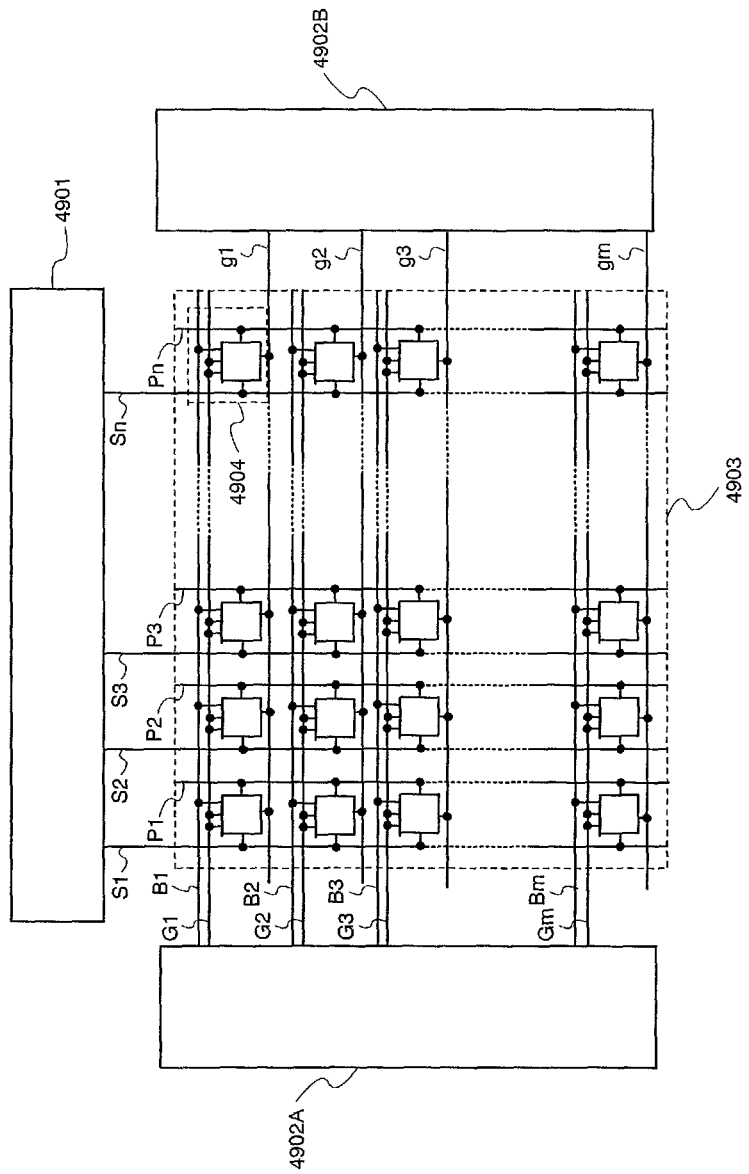
FIG. 91 is a diagram showing a display device according to an aspect of the present invention.
Figure 92:
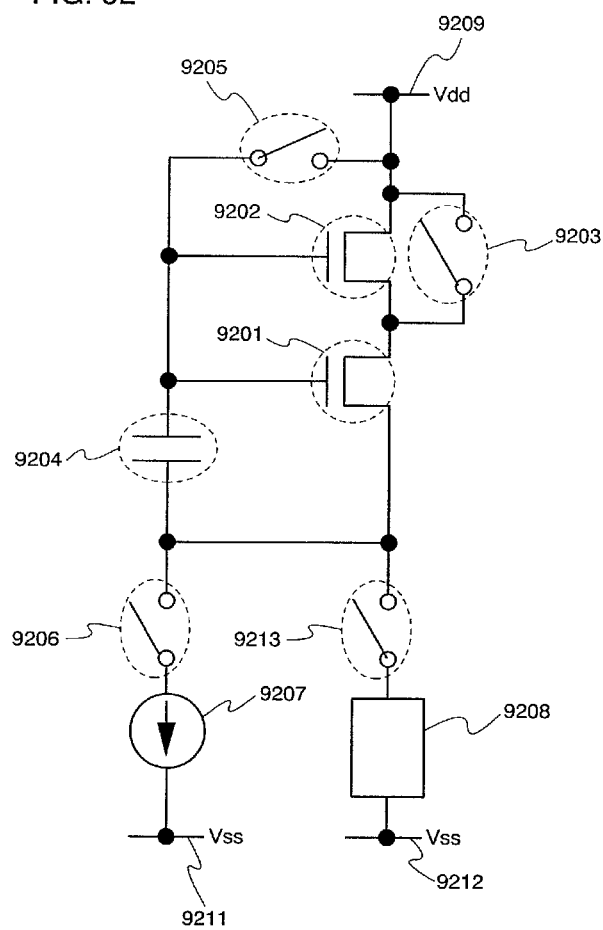
FIG. 92 is a circuit diagram showing a conventional circuit.
Figure 93:
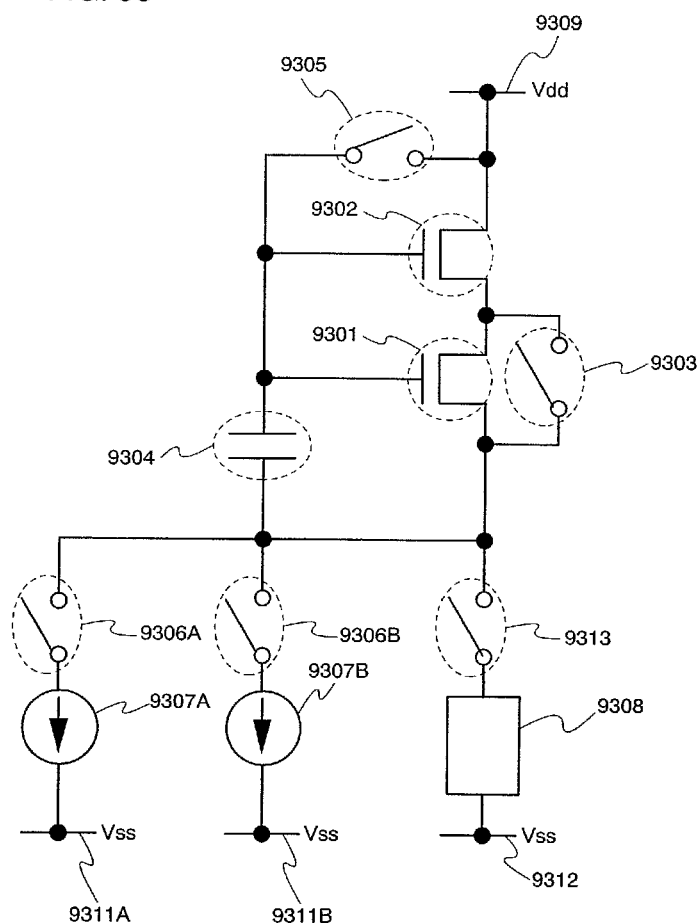
FIG. 93 is a circuit diagram showing a conventional circuit.
Figure 94B:
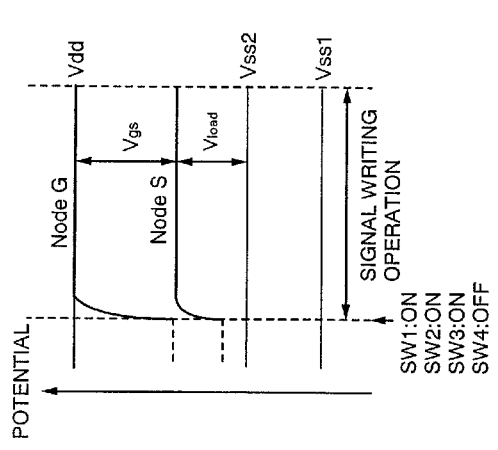
FIGS. 94A and 94B are circuit diagrams showing a conventional circuit.
Figure 94A:
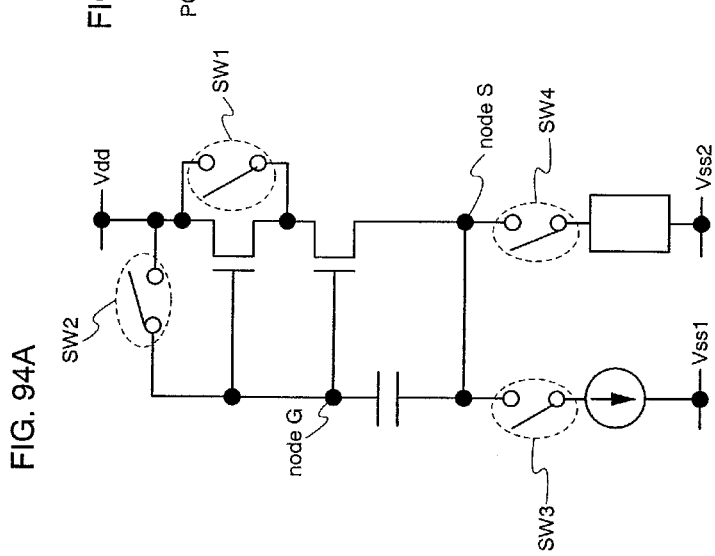

That is to say, the second wire 4610 in the pixel of FIG. 46 may be arranged in parallel to the fourth wire 4614 as shown in FIG. 90. In this case, bias lines B1 to Bm corresponding to the bias lines B1 to Bn in FIG. 49 are arranged in parallel to the scan lines G1 to Gm as shown in FIG. 91. Potentials of the bias lines B1 to Bm may be varied. In other words, the bias lines may be scanned. In this case, a bias line driver circuit may be provided in addition to the scan line driver circuit 4902 which scans the scan lines G1 to Gm.

In the case where the pixel portion 4903 includes a plurality of color elements, potentials of a power source line and a bias line connected to each pixel which is a color element may be varied. Further, the size of a pixel electrode may be different on a pixel-by-pixel basis which is a color element. In other words, a light emitting area may be different per pixel to be a color element. Thus, in the case where an EL element of a different color is used as a display element for a full color display, a balance of colors and a progress of deterioration of the EL element can be controlled.

Figure 50:
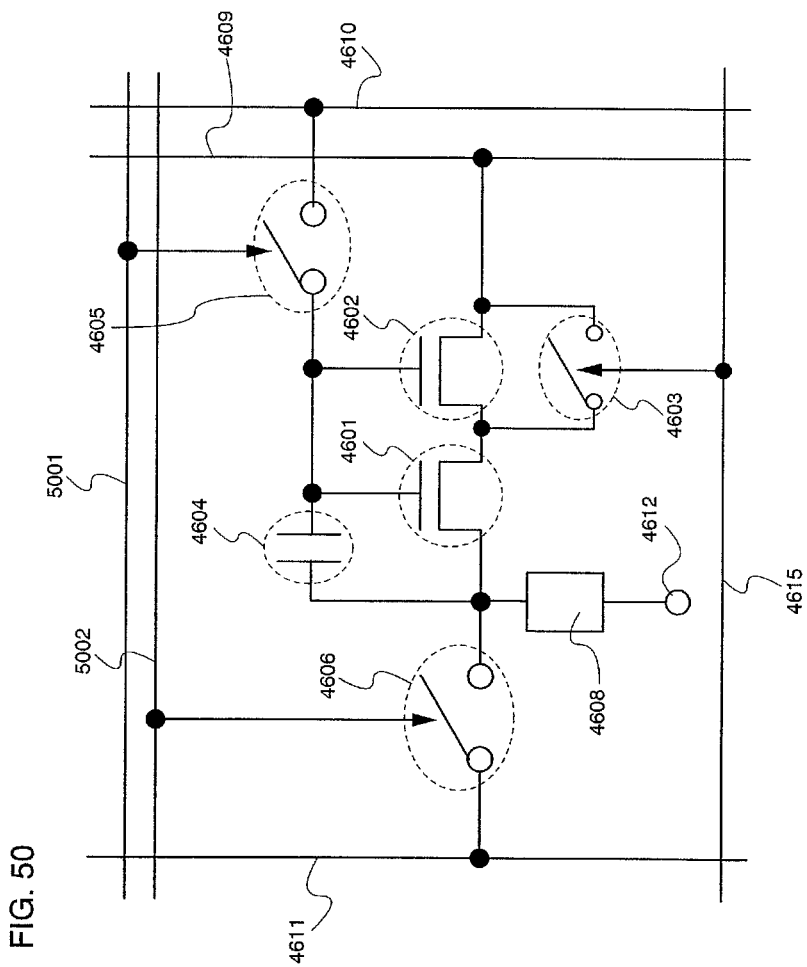
FIG. 50 is a diagram showing a pixel configuration according to an aspect of the present invention.

Thus, in the pixel shown in FIG. 46, an additional wire may be provided to control ON/OFF of the second switch 4605 and the third switch 4606 separately. That is to say, a fourth wire B 5002 for controlling ON/OFF of the third switch 4606 may be provided in addition to the fourth wire A 5001 for controlling ON/OFF of the second switch 4605 as shown in FIG. 50. In this case, after the signal writing operation is completed, the third switch 4606 and the second switch 4605 are turned off at the same time or the second switch 4605 is turned off before the third switch 4606 is turned off.

This example can be freely combined with the other embodiment modes or examples in this specification.

Example 4

Example 4 shows another pixel configuration in which the present invention is applied to a pixel.

Figure 59:
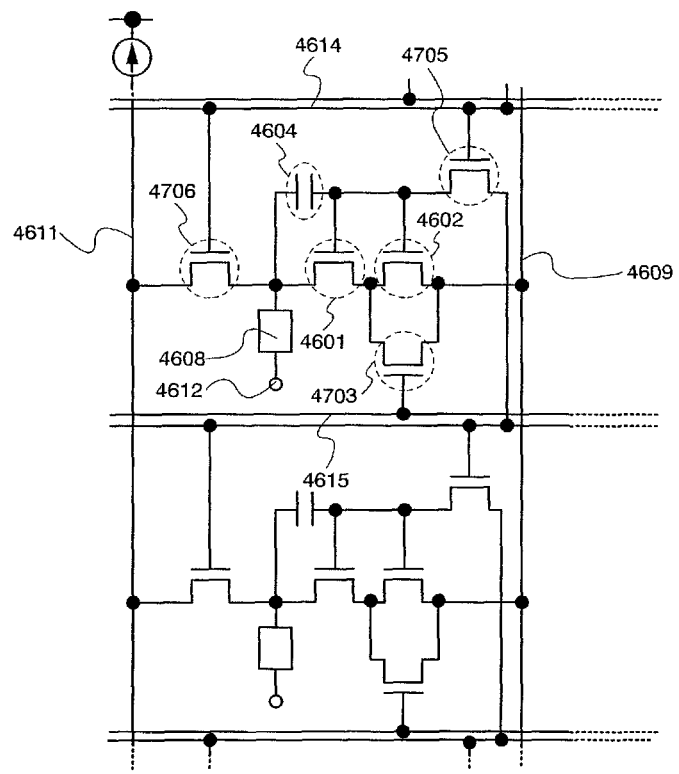
FIG. 59 is a diagram showing a pixel configuration according to an aspect of the present invention.

In the pixel of FIG. 1 or FIG. 2, the fourth wire 4614 in a pixel of another row can be used as a substitute for the second wire 4610. That is, in this case, the bias lines B1 to Bn of the display device shown in FIG. 49 can be omitted. As an example, FIG. 59 shows a structure where the second wire 4610 in the pixel of FIG. 47 is omitted and the fourth wire 4614 in a pixel of the adjacent row is used instead.

Figure 60:
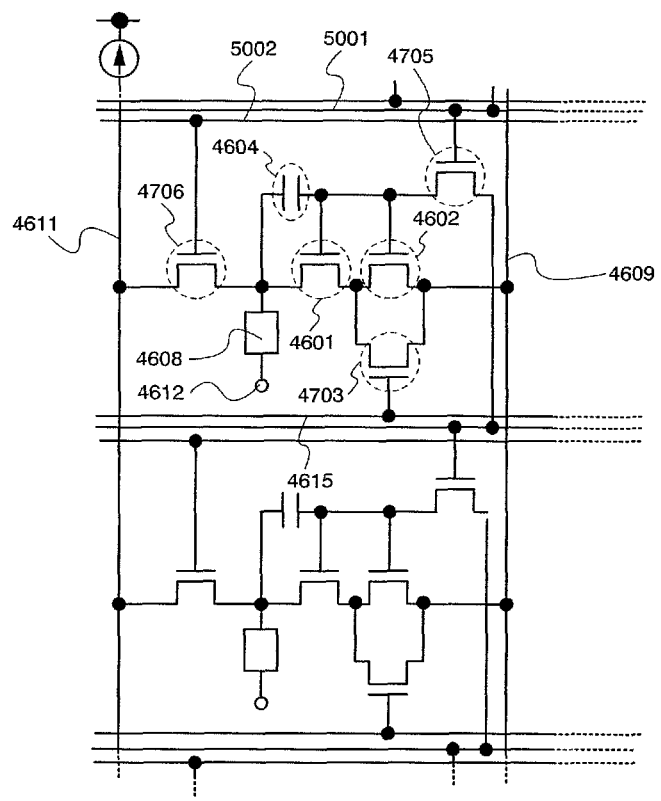
FIG. 60 is a diagram showing a pixel configuration according to an aspect of the present invention.

As shown in FIG. 60, the first switching transistor 4703, the second switching transistor 4705 and the third switching transistor 4706 which are N-channel transistors can be applied to the first switch 4603, the second switch 4605 and the third switch 4606 in the pixel of FIG. 50 respectively, and the fourth wire A 5001 in a pixel of another row can be used as a substitute for the second wire 4610.

Figure 61:
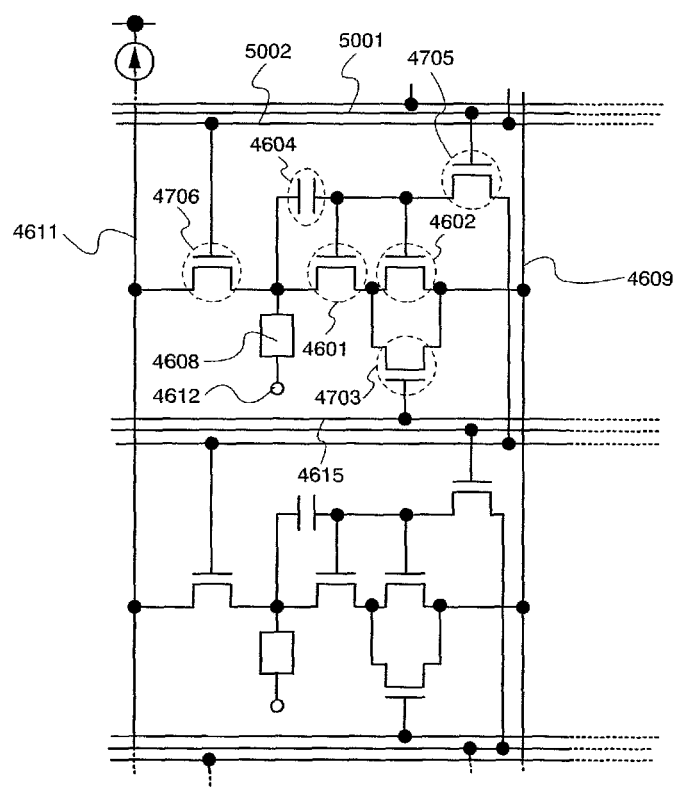
FIG. 61 is a diagram showing a pixel configuration according to an aspect of the present invention.

As shown in FIG. 61, the first switching transistor 4703, the second switching transistor 4705 and the third switching transistor 4706 which are N-channel transistors described in FIG. 47 can be applied to the first switch 4603, the second switch 4605 and the third switch 4606 in the pixel of FIG. 50 respectively, and the fourth wire B 5002 in a pixel of another row can also be used instead of the second wire 4610.

This example can be freely combined with the other embodiment modes or examples in this specification.

Example 5

Example 5 shows another pixel configuration in which the present invention is applied to a pixel.

When a pixel is formed using a transistor, variation in characteristics of transistors between pixels is a problem. The variation in transistor characteristics is recognized as display unevenness.

In this example, description is made of a case where transistors (transistors to be turned on) used in pixels of the present invention are shifted each period, thereby transistor characteristics can be averaged in terms of time and display unevenness can be hardly recognized.

Figure 51:
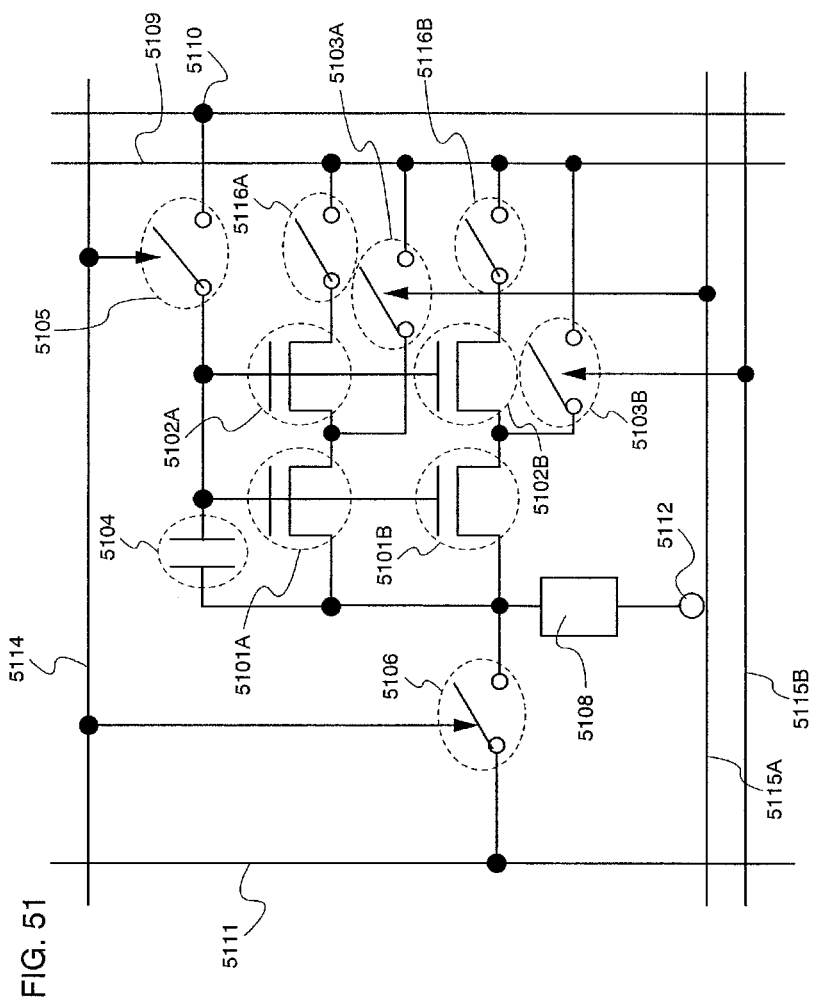
FIG. 51 is a diagram showing a pixel configuration according to an aspect of the present invention.

A pixel of this example is shown in FIG. 51.

A pixel of this example includes a first current source transistor 5101A, a second current source transistor 5101B, a first shift transistor 5102A, a second shift transistor 5102B, a first switch A 5103A, a first switch B 5103B, a capacitor element 5104, a second switch 5105, a third switch 5106, a display element 5108, a first wire 5109, a second wire 5110, a third wire 5111, an opposite electrode 5112, a fourth wire 5114, a fifth wire A 5115A and a fifth wire B 5115B, a fourth switch A 5116A, and a fourth switch B 5116B. It is to be noted that the first current source transistor 5101A, the second current source transistor 5101B, the first shift transistor 5102A, the second shift transistor 5102B are N-channel transistors.

First, a connection structure of the pixel is described.

A first terminal (one of a source terminal and a drain terminal) of the first current source transistor 5101A is connected to a pixel electrode of the display element 5108, a second terminal (the other of the source terminal and the drain terminal) of the first current source transistor 5101A is connected to the first wire 5109 through the first shift transistor 5102A and the fourth switch A 5116A, and a gate terminal of the first current source transistor 5101A is connected to the second wire 5110 through the second switch 5105. In addition, a gate terminal of the first current source transistor 5101A is connected to one terminal of the capacitor element 5104, and the other terminal of the capacitor element 5104 is connected to the first terminal of the first current transistor 5101A. Thus, a gate potential of the first current source transistor 5101A, i.e., a gate-source voltage (Vgs) can be held. The gate of the first current source transistor 5101A is connected to the second wire 5110 via the second switch 5105, and charge supply to the capacitor element 5104 can be controlled by ON/OFF of the second switch 5105. That is to say, when the second switch 5105 is in an ON state, the gate terminal of the first current source transistor 5101A and the second wire 5110 are connected. On the other hand, when the second switch 5105 is in an OFF state, the gate terminal of the first current source transistor 5101A and the second wire A 5105A are disconnected.

Similarly, a first terminal (one of a source terminal and a drain terminal) of the second current source transistor 5101B is connected to a pixel electrode of the display element 5108, a second terminal (the other of the source terminal and the drain terminal) of the second current source transistor 5101B is connected to the first wire 5109 through the second shift transistor 5102B and the fourth switch B 5116B, and a gate terminal of the second current source transistor 5101B is connected to the second wire 5110 through the second switch 5105. In addition, a gate terminal of the second current source transistor 5101B is connected to one terminal of the capacitor element 5104, and the other terminal of the capacitor element 5104 is connected to the first terminal of the second current source transistor 5101B. Thus, a gate potential of the second current source transistor 5101B, i.e., a gate-source voltage (Vgs) can be held. The gate of the second current source transistor 5101B is connected to the second wire 5110 via the second switch 5105, and charge supply to the capacitor element 5104 can be controlled by ON/OFF of the second switch 5105. That is to say, when the second switch 5105 is in an ON state, the gate terminal of the second current source transistor 5101B and the second wire 5110 are connected. On the other hand, when the second switch 5105 is in an OFF state, the gate terminal of the second current source transistor 5101B and the second wire B 5105B are disconnected.

The first shift transistor 5102A includes a first switch A 5103A as a shift means in a case where it serves as a current source depending on a state or a case where it serves so that no current flows between a source and a drain (or serves as a switch). Here, a case where the first shift transistor 5102A serves as a current source (or a part thereof) is referred to as a current source operation. In addition, a case where the first shift transistor 5102A operates so that no current flows between the source and the drain (or serves as a switch) or a case where a source-drain voltage is small, is referred to as a short circuit operation. In FIG. 51, a source terminal and a drain terminal of the first shift transistor 5102A can be connected via a first switch A 5103A. A gate terminal of the first shift transistor 5102A is connected to a gate terminal of the first current source transistor 5101A. The operation of the first shift transistor 5102A can be shifted into a current source operation or a short circuit operation by using the first switch A 5103A.

Similarly, the second shift transistor 5102B includes a second switch 5103 as a shift means in a case where it serves as a current source depending on a state or a case where it serves so that no current flows between a source and a drain (or serves as a switch). Here, a case where the second shift transistor 5102B serves as a current source (or a part thereof) is referred to as a current source operation. In addition, a case where the second shift transistor 5102B operates so that no current flows between the soured and the drain (or serves as a switch) or a case where a source-drain voltage is small, is referred to as a short circuit operation. In FIG. 51, a source terminal and a drain terminal of the second shift transistor 5102B can be connected via the second switch 5103. A gate terminal of the second shift transistor 5102B is connected to a gate terminal of the second current source transistor 5101B. The operation of the second shift transistor 5102B can be shifted into a current source operation or a short circuit operation by using the second switch 5103.

The first terminal of the first current source transistor 5101A and the first terminal of the second current source transistor 5101B are connected to the third wire 5111 through the third switch 5106. That is to say, when the third switch 5106 is in an ON state, the first terminals of the first current source transistor 5101A and the second current source transistor 5101B are connected to the third wire 5111. On the other hand, when the third switch 5106 is in an OFF state, the first terminals of the first current source transistor 5101A and the second current source transistor 5101B are disconnected to the third wire 5111.

The gate terminals of the first current source transistor 5101A and the second current source transistor 5101B are connected to each other, and the gate terminals of the first shift transistor 5102A and the second shift transistor 5102B are connected to each other. The capacitor element 5104 is connected between the gate terminals and the first terminals of the first current source transistor 5101A and the second current source transistor 5101B. That is to say, a first electrode of the capacitor element 5104 is connected to the gate terminals of the first current source transistor 5101A and the second current source transistor 5101B, and a second electrode of the capacitor element 5104 is connected to the first terminals of the first current source transistor 5101A and the second current source transistor 5101B. It is to be noted that the capacitor element 5104 may have a structure where an insulating film is interposed between a wire, an active layer, an electrode, or the like, or can be omitted by using the gate capacitor of the first current source transistor 5101A or the gate capacitor of the second current source transistor 5101B.

The gate terminal of the first switch A 5103A is connected to the fifth wire A 5115A, the first terminal thereof (a source terminal or a drain terminal) is connected to a first terminal of the first shift transistor 5102A, and a second terminal (a source terminal or a drain terminal) is connected to the first wire 5109. Thus, when a signal input to the fifth wire A 5515A is at H level, the first switch A 5103A is turned ON, whereas the signal input to the fifth wire A 5115A is at L level, the first switch is turned OFF. In other words, the first switch A 5103A and the fourth switch A 5116A are turned ON, and thus, the first shift transistor 5102A conducts a short circuit operation.

The gate terminal of the first switch B 5103B is connected to the fifth wire B 5115B, the first terminal thereof (a source terminal or a drain terminal) is connected to a first terminal of the second shift transistor 5102B, and a second terminal thereof (a source terminal or a drain terminal) is connected to the first wire 5109. Thus, when a signal input to the fifth wire B 5515B is at H level, the first switch B 5103B is turned ON, whereas the signal input to the fifth wire B 5115B is at L level, the first switch B 5103B is turned OFF. In other words, the first switch B 5103B and the fourth switch B 5116B are turned ON, and thus, the second shift transistor 5102B conducts a short circuit operation.

The short circuit operation of the first shift transistor 5102A and the second shift transistor 5102B may be conducted with the first and fourth switches A, B 5103A, 5103B, A 5116A and B 5116B which are each connected at their ends to the first terminals or the second terminals of the first shift transistor 5102A and the second shift transistor 5102B. In this case, the short circuit operations of the first shift transistor 5102A and the second shift transistor 5102B are similar to the short circuit operation of the shift transistor 4602 in Example 3.

Note that a predetermined potential is input into each of the opposite electrode 5112 of the display element 5108, the first wire 5109 and the second wire 5110.

ON/OFF of the second switch 5105 and the third switch 5106 is controlled by inputting a signal into the fourth wire 5114.

ON/OFF of the first switch A 5103A is controlled by inputting a signal into the fifth wire A 5115A. ON/OFF of the first switch B 5103B is controlled by inputting a signal into the fifth wire B 5115B.

A signal is input into the third wire 5111 in response to a gray scale of a pixel. This signal corresponds to a video signal and a signal current flows to the third wire 5111.

Transistors can be applied to the first switch A 5103A, the first switch B 5101B, the second switch 5105, the third switch 5106, the fourth switch A 5116A, and the fourth switch B 5116B. Thus, N-channel transistors can be applied to the first switch A 5103A, the first switch B 5103B, the second switch 5105, the third switch 5106, the fourth switch A 5116A, and the fourth switch B 5116B.

Figure 63:
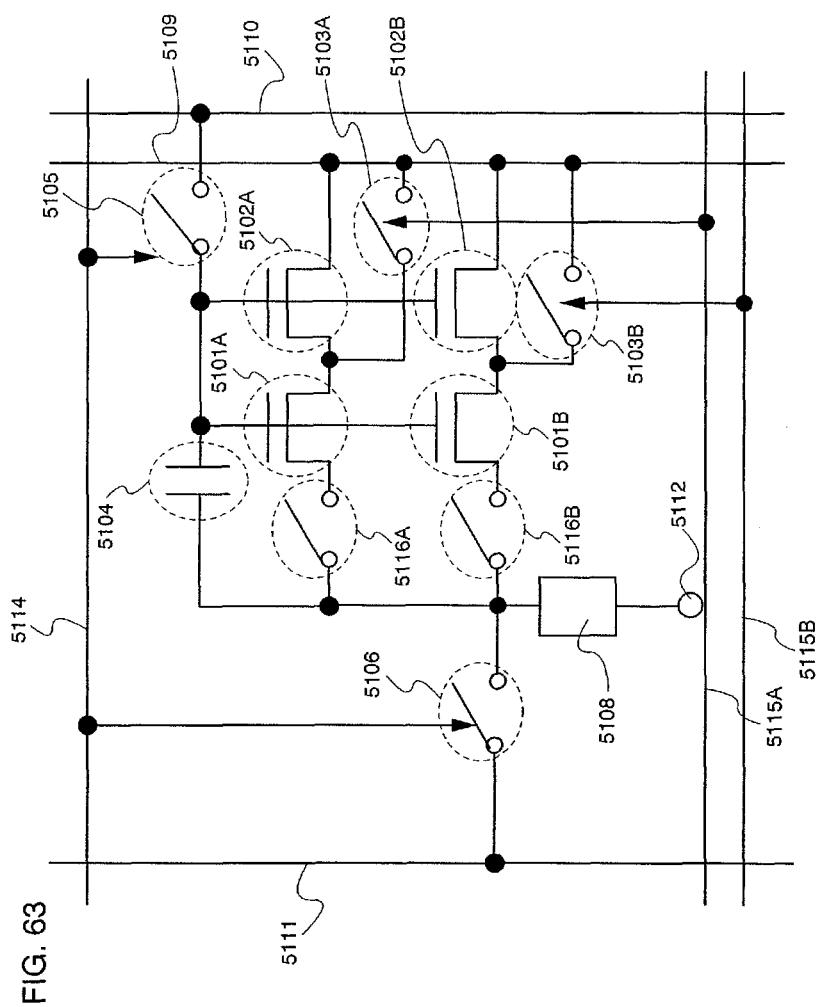
FIG. 63 is a diagram showing a pixel configuration according to an aspect of the present invention.

Note that the fourth switch A 5116A, and the fourth switch B 5116B may be arranged anywhere, as long as the fourth switches can switch a current flowing to the first current source transistor 5101A and the second current source transistor 5101B. For example, as shown in FIG. 63, the fourth switches may be provided in parallel between the first terminals of the first current source transistor 5101A and the second current source transistors 5101B and a light-emitting element.

Next, an operation of the pixel is described with reference to FIG. 51.

Note that as for the operation of the pixel, there are a signal writing operation in which a signal is written into a pixel and a light-emitting operation which light is emitted at a gray scale in accordance with a signal written in the pixel. In the pixel shown in this example, a transistor to be used (a transistor to be turned ON) is shifted between a signal writing operation and a light-emitting operation for a certain period, and a signal writing operation and a light-emitting operation for another period.

Figure 52A:
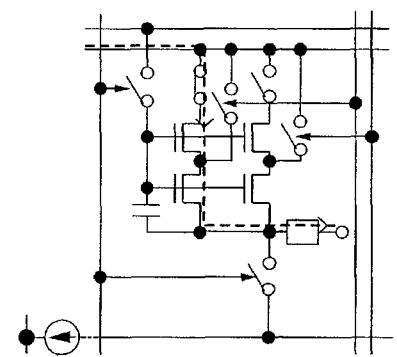
FIGS. 52A to 52D are each a diagram showing a pixel configuration according to an aspect of the present invention.
Figure 52B:
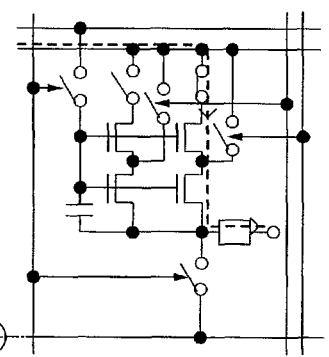
Figure 52C:
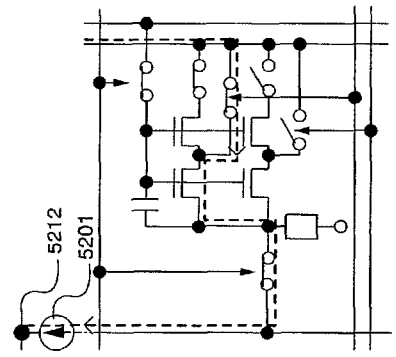
Figure 52D:
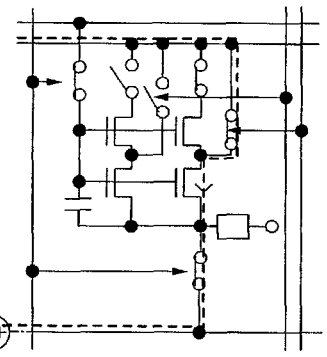

FIG. 52A is a diagram showing a signal writing operation for a certain period, and FIG. 52B is a diagram showing a light-emitting operation at that time. FIG. 52C is a diagram showing a signal writing operation for another period, and FIG. 52D is a diagram showing a light-emitting operation at that time. Note that the current source 5201 connected to the third wire 5111 sets a signal current to be written in this pixel. The third wire 5111 is connected to the wire 5212 via a current source 5201. A predetermined potential is input into the wire 5212. Here, potentials input to the first wire 5109, the second wire 5110, the wire 5212, and the opposite electrode 5112 are denoted by V1, V2, V3, and Vcom respectively. As for a relation of the potentials, V1>V2>V3 and V1>Vcom>V3 is at least satisfied.

FIG. 52A shows a pixel state which is in a steady state at the signal writing operation for a certain period, and a current flows at that time. The first switch A 5103A, the second switch 5105, the third switch 5106 and the fourth switch A 5116A are turned ON, while the other switches are turned OFF. At that time, the first current source transistor 5101A is used. A signal current Idata set by the current source 5201 flows to the first current source transistor 5101A from the first wire 5109 via the first switch A 5103A, and at that time, the fourth switch A 5116A is in a conductive state. In other words, in this case, the first current source transistor 5101A has a gate-source voltage enough to allow the signal current Idata to flow, and charges corresponding to the voltage are accumulated in the capacitor element 5104.

Thus, the fourth switch A 5116A is turned ON at the light-emitting operation, while the other switches are turned OFF, so that a current flows as shown in FIG. 52B. In other words, the current flows to the display element 5108 via the fourth switch A 5116A, the first shift transistor 5102A and the first current source transistor 5101A from the first wire 5109. This current can be made to flow as a current smaller than the signal current Idata, since the first current source transistor 5101A and the first shift transistor 5102A serve as a multigate transistor.

However, the drain-source voltage of the first current source transistor 5101A is different between at the signal writing operation and at the light-emitting operation, which generates a slight difference in amount of current which flows to the first current source transistor 5101A. If there is a variation in characteristics of the first current source transistor 5101A each pixel, it is recognized as display unevenness.

Thus in another period, at the signal writing operation, the first switch B 5103B, the second switch 5105, the third switch 5106 and the fourth switch B 5116B are turned on whereas the other switches are turned off. FIG. 52C shows a state where a pixel becomes a steady state in this period and a current flows at this time. In this case, the second current source transistor 5101B is used. That is to say, the signal current Idata set by a current source 5201 flows from the first wire 5109 to the second current source transistor 5101B through the first switch B 5103B. At this time, the fourth switch B 5116B is conducted. In other words, at this time, the second current source transistor 5101B has a gate-source voltage enough to allow the signal current Idata to flow, and charges for the voltage is accumulated in the capacitor element 5104.

Therefore, at the light emitting operation, the fourth switch B 5116B is turned on, while the other switches are turned off, and a current flows as shown in FIG. 52D. That is, a current flows from the first wire 5109 to the display element 5108 through the fourth switch B 5116B, the second shift transistor 5102B, and the second current source transistor 5101B. This current is smaller than the signal current Idata, since the second current source transistor 5101B and the second shift transistor 5102B serve as a multigate transistor.

In this manner, transistors to be used are shifted each period, thereby transistor characteristics can be averaged in terms of time. Accordingly, display unevenness can be reduced.

Further, another driving method can be applied to a pixel described in this example and shown in FIG. 51. For example, at the signal writing operation, a signal is written with a large amount of signal current, and the amount of current applied to a display element at a light emitting operation is reduced. Hereinafter, such a driving method is described FIG. 53A is a diagram showing a signal writing operation and FIG. 53B is a diagram showing a light emitting operation.

Figure 53B:
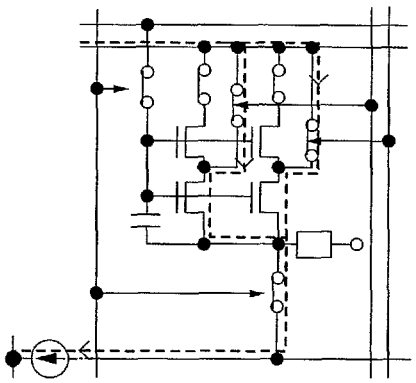
FIGS. 53A and 53B are each a diagram showing a pixel configuration according to an aspect of the present invention.
Figure 53A:
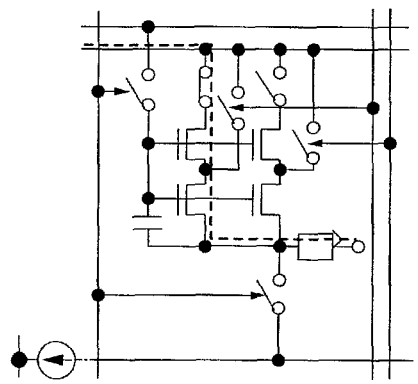

Further, FIG. 53A shows a state where a pixel becomes a steady state at the signal writing operation and a current flows at this time. The first switch A 5103A, the first switch B 5103B, the second switch 5105, the third switch 5106, the fourth switch A 5116A and the fourth switch B 5116B are in an ON state, and a current flows as shown in FIG. 53A. That is, as paths of current, there are a first path where a current flows from the first wire 5109 to the first current source transistor 5101A through the first switch A 5103A and a second path where a current flows from the first wire 5109 to the first current source transistor 5101A through the first switch A 5103A. A current I1 that flows through the first path and a current I2 that flows through the second path unite at a connecting portion of the first terminals of the first current source transistor 5101A and the second current source transistor 5101B. Then, a current I1 and a current I2 flow as the signal current Idata to the wire 5212 through the third switch 5106 and a current source 5201. That is to say, I1+I2=Idata is satisfied.

Description is made with reference to FIG. 53B of the light emitting operation. The fourth switch A 5116A is turned ON, while the other switches are turned OFF. Then a current flows as shown in FIG. 53B. Since the second switch 5105 is in an OFF state at this time, the capacitor element 5104 holds a gate-source voltage Vgs necessary for a current flowing to the first current source transistor 5101A and the second current source transistor 5101B to be the signal current Idata. Accordingly, a current flows to the display element 5108 through the first current source transistor 5101A. With this structure, this current can be adjusted.

Here, the channel length and the channel width of a transistor are denoted by L and W respectively. When the transistor operates in a saturation region, a current value flowing through the transistor is generally proportional to W/L if a gate-source voltage is constant. In other words, a current value is proportional to the channel width W and inversely proportional to the channel length L.

Therefore, the channel width and the channel length of the first current source transistor 5101A are denoted by W1 and L1 respectively, and the channel width and the channel length of the second current source transistor 5101B are denoted by W2 and L2 respectively. If the first current source transistor 5101A and the second current source transistor 5101B through which a current flows are regarded as one transistor in FIG. 53A, the channel width and the channel length can be regarded as (W1+W2) and L respectively. On the other hand, in FIG. 8B, a current flows through the first current source transistor 5101A and the first shift transistor 5102A and the transistor has the channel width W1 and the channel length (L1+L2). Therefore, at the light emitting operation, a current of Idata×(W1/(W1+W2))×(L1/(L1+L2)) can be applied to the display element 5108.

In this manner, the channel width or the channel length of the first current source transistor 5101A or the second current source transistor 5101B is adjusted, thereby a smaller amount of current than the signal current which is applied at the signal writing operation can be applied to the display element 5108.

Further, the channel width W1 and the channel length W2 are set to be the same and a transistor used at the light emitting operation is shifted each a certain period. Accordingly, characteristics of the transistor can be averaged in terms of time.

By shifting the transistor to be used between at the signal writing operation and at the light emitting operation, a ratio W/L of the channel width W to the channel length L of the transistor which is used at the signal writing operation and the light emitting operation may be adjusted to control the amount of current applied to the display element.

Figure 54B:
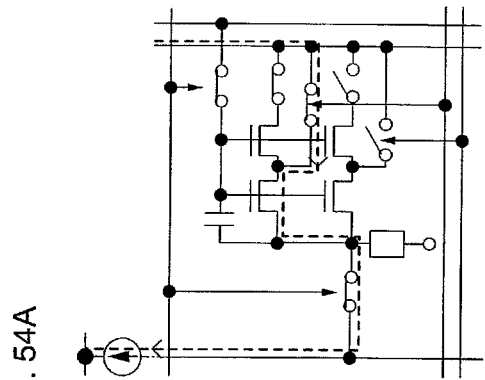
FIGS. 54A and 54B are each a diagram showing a pixel configuration according to an aspect of the present invention.
Figure 54A:
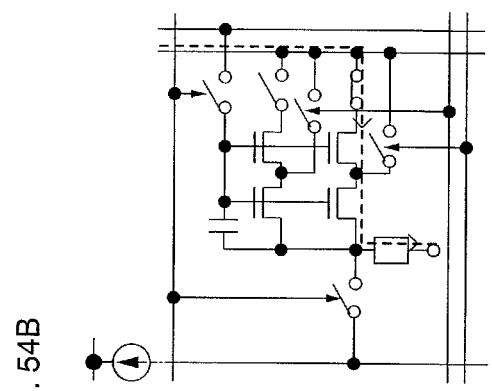

That is, as shown in FIG. 54A, at the signal writing operation, the first switch A 5103A, the second switch 5105, the third switch 5106 and the fourth switch A 5116A are turned on whereas the other switches are turned off. Then, the signal current Idata is supplied from the first wire 5109 to the first current source transistor 5101A through the fourth switch A 5116A. At the light emitting operation, the fourth switch B 5116B is turned ON, whereas the other switches are turned ON. Then, a current of Idata×(W1/W2)×(L1/(L1+L2)) flows through the first current source transistor 5101A. It is to be noted that the amount of current applied to the display element 5108 at the light emitting operation can be set smaller than the signal current Idata if W1<W2 is satisfied.

Thus, by writing a signal with a large amount of current at the signal writing operation, even when parasitic capacitance is formed in the path where the signal current flows, signal writing can be performed quickly. Accordingly, a display defect can be prevented.

Further, in a pixel of this example, a precharge operation may be performed. The operation is described with reference to FIG. 55. In this case, a current source 5201 connected to a wire 5212 is connected to a third wire 5111 through a fifth switch 5501. The third wire 5111 is connected to a wire 5504 through a sixth switch 5502 and a precharging current source 5503. It is to be noted that the precharging current source 5503 which can set a larger amount of current than a current source 5201, is used. A predetermined potential is input to the wire 5505. As the wire 5212 and the wire 5504, the common wire or different wires may be used.

Figure 55B:
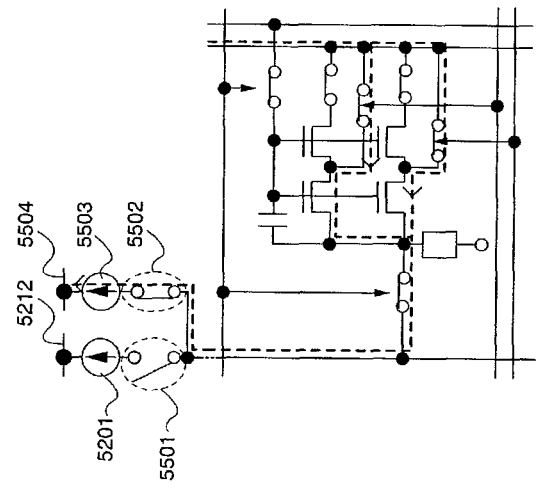
FIGS. 55A and 55B are each a diagram showing a pixel configuration according to an aspect of the present invention.
Figure 55A:
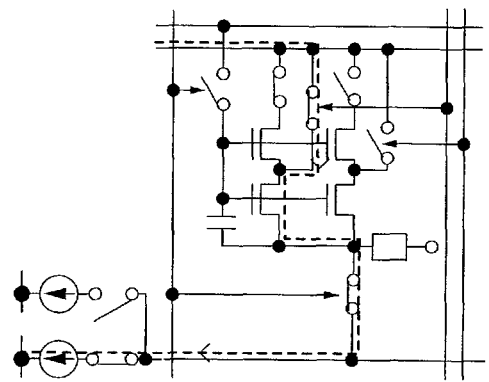

First, FIG. 55A shows a state where a pixel becomes a steady state at the precharge operation and a current flows at this time. The first switch A 5103A, the second switch 5105, the third switch 5106, the fourth switch A 5116A, the fourth switch B 5116B and the sixth switch 5502 are turned on whereas the other switches are turned off. Then, a current set by the precharging current source 5503 flows from the first wire 5109 to the first current source transistor 5101A and the second current source transistor 5101B through the first switch A 5103A and the first switch B 5103B, respectively. Thus, charges are accumulated in the capacitor element 5104.

At the signal writing operation, the first switch A 5103A, the second switch 5105, the third switch 5106, the fourth switch A 5116A and the fifth switch 5501 are turned on whereas the other switches are turned off. Then, in a steady state, a current flows as shown in FIG. 55B. That is to say, the signal current Idata set by a current source 5201 flows from the first wire 5109 to the first current source transistor 5101A. Then, charges for the gate-source voltage necessary for applying the signal current Idata to the first current source transistor 5101A are accumulated in the capacitor element 5104.

A current supplied to the precharging current source 5503, the channel length L1 and the channel width W1 of the first current source transistor 5101A, and the channel length L2 and the channel width W2 of the second current source transistor 5101B are appropriately determined, thereby charges which are accumulated in the capacitor element 5104 at the precharge operation can be set so as to be approximately equal to that at the signal writing operation, and the signal current can be written to a pixel quickly.

In FIG. 55, although a current is supplied to the first current source transistor 5101A and the second current source transistor 5101B at the precharge operation, a current may be supplied to only one of them. Then, at the signal writing operation, a current may be supplied to the other transistor.

In this example, at the signal writing operation, a gate terminal of a transistor to which a current is applied can be set so as to have a predetermined potential; therefore, a potential difference between a pixel electrode and an opposite electrode of the display element can be equal to or lower than a forward threshold voltage of the display element. Accordingly, a current can be prevented from flowing to the display element at the signal writing operation.

Also in this example, N-channel transistors may be used for the first switch A 5103A, the first switch B 5103B, the second switch 5105, the third switch 5106, the fourth transistor A 5116A, the fourth transistor B 5116B, a fifth switch 5501, a sixth switch 5502, thereby a pixel can be formed of a unipolar transistor. Accordingly, a manufacturing process can be simplified. As a result, reduction in a manufacturing cost and improvement in the yield can be achieved. Further, since a pixel can be formed of only an N-channel transistor, a semiconductor layer of the transistor which is included in the pixel can be formed of an amorphous semiconductor, a semi-amorphous semiconductor (also referred to as microcrystalline semiconductor), or the like. For example, amorphous silicon (a-Si:H) may be used as an amorphous semiconductor. Therefore, a manufacturing process can be further simplified. As a result, reduction in a manufacturing cost and improvement in the yield can be achieved.

This example can be freely combined with the other embodiment modes or examples in this specification.

Example 6

Figure 64:
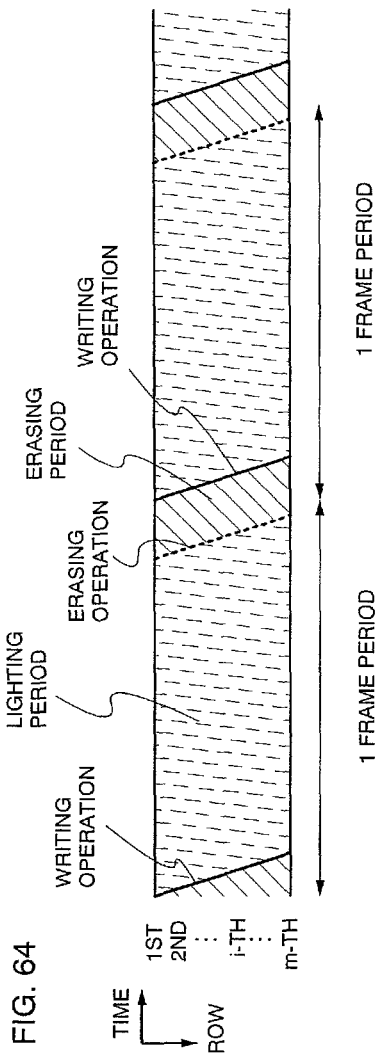
FIG. 64 is a diagram showing a driving method according to an aspect of the present invention.

In Example 6, by using a timing chart shown in FIG. 64, description is made of one mode of a driving method of a display device to which a pixel of the present invention can be applied. Further, a pixel configuration of the present invention, to which the driving method can be applied, is described.

The horizontal direction indicates passage of time and the longitudinal direction indicates the number of scan rows of scan lines.

When images are displayed, writing operation and light emitting operation are conducted repeatedly. A period in which writing operation and light emitting operation for one screen (one frame) are performed is referred to as one frame period. Although there is no particular limitation on a process of signals for one frame, it is preferable that the number of one frame periods be at least about 60 times per second so as not to make a viewer notice flickers.

In a display device of this example, a video signal is written to a pixel in accordance with a gray scale of each pixel. In other words, an analog signal is written to a pixel. The video signal is a signal current.

In a light emitting period, a gray scale is expressed by holding the video signal. Here, a display device including a pixel of this example erases a signal written to a pixel by an erasing operation. Thus, an erasing period is provided until a next frame period. That is, black display is inserted, thereby persistence of an image can be hardly seen. Accordingly, characteristics of a moving image can be improved.

Description is made of a pixel configuration to which a driving method of this example can be applied. A pixel of this example may be used as long as it has a means of forcibly making a pixel emit no light by scanning. As such a means, in the case of the pixel shown in FIG. 46, a path of a current from the first wire 4609 to the opposite electrode 4612 of the display element 4608 through the current source transistor 4601 and the shift transistor 4602 is preferably made non-conductive.

There are roughly two methods of making the path of a current non-conductive. As one method, another switch is provided in the path of a current from the first wire 4609 to the opposite electrode 4612 of the display element 4608 through the current source transistor 4601 and the shift transistor 4602. Then, the switch from the first wire 4609 to the opposite electrode 4612 of the display element 4608 through the current source transistor 4601 and the shift transistor 4602 is turned off by scanning a pixel row by row, thereby the current path from the first wire 4609 to the opposite electrode 4612 of the display element 4608 through the current source transistor 4601 and the shift transistor 4602 is made non-conductive.

Figure 86:
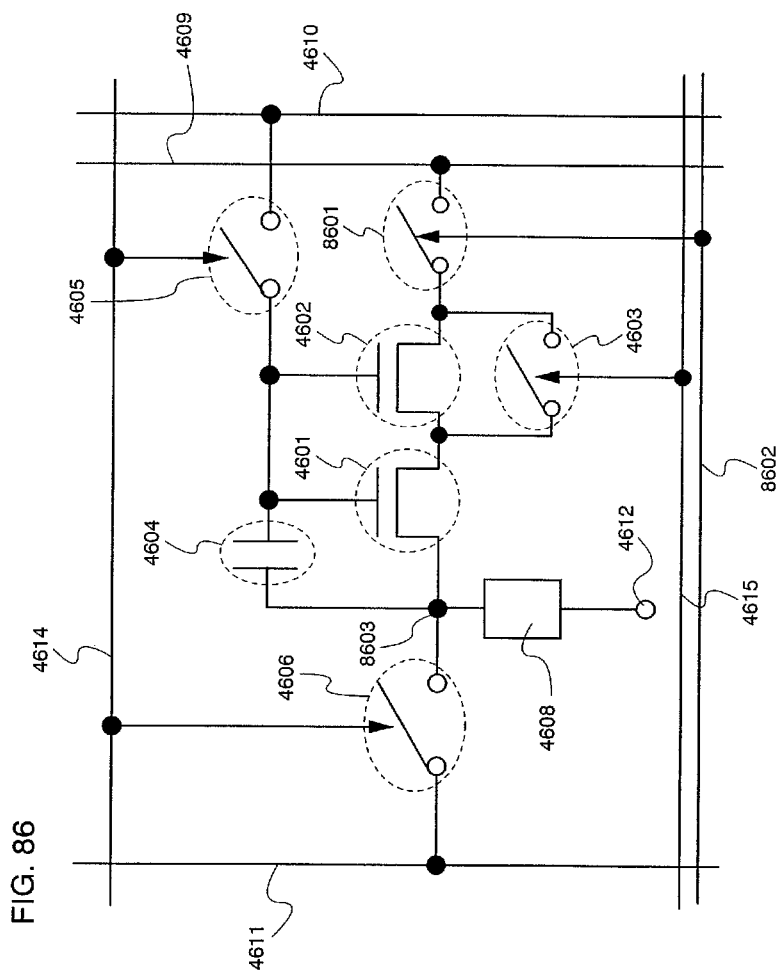
FIG. 86 is a diagram showing a pixel configuration according to an aspect of the present invention.

An example of such a structure is shown in FIG. 86. Note that common portions to those in FIG. 46 are denoted by the same reference numerals and description thereof is omitted.

In a structure of FIG. 86, a fourth switch 8601 is connected between a second terminal of a shift transistor 4602 and a first wire 4609, based on the structure of FIG. 46. The fourth switch 8601 is controlled to be turned on or off by a signal to be input to a sixth wire 8602. Note that a portion where the switch is provided is not limited to the structure of FIG. 86. When a connecting point of the first terminal of the current source transistor 4601 and a pixel electrode of the display element 4608 is a node 8603, a switch may be connected between the node 8603 and the first terminal of the current source transistor 4601 or the pixel electrode of the display element 4608.

As the other method, the current source transistor 4601 and the shift transistor 4602 are forcibly turned off by scanning a pixel row by row. Therefore, the pixel is required to have a means of discharging charges accumulated in a capacitor element 4604 or a means of inputting a potential to gate terminals of the current source transistor 4601 and the shift transistor 4602.

Figure 65:
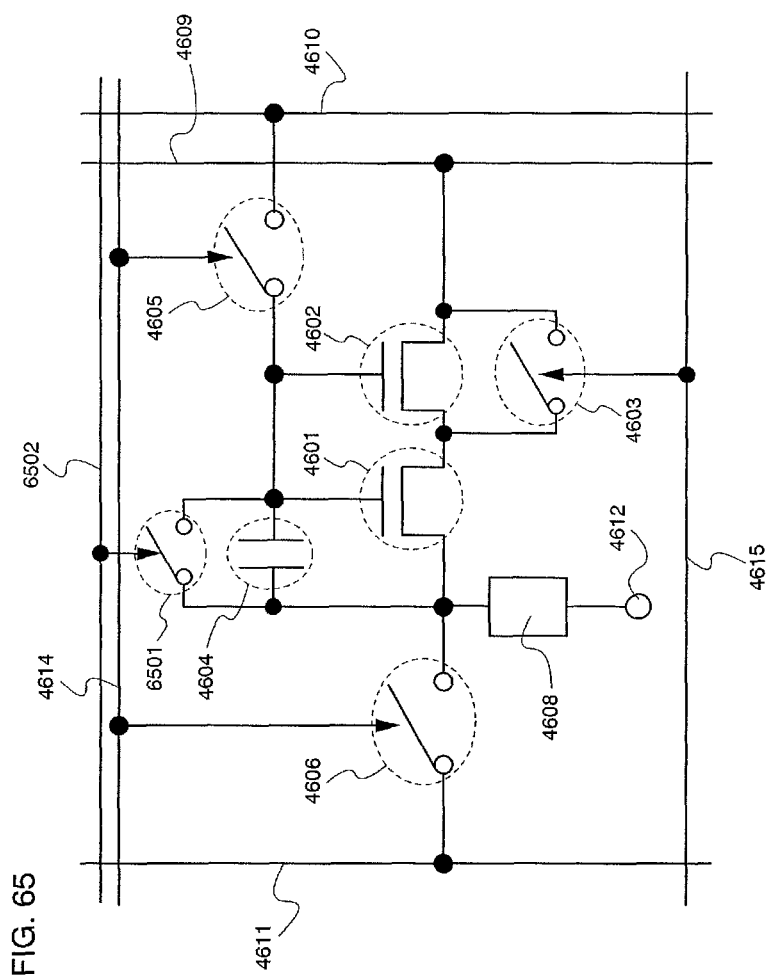
FIG. 65 is a diagram showing a pixel configuration according to an aspect of the present invention.

First, FIG. 65 shows one example of a pixel having a means of discharging charges accumulated in the capacitor element 4604. Note that common portions to those in FIG. 46 are denoted by the same reference numerals and description thereof is omitted. In FIG. 65, the capacitor element 4604 and a fourth switch 6501 are connected in parallel. The fourth switch 6501 is controlled to be turned on or off by a signal to be input to a sixth wire 6502. That is, when the fourth switch 6501 is turned on, the gate and the first terminal of the current source transistor 4601 are short-circuited. Thus, a gate-source voltage of the current source transistor 4601, which is held in the capacitor element 4604, can be set to 0 V. Accordingly, the current source transistor 4601 can be turned off.

Figure 66:
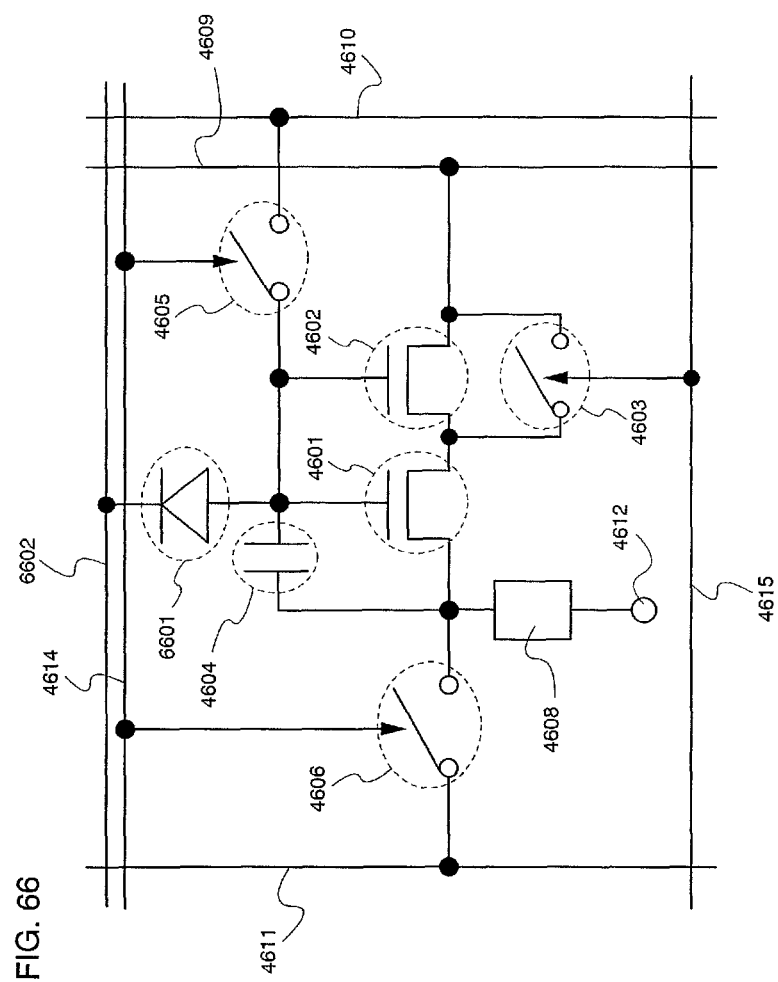
FIG. 66 is a diagram showing a pixel configuration according to an aspect of the present invention.

Further, FIG. 66 shows one example of a pixel having a means of inputting a potential to the gate terminal of the current source transistor 4601. Note that common portions to those in FIG. 46 are denoted by the same reference numerals and description thereof is omitted. In FIG. 66, a rectifying element 6601 is connected between the gate terminal of the current source transistor 4601 and a sixth wire 6602. The rectifying element 6601 is connected such that direction of a current flowing from the gate terminal of the current source transistor 4601 to the sixth wire 6602 is a forward current. Only in the case where the current source transistor 4601 is forcibly turned off, L level signal is input to the sixth wire 6602, and in the other cases, H level signal is input to the sixth wire 6602. Accordingly, when the sixth wire 6602 is at H level, a current does not flow to the rectifying element 6601 whereas when the sixth wire 6602 is at L level, a current flows from the current source transistor 4601 to the sixth wire 6602. Therefore, a potential of the gate terminal of the current source transistor 4601 is higher than that of the sixth wire 6602 at L level by a forward threshold voltage of the rectifying element 6601. At this time, charges are also accumulated in a second electrode of the capacitor element 4604 through the current source transistor 4601. Then, a potential of the first terminal of the current source transistor 4601 also becomes high. Thus, the current source transistor 4601 can be forcibly turned off.

Figure 85:
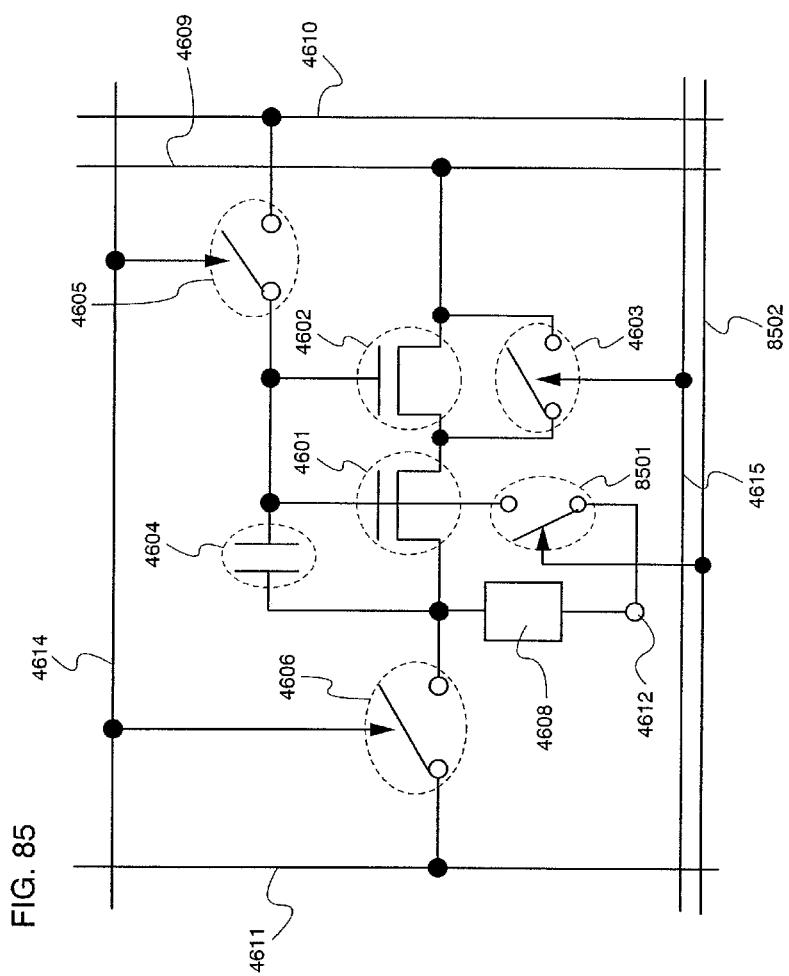
FIG. 85 is a diagram showing a pixel configuration according to an aspect of the present invention.

Further, FIG. 85 shows another example of a pixel having a means of inputting a potential to the gate terminal of the current source transistor 4601. Note that common portions to those in FIG. 46 are denoted by the same reference numerals and description thereof is omitted. In FIG. 85, a fourth switch 8501 is connected between the gate terminal of the current source transistor 4601 and the opposite electrode 4612 of the display element 4608. Note that the fourth switch 8501 is controlled to be turned on or off by inputting a signal to a sixth wire 8502. When the fourth switch 8501 is turned on by inputting a signal to the sixth wire 8502, charges are stored in the second electrode of the capacitor element 4604 through the current source transistor 4601. Accordingly, the current source transistor 4601 is turned off.

Note that a cross sectional structure of a display panel having pixels shown in FIG. 85 is described with reference to FIG. 87.

A base film 8702 is provided over a substrate 8701. The substrate 8701 can be formed of an insulating substrate such as a glass substrate, a quartz substrate, a plastic substrate, or a ceramic substrate, or of a metal substrate, a semiconductor substrate, or the like. The base film 8702 can be formed by CVD or sputtering. For example, a silicon oxide film, a silicon nitride film, a silicon oxynitride film, or the like formed by CVD using $SiH_4$, $N_2O$, and $NH_3$ as a source material, can be used. Moreover, a stacked layer of them may be used as well. It is to be noted that the base film 8702 is provided to prevent impurities from dispersing from the substrate 8701 into the semiconductor layer. When the substrate 8701 is formed of a glass substrate or a quartz substrate, the base film 8702 is not necessarily provided.

Island-shaped semiconductor layers are formed over the base film 8702. In each of the semiconductor layers, a channel forming region 8703 where an N-channel is formed, an impurity region 8704 which functions as a source region or a drain region, and a low concentration impurity region (LDD region) 8705 are formed. A gate electrode 8707 is formed over the channel forming region 8703 with a gate insulating film 8706 interposed therebetween. As the gate insulating film 8706, a silicon oxide film, a silicon nitride film, a silicon oxynitride film, or the like formed by CVD or sputtering can be used. Further, an aluminum (Al) film, a copper (Cu) film, a thin film containing aluminum or copper as a main component, a chromium (Cr) film, a tantalum (Ta) film, a tantalum nitride (TaN) film, a titanium (Ti) film, a tungsten (W) film, a molybdenum (Mo) film, or the like can be used as the gate electrode 8707.

Sidewalls 8722 are formed on the sides of the gate electrode 8707. After forming a silicon compound, for example, a silicon oxide film, a silicon nitride film, or a silicon oxynitride film is formed so as to cover the gate electrode 8707, etchback treatment is applied to form the sidewalls 8722.

The low concentration impurity regions 8705 are formed under the sidewalls 8722. That is, the low concentration impurity regions 8705 are formed in a self-aligned manner. Note that the sidewalls 8722 are not necessarily provided since they are provided to form the low concentration impurity regions 8705 in a self-aligned manner.

A first interlayer insulator is formed over the gate electrode 8707, the sidewalls 8722, and the gate insulating film 8706. The first interlayer insulator includes an inorganic insulating film 8718 as a lower layer and a resin film as an upper layer. As the inorganic insulating film 8718, a silicon nitride film, a silicon oxide film, a silicon oxynitride film, or a film formed by stacking these layers can be used. As the resin film, polyimide, polyamide, acrylic, polyimide amide, epoxy, or the like can be used.

A first electrode 8709, a second electrode 8724, a third electrode 8720, and a fourth electrode 8721 are formed over the first interlayer insulating film. The first electrode 8709, the second electrode 8724, and the fourth electrode 8721 are electrically connected to the impurity regions 8704 through contact holes. Further, the third electrode 8720 is electrically connected to the gate electrode 8707 through a contact hole. The third electrode 8720 and the fourth electrode 8721 are electrically connected to each other. A titanium (Ti) film, an aluminum (Al) film, a copper (Cu) film, an aluminum film containing Ti, or the like can be used as the first electrode 8709 and the second electrode 8724. It is to be noted that in the case of providing a wire such as a signal line in the same layer as the first electrode 8709, the second electrode 8724, the third electrode 8720, and the fourth electrode 8721, copper which has low resistance is preferably used.

A second interlayer insulator 8710 is formed over the first electrode 8709, the second electrode 8724, the third electrode 8720, the fourth electrode 8721, and the first interlayer insulating film 8708. As the second interlayer insulator 8710, an inorganic insulating film, a resin film, or a film formed by stacking these layers can be used. As an inorganic insulating film, a silicon nitride film, a silicon oxide film, a silicon oxynitride film, or a film formed by stacking these layers can be used. As a resin film, polyimide, polyamide, acrylic, polyimide amide, epoxy, or the like can be used.

A pixel electrode 8711 and a wire 8719 are formed over the second interlayer insulator 8710. The pixel electrode 8711 and the wire 8719 are formed of the same material. That is, they are formed in the same layer at the same time. As a material used for the pixel electrode 8711 and the wire 8719, a material having a high work function is preferably used. For example, a single layer of a titanium nitride (TiN) film, a chromium (Cr) film, a tungsten (W) film, a zinc (Zn) film, a platinum (Pt) film, or the like, a stacked layer of a titanium nitride film and a film containing aluminum as a main component, a stacked layer of three layers of a titanium nitride film, a film containing aluminum as a main component, and a titanium nitride film can be used. With a stacked layer structure, the resistance as a wire is low, a good ohmic contact can be obtained, and further a function as an anode can be obtained. By using a metal film which reflects light, an anode which does not transmit light can be formed.

An insulator 8712 is formed so as to cover end portions of the pixel electrode 8711 and the wire 8719. As the insulator 8712, for example, a positive type photosensitive acrylic resin film can be used.

A layer 8713 containing an organic compound is formed over the pixel electrode 8711, and the layer 8713 containing an organic compound partially overlaps the insulator 8712. Note that the layer 8713 containing an organic compound is not formed over the wire 8719.

An opposite electrode 8714 is provided over the layer 8713 containing an organic compound, the insulator 8712, and the wire 8719. As a material used for the opposite electrode 8714, a material having a low work function is preferably used. For example, a thin metal film of aluminum (Al), silver (Ag), lithium (Li), calcium (Ca), an alloy of these, MgAg, MgIn, AlLi, $CaF_2$, $Ca_3N_2$ or the like can be used. By using a thin metal film in this manner, a cathode which can transmit light can be formed.

A region where the layer 8713 containing an organic compound is interposed between the opposite electrode 8714 and the pixel electrode 8711 includes a light-emitting element 8716.

In a region where the layer 8713 containing an organic compound is isolated by the insulator 8712, a joint portion 8717 is formed, so that the opposite electrode 8714 and the wire 8719 contact each other. Therefore, the wire 8719 functions as an auxiliary electrode of the opposite electrode 8714, thereby the lower resistance of the opposite electrode 8714 can be realized. Accordingly, a film thickness of the opposite electrode 8714 can be reduced, which leads to an increase in the light transmittance. Therefore, higher luminance can be obtained in a top emission structure where the light from the light-emitting element 8716 is extracted from a top surface.

A stacked layer of a thin metal film and a transparent conductive film (such as ITO (indium tin oxide) film, indium zinc oxide (IZO) film, or zinc oxide (ZnO) film) may be used in order to lower the resistance of the opposite electrode 8714. In this manner, a cathode which can transmit light can be formed by using a thin metal film and a transparent conductive film with transparency as well.

That is, a transistor 8715 corresponds to the current source transistor 4601 in the pixel of FIG. 85 and a transistor 8723 fulfills the function of the fourth transistor 8501 in the pixel of FIG. 85. Further, the opposite electrode 8714 corresponds to the opposite electrode 4612 of the display element 4608 in the pixel of FIG. 85.

Figure 87:
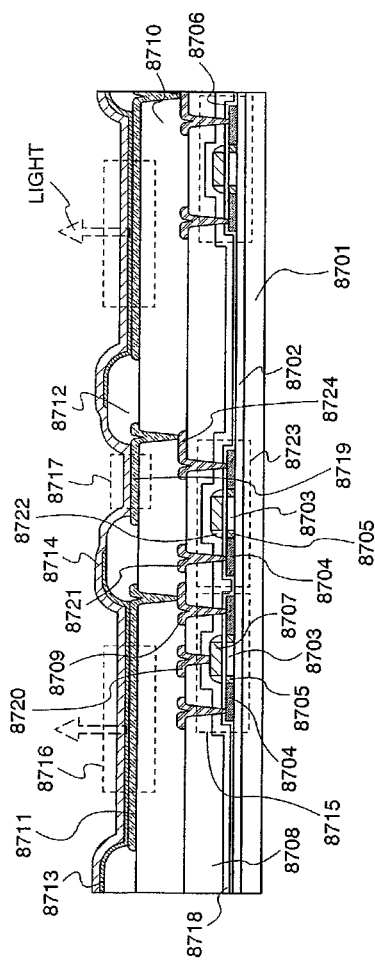
FIG. 87 is a diagram showing a pixel configuration according to an aspect of the present invention.

In the display panel having the structure shown in FIG. 87, the film of the opposite electrode 8714 can be thinned, thereby the light can be emitted from a top surface with high transmittance. Therefore, the luminance from the top surface can be enhanced. Further, by connecting the opposite electrode 8714 and the wire 8719, the lower resistances of the opposite electrode 8714 and the wire 8719 can be realized. Therefore, power consumption can be reduced.

Further, the transistor 101 can be forcibly turned off in a display device having the pixel configuration of FIG. 47. A driving method in this case is described below.

Figure 88:
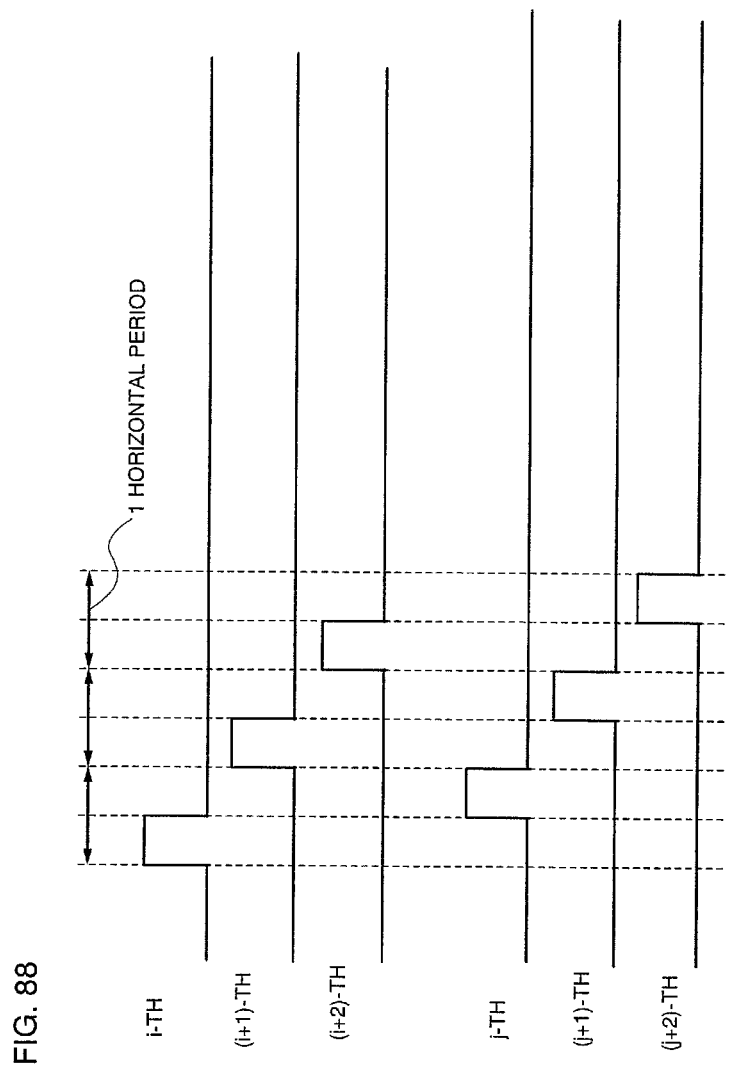
FIG. 88 is a circuit diagram showing an example of a circuit according to an aspect of the present invention.

One horizontal period is divided into two periods as shown in FIG. 88. Here, description is made assuming that the former half is writing time and the latter half is erasing time. In the divided horizontal period, each scan line is selected, and a corresponding signal at that time is input to a signal line. For example, an i-th row is selected in the former half of a certain horizontal period and a j-th row is selected in the latter half. Then, operation can be performed as if two rows were selected at the same time in one horizontal period. In other words, the video signals are written to pixels from the signal line using writing time that is the former half of each horizontal period. Then, a pixel is not selected in erasing time that is the latter half of the one horizontal period at this time. In addition, an erasing signal is input to a pixel from the signal line at the erasing time using an erasing time that is the latter half of another horizontal period. In writing time that is the former half of one horizontal period at this time, a pixel is not selected. Thus, a display device having a pixel with a high aperture ratio can be provided and the yield can be improved.

Figure 89:
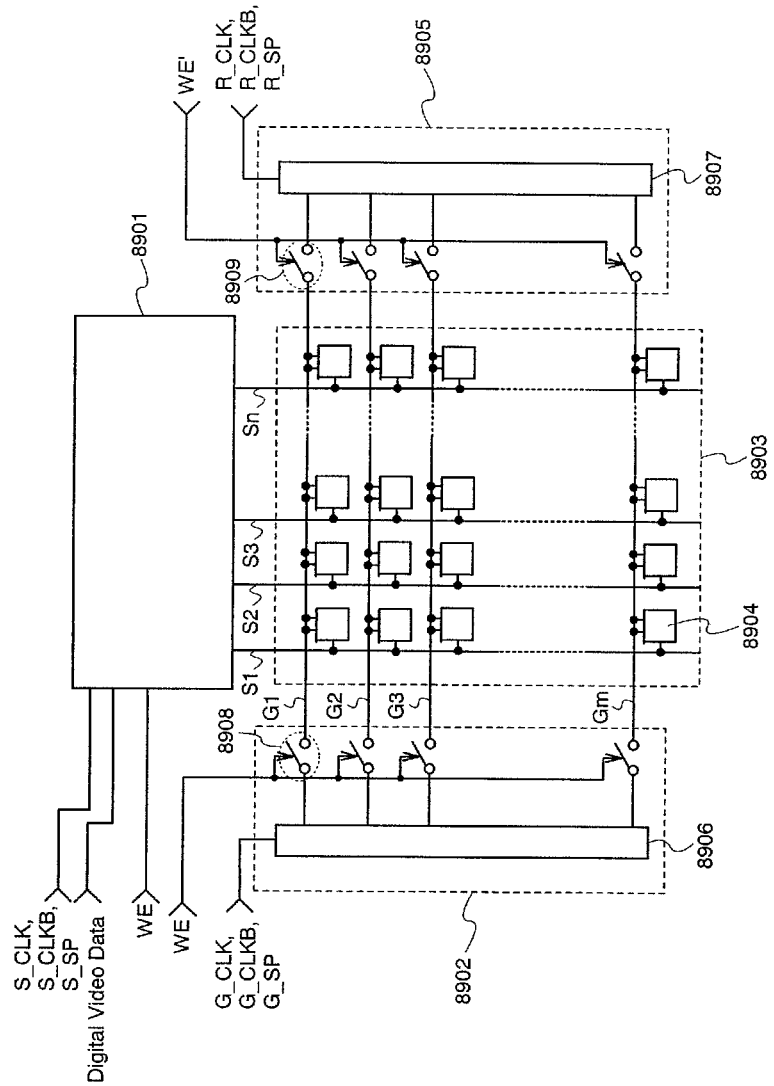
FIG. 89 is a view showing a display device according to one aspect of the present invention.

FIG. 89 shows an example of a display device including such a pixel. The display device has a signal line driver circuit 8901, a first scan line driver circuit 8902, a second scan line driver circuit 8905, and a pixel portion 8903 in which pixels 8904 are arranged in matrix corresponding to scan lines G1 to Gm and signal lines S1 to Sn. The first scan line driver circuit 8902 includes a pulse output circuit 8906 and switches 8908 which are connected between each of the scan lines G1 to Gm and the pulse output circuit 8906. The second scan line driver circuit 8905 includes a pulse output circuit 8907 and switches 8909 which are connected between each of the scan lines G1 to Gm and the pulse output circuit 8907.

It is to be noted that a scan line Gi (one of the scan lines G1 to Gm) corresponds to the fourth wire 4614 in FIG. 47, and a signal line Sj (one of the signal lines S1 to Sn) corresponds to the third wire 4611 in FIG. 47

A clock signal (G_CLK), an inverted clock signal (G_CLKB), a start pulse signal (G_SP), a control signal (WE), and the like are input to the first scan line driver circuit 8902. In accordance with these signals, signals selecting pixels are output to a first scan line Gi (one of the first scan lines G1 to Gm) of a pixel row to be selected. Note that the signals at this time are pulses output in the former half of one horizontal period as shown in a timing chart in FIG. 88. The switch 8908 is controlled to be turned on or off by the control signal (WE), thereby the pulse output circuit 8906 and the scan lines G1 to Gm can be connected or disconnected.

A clock signal (R_CLK), an inverted clock signal (R_CLKB), a start pulse signal (R_SP), a control signal (WE'), and the like are input to the second scan line driver circuit 8905. In accordance with these signals, signals are output to a second scan line Ri (one of the second scan lines R1 to Rm) of a pixel row to be selected. Note that the signals at this time are pulses output in the latter half of one horizontal period as shown in the timing chart in FIG. 88. The switch 8909 is controlled to be turned on or off by the control signal (WE'), thereby the pulse output circuit 8907 and the scan lines G1 to Gm can be electrically connected or disconnected. Note that when one of the switch 8908 and the switch 8909 is electrically connected, the other is electrically disconnected.

A clock signal (S_CLK), an inverted clock signal (S_CLKB), a start pulse signal (S_SP), a video signal (Digital Video Data), a control signal (WE), and the like are input to the signal line driver circuit 8901. In accordance with these signals, a video signal corresponding to pixels of each row is output to each of the signal lines S1 to Sn.

Therefore, the video signal input to the signal lines S1 to Sn is written to the pixel 8904 of each column in the row selected by a signal input to the scan line Gi (one of the scan lines G1 to Gm) from the first scan line driver circuit 8902. Then, each pixel row is selected through each of the scan lines G1 to Gm, thereby video signals corresponding to each of the pixels 8904 are input to all the pixels 8904. Each of the pixels 8904 holds the data of the written video signal for a certain period. Then, each of the pixels 8904 can keep a light emitting state or a non-light emitting state by holding the data of the video signal for a certain period.

Further, a signal (also referred to as erasing signal) for making a pixel emit no light is written from the signal lines S1 to Sn to the pixel 8904 of each column in the pixel row selected by a signal input to the scan line Gi (one of the scan lines G1 to Gm) from the second scan line driver circuit 8905. Then, each pixel row is selected by each of the scan lines G1 to Gm, thereby setting a non-light emitting period. For example, at the time when the pixel in an i-th row is selected by the signal input from the second scan line driver circuit 8905 to the scan line Gi, the potentials of the signal lines S1 to Sn are made equal to that of the third wire 4611 in the pixel of FIG. 47. Note that the signal lines Si to Sn may be in a floating state at this time.

Therefore, by using a display device of the present invention, in the case of focusing on a certain pixel row, when a signal input to the certain pixel row is the same as that to be input, the signal can be prevented from being input to the pixel row, which leads to reduction in the number of times of charging and discharging the scan line or the signal line are performed. As a result, power consumption can be lowered.

This example can be freely combined with the other embodiment modes or examples in this specification.

Example 7

Figure 56:
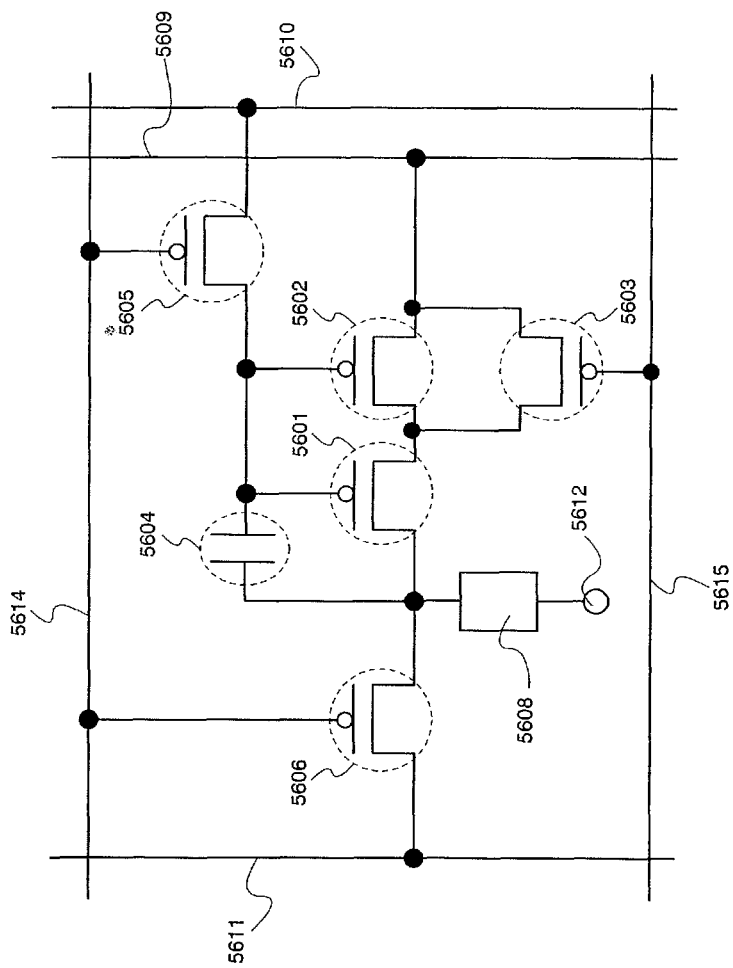
FIG. 56 is a diagram showing a pixel configuration according to an aspect of the present invention.

In Example 7, description is made with reference to FIG. 56 of a case where a P-channel transistor is applied to a transistor included in a pixel of the present invention.

A pixel described in this example includes a current source transistor 5601, a shift transistor 5602, a first switching transistor 5603, a capacitor element 5604, a second switching transistor 5605, a third switching transistor 5606, a display element 5608, a first wire 5609, a second wire 5610, a third wire 5611, an opposite electrode 5612, a fourth wire 5614 and a fifth wire 5615. It is to be noted that the current source transistor 5601, the shift transistor 5602, the first switching transistor 5603, the second switching transistor 5605, and the third switching transistor 5606 are P-channel transistors.

First, a connection structure of the pixel is described.

A first terminal (one of a source terminal and a drain terminal) and a second terminal (the other of the source terminal and the drain terminal) of the current source transistor 5601 are connected to a pixel electrode of the display element 5608 and the first wire 5609 via the shift transistor, respectively. A gate terminal of the current source transistor 5601 is connected to the second wire 5610 through the second switching transistor 5605. One terminal of the capacitor element 5604 is connected to the gate terminal of the current source transistor 5601, and the other terminal of the capacitor element 5604 is connected to the first terminal of the current source transistor 5601. Thus, a gate potential of the current source transistor 5601, i.e., a gate-source voltage (Vgs) can be held. The gate of the current source transistor 5601 is connected to the wire 5610 via the second switching transistor 5605, and charge supply to the capacitor element 5604 can be controlled by ON/OFF of the second switching transistor 5605. That is to say, when the second switching transistor 5605 is in an ON state, the gate terminal of the current source transistor 5601 and the second wire 5610 are connected. On the other hand, when the second switching transistor 5605 is in an OFF state, the gate terminal of the current source transistor 5601 and the second wire 5610 are disconnected.

The shift transistor 5602 includes a first switching transistor 5603 as a shift means in a case where it serves as a current source depending on a state or a case where it serves so that no current flows between a source and a drain (or serves as a switch). Here, a case where the shift transistor 5602 serves as a current source (or a part thereof) is referred to as a current source operation. In addition, a case where the shift transistor 5602 operates such that no current flows between the soured and the drain (or serves as a switch) or a case where a source-drain voltage is small, is referred to as a short circuit operation. In FIG. 56, a source terminal and a drain terminal of the shift transistor 5602 can be connected via the first switching transistor 5603. A gate terminal of the shift transistor 5602 is connected to a gate terminal of the current source transistor 5601. The operation of the shift transistor 5602 can be shifted into a current source transistor or a short circuit operation by using the first switching transistor 5603.

The first terminal of the current source transistor 5601 is connected to the third wire 5611 via the third switching transistor 5606. In other words, when the third shift transistor is ON, the conduction is made between the first terminal of the current source transistor 5601 and the third wire 5611. When the third switching transistor 5606 is OFF, the first terminal of the current source transistor 5601 is disconnected to the third wire 5611.

Note that the capacitor element 5604 may have a structure in which an insulting film is interposed by wires, active layers, electrodes or the like, or can be omitted by using a gate capacitor of the current source transistor 5601.

It is to be noted that a predetermined potential is input to each of the opposite electrode 5612 of the display element 5608, the first wire 5609, and the second wire 5610.

By inputting a signal to the fourth wire 5614, the second switching transistor 5605 and the second switching transistor 5606 are controlled to be turned ON or OFF.

By inputting a signal to the fifth wire 5615, the first switching transistor 5603 is controlled to be turned on or off.

A signal is input to the third wire 5611 in accordance with a gray scale level of a pixel. This signal corresponds to a video signal and a signal current flows to the third wire 5611.

Subsequently, description is made with reference to FIGS. 57A to 57C of operation of the pixel of this example.

It is to be noted that a current source 5701 connected to the third wire 5611 sets a signal current Idata which is written to a pixel. The third wire 5611 is connected to a wire 5712 through the current source 5701. A predetermined potential is input to the wire 5712. Here, potentials input to the first wire 5609, the second wire 5610, the wire 5712, and the opposite electrode 5612 are denoted by V1, V2, V3, and Vcom respectively. As for a relation of the potentials, V1<V2<V3 and V1<Vcom<V3 are at least satisfied.

It is to be noted that the operation of a pixel includes a signal writing operation for writing a signal to a pixel and a light emitting operation for emitting light of a gray scale level in accordance with the signal written to the pixel. FIGS. 57A and 57B are diagrams showing the signal writing operation, and FIG. 57C is a diagram showing the light emitting operation.

First, a transient state at the signal writing operation is described with reference to FIG. 57A. A signal which is input to the fourth wire 5614 and the fifth wire is set to be at L level, thereby turning on the first, second and third switching transistors 5603, 5605 and 5606. Accordingly, a current flows as shown in FIG. 57A. That is, the signal current Idata set by a current source 5701 flows to the capacitor element 5604 and the current source transistor 5601. If a current Ic and a current Itr flow to the capacitor element 5604 and the current source transistor 5601 respectively, Ic+Itr=Idata is satisfied.

A current does not flow to the capacitor element 5604 before long, which leads to a steady state at the signal writing operation. Therefore, a current flows as shown in FIG. 56B. A current Itr that flows to the current source transistor 5601 is equal to the signal current Idata. That is, a gate-source voltage Vgs of the current source transistor 5601 is a voltage necessary for applying the signal current Idata to the current source transistor 5601. Charges for the gate-source voltage Vgs of the current source transistor 5601 are accumulated in the capacitor element 5604.

It is to be noted that when potentials of the gate terminal and the first terminal of the current source transistor 5601 at this time are denoted by Va and Vb respectively, Vgs=(Va−Vb) is satisfied. When a forward threshold voltage of the display element 5608 is denoted by $V_{ELth}$, (Vcom−Vb)<$V_{ELth}$ is preferably satisfied, thereby applying no current to the display element 5608 at the signal writing operation. Therefore, the potential V2 to be input to the second wire 5610 is desirably set so as to satisfy V1<V2<V3. When V2=Vcom is satisfied, the number of power sources necessary for pixels can be reduced. Further, a reverse bias can be applied to the display element 5608 at the signal writing operation.

It is to be noted that even when a reverse bias is applied to the display element 5608, a current does not flow to the normal display element 5608 (even if it flows, it is a slight amount of current). On the other hand, in the case where the display element 5608 has a short-circuited portion, a current flows to the short-circuited portion. Then, the short-circuited portion is insulated, thereby a display defect can be improved.

Subsequently, description is made with reference to FIG. 57C of the light emitting operation. A signal input to the fourth wire 5614 and the fifth wire 4615 is set to be at H level, thereby turning off the first, second, third switching transistors 5603, 5605 and 5606. Thus, a current flows as shown in FIG. 57C. At this time, the second switching transistor 5605 is in an OFF state. Therefore, the capacitor element 5604 holds the gate-source voltage Vgs necessary for applying the signal current Idata to the current source transistor 5601. Accordingly, Vgs, which allows a current almost equal to the signal current Idata flow, is applied to the current source transistor 5601.

Here, the channel length and the channel width of a transistor are denoted by L and W respectively. When the transistor operates in a saturation region, a current value flowing through the transistor is generally proportional to W/L if a gate-source voltage is constant. In other words, a current value is proportional to the channel width W and inversely proportional to the channel length L.

In this example, the channel length of the current source transistor 5601 and the channel length of the shift transistor 5602 are denoted by L1 and L2 respectively, and these transistors have the same channel width. If the current source transistor 5601 and the shift transistor 5602 through which a current flows serve together as a multigate transistor, and they serve as a current source in FIG. 57C. At that tie, the multigate transistor can be considered to have the channel length (L1+L2) and the channel width W. In FIG. 57C, a current flows to the current source transistor 5601 and the shift transistor 5602, and the transistor has the channel width W and the channel length (L1+L2). Therefore, at the light emitting operation, a current of Idata×(L1/(L1+L2)) can be applied to the display element 5608.

In this manner, the shift transistor 5602 is short circuited at the set operation and it is made to operate as a current source at a light-emitting operation, thereby a smaller amount of current than the signal current which is applied at the signal writing operation can be applied to the display element 5608. In other words, by adjusting the channel lengths of the current source transistor 5601 and the shift transistor 5602, a smaller amount of current than the signal current which is applied at the signal writing operation can be applied to the display element 5608.

It is to be noted that when potentials of the gate terminal and the first terminal of the current source transistor 5601 at this time are denoted by Va' and Vb' respectively, Vgs=(Va'−Vb') is satisfied. This is because Va' is increased as Vb' is increased, since the capacitor element 5604 holds the gate-source voltage Vgs although Vb'>Vb is satisfied.

It is to be noted that when potentials of L level signal and H level signal to be input to the fourth wire 5614 are denoted by V4(L) and V4(H) respectively, the following potentials are preferable. Threshold voltages of the second switching transistor 5605 and the third switching transistor 5606 are denoted by Vth2 and Vth3 respectively.

Figure 57B:
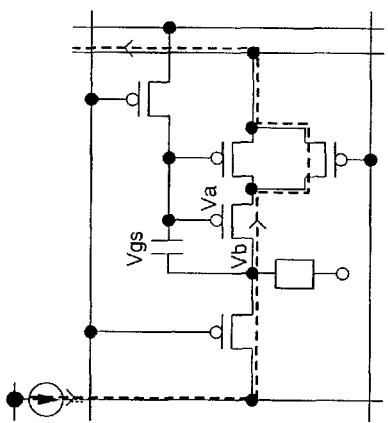
FIGS. 57A to 57C are each a diagram showing a pixel configuration according to an aspect of the present invention.
Figure 57A:
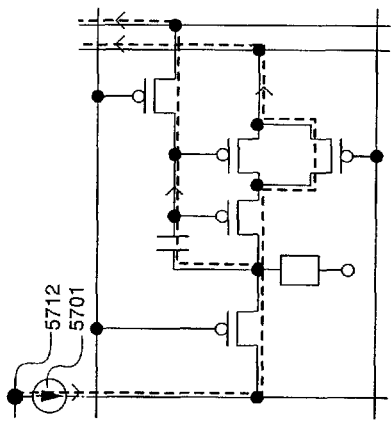

As shown in FIG. 57B, even when a potential of the pixel electrode of the display element 5608 becomes Vb, the third switching transistor 5606 is required to be in an ON state. Therefore, V4(L)<(Vb+Vth3) is satisfied. Further, V4(L)<(V2+Vth2) is satisfied in order that the second switching transistor 5605 is in an ON state. Specifically, for example, when V4=Vcom is satisfied, V4(L) is preferably a potential lower than Vcom by 1 to 8 V.

Figure 57C:
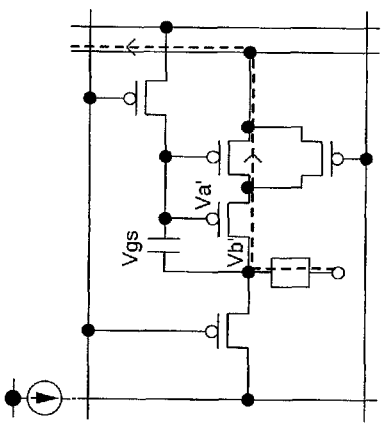

As shown in FIG. 57C, V4(H)>(Vb+Vth3) is satisfied in order that the third switching transistor 5606 is turned off. That is, when the signal current is written to another pixel, a potential of the third wire 5611 becomes Vb. Therefore, in a pixel which is not selected at this time, the third switching transistor 5606 is required to be in an OFF state. On the other hand, V4(H)>(V2+Vth2) is satisfied in order that the second switching transistor 5605 is in an OFF state. Specifically, for example, when V2=Vcom is satisfied, V4(H) is preferably a potential higher than Vcom by 1 to 8 V.

By employing the pixel configuration described in this example, a potential of a gate terminal of a transistor at the signal writing operation can be controlled, thereby preventing a current from flowing to the display element at the time of the signal wiring operation.

Figure 58:
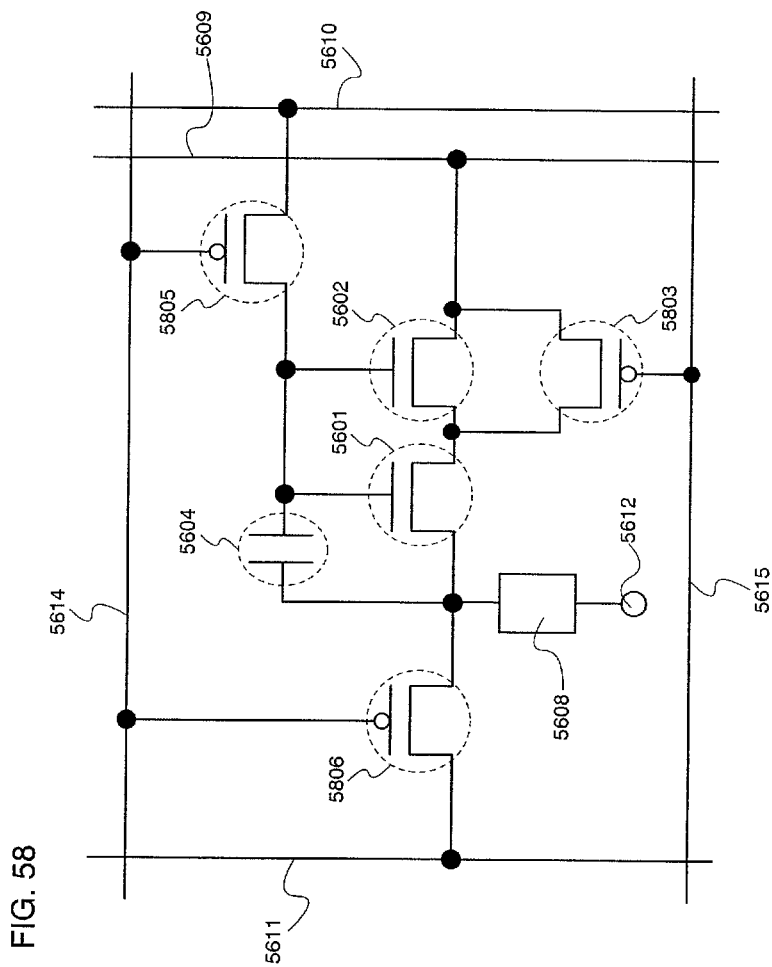
FIG. 58 is a diagram showing a pixel configuration according to an aspect of the present invention.

By employing the pixel configuration shown in FIG. 56, a pixel can be formed of only P-channel transistors, which can simplify a manufacturing process. Naturally, as shown in FIG. 58, only the first switching transistor 5603, the second switching transistor 5605, the third switching transistor 5606 may be replaced by a first switching transistor 5803, a second switching transistor 5805, and a third switching transistor 5806 which are P-channel transistors.

Further, by employing the structure of the present invention, |Vds|>|Vgs| can be satisfied at the signal writing operation. A change in the Vds can be made small between at the signal writing operation and at the light emitting operation. Therefore, even if constant current characteristics (flatness of current) in a saturation region of the current source transistor 5601 are bad, current values are almost equal between at the signal writing operation and at the light emitting operation. In particular, when an amorphous semiconductor film (such as amorphous silicon) is used for a semiconductor layer of the current source transistor 5601, constant current characteristics (flatness of current) in a saturation region of the current source transistor 5601 may be deteriorated. Thus, when the structure of the present invention is applied in the case where an amorphous semiconductor film is used for a semiconductor layer of the current source transistor 5601, a display defect can be prevented.

This example can be freely combined with the other embodiment modes or examples in this specification.

Example 8

In Example 8, description is made with reference to FIGS. 67A and 67B of the structures of a display panel having the pixel configuration described in the above described examples.

It is to be noted that FIG. 67A is a top plan view of the display panel and FIG. 67B is a cross sectional diagram along a line A-A' of FIG. 67A. The display panel includes a signal line driver circuit 6701, a pixel portion 6702, a first scan line driver circuit 6703, and a second scan line driver circuit 6706, which are shown by dotted lines. Further, a sealing substrate 6704 and a sealing material 6705 are provided. A portion surrounded by the sealing material 6705 is a space 6707.

It is to be noted that a wire 6708 is a wire for transmitting a signal input to the first scan line driver circuit 6703, the second scan line driver circuit 6706, and the signal line driver circuit 6701 and receives a video signal, a clock signal, a start signal, and the like from an FPC (Flexible Printed Circuit) 6709 functioning as an external input terminal. An IC chip (a semiconductor chip including a memory circuit, a buffer circuit, and the like) 6719 is mounted over a connecting portion of the FPC 6709 and the display panel by COG (Chip On Glass) or the like. It is to be noted that only the FPC 6709 is shown here; however, a printed wire board (PWB) may be attached to the FPC 6709. The display device in this specification includes not only a main body of the display panel but also one with an FPC or a PWB attached thereto and one on which an IC chip or the like is mounted.

Next, description is made with reference to FIG. 67B of a cross-sectional structure. The pixel portion 6702 and peripheral driver circuits (the first scan line driver circuit 6703, the second scan line driver circuit 6706, and the signal line driver circuit 6701) are formed over a substrate 6710. Here, the signal line driver circuit 6701 and the pixel portion 6702 are shown.

It is to be noted that the signal line driver circuit 6701 is formed of a unipolar transistor such as an N-channel TFT 6720 or an N-channel TFT 6721. As for a pixel configuration, a pixel can be formed of a unipolar transistor by applying the pixel configuration of FIG. 2, 13, 14, or 15. Accordingly, the peripheral driver circuits are formed of N-channel transistors, thereby a unipolar display panel can be manufactured. Needless to say, a CMOS circuit may be formed of a P-channel transistor as well as a unipolar transistor. Further, in this example, a display panel in which the peripheral driver circuits are formed over the same substrate is shown; however, the present invention is not limited to this. All or some of the peripheral driver circuits may be formed into an IC chip or the like and mounted by COG or the like. In this case, the driver circuit is not required to be unipolar and can be formed in combination with a P-channel transistor.

Further, the pixel portion 6702 includes TFTs 6711 and 6712. It is to be noted that a source electrode of the TFT 6712 is connected to a first electrode (pixel electrode) 6713. An insulator 6714 is formed so as to cover end portions of the first electrode 6713. Here, a positive photosensitive acrylic resin film is used for the insulator 6714.

In order to obtain excellent coverage, the insulator 6714 is formed to have a curved surface having a curvature at a top end portion or a bottom end portion of the insulator 6714. For example, in the case of using a positive photosensitive acrylic as a material for the insulator 6714, it is preferable that only the top end portion of the insulator 6714 has a curved surface having a curvature radius (0.2 to 3 µm). Moreover, either a negative photosensitive acrylic which becomes insoluble in etchant by light or a positive photosensitive acrylic which becomes soluble in etchant by light can be used as the insulator 6714.

A layer 6716 containing an organic compound and a second electrode to (opposite electrode) 6717 are formed over the first electrode 6713. Here, it is preferable to use a material having a high work function as a material used for the first electrode 6713 which functions as an anode. For example, a single layer of an ITO (indium tin oxide) film, an indium zinc oxide (IZO) film, a titanium nitride film, a chromium film, a tungsten film, a Zn film, a Pt film, or the like, a stacked layer of a titanium nitride film and a film containing aluminum as a main component, a three-layer structure of a titanium nitride film, a film containing aluminum as a main component, and a titanium nitride film, or the like can be used. It is to be noted that with a stacked layer structure, resistance as a wire is low, good ohmic contact can be obtained, and a function as an anode can be obtained.

The layer 6716 containing an organic compound is formed by an evaporation method using an evaporation mask, or ink-jet. A complex of a metal belonging to group 4 of the periodic table of the elements is used for a part of the layer 6716 containing an organic compound. Besides, a low molecular material or a high molecular material may be used in combination as well. Further, as a material used for the layer containing an organic compound, a single layer or a stacked layer of an organic compound is often used; however, in this example, an inorganic compound may be used in a part of a film formed of an organic compound. Moreover, a known triplet material can also be used.

Further, as a material used for the second electrode 6717 which functions as a cathode and is formed over the layer 6716 containing an organic compound, a material having a low work function (Al, Ag, Li, Ca, or an alloy thereof such as MgAg, MgIn, AlLi, $CaF_2$, or $Ca_3N_2$) may be used. In the case where light generated from the layer 6716 containing an organic compound passes through the second electrode 6717, a stacked layer of a thin metal film with a thinner thickness and a transparent conductive film (ITO (indium tin oxide) film), indium oxide zinc oxide alloy ($In_2O_3$—ZnO), zinc oxide (ZnO), or the like) is preferably used as the second electrode (a cathode) 6717.

Further, by attaching the sealing substrate 6704 to the substrate 6710 with the sealing material 6705, a light-emitting element 6718 is provided in the space 6707 surrounded by the substrate 6710, the sealing substrate 6704, and the sealing material 6705. It is to be noted that the space 6707 may be filled with the sealing material 6705, as well as with an inert gas (nitrogen, argon, or the like).

It is to be noted that an epoxy-based resin is preferably used for the sealing material 6705. Further, it is preferable that these materials should not transmit moisture or oxygen as much as possible. As a material for the sealing substrate 6704, a glass substrate, a quartz substrate, a plastic substrate formed of FRP (Fiberglass-Reinforced Plastics), PVF (polyvinylfluoride), myler, polyester, acrylic, or the like can be used.

As described above, a display panel having a pixel configuration of the present invention can be obtained. Note that the structure described above is just one example, and a structure of a display panel is not limited to this.

As shown in FIGS. 67A and 67B, the cost of the display device can be reduced by forming the signal line driver circuit 6701, the pixel portion 6702, the first scan line driver circuit 6703, and the second scan line driver circuit 6706 over the same substrate. Further, in this case, unipolar transistors are used for the signal line driver circuit 6701, the pixel portion 6702, the first scan line driver circuit 6703, and the second scan line driver circuit 6706, thereby a manufacturing process can be simplified. As a result, further cost reduction can be achieved.

Figure 68A:
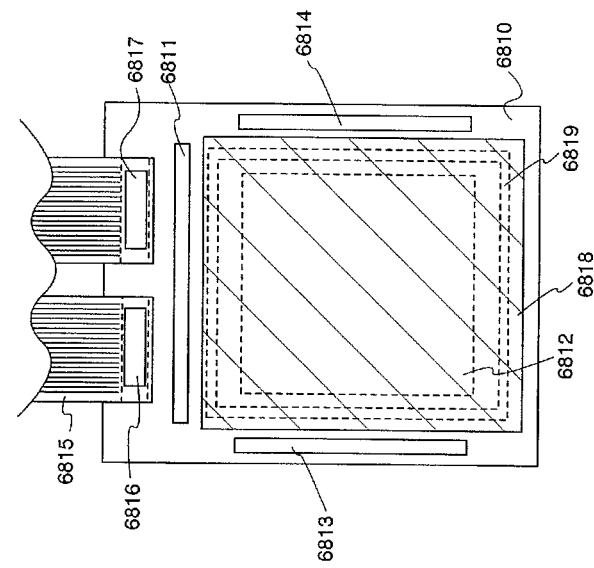
FIGS. 68A and 68B are views showing a display panel according to an aspect of the present invention.

It is to be noted that the structure of the display panel is not limited to the structure shown in FIG. 67A where the signal line driver circuit 6701, the pixel portion 6702, the first scan line driver circuit 6703, and the second scan line driver circuit 6706 are formed over the same substrate, and a signal line driver circuit 6801 shown in FIG. 68A corresponding to the signal line driver circuit 6701 may be formed into an IC chip and mounted on the display panel by COG; or the like. It is to be noted that a substrate 6800, a pixel portion 6802, a first scan line driver circuit 6803, a second scan line driver circuit 6804, an FPC 6805, IC chips 6806 and 6807, a sealing substrate 6808, and a sealing material 6809 in FIG. 68A correspond to the substrate 6710, the pixel portion 6702, the first scan line driver circuit 6703, the second scan line driver circuit 6706, the FPC 6709, the IC chip 6719, the sealing substrate 6704, and the sealing material 6705 in FIG. 67A, respectively.

That is, only the signal line driver circuit which is required to operate at high speed is formed into an IC chip using a CMOS or the like, thereby lower power consumption is achieved. Further, by forming the IC chip as a semiconductor chip formed of a silicon wafer or the like, a higher-speed operation and lower power consumption can be realized.

By forming the second scan line driver circuit 6803 and/or the first scan line driver circuit 6804 over the same substrate as the pixel portion 6802, cost reduction can be achieved. Further, unipolar transistors are used for the second scan line driver circuit 6803, the first scan line driver circuit 6804, and the pixel portion 6802, thereby further cost reduction can be achieved. As for a pixel configuration of the pixel portion 6802, the structures described in Embodiment Modes 1 to 4 can be applied.

In this manner, cost reduction of a high definition display device can be realized. Further, by mounting an IC chip including a functional circuit (memory or buffer) at a connecting portion of the FPC 6805 and the substrate 6800, a substrate area can be effectively utilized.

Figure 68B:
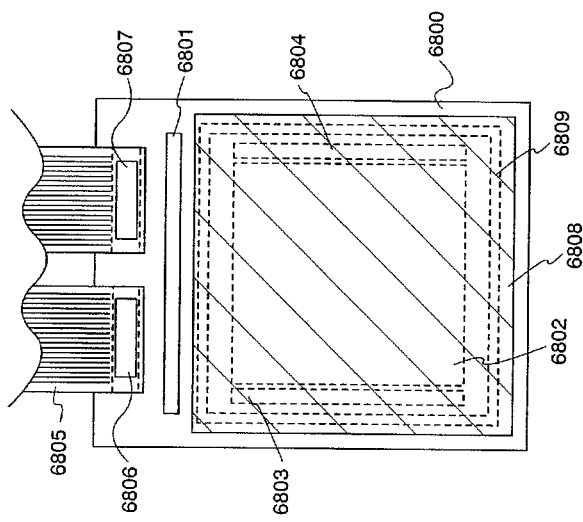

Moreover, a signal line driver circuit 6811, a first scan line driver circuit 6814, and a second scan line driver circuit 6813 shown in FIG. 68B corresponding to the signal line driver circuit 6701, the first scan line driver circuit 6703, and the second scan line driver circuit 6706 shown in FIG. 67A may be formed into an IC chip and mounted on a display panel by COG or the like. In this case, lower power consumption of a high definition display device can be realized. Therefore, in order to obtain a display device with less power consumption, it is preferable to use polysilicon for a semiconductor layer of a transistor used in the pixel portion. It is to be noted that a substrate 6810, a pixel portion 6812, an FPC 6815, IC chips 6816 and 6817, a sealing substrate 6818, and a sealing material 6819 in FIG. 68B correspond to the substrate 6710, the pixel portion 6702, the FPC 6709, the IC chips 6716 and 6719, the sealing substrate 6704, and the sealing material 6705 in FIG. 67A, respectively.

Further, by using amorphous silicon for a semiconductor layer of a transistor of the pixel portion 6812, further cost reduction can be achieved. Moreover, a large display panel can be manufactured.

Further, the second scan line driver circuit, the first scan line driver circuit, and the signal line driver circuit are not necessarily provided in a row direction and a column direction of the pixels. For example, as shown in FIG. 69A, a peripheral driver circuit 6901 formed in an IC chip may have functions of the first scan line driver circuit 6814, the second scan line driver circuit 6813, and the signal line driver circuit 6811 shown in FIG. 68B. It is to be noted that a substrate 6900, a pixel portion 6902, an FPC 6904, IC chips 6905 and 6906, a sealing substrate 6907, and a sealing material 6908 in FIG. 69A correspond to the substrate 6710, the pixel portion 6702, the FPC 6709, the IC chip 6719, the sealing substrate 6704, and the sealing material 6705 in FIG. 67A, respectively.

FIG. 69B shows a schematic diagram showing connections of wires of the display device shown in FIG. 69A. A substrate 6910, a peripheral driver circuit 6911, a pixel portion 6912, and FPCs 6913 and 6914 are provided. A signal and a power source potential are externally input from the FPC 6913 to the peripheral driver circuit 6911. An output from the peripheral driver circuit 6911 is input to wires in the row direction and wires in the column direction, which are connected to the pixels in the pixel portion 6912.

Figure 70A:
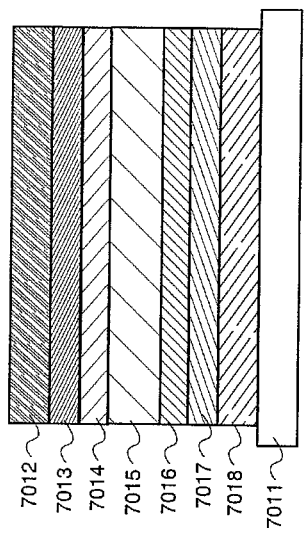
FIGS. 70A and 71B are views showing light-emitting elements which can be applied to a display device according to an aspect of the present invention.
Figure 70B:
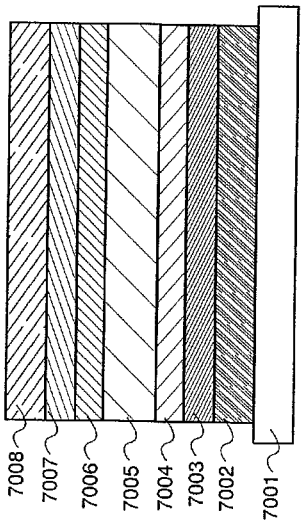

Further, FIGS. 70A and 70B show examples of a light-emitting element which can be applied to the light-emitting element 6718. That is, description is made with reference to FIGS. 70A and 70B of structures of a light-emitting element which can be applied to the pixels described in the above examples.

In a light-emitting element shown in FIG. 70A, an anode 7002, a hole injecting layer 7003 formed of a hole injecting material, a hole transporting layer 7004 formed of a hole transporting material, a light emitting layer 7005, an electron transporting layer 7006 formed of an electron transporting material, an electron injecting layer 7007 formed of an electron injecting material, and a cathode 7008 are stacked over a substrate 7001 in this order. Here, the light emitting layer 7005 may be formed of only one kind of light emitting material; however, it may also be formed of two or more kinds of materials. The structure of the element of the present invention is not limited to this.

In addition to the stacked layer structure shown in FIG. 70A where each functional layer is stacked, there are wide variations such as an element formed of a high molecular compound, a high efficiency element utilizing a triplet light emitting material which emits light from a triplet excitation state in a light emitting layer. It is also possible to apply to a white light-emitting element which can be obtained by dividing a light emitting region into two regions by controlling a recombination region of carriers using a hole blocking layer, and the like.

The element of the present invention shown in FIG. 70A can be formed by sequentially depositing a hole injecting material, a hole transporting material, and a light emitting material over the substrate 7001 having the anode 7002 (ITO). Next, an electron transporting material and an electron injecting material are deposited, and finally the cathode 7008 is formed by an evaporation method.

Materials suitable for the hole injecting material, the hole transporting material, the electron transporting material, the electron injecting material, and the light emitting material are as follows.

As the hole injecting material, an organic compound such as a porphyrin-based compound, a phthalocyanine (hereinafter referred to as "$H_2Pc$"), copper phthalocyanine (hereinafter referred to as "CuPc"), or the like is available. Further, a material that has a smaller value of an ionization potential than that of the hole transporting material to be used and has a hole transporting function can also be used as the hole injecting material. There is also materials obtained by chemically doping a conductive high molecular compound, which includes polyaniline, polyethylene dioxythiophene (hereinafter referred to as "PEDOT") doped with polystyrene sulfonate (hereinafter referred to as "PSS") and the like. Also, a high molecular compound of an insulator is effective in terms of planarization of an anode, and polyimide (hereinafter referred to as "PI") is often used. Further, an inorganic compound is also used, which includes an ultra-thin film of aluminum oxide (hereinafter referred to as "alumina") in addition to a thin film of a metal such as gold or platinum.

An aromatic amine-based (that is, one having a bond of benzene ring-nitrogen) compound is most widely used as the hole transporting material. A material that is widely used includes 4,4'-bis(diphenylamino)-biphenyl (hereinafter referred to as "TAD"), derivatives thereof such as 4,4'-bis[N-(3-methylphenyl)-N-phenyl-amino]-biphenyl (hereinafter referred to as "TPD"), 4,4'-bis[N-(1-naphthyl)-N-phenyl-amino]-biphenyl (hereinafter referred to as "α-NPD"), and star burst aromatic amine compounds such as 4,4',4"-tris(N, N-diphenyl-amino)-triphenylamine (hereinafter referred to as "TDATA") and 4,4',4"-tris[N-(3-methylphenyl)-N-phenyl-amino]triphenylamine (hereinafter referred to as "MTDATA").

As the electron transporting material, a metal complex is often used, which includes a metal complex having a quinoline skeleton or a benzoquinoline skeleton such as Alq, BAlq, tris(4-methyl-8-quinolinolato)aluminum (hereinafter referred to as "Almq"), or bis(10-hydroxybenzo[h]-quinolinato)beryllium (hereinafter referred to as "BeBq"), and in addition, a metal complex having an oxazole-based or a thiazole-based ligand such as bis[2-(2-hydroxyphenyl)-benzoxazolato]zinc (hereinafter referred to as "Zn(BOX)$_2$") or bis[2-(2-hydroxyphenyl)-benzothiazolato]zinc (hereinafter referred to as "Zn(BTZ)$_2$"). Further, in addition to the metal complexes, oxadiazole derivatives such as 2-(4-biphenylyl)-5-(4-tert-butylphenyl)-1,3,4-oxadiazole (hereinafter referred to as "PBD") and OXD-7, triazole derivatives such as TAZ and 3-(4-tert-butylphenyl)-4-(4-ethylphenyl)-5-(4-biphenylyl)-2,3,4-triazole (hereinafter referred to as "p-EtTAZ"), and phenanthroline derivatives such as bathophenanthroline (hereinafter referred to as "BPhen") and BCP have an electron transporting property.

As the electron injecting material, the above-mentioned electron transporting materials can be used. In addition, an ultra-thin film of an insulator, for example, metal halide such as calcium fluoride, lithium fluoride, or cesium fluoride, alkali metal oxide such as lithium oxide, or the like is often used. Further, an alkali metal complex such as lithium acetyl acetonate (hereinafter referred to as "Li(acac)") or 8-quinolinolato-lithium (hereinafter referred to as "Liq") is also available.

As the light emitting material, in addition to the above-mentioned metal complexes such as Alq, Almq, BeBq, BAlq, Zn(BOX)$_2$, and Zn(BTZ)$_2$, various fluorescent pigments are available. The fluorescent pigments include 4,4'-bis(2,2-diphenyl-vinyl)-biphenyl, which is blue, and 4-(dicyanomethylene)-2-methyl-6-(p-dimethylaminostyryl)-4H-pyran, which is red-orange, and the like. Also, a triplet light emitting material is available, which mainly includes a complex with platinum or iridium as a central metal. As the triplet light emitting material, tris(2-phenylpyridine)iridium, bis(2-(4'-tryl)pyridinato-N,C$^{2'}$)acetylacetonato iridium (hereinafter referred to as "acacIr(tpy)$_2$"), 2,3,7,8,12,13,17,18-octaethyl-21H,23Hporphyrin-platinum, and the like are known.

By using the materials each having a function as described above in combination, a highly reliable light-emitting element can be formed.

In the case of the pixel of FIG. 56 shown in the above example, a light-emitting element in which layers are formed in a reverse order to that of FIG. 70A can be used as shown in FIG. 70B. That is, a cathode 7018, an electron injecting layer 7017 formed of an electron injecting material, an electron transporting layer 7016 formed of an electron transporting material, a light emitting layer 7015, a hole transporting layer 7014 formed of a hole transporting material, a hole injecting layer 7013 formed of a hole injecting material, and an anode 7012 are stacked over a substrate 7011 in this order.

In addition, in order to extract light emission of a light-emitting element, at least one of an anode and a cathode is required to be transparent. A TFT and a light-emitting element are formed over a substrate; and there are light-emitting elements having a top emission structure where light emission is taken out through a surface on the side opposite to the substrate, having a bottom emission structure where light emission is taken out through a surface on the substrate side, and having a dual emission structure where light emission is taken out through the surface on the side opposite to the substrate and the surface on the substrate side respectively. The pixel configuration of the present invention can be applied to the light-emitting element having any emission structure.

Figure 71A:
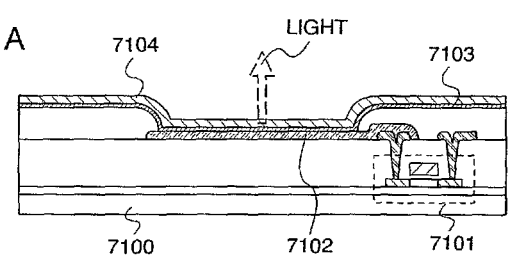

Description is made with reference to FIG. 71A of a light-emitting element with a top emission structure.

A driving TFT 7101 is formed over a substrate 7100 and a first electrode 7102 is formed in contact with a source electrode of the driving TFT 7101, over which a layer 7103 containing an organic compound and a second electrode 7104 are formed.

Further, the first electrode 7102 is an anode of a light-emitting element. The second electrode 7104 is a cathode of the light-emitting element. That is, a region where the layer 7103 containing an organic compound is interposed between the first electrode 7102 and the second electrode 7104 corresponds to the light-emitting element.

Further, as a material used for the first electrode 7102 which functions as an anode, a material having a high work function is preferably used. For example, a single layer of a titanium nitride film, a chromium film, a tungsten film, a Zn film, a Pt film, or the like, a stacked layer of a titanium nitride film and a film containing aluminum as a main component, a stacked layer of three layers of a titanium nitride film, a film containing aluminum as a main component, and a titanium nitride film, or the like can be used. With a stacked layer structure, the resistance as a wire is low, a good ohmic contact can be obtained, and further a function as an anode can be obtained. By using a metal film which reflects light, an anode which does not transmit light can be formed.

As a material used for the second electrode 7104 which functions as a cathode, a stacked layer of a thin metal film formed of a material having a low work function (Al, Ag, Li, Ca, or an alloy thereof such as MgAg, MgIn, AlLi, CaF$_2$, or Ca$_3$N$_2$) and a transparent conductive film (of ITO (indium tin oxide), indium zinc oxide (IZO), zinc oxide (ZnO), or the like) is preferably used. By using a thin metal film and a transparent conductive film with transparency in this manner, a cathode which can transmit light can be formed.

In this manner, light from the light-emitting element can be extracted to the top surface as shown by an arrow in FIG. 71A. That is, in the case of applying to the display panel shown in FIGS. 67A and 67B, light is emitted to the sealing substrate 6704 side. Therefore, in the case of using a light-emitting element with a top emission structure to a display device, a light-transmitting substrate is used as the sealing substrate 6704.

In the case of providing an optical film, an optical film may be provided over the sealing substrate 6704.

In the case of the pixel configuration shown in FIG. 66 in the above example, a metal film formed of a material which functions as a cathode and has a low work function, such as MgAg, MgIn, or AlLi can be used for the first electrode 7102. For the second electrode 7104, a transparent conductive film such as an ITO (indium tin oxide) film or an indium zinc oxide (IZO) film can be used. Accordingly, with this structure, the transmittance of the top light emission can be improved.

Figure 71B:
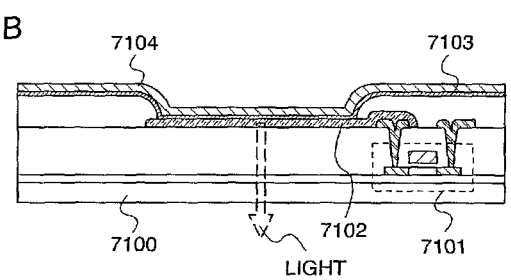

Further, description is made of a light-emitting element with a bottom emission structure with reference to FIG. 71B. The same reference numerals as those in FIG. 71A are used since the structures are the same, except for the light emission structure.

Here, as a material used for the first electrode 7102 which functions as an anode, a material having a high work function is preferably used. For example, a transparent conductive film such as an ITO (indium tin oxide) film or an indium zinc oxide (IZO) film can be used. By using a transparent conductive film with transparency, an anode which can transmit light can be formed.

As a material used for the second electrode 7104 which functions as a cathode, a metal film formed of a material having a low work function (Al, Ag, Li, Ca, or an alloy thereof such as MgAg, MgIn, AlLi, CaF$_2$, or Ca$_3$N$_2$) can be used. By using a metal film which reflects light, a cathode which does not transmit light can be formed.

In this manner, light from the light-emitting element can be extracted to a bottom surface as shown by an arrow in FIG. 71B. That is, in the case of applying to the display panel shown in FIGS. 67A and 67B, light is emitted to the substrate 6710 side. Therefore, in the case of using a light-emitting element with a bottom emission structure to a display device, a light-transmitting substrate is used as the substrate 6710.

In the case of providing an optical film, an optical film may be provided over the substrate 6710.

Figure 71C:
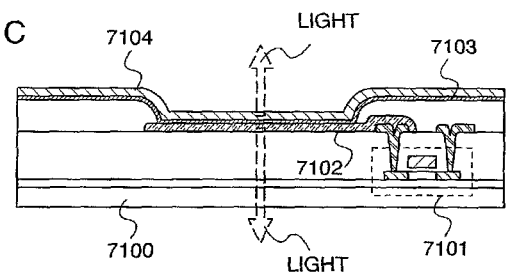

Description is made of a light-emitting element with a dual emission structure with reference to FIG. 71C. The same reference numerals as those in FIG. 571A are used since the structures are the same, except for the light emission structure.

Here, as a material used for the first electrode 7102 which functions as an anode, a material having a high work function is preferably used. For example, a transparent conductive film such as an ITO (indium tin oxide) film or an indium zinc oxide (IZO) film can be used. By using a transparent conductive film with transparency, an anode which can transmit light can be formed.

As a material used for the second electrode 7104 which functions as a cathode, a stacked layer of a thin metal film formed of a material having a low work function (Al, Ag, Li, Ca, or an alloy thereof such as MgAg, MgIn, AlLi, CaF$_2$, or Ca$_3$N$_2$), and a transparent conductive film (ITO (indium tin oxide), indium oxide zinc oxide (In$_2$O$_3$—ZnO) alloy, zinc oxide (ZnO), or the like) is preferably used. By using a thin metal film and a transparent conductive film with transparency in this manner, a cathode which can transmit light can be formed.

In this manner, light from the light-emitting element can be extracted to the both surfaces as shown by arrows of FIG. 71C. That is, in the case of applying to the display panel shown in FIGS. 67A and 67B, light is emitted to the substrate 6160 side and the sealing substrate 6704 side. Therefore, in the case of applying a light-emitting element with a dual emission structure to a display device, light-transmitting substrates are used as the substrate 6710 and the sealing substrate 6704 both.

In the case of providing an optical film, optical films may be provided over both the substrate 6710 and the sealing substrate 6704.

The present invention can also be applied to a display device which realizes full color display by using a white light-emitting element and a color filter.

Figure 72:
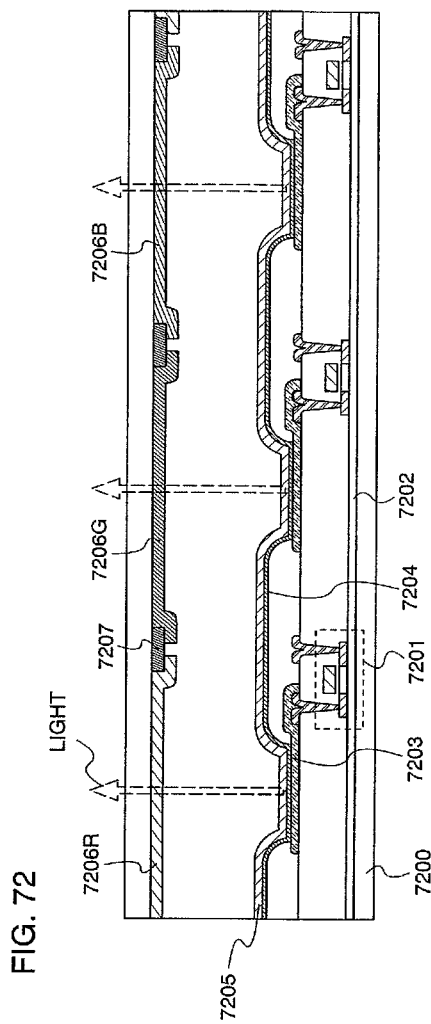
FIG. 72 is a view showing a display panel according to an aspect of the present invention.

As shown in FIG. 72, a base film 7202 is formed over a substrate 7200 and a driving TFT 7201 is formed thereover. A first electrode 7203 is formed in contact with a source electrode of the driving TFT 7201 and a layer 7204 containing an organic compound and a second electrode 7205 are formed thereover.

The first electrode 7203 is an anode of a light-emitting element. The second electrode 7205 is a cathode of the light-emitting element. That is, a region where the layer 7204 containing an organic compound is interposed between the first electrode 7203 and the second electrode 7205 corresponds to the light-emitting element. In the structure shown in FIG. 72, white light is emitted. A red color filter 7206R, a green color filter 7206G, and a blue color filter 7206B are provided over the light-emitting element, thereby full color display can be performed. Further, a black matrix (also referred to as BM) 7207 for separating these color filters is provided.

The aforementioned structures of the light-emitting element can be used in combination and can be used appropriately for the display device having the pixel configuration of the present invention. The structures of the display panel and the light-emitting elements which are described above are just examples and it is needless to say that the pixel configuration of the present invention can be applied to display devices having other structures.

Next, a partial cross-sectional view of a pixel portion of a display panel is described.

First, description is made of the case of using a crystalline semiconductor film (polysilicon (p-Si:H) film) as a semiconductor layer of a transistor with reference to FIGS. 73A and 73B and FIGS. 74A and 74B.

Here, the semiconductor layer is obtained by, for example, forming an amorphous silicon (a-Si) film over a substrate by a known film formation method. Note that the semiconductor film is not limited to the amorphous silicon film, and any semiconductor film having an amorphous structure (including a microcrystalline semiconductor film) may be used. Further, a compound semiconductor film having an amorphous structure, such as an amorphous silicon germanium film may be used.

Then, the amorphous silicon film is crystallized by laser crystallization, thermal crystallization using RTA or an annealing furnace, thermal crystallization using a metal element which promotes crystallization, or the like. Needless to say, such crystallization may be performed in combination.

As a result of the aforementioned crystallization, a crystallized region is formed in a part of the amorphous semiconductor film.

In addition, the crystalline semiconductor film having a partially increased crystallinity is patterned into a desired shape, and an island-shaped semiconductor film (each of the films that are formed by separating one semiconductor film) is formed with the crystallized region. This semiconductor film is used as the semiconductor layer of the transistor. Note that patterning is processing a film shape, which means forming a film pattern by a photolithography technique (including forming contact hole in photosensitive acrylic and processing photosensitive acrylic so as to be a spacer), forming a mask pattern by a photolithography technique and etching with the use of the mask pattern, or the like.

Figures 73A, 73B:
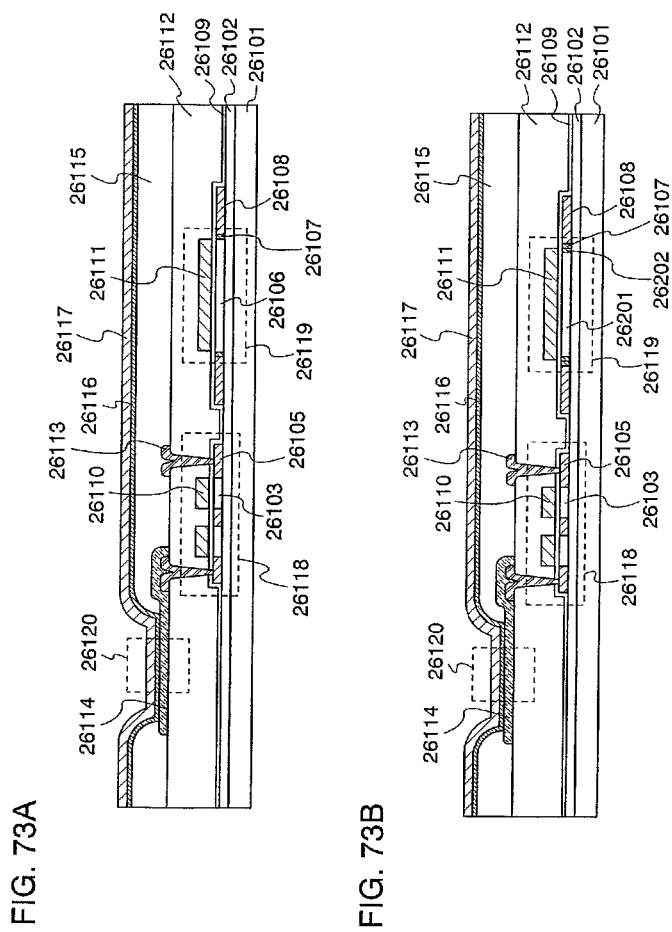
FIGS. 73A and 73B are views showing a display panel according to an aspect of the present invention.

As shown in FIG. 73A, a base film 26102 is formed over a substrate 26101, and a semiconductor layer is formed thereover. The semiconductor layer includes a channel forming region 26103 and an impurity region 26105 functioning as a source or drain region, which are in a driving transistor 26118, and a channel forming region 26106, an LDD region 26107, and an impurity region 26108 which function as a lower electrode, which are in a capacitor element 26119. Note that channel doping may be performed to the channel forming regions 26103 and 26106.

As the substrate, a glass substrate, a quartz substrate, a ceramic substrate, a plastic substrate, or the like can be used. The base film 26102 can be formed using a single layer of aluminum nitride (AlN), silicon oxide (SiO$_2$), silicon oxynitride (SiO$_x$N$_y$), or the like, or stacked layers thereof.

A gate electrode 26110 and an upper electrode 26111 of the capacitor element are formed over the semiconductor layer with a gate insulating film 26109 interposed therebetween.

An interlayer insulating film 26112 is formed so as to cover the driving transistor 26118 and the capacitor element 26119. Then, a contact hole is formed in the interlayer insulating film 26112, through which a wire 26113 is in contact with the impurity region 26105. A pixel electrode 26114 is formed in contact with the wire 26113, and a second interlayer insulator 26115 is formed so as to cover end portions of the pixel electrode 26114 and the wire 26113. Here, the second interlayer insulator 26115 is formed with a positive photosensitive acrylic resin film. Then, a layer 26116 containing an organic compound and an opposite electrode 26117 are formed over the pixel electrode 26114. Thus, a light-emitting element 26120 is formed in a region where the layer 26116 containing an organic compound is interposed between the pixel electrode 26114 and the opposite electrode 26117.

In addition, as shown in FIG. 73B, an LDD region 26202 may be provided so as to overlap with the upper electrode 26111, which forms a part of the lower electrode of the capacitor element 26119. Note that common portions to those in FIG. 73A are denoted by the same reference numerals, and description thereof is omitted.

In addition, as shown in FIG. 74A, a second upper electrode 26301 may be provided, which is formed in the same layer as the wire 26113 in contact with the impurity region 26105 of the driving transistor 26118. Note that common portions to those in FIG. 73A are denoted by the same reference numerals, and description thereof is omitted. A second capacitor element is formed by interposing the interlayer insulating film 26112 between the second upper electrode 26301 and the upper electrode 26111. In addition, since the second upper electrode 26301 is in contact with the impurity region 26108, a first capacitor element having such a structure that the gate insulating film 26109 is interposed between the upper electrode 26111 and the channel forming region 26106, and the second capacitor element having such a structure that the interlayer insulating film 26112 is interposed between the upper electrode 26111 and the second upper electrode 26301 are connected in parallel, so that a capacitor element 26302 having the first and second capacitor elements is obtained. Since the capacitor element 26302 has a total capacitance of those of the first and second capacitor elements, the capacitor element having a large capacitance can be formed in a small area. That is, using the capacitor element in the pixel configuration of the present invention will lead to a further improved aperture ratio.

Alternatively, a structure of a capacitor element as shown in FIG. 74B may be adopted. A base film 27102 is formed over a substrate 27101, and a semiconductor layer is formed thereover. The semiconductor layer includes a channel forming region 27103 and an impurity region 27105 to function as a source or drain region of a driving transistor 27118. Note that channel doping may be performed to the channel forming region 27103.

As the substrate, a glass substrate, a quartz substrate, a ceramic substrate, a plastic substrate, or the like can be used. The base film 27102 can be formed using a single layer of aluminum nitride (AlN), silicon oxide ($SiO_2$), silicon oxynitride ($SiO_xN_y$), or the like or stacked layers thereof.

A gate electrode 27107 and a first electrode 27108 are formed over the semiconductor layer with a gate insulating film 27106 interposed therebetween.

A first interlayer insulating film 27109 is formed so as to cover the driving transistor 27118 and the first electrode 27108. Then, a contact hole is formed in the first interlayer insulating film 27109, through which a wire 27110 is in contact with the impurity region 27105. In addition, a second electrode 27111 is formed in the same layer and with the same material as the wire 27110.

Furthermore, a second interlayer insulator 27112 is formed so as to cover the wire 27110 and the second electrode 27111. Then, a contact hole is formed in the second interlayer insulator 27112, through which a pixel electrode 27113 is formed in contact with the wire 27110. A third electrode 27114 is formed in the same layer and with the same material as the pixel electrode 27113. Here, a capacitor element 27119 is formed of the first electrode 27108, the second electrode 27111, and the third electrode 27114.

An insulator is formed so as to cover end portions of the pixel electrode 27113 and the third electrode 27114. A layer 27116 containing an organic compound and an opposite electrode 27117 are formed over a third interlayer insulator 27115 and the third electrode 27114. Then, a light-emitting element 27120 is formed in a region where the layer 27116 containing an organic compound is interposed between the pixel electrode 27113 and the opposite electrode 27117.

As described above, each of the structures shown in FIGS. 73A and 73B and FIGS. 74A and 74B can be given as a structure of a transistor using a crystalline semiconductor film for its semiconductor layer. Note that the transistors having the structures shown in FIGS. 73A and 73B and FIGS. 74A and 74B are examples of transistors with a top-gate structure. That is, the transistor may be either a P-channel transistor or an N-channel transistor. In the case where the transistor is an N-channel transistor, the LDD region may be formed so as to overlap the gate electrode or not, or a part of the LDD region may be formed so as to overlap the gate electrode. Further, the gate electrode may have a tapered shape and the LDD region may be provided below the tapered portion of the gate electrode in a self-aligned manner. In addition, the number of gate electrodes is not limited to two, and a multigate structure with three or more gate electrodes may be employed, or a single gate structure may also be employed.

By using a crystalline semiconductor film for a semiconductor layer (channel forming region, source region, drain region, or the like) of a transistor included in the pixel of the present invention, for example, it becomes easier to form the first scan line driver circuit 4902A, the second scan line driver circuit 4902B and the signal line driver circuit 4901 over the same substrate as the pixel portion 4903 in FIG. 49.

Next, as a structure of a transistor which uses polysilicon (p-Si) for its semiconductor layer, FIG. 75 shows a partial cross-sectional view of a display panel using a transistor which has a structure where a gate electrode is interposed between a substrate and a semiconductor layer, that is, a transistor with a bottom-gate structure where a gate electrode is located below a semiconductor layer.

A base film 7502 is formed over a substrate 7501. Then, a gate electrode 7503 is formed over the base film 7502. A first electrode 7504 is formed in the same layer and with the same material as the gate electrode. As a material of the gate electrode 7503, polycrystalline silicon to which phosphorus is added can be used. Besides polycrystalline silicon, silicide which is a compound of metal and silicon may be used.

Then, a gate insulating film 7505 is formed so as to cover the gate electrode 7503 and the first electrode 7504. As the gate insulating film 7505, a silicon oxide film, a silicon nitride film, or the like is used.

A semiconductor layer is formed over the gate insulating film 7505. The semiconductor layer includes a channel forming region 7506, an LDD region 7507, and an impurity region 7508 functioning as a source or drain region, which are in a driving transistor 7522, and a channel forming region 7509, an LDD region 7510, and an impurity region 7511, which function as a second electrode of a capacitor element 7523. Note that channel doping may be performed to the channel forming regions 7506 and 7509.

As the substrate, a glass substrate, a quartz substrate, a ceramic substrate, a plastic substrate, or the like can be used. The base film 7502 can be formed using a single layer of aluminum nitride (AlN), silicon oxide ($SiO_2$), silicon oxynitride ($SiO_xN_y$), or the like or stacked layers thereof.

A first interlayer insulating film 7512 is formed so as to cover the semiconductor layer. Then, a contact hole is formed in the first interlayer insulating film 7512, through which a wire 7513 is in contact with the impurity region 7508. A third electrode 7514 is formed in the same layer and with the same material as the wire 7513. The capacitor element 7523 is formed with the first electrode 7504, the second electrode, and the third electrode 7514.

In addition, an opening portion 7515 is formed in the first interlayer insulating film 7512. A second interlayer insulator 7516 is formed so as to cover the driving transistor 7522, the capacitor element 7523, and the opening portion 7515. Then, a contact hole is formed in the second interlayer insulator 7516, through which a pixel electrode 7517 is formed. Then, an insulator 7518 is formed so as to cover end portions of the pixel electrode 7517. For example, a positive photosensitive acrylic resin film can be used. Subsequently, a layer 7519 containing an organic compound and an opposite electrode 7520 are formed over the pixel electrode 7517. Thus, a light-emitting element 7521 is formed in a region where the layer 7519 containing an organic compound is interposed between the pixel electrode 7517 and the opposite electrode 7520. The opening portion 7515 is located below the light-emitting element 7521. That is, in the case where light emitted from the light-emitting element 7521 is extracted from the substrate side, the transmittance can be improved due to the existence of the opening portion 7515.

Furthermore, a fourth electrode 7524 may be formed in the same layer and with the same material as the pixel electrode 7517 in FIG. 75A so as to obtain a structure shown in FIG. 75B. In this case, a capacitor element 7525 can be formed with the first electrode 7504, the second electrode, the third electrode 7514, and the fourth electrode 7524.

Next, description is made of a case of using an amorphous silicon (a-Si:H) film as a semiconductor layer of a transistor. FIGS. 76A and 76B show cases of a top-gate transistor, and FIGS. 77A, 77B, 75A, and 75B show cases of a bottom-gate transistor.

FIG. 76A shows a cross sectional view of a transistor having a forward staggered structure, which uses amorphous silicon for its semiconductor layer. A base film 7602 is formed over a substrate 7601. Further, a pixel electrode 7603 is formed over the base film 7602. In addition, a first electrode 7604 is formed in the same layer and with the same material as the pixel electrode 7603.

As the substrate, a glass substrate, a quartz substrate, a ceramic substrate, a plastic substrate, or the like can be used. The base film 7602 can be formed using a single layer of aluminum nitride (AlN), silicon oxide ($SiO_2$), silicon oxynitride ($SiO_xN_y$), or the like or stacked layers thereof.

Wires 7605 and 7606 are formed over the base film 7602, and an end portion of the pixel electrode 7603 is covered with the wire 7605. N-type semiconductor layers 7607 and 7608 each having N-type conductivity are formed over the wires 7605 and 7606 respectively. In addition, a semiconductor layer 7609 is formed between the wires 7605 and 7606 and over the base film 7602, a part of which is extended so as to cover the N-type semiconductor layers 7607 and 7608. Note that this semiconductor layer is formed with a non-crystalline semiconductor film such as an amorphous silicon (a-Si:H) film or a microcrystalline semiconductor (μ-Si:H) film. Then, a gate insulating film 7610 is formed over the semiconductor layer 7609, and an insulating film 7611 is formed in the same layer and with the same material as the gate insulating film 7610, and also over the first electrode 7604. Note that as the gate insulating film 7610, a silicon oxide film, a silicon nitride film, or the like is used.

A gate electrode 7612 is formed over the gate insulating film 7610. In addition, a second electrode 7613 is formed in the same layer and with the same material as the gate electrode, and over the first electrode 7604 with the insulating film 7611 interposed therebetween. A capacitor element 7619 in which the insulating film 7611 is interposed between the first electrode 7604 and the second electrode 7613 is formed. An interlayer insulator 7614 is formed so as to cover end portions of the pixel electrode 7603, the driving transistor 7618, and the capacitor element 7619.

A layer 7615 containing an organic compound and an opposite electrode 7616 are formed over the interlayer insulator 7614 and the pixel electrode 7603 located in an opening portion of the interlayer insulator 7614. Thus, a light-emitting element 7617 is formed in a region where the layer 7615 containing an organic compound is interposed between the pixel electrode 7603 and the opposite electrode 7616.

The first electrode 7604 shown in FIG. 76A may be formed like a first electrode 7620 as shown in FIG. 76B. The first electrode 7620 is formed in the same layer and with the same material as the wires 7605 and 7606.

Figure 77A:
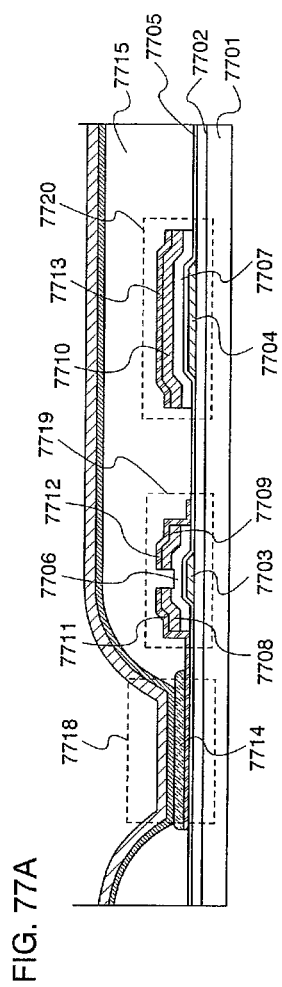
FIGS. 77A and 77B are views showing a display panel according to an aspect of the present invention.
Figure 77B:
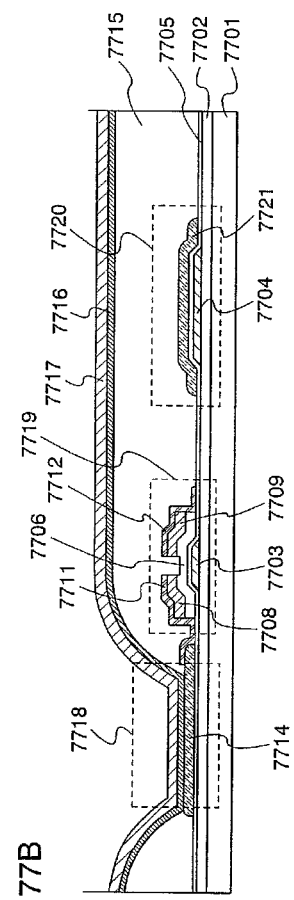

FIGS. 77A and 77B are partial cross-sectional views of a display panel having a bottom-gate transistor which uses amorphous silicon as its semiconductor layer.

A base film 7702 is formed over a substrate 7701. A gate electrode 7703 is formed over the base film 7702. A first electrode 7704 is formed in the same layer and with the same material over the gate electrode 7703. As a material of the gate electrode 7703, polycrystalline silicon to which phosphorus is added can be used. Besides polycrystalline silicon, silicide which is a compound of metal and silicon may be used.

Then, a gate insulating film 7705 is formed so as to cover the gate electrode 7703 and the first electrode 7704. As the gate insulating film 7705, a silicon oxide film, a silicon nitride film, or the like is used.

A semiconductor layer 7706 is formed over the gate insulating film 7705. In addition, a semiconductor layer 7707 is formed in the same layer and with the same material as the semiconductor layer 7706.

As the substrate, a glass substrate, a quartz substrate, a ceramic substrate, a plastic substrate, or the like can be used. The base film 7602 can be formed using a single layer of aluminum nitride (AlN), silicon oxide ($SiO_2$), silicon oxynitride ($SiO_xN_y$), or the like or stacked layers thereof.

N-type semiconductor layers 7708 and 7709 having N-type conductivity are formed over the semiconductor layer 7706, and an N-type semiconductor layer 7710 is formed over the semiconductor layer 7707.

Wires 7711 and 7712 are formed over the N-type semiconductor layers 7708 and 7709 respectively, and a conductive layer 7713 is formed in the same layer and with the same material as the wires 7711 and 7712, over the N-type semiconductor layer 7710.

Thus, a second electrode is formed with the semiconductor layer 7707, the N-type semiconductor layer 7710, and the conductive layer 7713. Note that a capacitor element 7720 having a structure where the gate insulating film 7705 is interposed between the second electrode and the first electrode 7704 is formed.

One end portion of the wire 7711 is extended, and a pixel electrode 7714 is formed so as to be in contact with an upper portion of the extended wire 7711.

In addition, an insulator 7715 is formed so as to cover end portions of the pixel electrode 7714, a driving transistor 7719, and the capacitor element 7720.

Then, a layer 7716 containing an organic compound and an opposite electrode 7717 are formed over the pixel electrode 7714 and the insulator 7715. A light-emitting element 7718 is formed in a region where the layer 7716 containing an organic compound is interposed between the pixel electrode 7714 and the opposite electrode 7717.

The semiconductor layer 7707 and the N-type semiconductor layer 77460 to be a part of the second electrode of the capacitor element are not necessarily formed. That is, the second electrode may be the conductive layer 7713, so that the capacitor element may have such a structure that the gate insulating film is interposed between the first electrode 7704 and the conductive layer 7713.

Note that the pixel electrode 7714 is formed before forming the wire 7711 in FIG. 77A, thereby a capacitor element 7722 as shown in FIG. 77B can be obtained, which has a structure where the gate insulating film 7705 is interposed between the first electrode 7704 and a second electrode 7721 formed of the pixel electrode 7714.

Although FIGS. 77A and 77B show inverted staggered channel-etched transistors, a channel-protective transistor may be used. Description of channel-protective transistors is made with reference to FIGS. 78A and 78B.

A channel-protective transistor shown in FIG. 78A is different from the channel-etched driving transistor 7719 shown in FIG. 77A in that an insulator 7801 functioning as an etching mask is provided over a region in which a channel is to be formed in the semiconductor layer 7706. Common portions except that point are denoted by the same reference numerals.

Similarly, a channel-protective transistor shown in FIG. 78B is different from the channel-etched driving transistor 7719 shown in FIG. 77B in that the insulator 7802 functioning as an etching mask is provided over the region in which a channel is to be formed in the semiconductor layer 7706 of the channel-etched driving transistor 7719. Common portions except that point are denoted by the same reference numerals.

By using an amorphous semiconductor film as a semiconductor layer (channel forming region, source region, drain region, and the like) of a transistor included in the pixel of the present invention, the manufacturing cost can be reduced. For example, an amorphous semiconductor film can be applied by using the pixel configuration shown in FIG. 47.

Note that structures of the transistors and capacitor elements to which the pixel configuration of the present invention can be applied are not limited to those described above, and transistors and capacitor elements with various structures can be used.

This example can be freely combined with the other embodiment modes or examples in this specification.

Example 9

The display device of the present invention can be applied to various electronic devices, specifically a display portion of electronic devices. The electronic devices include cameras such as a video camera and a digital camera, a goggle-type display, a navigation system, an audio reproducing device (car audio component stereo, audio component stereo, or the like), a computer, a game machine, a portable information terminal (mobile computer, mobile phone, mobile game machine, electronic book, or the like), an image reproducing device provided with a recording medium (specifically, a device for reproducing content of a recording medium such as a digital versatile disc (DVD) and having a display for displaying the reproduced image) and the like.

Figure 84A:
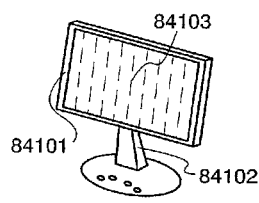
FIGS. 84A to 84H are views showing an electronic device to which a display device according to an aspect of the present invention can be applied.

FIG. 84A shows a display which includes a housing 84101, a supporting base 84102, a display portion 84103, a speaker portion 84104, a video inputting terminal 84105, and the like. A display device having the pixel configuration of the present invention can be used for the display portion 84103. Note that the display includes all display devices for displaying information such as for a personal computer, receiving television broadcasting, and displaying an advertisement. A display using the display device having the pixel configuration of the present invention for the display portion 84103 can reduce power consumption and prevent a display defect. Further, cost reduction can be achieved.

In recent years, the need for a large size display has been increased. As a display becomes larger, there is caused a problem of increased cost. Therefore, it is an issue to reduce the manufacturing cost as much as possible and to provide a high quality product at as low a price as possible.

For example, by applying the pixel configuration of FIG. 47 or the like to a pixel portion of a display panel, a display panel formed with unipolar transistors can be provided. Therefore, the number of manufacturing steps can be reduced, which leads to reduction in the manufacturing cost.

In addition, by forming the pixel portion and the peripheral driver circuit over the same substrate as shown in FIG. 67A, the display panel can be formed using circuits including unipolar transistors.

In addition, by using an amorphous semiconductor (such as amorphous silicon (a-Si:H)) as a semiconductor layer of a transistor in a circuit constituting the pixel portion, a manufacturing process can be simplified and further cost reduction can be realized. In this case, it is preferable that a driver circuit in the periphery of the pixel portion be formed into an IC chip and mounted on the display panel by COG or the like as shown in FIGS. 68B and 69A. In this manner, by using an amorphous semiconductor, it becomes easy to size up the display.

Figure 84B:
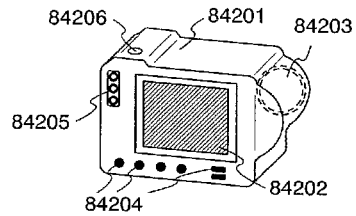

FIG. 84B shows a camera which includes a main body 84201, a display portion 84202, an image receiving portion 84203, operating keys 84204, an external connection port 84205, a shutter 84206, and the like.

In recent years, in accordance with advance in performance of a digital camera and the like, competitive manufacturing thereof has been intensified. Thus, it is important to provide a higher-performance product at as low a price as possible. A digital camera using a display device having a pixel configuration of the present invention for the display portion 84202 can reduce power consumption and prevent a display defect. Further, cost reduction can be achieved.

For example, by using the pixel configuration of FIG. 47 for the pixel portion, the pixel portion can be constituted by unipolar transistors. In addition, as shown in FIG. 68A, by forming a signal line driver circuit whose operating speed is high into an IC chip, and forming a scan line driver circuit whose operating speed is relatively low with a circuit constituted by unipolar transistors over the same substrate as the pixel portion, higher performance can be realized and cost reduction can be achieved. In addition, by using an amorphous semiconductor such as amorphous silicon for a semiconductor layer of a transistor in the pixel portion and the scan line driver circuit formed over the same substrate as the pixel portion, further cost reduction can be achieved.

Figure 84C:
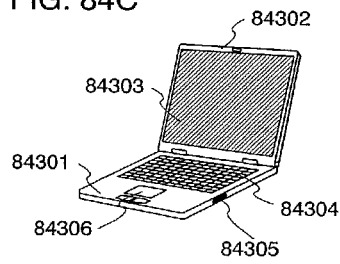

FIG. 84C shows a computer which includes a main body 84301, a housing 84302, a display portion 84303, a keyboard 84304, an external connection port 84305, a pointing mouse 84306, and the like. A computer using a display device having the pixel configuration of the present invention for the display portion 84303 can reduce power consumption and prevent a display defect. Further, cost reduction can be achieved.

Figure 84D:
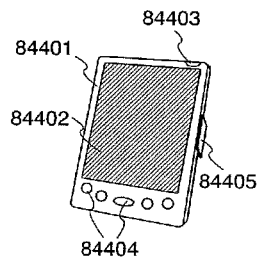

FIG. 84D shows a mobile computer which includes a main body 84401, a display portion 84402, a switch 84403, operating keys 84404, an infrared port 84405, and the like. A mobile computer using a display device having a pixel configuration of the present invention for the display portion 84402 can reduce power consumption and prevent a display defect. Further, cost reduction can be achieved.

Figure 84E:
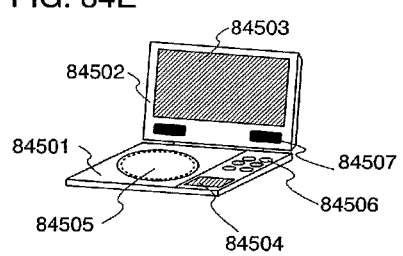

FIG. 84E shows a portable image reproducing device having a recording medium (specifically, a DVD player), which includes a main body 84501, a housing 84502, a display portion A 84503, a display portion B 84504, a recording medium (DVD or the like) reading portion 84505, operating keys 84506, a speaker portion 84507, and the like. The display portion A 84503 mainly displays video data and the display portion B 84504 mainly displays text data. An image reproducing device using a display device having a pixel configuration of the present invention for the display portions A 84503 and B 84504 can reduce power consumption and prevent a display defect. Further, cost reduction can be achieved.

Figure 84F:
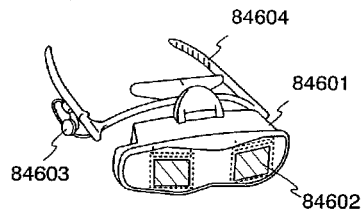

FIG. 84F shows a goggle-type display which includes a main body 84601, a display portion 84602, an earphone 84603, and a support portion 84604. A goggle type display using a display device having a pixel configuration of the present invention for the display portion 84602 can reduce power consumption and prevent a display defect. Further, cost reduction can be achieved.

Figure 84G:
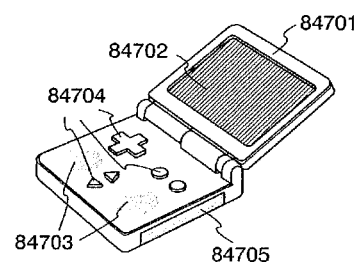

FIG. 84G shows a portable type game machine, which includes a housing 84701, a display portion 84702, a speaker portion 84703, operation keys 84704, a recording medium insert portion 84705 and the like. A portable type game machine using a display device having a pixel configuration of the present invention for the display portion 84702 can reduce power consumption and prevent a display defect. Further, cost reduction can be achieved.

Figure 84H:
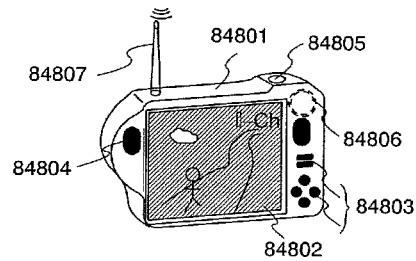

FIG. 84H shows a digital camera having a television receiving function, which includes a main body 84801, a display portion 84802, operation keys 84803, a speaker 84804, a shutter 84805, an image receiving portion 84806, an antenna 84807 and the like. A digital camera having a television receiving function using a display device having a pixel configuration of the present invention for the display portion 84802 can reduce power consumption and prevent a display defect. Further, cost reduction can be achieved.

For example, the pixel configuration of FIG. 47 is used in the pixel portion to enhance an aperture ratio of a pixel. Specifically, the aperture ratio can be increased by using an N-channel transistor for a driving transistor for driving a light-emitting element. Thus, a digital camera having a television receiving function which includes a high-definition display portion can be provided.

While frequency of using such a digital camera having a television receiving function, such as television watching and listening, has been increased, the life per charge has been required to be long.

For example, by forming a peripheral driver circuit into an IC chip as shown in FIG. 68B and FIG. 69A and using a CMOS or the like, power consumption can be reduced.

Thus, the present invention can be applied to various electronic devices.

This example can be freely combined with the other embodiment modes or examples in this specification.

Example 10

Figure 83:
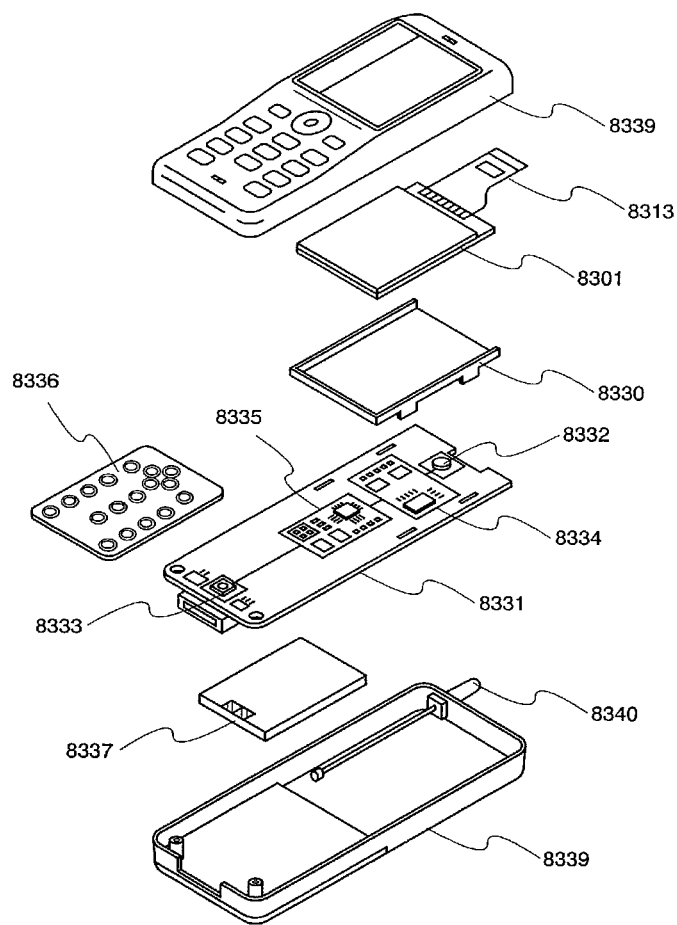
FIG. 83 is a view showing an electronic device to which a display device according to an aspect of the present invention can be applied.

In Example 10, description is made with reference to FIG. 83 of an example of a structure of a mobile phone which has a display portion having a display device using a pixel configuration of the present invention.

A display panel 8301 is incorporated in a housing 8330 so as to be freely attached and detached. The shape and size of the housing 8330 can be changed appropriately in accordance with the size of the display panel 8301. The housing 8330 provided with the display panel 8301 is fitted in a printed circuit board 8331 so as to be assembled as a module.

The display panel 8301 is connected to the printed board 8331 through an FPC 8313. A speaker 8332, a microphone 8333, a transmitting and receiving circuit 8334, and a signal processing circuit 8335 including a CPU, a controller, and the like are formed over the printed circuit board 8331. Such a module, an inputting means 8336, and a battery 8337 are combined, and they are stored in a housing 8339. A pixel portion of the display panel 8301 is disposed so as to be seen from an opening window formed in the housing 8339.

The display panel 8301 may be formed by forming a pixel portion and a part of peripheral driver circuits (a driver circuit whose operation frequency is low among a plurality of driver circuits) using TFTs over the same substrate; forming a part of the peripheral driver circuits (a driver circuit whose operation frequency is high among the plurality of driver circuits) into an IC chip; and mounting the IC chip on the display panel 8301 by COG (Chip On Glass). The IC chip may be, alternatively, connected to a glass substrate by using TAB (Tape Automated Bonding) or a printed circuit board. It is to be noted that FIG. 28A shows an example of a structure of such a display panel that a part of peripheral driver circuits is formed over the same substrate as a pixel portion and an IC chip provided with the other part of the peripheral driver circuits is mounted by COG or the like. By employing such a structure, power consumption of a display device can be reduced and the life per charge of a mobile phone can be made long. In addition, cost reduction of the mobile phone can be achieved.

To the pixel portion, the pixel configurations described in the above examples can be appropriately applied.

For example, by applying the pixel configuration of FIG. 47 described in the above example, the number of manufacturing steps can be reduced. That is to say, the pixel portion and the peripheral driver circuit formed over the same substrate as the pixel portion are constituted by unipolar transistors in order to achieve cost reduction.

In addition, in order to further reduce the power consumption, the pixel portion may be formed using TFTs over a substrate, all of the peripheral driver circuits may be formed into IC chips, and the IC chips may be mounted on the display panel by COG (Chip On Glass) or the like as shown in FIGS. 68B and 69A. The pixel configuration of FIG. 47 is used for the pixel portion and an amorphous semiconductor film is used for a semiconductor layer of a transistor, thereby reducing manufacturing cost.

It is to be noted that the structure described in this example is just an example of a mobile phone, and the pixel configuration of the present invention can be applied not only to a mobile phone having the above-described structure but also to mobile phones having various structures.

Example 11

In Example 11, a structural example of an electronic device in which a display device using a pixel configuration of the present invention in a display portion, in particular, a television receiver including an EL module, will be described.

Figure 79:
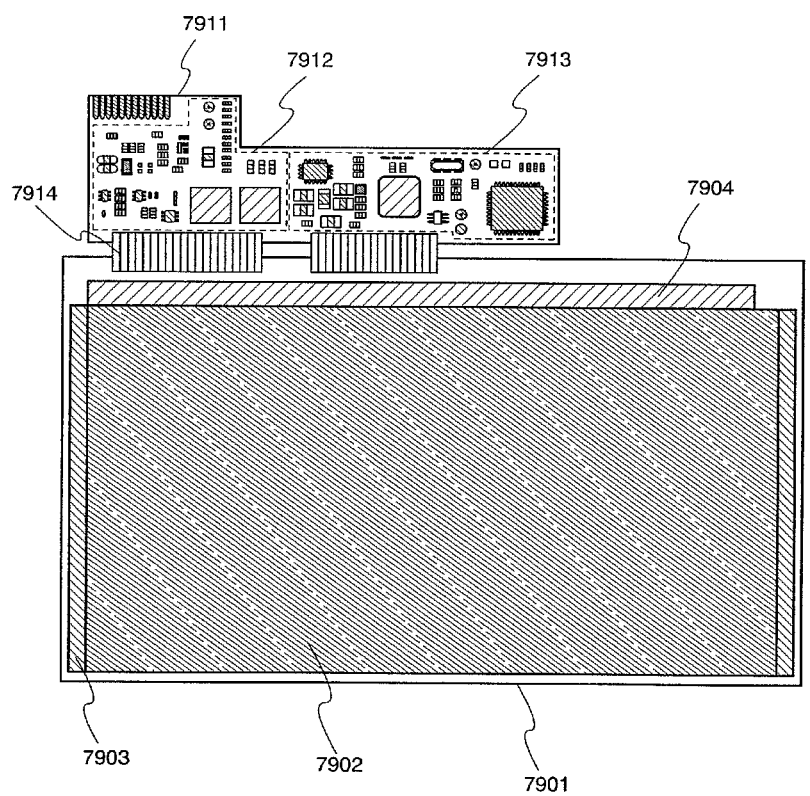
FIG. 79 is a view showing an electronic device to which a display device according to an aspect of the present invention can be applied.

FIG. 79 shows an EL module combining a display panel 7901 and a circuit board 7911. The display panel 7901 includes a pixel portion 7902, a scan line driver circuit 7903, and a signal line driver circuit 7904. A control circuit 7912, a signal dividing circuit 7913, and the like are formed over the circuit board 7911. The display panel 7901 and the circuit board 7911 are connected to each other by a connecting wire 7914. As the connecting wire, an FPC or the like can be used.

The display panel 7901 may be formed by forming a pixel portion and a part of peripheral driver circuits (a driver circuit whose operation frequency is low among a plurality of driver circuits) using TFTs over the same substrate; forming a part of the peripheral driver circuits (a driver circuit whose operation frequency is high among the plurality of driver circuits) into an IC chip; and mounting the IC chip on the display panel 7901 by COG (Chip On Glass) or the like. The IC chip may be, alternatively, mounted on the display panel 7901 by using TAB (Tape Automated Bonding) or a printed circuit board. It is to be noted that FIG. 28A shows an example of structure where a part of peripheral driver circuits is formed over the same substrate as a pixel portion and an IC chip provided with the other peripheral driver circuits are mounted by COG or the like.

In the pixel portion, the pixel configurations described in the above examples can be appropriately applied.

For example, by applying the pixel configuration etc., of FIG. 47 described in the above examples, the number of manufacturing steps can be reduced. That is to say, the pixel portion and the peripheral driver circuit formed over the same substrate as the pixel portion are constituted by unipolar transistors in order to achieve cost reduction.

In addition, in order to further reduce the power consumption, the pixel portion may be formed using TFTs over a glass substrate, all of the peripheral driver circuits may be formed into an IC chip, and the IC chip may be mounted on the display panel by COG (Chip On Glass) or the like.

In addition, by applying the pixel configuration shown in FIG. 47 of the above examples, pixels can be constituted only by N-channel transistors, so that an amorphous semiconductor (such as amorphous silicon) can be applied to a semiconductor layer of a transistor. That is, a large display device where it is difficult to form an even crystalline semiconductor film can be manufactured. Further, by using an amorphous semiconductor film for a semiconductor layer of a transistor constituting a pixel, the number of manufacturing steps can be reduced and reduction in the manufacturing cost can be achieved.

It is preferable that, in the case where an amorphous semiconductor film is applied to a semiconductor layer of a transistor constituting a pixel, the pixel portion be formed using TFTs over a substrate, all of the peripheral driver circuits be formed into an IC chip, and the IC chip be mounted on the display panel by COG (Chip On Glass). Note that FIG. 68B shows an example of the structure where a pixel portion is formed over a substrate and an IC chip provided with a peripheral driver circuit is mounted on the substrate by COG or the like.

Figure 80:
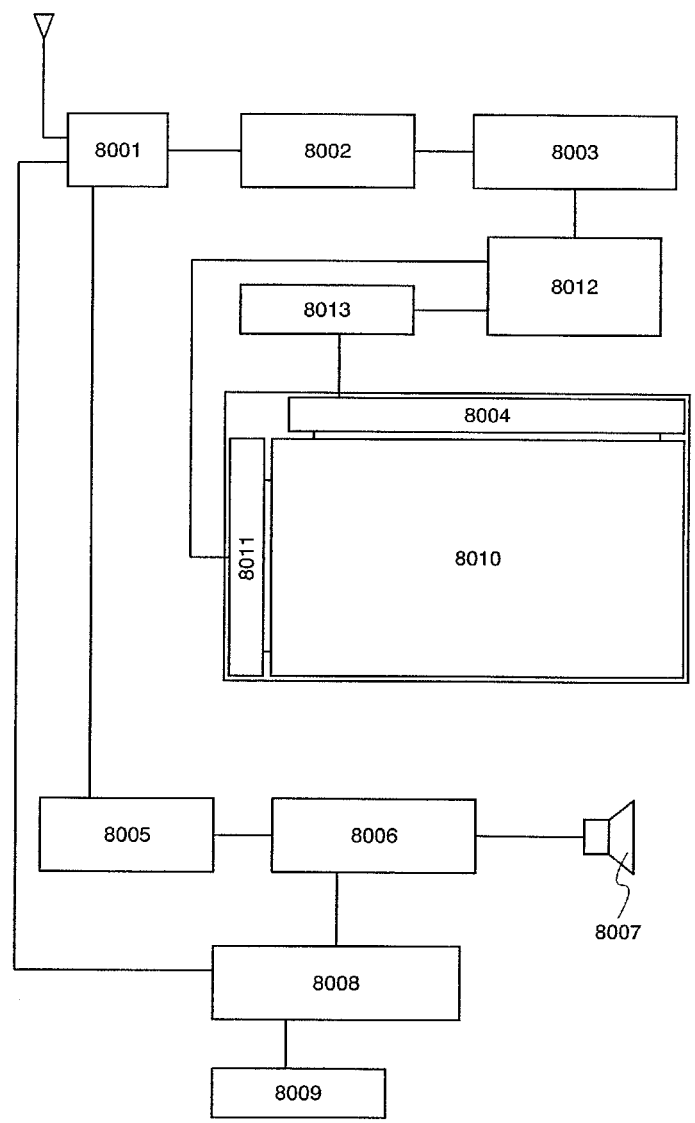
FIG. 80 is a view showing an electronic device to which a display device according to an aspect of the present invention can be applied.

An EL television receiver can be completed with this EL module. FIG. 80 is a block diagram showing a main structure of an EL television receiver. A tuner 8001 receives a video signal and an audio signal. The video signals are processed by a video wave amplifier circuit 8002, a video signal processing circuit 8003 for converting a signal output from the video wave amplifier circuit 8002 into a color signal corresponding to each color of red, green and blue, and the control circuit 8012 for converting the video signal into the input specification of a signal line driver circuit 8004 and a scan line driver circuit 8011 which supply a signal to a display panel 8010. The control circuit 8012 outputs a signal to each of the scan line side and the signal line side. In the case of driving in a digital manner, a structure where the signal dividing circuit 8013 is provided on the signal line driver circuit 8004 side to supply an input digital signal by dividing the digital input signal into m signals may be employed.

An audio signal received by the tuner 8001 is transmitted to an audio wave amplifier circuit 8005, an output thereof is supplied to a speaker 8007 through an audio signal processing circuit 8006. A control circuit 8008 receives receiving station (received frequency) and volume control data from an input portion 8008, and transmits signals to the tuner 8001 and the audio signal processing circuit 8006.

Figure 81A:
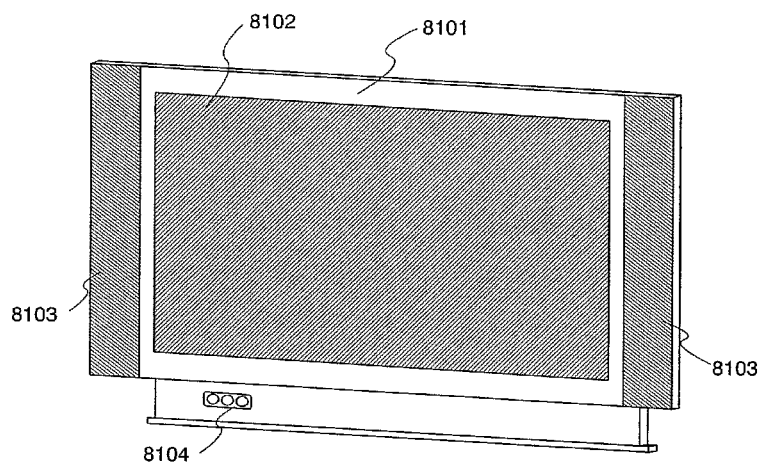
FIGS. 81A and 81B are views showing an electronic device to which a display device according to an aspect of the present invention can be applied.

FIG. 81A shows a television receiver 8101 incorporating an EL module having a different mode from that in FIG. 80. In FIG. 81A, the display screen 8102 is constituted by the EL module. In addition, the speaker portion 8103, the operation switches 8104, and the like are provided appropriately.

Figure 81B:
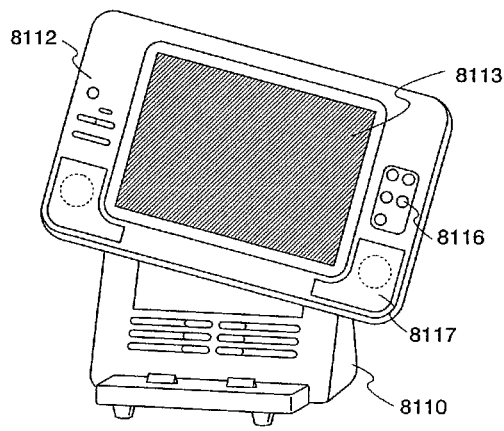

FIG. 81B shows a television receiver having a portable wireless display. A housing 8112 is installed with a battery and a signal receiver. The battery drives a display portion 8113 and a speaker portion 8117. The battery can be repeatedly charged by a battery charger 8110. The battery charger 8110 can send and receive a video signal and send the video signal to the signal receiver of the display. The housing 8112 is controlled by operation switches 8116. The device shown in FIG. 81B can be referred to as a video-audio bidirectional communication device since a signal can be sent from the housing 8112 to the battery charger 8110 by operating the operation keys 8116. Further, the device can be referred to as a versatile remote control device since a signal can be sent from the housing 8112 to the battery charger 8110 by operating the operation keys 8116 and another electronic device is made to receive a signal which can be sent by the battery charger 8110, accordingly, communication control of another electronic device is realized. The present invention can be applied to the display portion 8113.

Figure 82A:
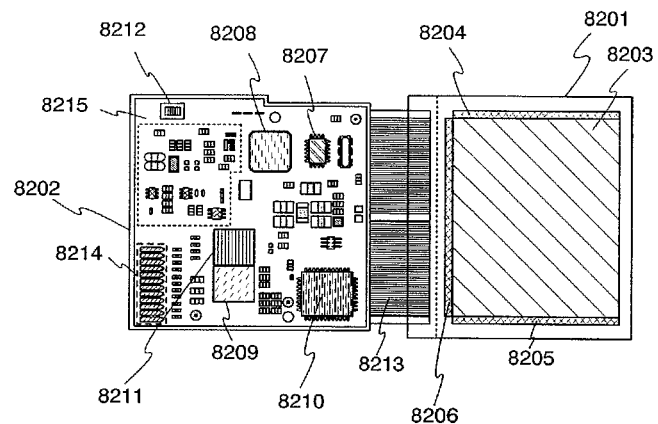
FIGS. 82A and 82B are views showing an electronic device to which a display device according to an aspect of the present invention can be applied.

FIG. 82A shows a module formed by combining a display panel 8201 and a printed wire board 8202. The display panel 8201 is provided with a pixel portion 8203 with a plurality of pixels, a first scanning line driver circuit 8204, a second scanning line driver circuit 8205, and a signal line driver circuit 8206 for supplying a video signal to a selected pixel.

A printed wire board 8202 is provided with a controller 8207, a central processing unit (CPU) 8208, a memory 8209, a power source circuit 8210, an audio processing circuit 8211, a sending and receiving circuit 8212 and the like. The printed wire board 8202 is connected to the display panel 8201 via a flexible printed circuit (FPC) 8213. The printed wire board 8213 can be formed to have a structure in which a capacitor element, a buffer circuit, and the like are formed to prevent noise from causing in power source voltage or a signal or the rising of a signal from dulling. The controller 8207, the audio processing circuit 8211, the memory 8209, the CPU 8208, the power source circuit 8210, and the like can be mounted to the display panel 8201 by using a COG (Chip on Glass) method. By means of the COG method, the size of the printed wire board 8202 can be reduced.

Various control signals are input or output via an interface portion (I/F) 8214 which is provided to the printed wire board 8202. An antenna port 8215 for sending and receiving to/from an antenna is provided to the printed wire board 8202.

Figure 82B:
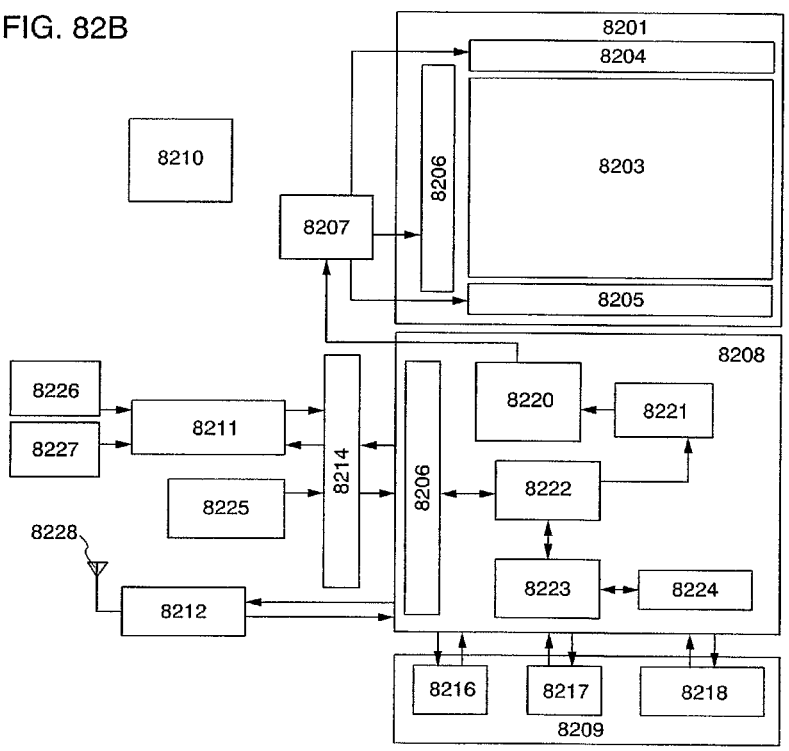

FIG. 82B is a block diagram for showing the module shown in FIG. 82A. The module includes a VRAM 8216, a DRAM 8217, a flash memory 8218, and the like as a memory 8209. The VRAM 8216 stores data on an image displayed on a panel, the DRAM 8217 stores video data or audio data, and the flash memory stores various programs.

The power source circuit 8210 supplies electricity for operating the display panel 8201, the controller 8207, the CPU 8208, the audio processing circuit 8211, the memory 8209, and the sending and receiving circuit 8212. A current source may be provided to the power source circuit 8210 depending on a panel specification.

The CPU 8208 includes a control signal generation circuit 8220, a decoder 8221, a resistor 8222, an arithmetic circuit 8223, a RAM 8224, an interface 8219 for a CPU 8208, and the like. Various signals input to the CPU 8208 via the interface 8219 are once stored in a resister 8222, then input to the arithmetic circuit 8223, the decoder 8221, or the like. The arithmetic circuit 8223 carries out an operation to designate the location to which various instructions are sent. On the other hand, the signal input to the decoder 8221 is decoded and input to the control signal generation circuit 8220. The control signal generation circuit 8220 produces a signal including various instructions based on the input signal, and sends the signal to the designated location by arithmetic circuit 8223, specifically, the memory 8209, the sending and receiving circuit 8212, the audio processing circuit 8211, and the controller 8207 etc.

The memory 8209, the sending and receiving circuit 8212, the audio processing circuit 8211, and the controller 8207 operate in accordance with the instruction which of each received. Hereinafter, the operation is briefly explained.

The signal input from an input means 8225 is sent to the CPU 8208 mounted to the printed wire board 8202 via the interface portion 8214. The control signal generation circuit 8220 converts video data stored in the VRAM 8216 into a predetermined format to send the converted data to the controller 8207 depending on the signal sent from the input means 8225 such as a pointing mouse or a key board.

The controller 8207 carries out data processing for the signal including the video data sent from the CPU 8208 along with the panel specification to supply the signal to the display panel 8201. Further, the controller 8207 produces a Hsync signal, a Vsync signal, a clock signal CLK, an alternating voltage (AC Cont), and a shift signal L/R based on power source input from the power source circuit 8210 or various signals input from the CPU 8208 to supply the signals to the display panel 8201.

The sending and receiving circuit 8212 processes a signal which is to be received and sent by an antenna 8228 as an electric wave, specifically, the sending and receiving circuit 8212 includes a high-frequency circuit such as isolator, a band pass filter, a VCO (Voltage Controlled Oscillator), an LPF (Low Pass Filter), a coupler, or a balun. A signal including audio information among signals received and sent in the sending and receiving circuit 8212 is sent to the audio processing circuit 8211 depending on an instruction from the CPU 8208.

The signal including audio information which is sent depending on an instruction from the CPU 8208 is demodulated in the audio processing circuit 8211 and is sent to a speaker 8227. An audio signal sent from a microphone 8226 is modulated in the audio processing circuit 8211 and is sent to the sending and receiving circuit 8212 depending on an instruction from the CPU 8208.

The controller 8207, the CPU 8208, the power source circuit 8210, the audio processing circuit 8211, and the memory 8209 can be mounted as a package according to this example.

Needless to say, the present invention is not limited to the television receiver. The present invention can be applied to various usages especially as a large display medium such as an information display board in a railway station or an airport, an advertisement display board on the street, or the like, in addition to a monitor of a personal computer.

This example can be freely combined with the other embodiment modes or examples in this specification.

Example 12

In Example 12, an application example of a display panel in which a display device using a pixel configuration of the present invention is used for a display portion will be described with reference to drawings. The display panel in which a display device using a pixel configuration of the present invention is used for a display portion, can be structured to be unified with a transportation body, a structure or the like.

Figure 97A:
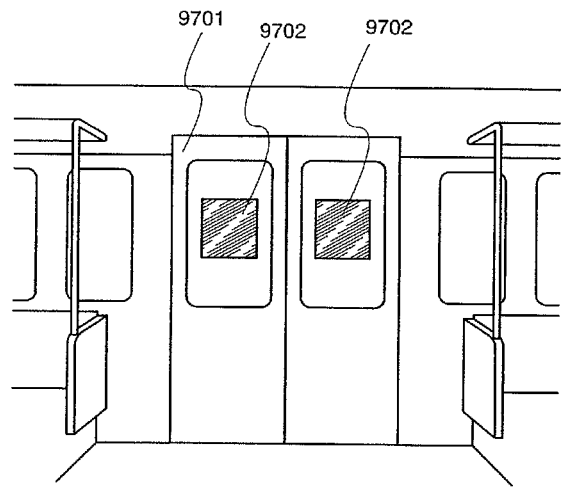
FIGS. 97A and 97B are views showing applications of a display device according to an aspect of the present invention, as examples.
Figure 97B:
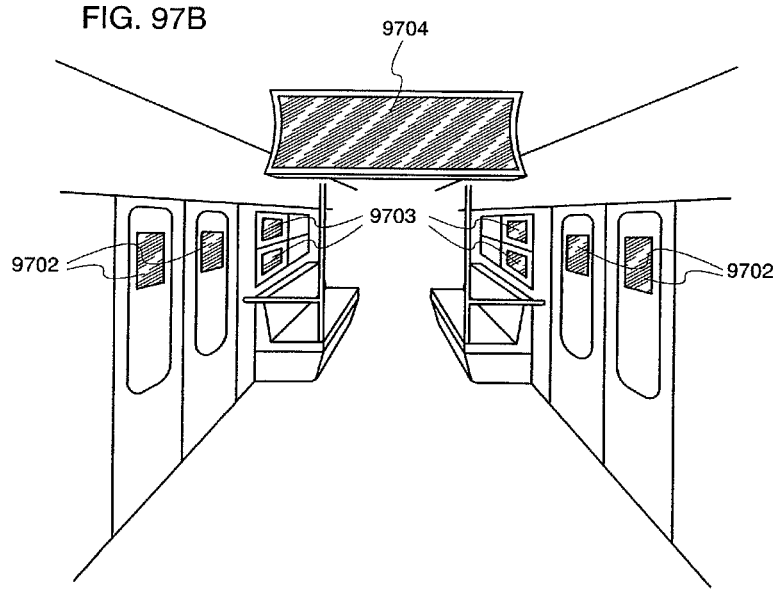

A transportation body unified with a display device is shown as one example of a display panel in which a display device using a pixel configuration of the present invention is used for a display portion in FIGS. 97A and 97B. FIG. 97A shows an example of a transportation body unified with a display device, in which a display panel 9702 is used in a glass portion of a door in a train car body 9701. In the display panel 9702 having a display portion using a display device in which a pixel configuration of the present invention shown in FIG. 97A is applied, an image to be displayed on the display portion can be easily shifted by an external signal. Thus, images of the display panel can be changed as the type of train passenger changes in accordance with different time periods. Accordingly, more effective advertising can be anticipated.

Applications for the display panel in which a display device using a pixel configuration of the present invention is used in the display portion are not limited to a glass portion of a door in the train car body as shown in FIG. 97A. The shape of the display panel can be changed so that it can be set anywhere. FIG. 97B shows an example thereof.

FIG. 97B shows the inside state of the train car body. In FIG. 97B, a display panel 9703 provided on a glass window, and a display panel 9704 hung on a ceiling are shown, in addition to the display panel 9702 of the glass portion of the door shown in FIG. 97A. The display panel 9703 equipped with a pixel configuration of the present invention has a self-luminous type display element. Thus, it displays images for advertisement during rush hours, and does not display them outside rush hours, so that the view from the train can be seen. By providing a switching element such as an organic transistor for a film-like substrate, and driving a self-luminous type display element, the display panel 9704 itself having a pixel configuration of the present invention can warp to display images.

Figure 99:
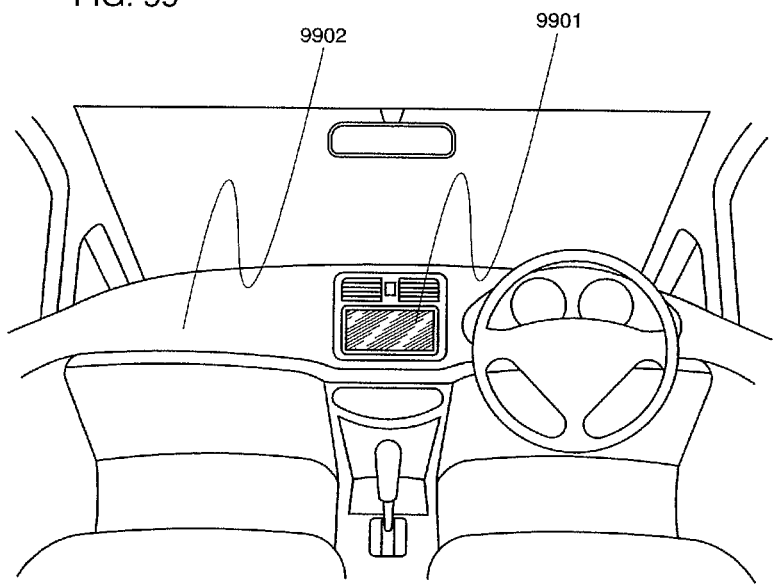
FIG. 99 is a view showing an application of a display device according to an aspect of the present invention, as an example.

FIG. 99 shows another application example of a transportation body unified with a display device using a display panel having a display device in a display portion. The display device uses a pixel configuration of the present invention in the display portion.

FIG. 99 shows an example of a transportation body unified with a display device using a display panel having a display device in a display portion. The display device uses a pixel configuration of the present invention in the display portion. FIG. 99 shows an example of a display panel 9902 unified with a car body 9901, as an example of a transportation body unified with a display device. The display panel 9902 having a display device using a pixel configuration of the present invention in a display portion shown in FIG. 99 is attached so as to be unified with the car body, and has a function of displaying on demand a car movement or information input from inside or outside the car or a navigation function till a destination of the car is reached.

Note that a display panel having a display device using a pixel configuration of the present invention in a display portion is not limited to being applied to a front portion of a car body. By changing its shape, it can be applied to any place, e.g., a glass window, a door or the like.

FIG. 101 shows another application example of a transportation body unified with a display device. The display device uses using a pixel configuration of the present invention is used in the display portion.

Figure 101A:
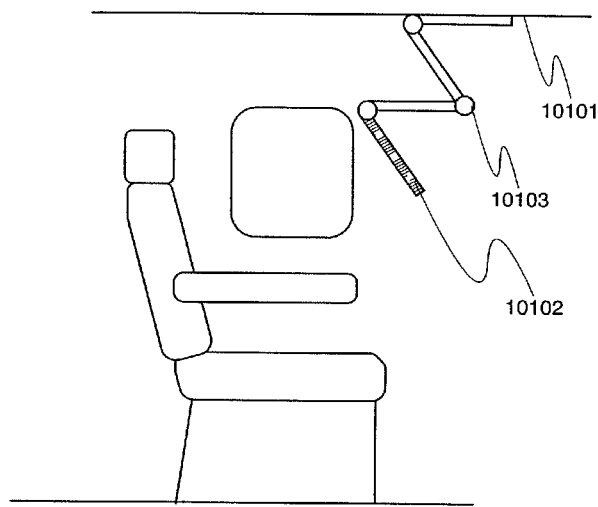
FIGS. 101A and 101B are views showing applications of a display device according to an aspect of the present invention, as examples.
Figure 101B:
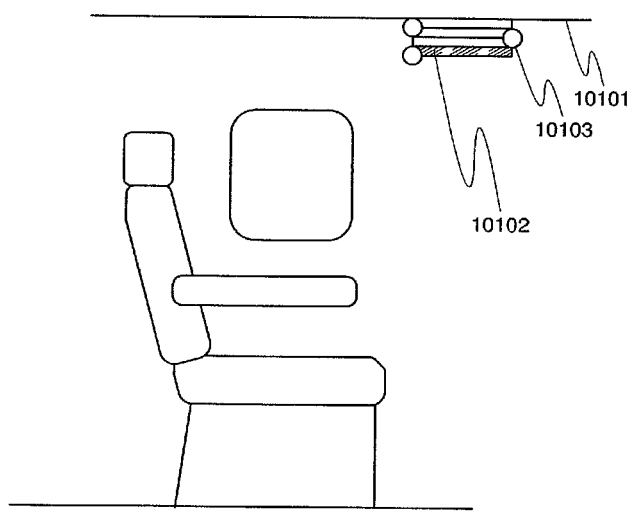

FIG. 101 shows an example of a transportation body which is unified with a display panel having a display device in a display portion. The display device uses using a pixel configuration of the present invention is used in the display portion. FIG. 101A shows an example of a display panel 10102 which is unified with a ceiling above passengers inside an airplane body 10101, as an example of a transportation body unified with a display device. The display panel 10102 having a display device using a pixel configuration of the present invention in a display portion shown in FIG. 101A is attached so as to be unified with an airplane body 10101 by a hinge portion 10103, and by expansion and contraction of the hinge portion 10103, passengers can see the display panel 10102 and listen to it. The display panel 10102 can have a function of displaying information or a means for an advertisement and entertainment unit by an operation of a passenger. As shown in FIG. 101B, the hinge portion folds as is be stored in the airplane body 10101, and thus, the safety can be maintained during takeoff and landing. In addition, by lighting the display element of the display panel in an emergency, it can be used a guidance light for the airplane body 10101.

Note that a display panel having a display device using a pixel configuration of the present invention in a display portion is not limited to being applied to a ceiling portion of the airplane body 10101 shown in FIG. 101. By changing its shape, it can be applied to anywhere, e.g., a passenger seat, a door or the like. For example, a display panel may be provided on the back of a seat in front of the seat in which a passenger sits, and the passenger may operate it so as to watch it or listen to it.

In this example, as a transportation body, a train car body, a car body, and an airplane body are given; however, the present invention is not limited to these. The application range of the present invention is wide. For example, it includes an automobile two-wheeled vehicle, an automatic four-wheeled vehicle (including a car, a bus and the like), a train (including a monorail, a railroad train and the like), a ship and the like. By applying a display panel having a display portion using a pixel configuration of the present invention, downsizing and low power consumption of the display panel are achieved, and a transportation body equipped with a display medium which operates well can be provided. In particular, since display of display panels in a transportation body can be easily changed all at once by an external signal, they are extremely effective as display devices for advertisement or information display in an emergency aimed at the general public or a large number of passengers.

As an application example in which a display panel having a display device using a pixel configuration of the present invention is used, an application mode applied to a structure is described with reference to FIG. 98.

Figure 98:
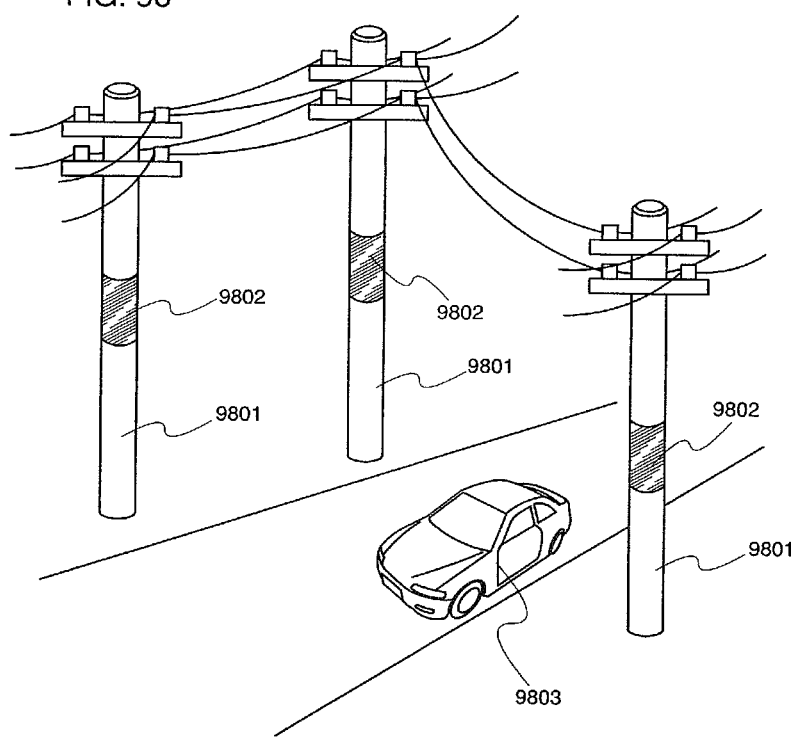
FIG. 98 is a view showing an application of a display device according to an aspect of the present invention, as an example.

FIG. 98 shows an application example of a display panel which can be warped by providing a switching element such as an organic transistor over a film-like substrate, and driving a self-luminous display element, to display an image. The display panel is shown as an example of a display panel in which a display device using a pixel configuration of the present invention is used in a display portion. In FIG. 98, a case where a display panel is provided on a curved surface of a columnar structure such as a telephone pole provided outside as a structure, is shown. Here, the display panel 9802 is provided on a telephone pole 9801 which is the columnar body.

The display panel 9802 shown in FIG. 98 is located in a position which is in about the middle of the telephone pole, at a higher point than a human viewpoint. When the display panel is seen from a transportation body 9803, an image display on the display panel 9802 can be perceived. Display panels are provided on telephone poles standing in large number outside so as to display the same image, and thus, information for display or advertisement display can be made visible to viewers. The display panel 9802 provided on the telephone pole 9801 in FIG. 98 can be easily made to display an image from outside. Thus, extremely effective information for display and advertisement effect can be anticipated. By providing a self-luminous display element as a display element in a display panel of the present invention, the display panel is effective as a highly visible display medium even at night.

Figure 100:
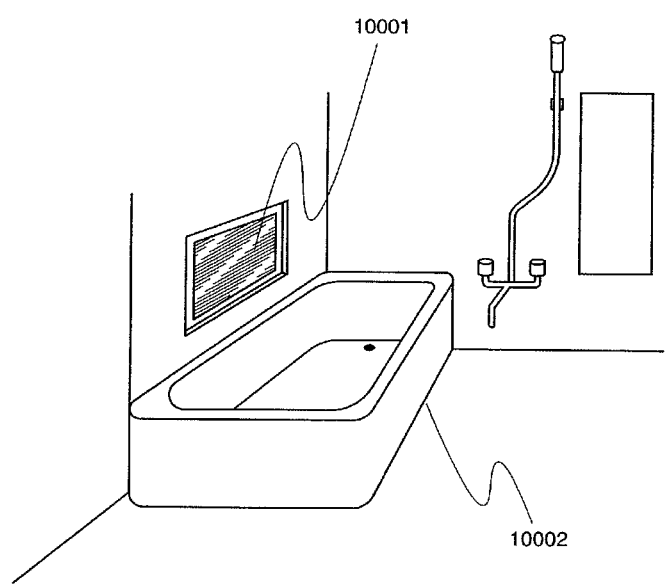
FIG. 100 is a view showing an application of a display device according to an aspect of the present invention, as an example.

FIG. 100 shows another application example of another structure with which a display panel having a display device using a pixel configuration of the present invention in a display portion is unified, which is different from that shown in FIG. 98.

FIG. 100 shows an application example of a display panel having a display device using a pixel configuration of the present invention in a display portion. FIG. 100 shows an example of a display panel 10002 which is unified with an inner wall of a prefabricated bath 10001, as an example of a transportation body unified with a display device. The display panel 10002 having a display device using a pixel configuration of the present invention in a display portion shown in FIG. 100 is attached so as to be unified with the prefabricated bath 10001, and a bather can watch and listen to the display panel 10002. The display panel 10002 can have a function of displaying information or be used as a means for an advertisement and entertainment unit by an operation of a bather.

The display panel having a display device using a pixel configuration of the present invention in a display portion is not limited to being applied to the side wall of the prefabricated bath 10001 shown in FIG. 100. By changing its shape, it can be applied to anywhere such as a part of a mirror or a bathtub itself.

In this example, a telephone pole which is an example of a columnar body or a prefabricated bath is given as an example of a structure; however, this example is not limited to these and any structure can be adopted as long as it can be equipped with a display panel. By applying a display device using a display portion using a pixel configuration of the present invention, downsizing and low power consumption of a display device can be achieved, and a transportation body equipped with a display medium which can operate well can be provided.

This application is based on Japanese Patent application No. 2005-234007 filed on Aug. 12, 2005 with the Japanese Patent Office, the entire contents of which are hereby incorporated by reference.

What is claimed is:

1. A display device comprising:
a pixel comprising:
a first transistor;
a second transistor;
a switch;
a capacitor; and
a load; and
a driver circuit provided in an IC chip,
wherein one of a source and a drain of the first transistor is electrically connected to a first terminal of the switch,
wherein the other of the source and the drain of the first transistor is electrically connected to a second terminal of the switch and one of a source and a drain of the second transistor,
wherein a gate of the first transistor is electrically connected to a gate of the second transistor and a first terminal of the capacitor,
wherein the other of the source and the drain of the second transistor is directly connected to the load,
wherein a second terminal of the capacitor is electrically connected to the other of the source and the drain of the second transistor and the load, and
wherein the first transistor comprises an oxide semiconductor.

2. The display device according to claim 1 wherein the oxide semiconductor comprises InGaZnO.

3. The display device according to claim 1 wherein the driver circuit comprises a signal line driver circuit.

4. The display device according to claim 1 wherein the display device is incorporated into one selected from the group consisting of a television receiver, a mobile phone, a camera, a computer, a portable image reproducing device, a goggle-type display, and a game machine.

5. The display device according to claim 1, wherein the second transistor comprises the oxide semiconductor.

6. The display device according to claim 1, wherein the load has a rectifying property.

7. A display device comprising:
a first wire to which a first potential is applied;
a second wire to which a second potential is applied;
a pixel comprising:
a first transistor;
a second transistor;
a first switch;
a second switch;
a capacitor; and
a load; and
a driver circuit provided in an IC chip;
wherein one of a source and a drain of the first transistor is electrically connected to a first terminal of the first switch and the first wire,
wherein the other of the source and the drain of the first transistor is electrically connected to a second terminal of the first switch and one of a source and a drain of the second transistor,
wherein a gate of the first transistor is electrically connected to a gate of the second transistor, a first terminal of the capacitor, and a first terminal of the second switch,
wherein a second terminal of the capacitor is electrically connected to the other of the source and the drain of the second transistor and the load,
wherein a second terminal of the second switch is electrically connected to the second wire,
wherein a value of the first potential is different from that of the second potential, and
wherein the first transistor comprises an oxide semiconductor.

8. The display device according to claim 7 wherein the oxide semiconductor comprises InGaZnO.

9. The display device according to claim 7 wherein the driver circuit comprises a signal line driver circuit.

10. The display device according to claim 7 wherein the display device is incorporated into one selected from the group consisting of a television receiver, a mobile phone, a camera, a computer, a portable image reproducing device, a goggle-type display, and a game machine.

11. The display device according to claim 7, wherein the second transistor comprises the oxide semiconductor.

12. The display device according to claim 7, wherein the load has a rectifying property.

13. A display device comprising:
a first wire to which a first potential is applied;
a second wire to which a second potential is applied;
a pixel comprising:
a first transistor;
a second transistor;
a first switch;
a second switch;
a third switch;
a current source;
a capacitor; and
a load; and
a driver circuit,
wherein one of a source and a drain of the first transistor is electrically connected to a first terminal of the first switch and the first wire,
wherein the other of the source and the drain of the first transistor is electrically connected to a second terminal of the first switch and one of a source and a drain of the second transistor,
wherein a gate of the first transistor is electrically connected to a gate of the second transistor, a first terminal of the capacitor, and a first terminal of the second switch,
wherein a second terminal of the capacitor is electrically connected to the other of the source and the drain of the second transistor, the load, and a first terminal of the third switch,
wherein a second terminal of the second switch is electrically connected to the second wire,
wherein a second terminal of the third switch is electrically connected to the current source,
wherein a value of the first potential is different from that of the second potential, and
wherein the first transistor comprises an oxide semiconductor.

14. The display device according to claim 13 wherein the oxide semiconductor comprises InGaZnO.

15. The display device according to claim 13 wherein the driver circuit comprises a signal line driver circuit.

16. The display device according to claim 13 wherein the display device is incorporated into one selected from the group consisting of a television receiver, a mobile phone, a camera, a computer, a portable image reproducing device, a goggle-type display, and a game machine.

17. The display device according to claim 13, wherein the second transistor comprises the oxide semiconductor.

18. The display device according to claim 13, wherein the load has a rectifying property.

* * * * *

UNITED STATES PATENT AND TRADEMARK OFFICE
CERTIFICATE OF CORRECTION

PATENT NO. : 8,570,456 B2  
APPLICATION NO. : 12/978802  
DATED : October 29, 2013  
INVENTOR(S) : Hajime Kimura It is certified that error appears in the above-identified patent and that said Letters Patent is hereby corrected as shown below:

In the Specification

Column 26, line 56, replace "mariner" with --manner--;

Column 61, line 54, after "second electrode" delete "to";

Column 62, line 61, after "COG" replace ";" with --,--;

Column 67, line 21, replace "571A" with --71A--;

Column 71, line 8, replace "MN" with --AIN--.

Signed and Sealed this  
Twenty-fifth Day of March, 2014

Michelle K. Lee  
*Deputy Director of the United States Patent and Trademark Office*